United States Patent [19]
Divine et al.

[11] Patent Number: 6,081,783
[45] Date of Patent: Jun. 27, 2000

[54] DUAL PROCESSOR DIGITAL AUDIO DECODER WITH SHARED MEMORY DATA TRANSFER AND TASK PARTITIONING FOR DECOMPRESSING COMPRESSED AUDIO DATA, AND SYSTEMS AND METHODS USING THE SAME

[75] Inventors: James Divine; Jeffrey Niehaus; Miroslav Dokic; Raghunath Rao; Terry Ritchie, all of Austin, Tex.; Baker Scott, III, Boulder, Colo.; John Pacourek; Zheng Luo, both of Austin, Tex.

[73] Assignee: Cirrus Logic, Inc.

[21] Appl. No.: 08/970,979

[22] Filed: Nov. 14, 1997

[51] Int. Cl.[7] .................................................. G10L 21/00
[52] U.S. Cl. .......................................... 704/500; 704/201
[58] Field of Search .................................... 704/200, 201, 704/221, 222, 500, 501; 395/800.35; 714/747

[56] References Cited

U.S. PATENT DOCUMENTS

| | | | |
|---|---|---|---|
| 4,802,119 | 1/1989 | Heene et al. | 364/943.9 |
| 4,991,217 | 2/1991 | Garrett et al. | 704/235 |
| 5,193,204 | 3/1993 | Qureshi et al. | 395/800.35 |
| 5,206,884 | 4/1993 | Bhaskar | 375/254 |
| 5,235,671 | 8/1993 | Mazor | 704/200 |
| 5,436,900 | 7/1995 | Hammar et al. | 370/336 |
| 5,491,771 | 2/1996 | Gupta et al. | 704/219 |
| 5,497,373 | 3/1996 | Hulen et al. | 370/259 |
| 5,553,063 | 9/1996 | Dickson | 370/294 |
| 5,652,903 | 7/1997 | Weng et al. | 395/800.35 |
| 5,761,516 | 6/1998 | Rostoker et al. | 710/260 |
| 5,768,613 | 6/1998 | Ashgar | 395/800.35 |
| 5,835,375 | 11/1998 | Kitamura . | |

FOREIGN PATENT DOCUMENTS

| | | |
|---|---|---|
| 0 514 949 A2 | 11/1992 | European Pat. Off. . |
| 0 682 337 A1 | 11/1995 | European Pat. Off. . |
| 0 734 021 A2 | 9/1996 | European Pat. Off. . |

*Primary Examiner*—David R. Hudspeth
*Assistant Examiner*—Donald L. Storm
*Attorney, Agent, or Firm*—James J. Murphy, Esq.; Peter Rutkowski, Esq.

[57] ABSTRACT

An audio decoder 100 for operating on a received compressed audio data stream compressed using an algorithm employing transform encoding and a bit allocation routine. A first processor 200 performs a first set of operations on the received compressed audio data stream including parsing the compressed audio data stream, recovering data fields within the compressed audio data stream, calculating a bit allocation, and passing frequency domain coefficients to shared memory. A second digital signal processor 100*b* performs a second set of operations on data passed from the first digital signal processor to shared memory including performing inverse transform operations on the data passed from the first digital signal processor.

15 Claims, 48 Drawing Sheets

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | SRCB | | | | SRCA | | | | | | | DEST | | | | | | | |

FIG. 8A

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | CC | | | | SRCD | | | | | | | | | | | | | | |

FIG. 8B

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | SHFCTL | | | | | | | | | | | DEST | | | | | | | |

FIG. 8C

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | SRCB* | | | | SRCA | | | | | | | DEST* | | | | | | | |

FIG. 8D

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | DESTB* | | | | SRCD | | | | | | | | | | | | | | |

FIG. 8E

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | MVSRCB | | | | | | | | | | | DEST | | | | | | | |

FIG. 8F

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| OPCODE | | | | | | | | | | | | | | | | | | | | | | | |

FIG. 8G

RESET_B: 0x00

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 0 | 0 | 0 | 0 | 0 | 0 | 0 | 0 | x | x | x | x | x | x | x | x | x | x | x | x | x | x |

*FIG. 49A*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 0 | 0 | 0 | 0 | 0 | 1 | 0 | 0 | x | x | x | x | x | x | x | x | x | x | x | x | x | x |

*FIG. 49B*

CONTINUE_B: 0x02

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 0 | 0 | 0 | 0 | 1 | 0 | 0 | 0 | x | x | x | x | x | x | x | x | x | x | x | x | x | x |

*FIG. 49C*

SINGLE_STEP_B: 0x03

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 0 | 0 | 0 | 0 | 1 | 1 | 0 | 0 | x | x | x | x | x | x | x | x | x | x | x | x | x | x |

*FIG. 49D*

JUMP_TO_PATCH_B: 0x04

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 0 | 0 | 0 | 1 | 0 | 0 | 0 | 0 | x | PATCH ADDRESS | | | | | | | | | | | | |

*FIG. 49E*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 0 | 0 | 1 | 0 | 0 | 0 | L1 | L0 | DATA MEMORY ADDRESS | | | | | | | | | | | | | |

*FIG. 50A*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 0 | 0 | 1 | 0 | 0 | 1 | L1 | L0 | DATA MEMORY ADDRESS | | | | | | | | | | | | | |

*FIG. 50B*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 0 | 0 | 1 | 0 | 1 | 0 | L1 | L0 | x | PROGRAM MEMORY ADDRESS | | | | | | | | | | | | |

*FIG. 50C*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 0 | 0 | 1 | 0 | 1 | 1 | L1 | L0 | x | PROGRAM MEMORY ADDRESS | | | | | | | | | | | | |

*FIG. 50D*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 0 | 0 | 1 | 1 | 0 | 0 | 0 | 1 | x | x | x | x | x | PAGE | | | IO ADDRESS | | | | | |

*FIG. 50E*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [0:5]} | | | L[1:0] | | \multicolumn{14}{c}{PARAMETER [13:0]} | | | | | | | | | | | | | |
| | | 0 | 0 | 1 | 1 | 0 | 1 | 0 | 1 | x | x | x | x | x | x | \multicolumn{4}{c}{PAGE} | | | | \multicolumn{4}{c}{IO ADDRESS} | | | |

*FIG. 50F*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [5:0]} | | | L[1:0] | | \multicolumn{14}{c}{PARAMETER [13:0]} | | | | | | | | | | | | | |
| | | 0 | 0 | 1 | 1 | 1 | 0 | 1 | 1 | x | x | x | x | x | x | x | x | x | x | x | x | x | x |

*FIG. 50G*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [5:0]} | | | L[1:0] | | \multicolumn{14}{c}{PARAMETER [13:0]} | | | | | | | | | | | | | |
| | | 0 | 0 | 1 | 1 | 1 | 1 | 1 | 1 | x | x | x | x | x | x | x | x | x | x | x | x | x | x |

*FIG. 50H*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [5:0]} | | | L[1:0] | | \multicolumn{14}{c}{PARAMETER [13:0]} | | | | | | | | | | | | | |
| | | 0 | 1 | \multicolumn{2}{c}{AR} | | 0 | 0 | 0 | \multicolumn{14}{c}{ADDRESS REGISTER DATA} | | | | | | | | | | | | | | |

*FIG. 50I*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [5:0]} | | | L[1:0] | | \multicolumn{14}{c}{PARAMETER [13:0]} | | | | | | | | | | | | | |
| | | 0 | 1 | \multicolumn{2}{c}{AR} | | 1 | 0 | 0 | \multicolumn{14}{c}{ADDRESS REGISTER DATA} | | | | | | | | | | | | | | |

*FIG. 50J*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [5:0]} | | | \multicolumn{2}{c}{L[1:0]} | | \multicolumn{14}{c}{PARAMETER [13:0]} | | | | | | | | | | | | |
|  |  | 1 | 0 | 0 | 0 | 0 | 0 | 1 | 1 | x | x | x | x | x | x | x | x | x | x | x | x | x | x |

*FIG. 50K*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [5:0]} | | | \multicolumn{2}{c}{L[1:0]} | | \multicolumn{14}{c}{PARAMETER [13:0]} | | | | | | | | | | | | |
|  |  | 1 | 0 | 0 | 0 | 0 | 1 | 1 | 1 | x | x | x | x | x | x | x | x | x | x | x | x | x | x |

*FIG. 50L*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [0:5]} | | | \multicolumn{2}{c}{L[1:0]} | | \multicolumn{14}{c}{PARAMETER [13:0]} | | | | | | | | | | | | |
|  |  | 1 | 0 | 0 | 0 | 1 | 0 | 0 | x | \multicolumn{14}{l}{PROGRAM ADDRESS REGISTER DATA} | | | | | | | | | | | | | | |

*FIG. 50M*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [0:5]} | | | \multicolumn{2}{c}{L[1:0]} | | \multicolumn{14}{c}{PARAMETER [13:0]} | | | | | | | | | | | | |
|  |  | 1 | 0 | 0 | 0 | 1 | 1 | 0 | 0 | x | \multicolumn{13}{l}{PROGRAM ADDRESS REGISTER DATA} | | | | | | | | | | | | |

*FIG. 50N*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c}{OPCODE [0:5]} | | | \multicolumn{2}{c}{L[1:0]} | | \multicolumn{14}{c}{PARAMETER [13:0]} | | | | | | | | | | | | |
|  |  | 1 | 0 | 0 | 1 | 0 | 0 | 0 | 0 | x | \multicolumn{13}{l}{PROGRAM ADDRESS REGISTER DATA} | | | | | | | | | | | | |

*FIG. 50O*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 0 | 0 | 1 | 0 | 1 | 0 | 0 | x | PROGRAM ADDRESS REGISTER DATA | | | | | | | | | | | | |

FIG. 50P

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 0 | 0 | 1 | 1 | 0 | 0 | 0 | x | x | x | MODULO PROGRAM ADDRESS REGISTER DATA | | | | | | | | | | |

FIG. 50Q

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 0 | 0 | 1 | 1 | 1 | 0 | 0 | x | x | x | MODULO PROGRAM ADDRESS REGISTER DATA | | | | | | | | | | |

FIG. 50R

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 0 | 1 | 0 | 0 | 0 | 0 | 0 | x | x | x | MODULO PROGRAM ADDRESS REGISTER DATA | | | | | | | | | | |

FIG. 50S

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 0 | 1 | 0 | 0 | 1 | 0 | 0 | x | x | x | MODULO PROGRAM ADDRESS REGISTER DATA | | | | | | | | | | |

FIG. 50T

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | \multicolumn{6}{c} OPCODE [5:0] | | | | | | L[1:0] | | \multicolumn{14}{c} PARAMETER [13:0] | | | | | | | | | | | | | |
|  |  | 1 | 0 | 1 | 0 | 1 | 0 | 1 | 0 | x | x | x | x | x | x | x | x | x | x | x | x | x | x |

*FIG. 50U*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
|  |  | 1 | 0 | 1 | 0 | 1 | 1 | 1 | 0 | x | x | x | x | x | x | x | x | x | x | x | x | x | x |

*FIG. 50V*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
|  |  | 1 | 0 | 1 | 1 | 0 | 0 | 1 | 0 | x | x | x | x | x | x | x | x | x | x | x | x | x | x |

*FIG. 50W*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
|  |  | 1 | 0 | 1 | 1 | 0 | 1 | 1 | 0 | x | x | x | x | x | x | x | x | x | x | x | x | x | x |

*FIG. 50X*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
|  |  | 1 | 0 | 1 | 1 | 1 | 0 | 0 | 1 | x | x | x | x | x | x | x | x | x | x | x | x | x | x |

*FIG. 50Y*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 0 | 1 | 1 | 1 | 1 | 0 | 1 | x | x | x | x | x | x | x | x | x | x | x | x | x | x |

*FIG. 50Z*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 1 | 0 | 1 | 0 | 0 | 0 | 0 | x | PROGRAM COUNTER DATA | | | | | | | | | | | | |

*FIG. 50AA*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 1 | 1 | 0 | 0 | 0 | 1 | 1 | 1 | x | x | x | x | x | x | x | x | x | x | x | x | x | x |

*FIG. 50AB*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [0:5] | | | | | | L[1:0] | | PARAMETER [13:0] | | | | | | | | | | | | | |
| | | 1 | 1 | 0 | 1 | 1 | 0 | 0 | 0 | x | x | x | x | LOOP COUNTER DATA | | | | | | | | | |

*FIG. 50AC*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| A/B_ | ERR | OPCODE [5:0] | | | | | | L[1:0] | | PARAMETER [13:0] | | | | | | | | | | | | | |
| | | 1 | 1 | 0 | 0 | 1 | 1 | 1 | 1 | x | x | x | x | x | x | x | x | x | x | x | x | x | x |

*FIG. 50AD*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| L  | OPCODE [6:0] ||||||| PARAMETER [15:0] |||||||||||||||||
| 1  | 0  | 0  | 0  | 0  | 0  | 0  | 0  | A/B | x | x | x | x | x | WRITETYPE ** || IO_PAGE ||| IO_ADDRESS ||||
| DATA WORD OR MASK ||||||||||||||||||||||||

FIG. 55A

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| L  | OPCODE [6:0] ||||||| PARAMETER [15:0] |||||||||||||||||
| 0  | 0  | 0  | 0  | 0  | 0  | 0  | 1  | A/B | x | x | x | x | x | x | x | IO_PAGE ||| IO_ADDRESS ||||

FIG. 55B

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| L  | OPCODE [6:0] ||||||| PARAMETER [15:0] |||||||||||||||||
| 1  | 0  | 0  | 0  | 0  | 0  | 0  | 1  | A/B | x | x | x | x | x | x | x | IO_PAGE ||| IO_ADDRESS ||||
| DATA WORD (RESPONSE) ||||||||||||||||||||||||

FIG. 55C

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| L  | OPCODE [6:0] ||||||| PARAMETER [15:0] |||||||||||||||||
| 1  | 0  | 0  | 0  | 0  | 0  | 1  | 0  | A/B | 0 | DATA MEMORY ADDRESS ||||||||||||||
| DATA WORD ||||||||||||||||||||||||

FIG. 55D

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| L  | OPCODE [6:0] ||||||| PARAMETER [15:0] |||||||||||||||||
| 0  | 0  | 0  | 0  | 0  | 0  | 1  | 1  | A/B | 0 | DATA MEMORY ADDRESS ||||||||||||||

FIG. 55E

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| L  | OPCODE [6:0] ||||||| PARAMETER [15:0] |||||||||||||||||
| 1  | 0  | 0  | 0  | 0  | 0  | 1  | 1  | A/B | 0 | DATA MEMORY ADDRESS ||||||||||||||
| DATA WORD (RESPONSE) ||||||||||||||||||||||||

FIG. 55F

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 0 | 1 | 0 | 0 | A/B | 0 | PROGRAM MEMORY ADDRESS | | | | | | | | | | | | | |
| DATA WORD | | | | | | | | | | | | | | | | | | | | | | | |

*FIG. 55G*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 0 | 0 | 1 | 0 | 1 | A/B | 0 | PROGRAM MEMORY ADDRESS | | | | | | | | | | | | | |

*FIG. 55H*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 0 | 1 | 0 | 0 | A/B | 0 | PROGRAM MEMORY ADDRESS | | | | | | | | | | | | | |
| DATA WORD (RESPONSE) | | | | | | | | | | | | | | | | | | | | | | | |

*FIG. 55I*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 0 | 0 | 1 | 1 | 0 | NUMBER OF BITS IN NEW SEGMENT OF AUXDATA | | | | | | | | | | | | | | | |

*FIG. 55J*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| 1 | OPCODE [6:0] | | | | | | | PARAMETER [15:0] | | | | | | | | | | | | | | | |
| 0 | 0 | 0 | 0 | 0 | 1 | 1 | 1 | x | x | x | x | x | x | x | x | x | x | x | x | x | x | x | x |

*FIG. 55K*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 0 | 1 | 1 | 1 | x | x | READ POINTER FOR THE APPENDED AUXDATA WORD | | | | | | | | | | | | | |
| AUXILLIARY DATA WORD | | | | | | | | | | | | | | | | | | | | | | | |

*FIG. 55L*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 0 | 0 | 0 | WRITE TYPE* | x | x | x | x | x | x | INDEX | | | | | | | | |
| DATA WORD OR MASK | | | | | | | | | | | | | | | | | | | | | | | |

*FIG. 55M*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 0 | 1 | 0 | 0 | 1 | x | x | x | x | x | x | x | x | INDEX | | | | | | | |

*FIG. 55N*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 0 | 0 | 1 | x | x | x | x | x | x | x | x | INDEX | | | | | | | |
| DATA WORD (RESPONSE) | | | | | | | | | | | | | | | | | | | | | | | |

*FIG. 55O*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 0 | 1 | 0 | WRITE TYPE* | x | x | x | x | x | x | INDEX | | | | | | | | |
| DATA WORD OR MASK | | | | | | | | | | | | | | | | | | | | | | | |

*FIG. 55P*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 0 | 1 | 0 | 1 | 1 | x | x | x | x | x | x | x | x | INDEX | | | | | | | |

FIG. 55Q

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 0 | 1 | 1 | x | x | x | x | x | x | x | x | INDEX | | | | | | | |
| DATA WORD (RESPONSE) | | | | | | | | | | | | | | | | | | | | | | | |

FIG. 55R

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 1 | 0 | 0 | WRITE TYPE* | | x | x | x | x | x | x | INDEX | | | | | | | |
| DATA WORD OR MASK | | | | | | | | | | | | | | | | | | | | | | | |

FIG. 55S

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 0 | 1 | 1 | 0 | 1 | x | x | x | x | x | x | x | x | INDEX | | | | | | | |

FIG. 55T

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 1 | 0 | 1 | x | x | x | x | x | x | x | x | INDEX | | | | | | | |
| DATA WORD | | | | | | | | | | | | | | | | | | | | | | | |

FIG. 55U

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 1 | 1 | 0 | WRITE TYPE* | x | x | x | x | x | x | INDEX | | | | | | | | |
| DATA WORD OR MASK | | | | | | | | | | | | | | | | | | | | | | | |

*FIG. 55V*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 0 | 1 | 1 | 1 | 1 | x | x | x | x | x | x | x | x | INDEX | | | | | | | |

*FIG. 55W*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 0 | 1 | 1 | 1 | 1 | x | x | x | x | x | x | x | x | INDEX | | | | | | | |
| DATA WORD | | | | | | | | | | | | | | | | | | | | | | | |

*FIG. 55X*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 0 | 0 | 0 | WRITE TYPE* | x | x | x | x | x | x | INDEX | | | | | | | | |
| DATA WORD OR MASK | | | | | | | | | | | | | | | | | | | | | | | |

*FIG. 55Y*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 0 | 0 | 0 | 1 | x | x | x | x | x | x | x | x | INDEX | | | | | | | |

*FIG. 55Z*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 0 | 0 | 1 | x | x | x | x | x | x | x | x | INDEX | | | | | | | |
| DATA WORD | | | | | | | | | | | | | | | | | | | | | | | |

*FIG. 55AA*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 0 | 1 | 0 | WRITE TYPE* | x | x | x | x | x | x | INDEX | | | | | | | | |
| DATA WORD OR MASK | | | | | | | | | | | | | | | | | | | | | | | |

FIG. 55AB

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 0 | 0 | 1 | 1 | x | x | x | x | x | x | x | x | INDEX | | | | | | | |

FIG. 55AC

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 0 | 1 | 1 | x | x | x | x | x | x | x | x | INDEX | | | | | | | |
| DATA WORD | | | | | | | | | | | | | | | | | | | | | | | |

FIG. 55AD

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 1 | 0 | 0 | WRITE TYPE* | x | x | x | x | x | x | INDEX | | | | | | | | |
| DATA WORD OR MASK | | | | | | | | | | | | | | | | | | | | | | | |

FIG. 55AE

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 0 | 1 | 0 | 1 | x | x | x | x | x | x | x | | INDEX | | | | | | | |

FIG. 55AF

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 1 | 0 | 1 | x | x | x | x | x | x | x | x | INDEX | | | | | | | |
| DATA WORD | | | | | | | | | | | | | | | | | | | | | | | |

FIG. 55AG

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 1 | 1 | 0 | WRITE TYPE* | x | x | x | x | x | x | INDEX | | | | | | | | |
| DATA WORD OR MASK | | | | | | | | | | | | | | | | | | | | | | | |

FIG. 55AH

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 0 | 1 | 1 | 1 | x | x | x | x | x | x | x | x | INDEX | | | | | | | |

FIG. 55AI

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 0 | 1 | 1 | 1 | x | x | x | x | x | x | x | x | INDEX | | | | | | | |
| DATA WORD (RESPONSE) | | | | | | | | | | | | | | | | | | | | | | | |

FIG. 55AJ

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 0 | 0 | 0 | WRITE TYPE* | x | x | x | x | x | x | INDEX | | | | | | | | |
| DATA WORD OR MASK | | | | | | | | | | | | | | | | | | | | | | | |

FIG. 55AK

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 1 | 0 | 0 | 1 | x | x | x | x | x | x | x | x | INDEX | | | | | | | |

FIG. 55AL

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 0 | 0 | 1 | x | x | x | x | x | x | x | x | INDEX | | | | | | | |
| DATA WORD (RESPONSE) | | | | | | | | | | | | | | | | | | | | | | | |

FIG. 55AM

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 0 | 1 | 0 | WRITE TYPE* | x | x | x | x | x | x | INDEX | | | | | | | | |
| DATA WORD OR MASK | | | | | | | | | | | | | | | | | | | | | | | |

FIG. 55AN

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 1 | 0 | 1 | 1 | x | x | x | x | x | x | x | x | INDEX | | | | | | | |

FIG. 55AO

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 0 | 1 | 1 | x | x | x | x | x | x | x | x | INDEX | | | | | | | |
| DATA WORD | | | | | | | | | | | | | | | | | | | | | | | |

FIG. 55AP

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 1 | 0 | 0 | WRITE TYPE* | x | x | x | x | x | x | INDEX | | | | | | | | |
| DATA WORD OR MASK | | | | | | | | | | | | | | | | | | | | | | | |

FIG. 55AQ

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 1 | 1 | 0 | 1 | x | x | x | x | x | x | x | x | INDEX | | | | | | | |

FIG. 55AR

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 1 | 0 | 1 | x | x | x | x | x | x | x | x | INDEX | | | | | | | |
| DATA WORD | | | | | | | | | | | | | | | | | | | | | | | |

FIG. 55AS

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 1 | 1 | 0 | WRITE TYPE* | x | x | x | x | x | x | INDEX | | | | | | | | |
| DATA WORD OR MASK | | | | | | | | | | | | | | | | | | | | | | | |

*FIG. 55AT*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 0 | 1 | 1 | 1 | 1 | 1 | x | x | x | x | x | x | x | x | INDEX | | | | | | | |

*FIG. 55AU*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 0 | 1 | 1 | 1 | 1 | x | x | x | x | x | x | x | x | INDEX | | | | | | | | |
| DATA WORD | | | | | | | | | | | | | | | | | | | | | | | |

*FIG. 55AV*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 1 | 0 | 0 | 0 | x | 0 | x | x | x | x | x | ** | STC_HI_9 | | | | | | | | | |

*FIG. 55AW*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 0 | 0 | 1 | 0 | 0 | 0 | 0 | 1 | x | x | x | x | x | x | x | x | x | x | x | x | x | x | x | x |

*FIG. 55AX*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | OPCODE [6:0] | | | | | | | PARAMETER [15:0] | | | | | | | | | | | | | | | |
| 1 | 0 | 1 | 0 | 0 | 0 | 1 | 0 | x | x | x | x | x | x | x | x | STC_HI_9 | | | | | | | |
| DATA WORD = STC_LO_24 | | | | | | | | | | | | | | | | | | | | | | | |

*FIG. 55AY*

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | | OPCODE [6:0] | | | | | | | | | | PARAMETER [15:0] | | | | | | | | | | | |
| 1 | 0 | 1 | 0 | 0 | 0 | 1 | 0 | x | x | x | x | x | x | x | x | x | x | x | x | x | x | x | x |

FIG. 55AZ

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | | OPCODE [6:0] | | | | | | | | | | PARAMETER [15:0] | | | | | | | | | | | |
| 0 | 0 | 1 | 0 | 0 | 0 | 1 | 1 | x | x | x | x | x | x | x | x | x | x | x | x | x | x | x | x |

FIG. 55BA

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | | OPCODE [6:0] | | | | | | | | | | PARAMETER [15:0] | | | | | | | | | | | |
| 1 | 0 | 1 | 0 | 0 | 0 | 1 | 1 | x | x | x | x | x | x | x | x | | PTS_HI_9 | | | | | | |
| DATA WORD = PTS_LO_24 | | | | | | | | | | | | | | | | | | | | | | | |

FIG. 55BB

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | | OPCODE [6:0] | | | | | | | | | | PARAMETER [15:0] | | | | | | | | | | | |
| 1 | 0 | 1 | 0 | 0 | 1 | 0 | 0 | x | x | x | x | x | x | x | x | x | x | x | x | x | x | x | x |

FIG. 55BC

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|
| L | | OPCODE [6:0] | | | | | | | | | | PARAMETER [15:0] | | | | | | | | | | | |
| 0 | 0 | 1 | 0 | 0 | 1 | 0 | 1 | x | x | x | x | x | x | x | x | x | x | x | x | x | x | x | x |

FIG. 55BD

DUAL PROCESSOR DIGITAL AUDIO DECODER WITH SHARED MEMORY DATA TRANSFER AND TASK PARTITIONING FOR DECOMPRESSING COMPRESSED AUDIO DATA, AND SYSTEMS AND METHODS USING THE SAME

CROSS-REFERENCE TO RELATED APPLICATION

The following co-pending and co-assigned application contains related information and is hereby incorporated by reference:

Ser. No. 08/970,794, entitled "METHODS FOR BOOTING A MULTIPROCESSOR SYSTEM", filed Nov. 14, 1997;

Ser. No. 08/969,883, entitled "INTERPROCESSOR COMMUNICATION CIRCUITRY AND METHODS", filed Nov. 14, 1997;

Ser. No. 08/969,884, entitled "METHODS FOR UTILIZING SHARED MEMORY IN A MULTIPROCESSOR SYSTEM", filed Nov. 14, 1997;

Ser. No. 08/970,796, entitled "ZERO DETECTION CIRCUITRY AND METHODS", filed Nov. 14, 1997;

Ser. No. 08/970,841, entitled "BIAS CURRENT CALIBRATION OF VOLTAGE CONTROLLED OSCILLATOR", filed Nov. 14, 1997 and granted May 25, 1999, U.S. Pat. No. 5,907,263;

Ser. No. 08/971,080, entitled "METHOD FOR ERROR CONCEALMENT IN AN AUDIO DECODING SYSTEM", filed Nov. 14, 1997;

Ser. No. 08/970,302, entitled "METHODS FOR EXPONENT HANDLING IN AN AUDIO DECODING SYSTEM", filed Nov. 14, 1997 and granted Sep. 28, 1999 U.S. Pat. No. 5,960,401; and Ser. No. 08/970,372, entitled "METHODS FOR DEBUGGING A MULTIPROCESSOR SYSTEM;", filed Nov. 14, 1997.

BACKGROUND OF THE INVENTION

1. Field of the Invention

The present invention relates in general to audio data processing and in particular, to dual processor digital audio decoder with shared memory data transfer and task partitioning for decompressing compressed audio data, and systems and methods using the same.

2. Description of the Related Art

The ability to process audio information has become increasingly important in the personal computer (PC) environment. Among other things, audio support is important requirement for many multimedia applications, such as gaming and telecommunications. Audio functionality is therefore typically available on most conventional PCs, either in the form of an add-on audio board or as a standard feature provided on the motherboard itself. In fact, PC users increasingly expect not only audio functionality but high quality sound capability. Additionally, digital audio plays a significant role outside the traditional PC realm, such as in compact disc players, VCRs and televisions. As the audio technology progresses, digital applications are becoming increasingly sophisticated as improvements in sound quality and sound effects are sought.

One of the key components in many digital audio information processing systems is the decoder. Generally, the decoder receives data in a compressed form and converts that data into a decompressed digital form. The decompressed digital data is then passed on for further processing, such as filtering, expansion or mixing, conversion into analog form, and eventually conversion into audible tones. In other words the decoder must provide the proper hardware and software interfaces to communicate with the possible compressed (and decompressed) data sources, as well as the destination digital and/or audio devices. In addition, the decoder must have the proper interfaces required for overall control and debugging by a host microprocessor or microcontroller.

Since, there are a number of different audio compression/decompression formats and interface definitions, such as Dolby AC-3 and S/PDIF (Sony/Phillips Digital Interface), a state of the art digital audio decoder should at least be capable of supporting multiple compression/decompression formats. Such a decoder should also perform additional functions appropriate to the decoder subsystem of a digital audio system, such as the mixing of various received digital and/or audio data streams. Notwithstanding these issues, it is essential that such a decoder handle the data throughput with efficiency and speed. Thus, the need has arisen for an digital audio decoder which provides maximum utility and flexibility in view of the array of different formats and interfaces.

SUMMARY OF THE INVENTION

Disclosed is an audio decoder comprising a first digital signal processor for performing a first set of operations on a received audio data stream and a second digital signal processor for performing a second set of operations on data passed from the first digital processor.

Audio decoders embodying the principles of the present invention differ substantially from those designed and operated in accordance with the conventional wisdom in the art. Namely, conventional audio decoders are single digital signal processor devices. These conventional devices, even if the size and complexity of the single digital signal processor is substantial, have a top rate of information throughput. The maximum efficiency of complex single digital signal processors is also substantially limited. According to the principles of the present invention, an audio decoder can be constructed and operated which can process an audio data received in differing formats, stream with substantially greater speed and efficiency.

BRIEF DESCRIPTION OF THE DRAWINGS

For a more complete understanding of the present invention, and the advantages thereof, reference is now made to the following descriptions taken in conjunction with the accompanying drawings, in which:

FIG. 8A is a diagram describing the bitfields of the Arithmetic Logic Unit Instruction format;

FIG. 8B is a diagram describing the bit fields of a jump instruction;

FIG. 8C is a diagram of the bitfields of a shift instruction;

FIG. 8D is a diagram illustrating the divide instruction format;

FIG. 8E is a diagram of the load instruction format;

FIG. 8F is a diagram of the program move instruction format;

FIG. 8G is a diagram of the control instruction format;

FIG. 49A is a diagram of the bitfields of the control command RESET_B;

FIG. 49B is a diagram of the bitfields of the control command HALT_B;

FIG. 49C is a diagram of the bitfields of the control command CONINUE_B;

FIG. 49D is a diagram of the bitfields of the control command SINGLE_STE_B;

FIG. 49E is a diagram of the bitfields of the control command JUMP_TO_PATCH_B;

FIG. 50A is a diagram of the WRITE TO DATAB of command;

FIG. 50B is a diagram of the READ DATA MEMORY B command;

FIG. 50C is a diagram of the READ/WRITE PROGRAM MEMORY B command;

FIG. 50D is a diagram of the READ PROGRAM MEMORY B request;

FIG. 50E is a diagram of the WRITE I/O REGISTER B command;

FIG. 50F is a diagram of the READ I/O REGISTER B;

FIG. 50G is a diagram of the WRITE REGISTERS AR0–7;

FIG. 50H is a diagram of the READ REGISTERS AR0–7 request;

FIG. 50I is a diagram of the WRITE AR REGISTERS;

FIG. 50J is a diagram of the READ REGISTERS AR 0–7;

FIG. 50K is a diagram of the WRITE TO ALL MAR REGISTERS;

FIG. 50L is a diagram of the READ ALL MAR REGISTERS;

FIG. 50M is the WRITE ER Register 0 command;

FIG. 50N is a diagram of the READ Register PAR0 Register;

FIG. 50O is a diagram of the WRITE Register PAR1;

FIG. 50P is a diagram of the READ Register PAR1 Register;

FIG. 50Q is a diagram of the WRITE Register MPAR0 Register;

FIG. 50R is a diagram of the READ Register MPAR0 Register;

FIG. 50S is a diagram of the WRITE Register MPAR1 Register;

FIG. 50T is a diagram of the READ MPAR Register;

FIG. 50U is a diagram of the WRITE Accumulator 0;

FIG. 50V is a diagram of the READ Accumulator 0;

FIG. 50W is a diagram of the WRITE Accumulator 1;

FIG. 50X is a diagram of the READ Accumulator 1;

FIG. 50Y is a diagram of the WRITE Register CR;

FIG. 50Z is a diagram of the READ CR Register;

FIG. 50AA is a diagram of the WRITE Program Counter;

FIG. 50AB is a diagram of the READ ALL the PCC stack locations;

FIG. 50AC is a diagram of WRITE TO LOOP COUNTER at address1

FIG. 50AD is a diagram of the READ ALL LOOP COUNTER STACK LOCATIONS;

FIG. 55A is a diagram of the Write I/O Register (WR_IO_REGISTER) command;

FIG. 55B is a diagram of the Read I/O Register (RD_IO_REGISTER) command;

FIG. 55C is a diagram of the Read I/O Register Response (RD_REGISTER_RESPONSE);

FIG. 55D is a diagram of the Write Data Memory (WR_DMEM);

FIG. 55E is a diagram of the Read Data Memory (RD_DMEM);

FIG. 55F is a diagram of the of the Read Data Memory Response (RD_DMEM_RESPONSE) command;

FIG. 55G is a diagram of the Write Program Memory (WR_PMEM) command;

FIG. 55H is a diagram of the Read Program Memory (RD_PMEM) command;

FIG. 55I is a diagram of the Read Program Memory Response (RD_PMEM_RESPONSE) command;

FIG. 55J is a diagram of the Auxiliary Data Ready (AUXDATA_READY) command;

FIG. 55K is a diagram of the Read Auxiliary Data (RD_AUXDATA) command;

FIG. 55L is a diagram of the Read Auxiliary Data Response (RD_AUXDATA_RESPONSE) command;

FIG. 55M is a diagram of the of the Write Audio Manager (WR_AUDIO_MGR) command;

FIG. 55N is a diagram of the Read Audio Manager (RD_AUDIO_MGR) command;

FIG. 55O is a diagram of the Read Audio Manager Response (RD_AUDIO_MGR_RESPONSE) command;

FIG. 55P is a diagram of the Write AC3 (Wr_AC3) command;

FIG. 55Q is a diagram of the Read AC3 (Rd_AC3) command;

FIG. 55R is a diagram of the Read AC3 Response (Rd_AC3_Response) command;

FIG. 55S is a diagram of the Write MPEG (WR_MPEG) command;

FIG. 55T is a diagram of the Read MPEG (Rd_MPEG) command;

FIG. 55U is a diagram of the Read MPEG Response (Rd_MPEG_Response) command;

FIG. 55V is a diagram of the Write ProLogic (Wr_ProLogic) command;

FIG. 55W is a diagram of the Read ProLogic (Rd_ProLogic) command;

FIG. 55X is a diagram of the Read ProLogic Response (Rd_ProLogic_Response) command;

FIG. 55Y is a diagram of the Write DAS (Wr_DAS) command;

FIG. 55Z is a diagram of the Read DAS (Rd_DAS) command;

Figures 56, 57:
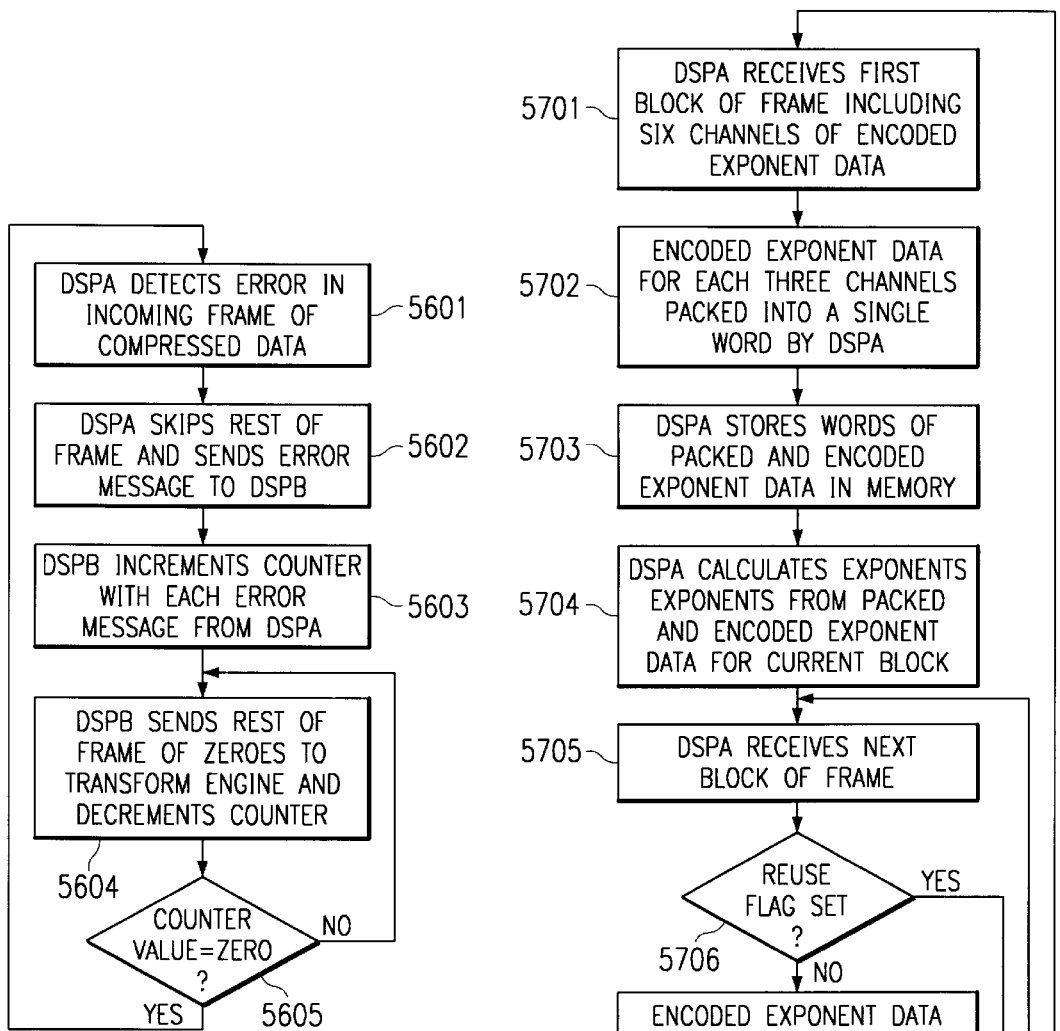

FIG. 55AA is a diagram of the Read DAS Response (Rd_DAS_Response) command;

FIG. 55AB is a diagram of the Write SDDS (Wr_SDDS) command;

FIG. 55AC is a diagram of the Read SDDS (Rd_SDDS) command;

FIG. 55 AD is a diagram of the Read SDDS Response (Rd_SDDS_Response) command;

FIG. 55AE is a diagram of the Write Bass Manager (Wr_Bass_Mgr) command;

FIG. 55AF is a diagram of the Read Bass Manager (Rd_Bass_Mgr) command;

FIG. 55AG is a diagram of the Read Bass Manager Response (Rd_Bass_Mgr_Response) command;

FIG. 55AH is a diagram of the Write 3D Manager (Wr_3D_Mgr) command;

FIG. 55AI is a diagram of the Read 3D Manager (Rd_3D_Mgr) command;

FIG. 55AJ is a diagram of the Read 3D Manager (Rd_3D_Mgr_Response) command;

FIG. 55AK is a diagram of the Write Effects Manager (Wr_Effects_Mgr) command;

FIG. 55AL is a diagram of the Read Effects Manager (Rd_Effects_Mgr) command;

FIG. 55AM is a diagram of the Read Effect Manager Response (Rd_Effects_Mgr_Response) command;

FIG. 55AN is a diagram of the Write PCM Synthesizer (Wr_PCM_Synthesizer) command;

FIG. 55AO is a diagram of the Read PCM Synthesizer (Rd_PCM_Synthesizer) command;

FIG. 55AP is a diagram of the Read PCM Synthesizer Response (Rd_PCM_Synthesizer_Response) command;

FIG. 55AQ is a diagram of the Write PCM Mixer (Wr_PCM_Mixer) command;

FIG. 55AR is a diagram of the Read PCM Mixer (Rd_PCM_Mixer) command;

FIG. 55AS is a diagram of the Read PCM Mixer Response (Rd_PCM_Mixer_Response) command;

FIG. 55AT is a diagram of the Write Reserved Manager (Wr_Reserved Mgr) command;

FIG. 55AU is a diagram of the Read Reserved Manager (Rd_Reserved_Mgr) command;

FIG. 55AV is a diagram of the Read Reserved Manager Response (Rd_Reserved_Mgr_Response) command;

FIG. 55AW is a diagram of the Write STC (Wr_STC) command;

FIG. 55AX is a diagram of the Read Stack (Rd_STC) command;

FIG. 55AY is a diagram of the Read STC Response (Rd_STC_Response) command;

FIG. 55AZ is a diagram of the Unused (Unused) command;

FIG. 55BA is a diagram of the Read PTS (Rd_PTS) command;

FIG. 55BB is a diagram of the Read PTS Response (Rd_PTS_Response) command;

FIG. 55BC is a diagram of the Channel Change (Channel_Change) command;

FIG. 55BD is a diagram of the Channel Change Acknowledge (Channel_Change_Ack) command;

FIG. 56 is a diagram illustrating an error concealment method for use in a dual processor audio decoder; and FIG. 57 is a diagram illustrating one method in which exponent data can be efficiently processed by DSPA and DSPB and stored in memory.

DESCRIPTION OF THE PREFERRED EMBODIMENTS

The principles of the present invention and their advantages are best understood by referring to the illustrated embodiment depicted in FIGS. 1–57 of the drawings, in which like numbers designate like parts.

Figure 1A:
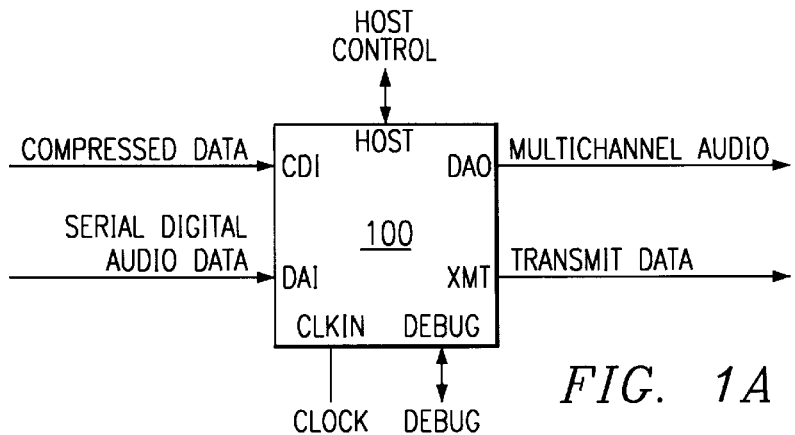
FIG. 1A is a diagram of a multichannel audio decoder embodying the principles of the present invention.

FIG. 1A is a general overview of an audio information decoder 100 embodying the principles of the present invention. Decoder 100 is operable to receive data in any one of a number of formats, including compressed data conforming to the AC-3 digital audio compression standard, (as defined by the United States Advanced Television System Committee) through a compressed data input port (CDI). An independent digital audio data (DAI) port provides for the input of PCM, S/PDIF, or non-compressed digital audio data.

A digital audio output (DAO) port provides for the output of multiple-channel decompressed digital audio data. Independently, decoder 100 can transmit data in the S/PDIF (Sony-Phillips Digital Interface) format through a transmit port XMT.

Decoder 100 operates under the control of a host microprocessor through a host port HOST and supports debugging by an external debugging system through the debug port DEBUG. The CLK port supports the input of a master clock for generation of the timing signals within decoder 100.

While decoder 100 can be used to decompress other types of compressed digital data, it is particularly advantageous to use decoder 100 for decompression of AC-3 bits streams.

Therefore, for understanding the utility and advantages of decoder 100, consider the case of when the compressed data received at the compressed data input (CDI) port has been compressed in accordance with the AC-3 standard.

Generally, AC-3 data is compressed using an algorithm which achieves high coding gain (i.e., the ratio of the input bit rate to the output bit rate) by coarsely quantizing a frequency domain representation of the audio signal. To do so, an input sequence of audio PCM time samples is transformed to the frequency domain as a sequence of blocks of frequency co-efficient. Generally, these overlapping blocks, each of 512 time samples, are multiplied by a time window and transformed into the frequency domain. Because the blocks of time samples overlap, each PCM input sample is represented by a two sequential blocks factor transformation into the frequency domain. The frequency domain representation may then be decimated by a factor of two such that each block contains 256 frequency coefficients, with each frequency coefficient represented in binary exponential notation as an exponent and a mantissa.

Next, the exponents are encoded into coarse representation of the signal spectrum (spectral envelope), which is in turn used in a bit allocation routine that determines the number of bits required to encode each mantissa. The spectral envelope and the coarsely quantized mantissas for six audio blocks (1536 audio samples) are formatted into an AC-3 frame. An AC bit stream is a sequence of the AC-3 frames.

In addition to the transformed data, the AC bit stream also includes additional information. For instance, each frame may include a frame header which indicates the bit rate, sample rate, number of encoded samples, and similar information necessary to subsequently synchronize and decode the AC-3 bit stream. Error detection codes may also inserted such that the, device, such as decoder 100, can verify that each received frame of AC-3 data does not contain any errors. A number of additional operations may be performed on the bit stream before transmission to the decoder. For a more complete definition of AC-3 compression, reference is now made to the digital audio compression standard (AC-3) available from the Advanced Televisions Systems Committee, incorporated herein by reference.

In order to decompress under the AC-3 standard, decoder 100 essentially must perform the inverse of the above described process. A decoder 100 synchronizes to the received AC-3 bit stream, checks for errors and deformats received AC-3 data audio. In particular, decoder 100 decodes spectral envelope and the quantitized mantissas. Among other things; a bit allocation routine is used to unpack and de-quantitize the mantissas. The spectral envelope is encoded to produce the exponents, then, a reverse transformation is performed to transform the exponents and mantissas to decoded PCM samples in the time domain.

Figure 1B:
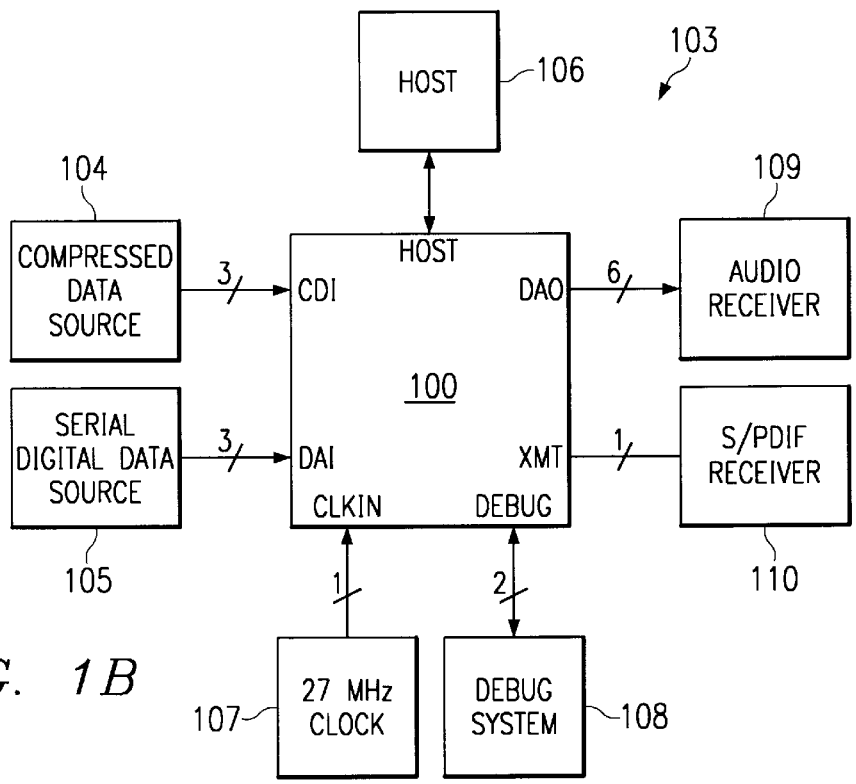
FIG. 1B is a diagram showing the decoder of FIG. 1 in an exemplary system context.

FIG. 1B shows decoder 100 embodied in a representative system 103. Decoder 100 as shown includes three compressed data input (CDI) pins for receiving compressed data from a compressed audio data source 104 and an additional three digital audio input (DAI) pins for receiving serial digital audio data from a digital audio source 105. Examples of compressed serial digital audio sources 105, and in particular of AC-3 compressed digital sources, are digital video discs and laser disc players.

Host port (HOST) allows coupling to a host processor 106, which is generally a microcontroller or microprocessor that maintains control over the audio system 103. For instance, in one embodiment, host processor 106 is the microprocessor in a personal computer (PC) and System 103 is a PC-basedsound system. In another embodiment, host processor 106 is a microcontroller in an audio receiver or controller unit and system 103 is a non-PC-based entertainment system such as conventional home entertainment systems produced by Sony, Pioneer, and others. A master clock, shown here, is generated externally by clock source 107. The debug port (DEBUG) consists of two lines for connection with an external debugger, which is typically a PC-based device.

Decoder 100 has six output lines for outputting multichannel audio digital data (DAO) to digital audio receiver 109 in any one of a number of formats including 3-lines out, 2/2/2, 4/2/0, 4/0/2 and 6/0/0. A transmit port (XMT) allows for the transmission of S/PDIF data to a S/PDIF receiver 110. These outputs may be coupled, for example, to digital to analog converters or codecs for transmission to analog receiver circuitry.

Figure 1C:
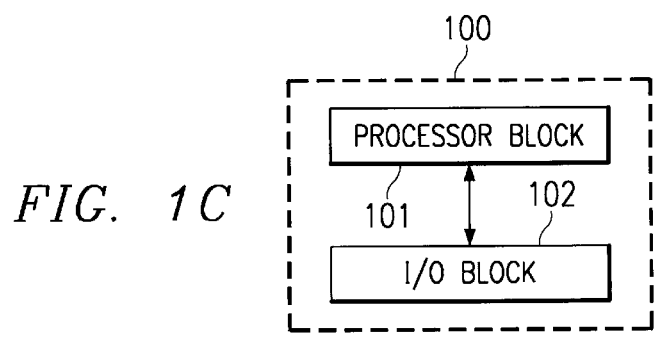
FIG. 1C is a diagram showing the partitioning of the decoder into a processor block and an input/output (I/O) block.

FIG. 1C is a high level functional block diagram of a multichannel audio decoder 100 embodying the principles of the present invention. Decoder 100 is divided into two major sections, a Processor Block 101 and an I/O Block 102. Processor Block 106 includes two digital signal processor (DSP) cores, DSP memory, and system reset control. I/O Block 102 includes interprocessor communication registers, peripheral I/O units with their necessary support logic, and interrupt controls. Blocks 101 and 102 communicate via interconnection with the I/O buses of the respective DSP cores. For instance, I/O Block 102 can generate interrupt requests and flag information for communication with Processor Block 101. All peripheral control and status registers are mapped to the DSP I/O buses for configuration by the DSPs.

Figure 2:
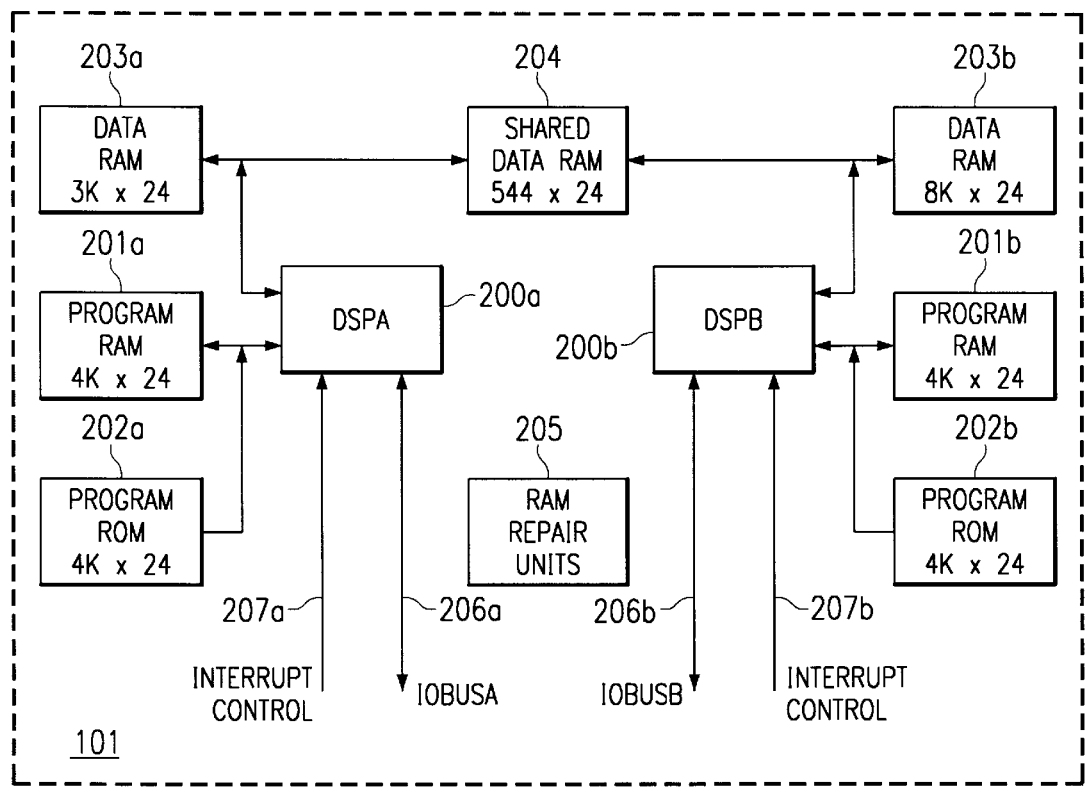
FIG. 2 is a diagram of the processor block of FIG. 1C.

FIG. 2 is a detailed functional block diagram of processor block 101. Processor block 101 includes two DSP cores 200a and 200b, labeled DSPA and DSPB respectively. Cores 200a and 200b operate in conjunction with respective dedicated program RAM 201a and 201b, program ROM 202a and 202b, and data RAM 203a and 203b. Shared data RAM 204, which the DSPs 200a and 200b can both access, provides for the exchange of data, such as PCM data and processing coefficients, between processors 200a and 200b. Processor block 101 also contains a RAM repair unit 205 that can repair a predetermined number of RAM locations within the on-chip RAM arrays to increase die yield.

DSP cores 200a and 200b respectively communicate with the peripherals through I/O Block 102 via their respective I/O buses 206a, 206b. The peripherals send interrupt and flag information back to the processor block via interrupt interfaces 207a, 207b.

DSP cores 200a and 200b are each based upon a time-multiplexed dual-bus architecture. Data Memory 203 typically contains buffered audio data and intermediate processing results. Program Memory 201/202 (referring to Program RAM 201 and Program ROM 202 collectively) contains the program running at a particular time. Program Memory 201/202 is also typically used to store filter coefficients, as required by the respective DSP 200a and 200b during processing.

DSP cores 200a and 200b also respectively include a Data Address unit for generating addresses to data memory, Program Address unit for generating addresses to Program Memory 201/202, Execution Unit which includes the circuitry required to perform arithmetic and logic operations on data received from either data memory or program memory, and buses and for carrying instructions to data to support DSP operations.

Buses 305 and 306 are respectively referred to as the source A/destination bus (Bus_A) and the source B/instruction bus (Bus_B). Bus_A 305 connects to data memory 203, data address unit (DAU) 303, the A input of execution unit (EU) 303, and I/O registers 300. Bus_B connects to program memory 201/202, program address unit (PAU) 302, DAU 301, and the B input to Execution Unit (EU) 303.

I/O registers 300 discussed in further detail below, provide for direct register control of respective DSP 200a and 200b from an external device, such as Host 106 (FIG. 1B).

Figure 4:
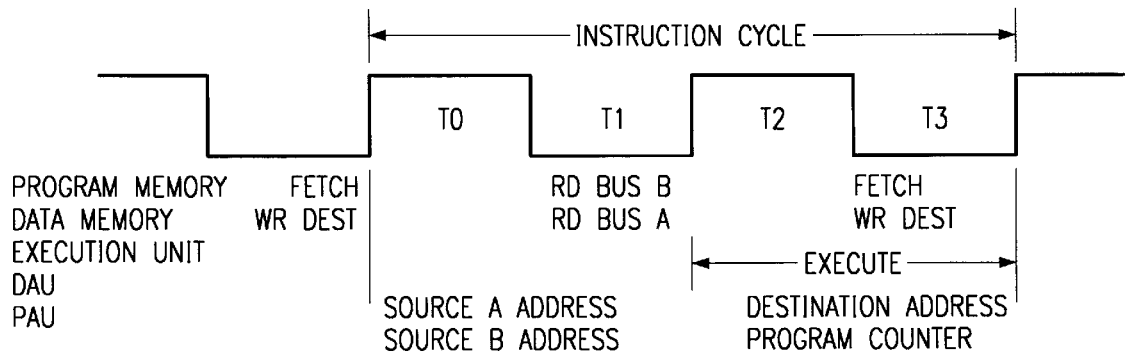
FIG. 4 is a diagram illustrating the operation of the DSPs of FIG. 3.

The overall operation of respective DSPs 200a and 200b can be described in reference to the diagram of FIG. 4. All instructions (instruction cycles) take two clock cycles (periods) to complete. During the first clock cycle, one operand is read from data memory 203 and a second operand is read from program memory 201/202 as directed by a prefetch instruction from program memory 201/202. During the second clock cycle, the result is stored in data memory 203 and the next instruction is prefetched from program memory 201/202.

Instruction execution occurs in four phases. In the first phase (T0), an instruction from a selected instruction register is decoded. In the second phase (T1), the A and B operands are read from registers or data memory. In the third phase (T2), an arithmetic or logic operation is performed by Execution Unit 303. In the fourth phase (T3), the result is stored and the next instruction is pre-fetched.

It should be noted that during the first half of the execution of typical arithmetic or logical instruction, the A operand to EU 303 is presented on Bus_A and the B operand to EU 303 is presented on Bus_B. During the second half of the execution of the instruction, the result from the EU 303 is presented on Bus_A and the next instruction fetched is presented on Bus_B.

Figure 3:
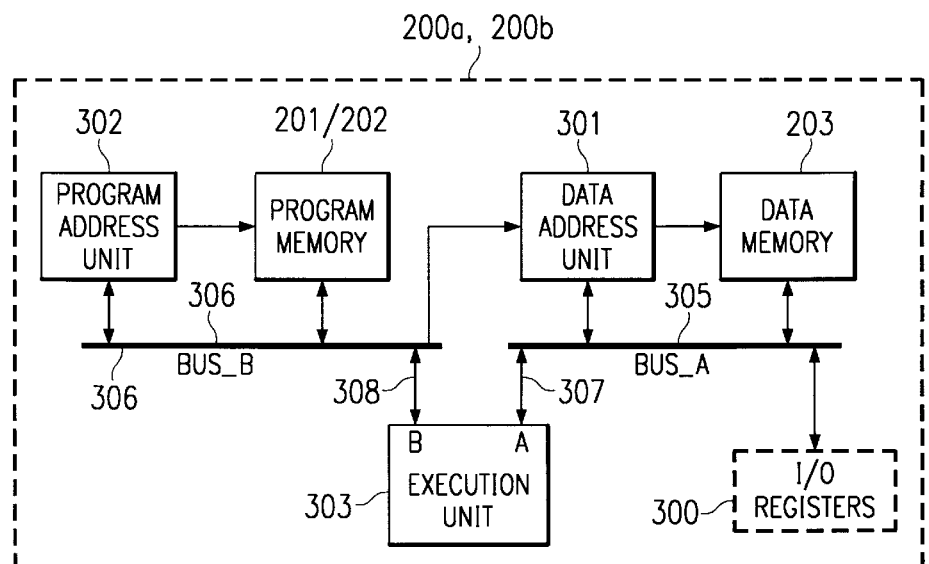
FIG. 3 depicts the organization of a selected one of digital signal processor (DSPs) cores within the processor block.

Advantageously, the architecture of FIG. 3, as operated as depicted in FIG. 4, does not employ pipelining and therefore, a user experiences no pipelining delays.

Figure 5:
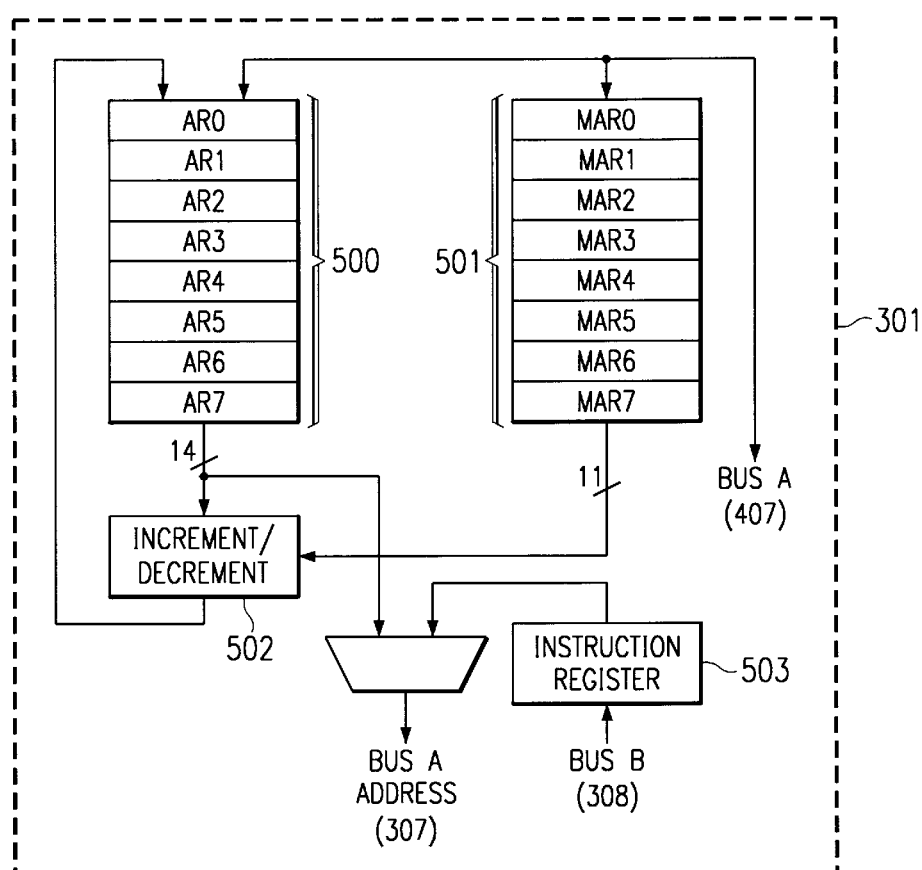
FIG. 5 is a detailed diagram of the Data Address Unit (DAU) within a selected DSP.

FIG. 5 is a detailed block diagram of Data Address Unit (DAU) 301. DAU 301 includes a block (stack) of address registers (ARs) 500, eight modulo address registers (MARs) 501, an increment/decrement unit 502, and an instruction register 503. Data Address Unit 402 supports addressing up to 16K words of data memory.

An instruction word received in instruction register 503 from Bus_B can independently specify both the source location of the A operand and the destination address for operand A. The A operand can be stored in an AR register 500, an I/O register 1300 (for register direct addressing) or a location in data memory 203 (for direct addressing). When it is a location in data memory 203, the instruction word specifies the seven LSBs of the data memory address for direct addressing or an AR 500 that contains the data memory address during indirect addressing.

When direct addressing is selected, address register AR0 is used as the A operand source page register and address register AR1 is used as the destination page register. Bits 13 through 7 of each page register are used as the MSBs of the given source or destination address, which along with the seven LSBs from the received instruction, create the entire 14-bit data memory address. When indirect addressing is selected, the 14 LSBs of a specified AR constitute the entire required 14-bit data memory address.

The 14-bit contents of any specified AR 500 can be post-incremented or post-decremented after being read to Bus_A by increment/decrement circuitry 502. This updated value is written back into that AR 500 at the end of the first half of the instruction cycle. In addition, addressing may be specified to be "bit-reverse post-increment" or "bit-reverse post-decrement." Bit-reverse addressing is very useful, for example, for addressing the results of an FFT operation.

Results from an operation performed by execution unit can be written to an AR 500, an MAR 501, an I/O register 1300, the accumulators ACC0 or ACC1 discussed below in conjunction with the Execution Unit 303, or any location in data memory 203. Each AR 500 is 14-bits wide and each MAR 501 is eleven bits wide. Thus, if an AR 500 is the destination, the low 14 bits of the result are written to that register and if a MAR 501 is specified as the destination, the 11 LSBs of the result are written thereto. If the result is written to data memory 203, the memory address is generated and/or post-modified in a manner similar to that used for the A operand address.

Every Address Register (AR) 500 is associated with a Modulo Address Register (MAR) 501. MARs 501 specify the size of circular buffers (reverse carry address blocks) of up to 2K words. For a buffer of size N+1, the value N is written to the MAR register. The circular buffer page is then determined from the upper bits of the corresponding AR register, and this page size scales with the buffer size N+1. The buffer size N+1 is represented with an M-bit number in the MAR and the circular buffer can start on $2^m$ block boundaries. The page is determined by bits 13 through 13–M of the selected AR register. For example, if the AR0 register contains 0x3FF0 and MAR0 contains 0x00A, the address sequence generated by a series of instructions with post incremented addressing will be (0x3FF0, 0x3FF1, 0x3FF2, . . . , 0x3FFA, 0x3FF0, 0x3FF1, . . . ).

It should be noted that bit-reverse addressing is provided for efficient resequencing of data points, when processing such as a Radix-2 FFT routine is being performed. For this reason, buffer sizes for bit reverse buffers are always be set to a power of 2. Additionally, all addressing options are completely specified in the instruction word and can be performed on the A operand address as well as the destination address.

Figure 6:
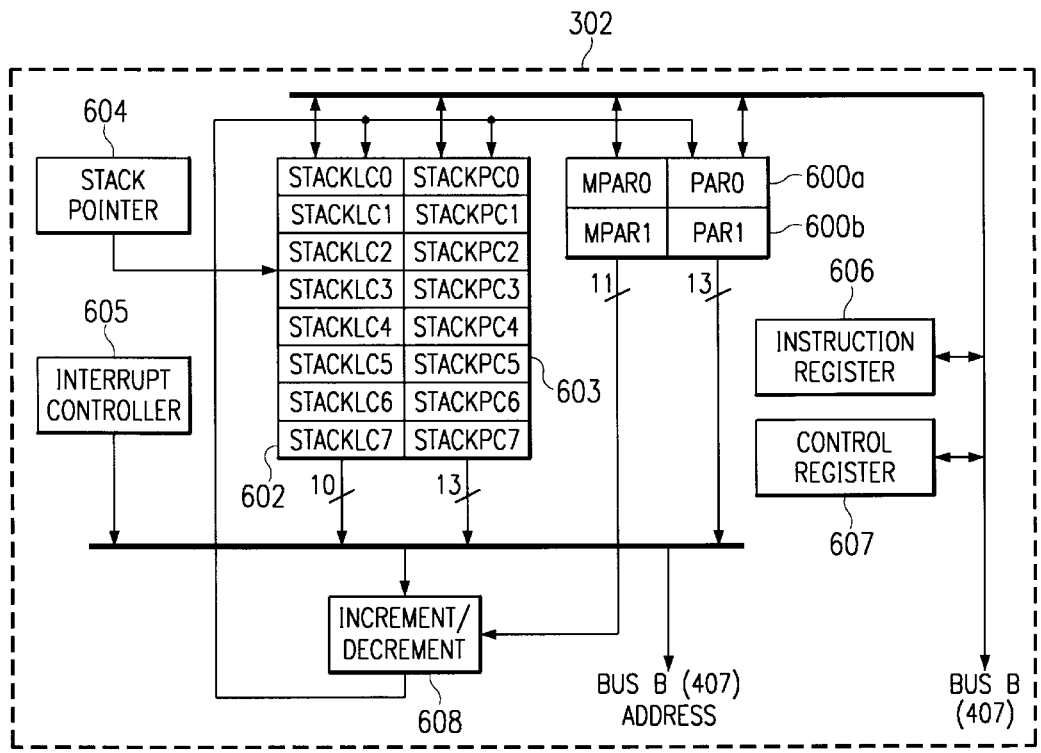
FIG. 6 is a diagram of a selected Program Address Unit (PAU)

FIG. 6 is a diagram of a selected Program Address Unit 302. Generally, Program Address Unit (PAU) 302 generates the 13-bit address for program memory 201/202, supporting a total of 8K words of program memory. Two program memory addresses are generated per instruction cycle. If the current instruction requires a source B address, the address generated by PAU 302 during the first half of the cycle is the B operand address. The address generated during the second half of the cycle is the next instruction address.

As shown in FIG. 6, PAU 302 consists of two 13-bit Program Address Registers (PARs) 600a and 600b, two 11-bit Modulo Program Address Registers (MPARs) 601a and 601b, eight stack locations 603 for storing 13-bit program counter (PC) values and eight stack locations 602 for storing 10-bit loop counter (LC) values. There is also a stack pointer 604 that points to the current PC and the current LC. Note that there is no dedicated PC or LC register. PAU 302 further includes an interrupt controller 605, instruction register 606, control register 607 and increment/decrement circuitry 608.

The next instruction address normally comes from the program counter stack location identified by pointer 604. After reading the instruction, the program counter in that location is incremented by circuitry 608. During a jump instruction (JMP), the jump address comes from an accumulator (ACC) or immediate short data. This address is loaded into the PC pointed to stack location during the first half of the jump instruction. The next instruction is read from the new address in the PC stack location.

When a jump-to-subroutine (JMPS) instruction is executed, the value in the pointed-to program counter location is incremented, the stack pointer 604 is incremented, and the jump address is written to the new PC stack location. When a return-from-subroutine (RET) instruction is executed, the stack pointer 604 is decremented and the next instruction is read from the old PC stack location. Incrementing stack pointer 604 pushes the PC and LC to the stack and decrementing the stack pointer pops the PC and LC from the stack. Since the stack has eight entries, one primary (main) routine and seven levels of subroutines are directly supported by the hardware. The stack is circular, which means that a stack overflow will overwrite data previously pushed onto the stack.

The load instruction (LD) and the repeat (REP) command can load a loop counter (LC) value from the Bus_B during the first half of an instruction cycle into the current LC stack location (register). Loading this register causes the next instruction to be executed one time more than the number loaded into the LC. Every time the next instruction is executed, LC value in the current stack location is decremented. Since the current PC value does not have to be incremented, LC value is decremented by the increment/decrement unit 608 during the time that the PC value is normally incremented. Instructions with immediate data are not repeated.

Looping can be accomplished by repeating a jump to subroutine instruction. Nested loops are possible since both the PC and LC are pushed onto the stack during jump-to-subroutine execution. This type of looping has two instructions of overhead: jump to subroutine; and return.

During the first half of an instruction cycle, the B operand can be read from a program address register (PAR) 600 or from program memory 402. If the B operand comes from program memory, the address can come from PC+1 (immediate addressing) or a PAR 600 (indirect addressing).

If indirect addressing is specified, the contents of the specified PAR 600 can be post-modified. Specifically, the contents can be incremented or decremented by increment/decrement circuitry 608. There is no reverse carry option. Although post-modify can be specified in the instruction word, whether it is an increment or decrement is determined by the DEC bit in control register 607. When DEC is high, the contents of the specified PAR 600 is decremented.

Each PAR 600 has an associated Modulo Program Address register (MPAR) 601. MPARs 601 create circular buffers of length N+1 that start at $2^m$ block boundaries, where N is the value in the selected MPAR 601 and M is the number of bits used to represent N. This allows circular buffers of any length up to 2K words. The effect of the MPAR registers values on PAR values is identical to the MAR/AR register operation in DAU 403, discussed above.

The PC 603, LC 602, PARs 600, MPARs 601, control register 607, the top stack location and program memory pointed to by a PAR value can be loaded from immediate data (13 bits) or from the accumulator in Execution Unit 303. The LD (load) instruction loads them during the first half of an instruction cycle. The PC, LC, PARs, MPARs, control register 607, top stack location and program memory pointed to by a PAR can be read by a move program (MVP) instruction.

Figure 7A:
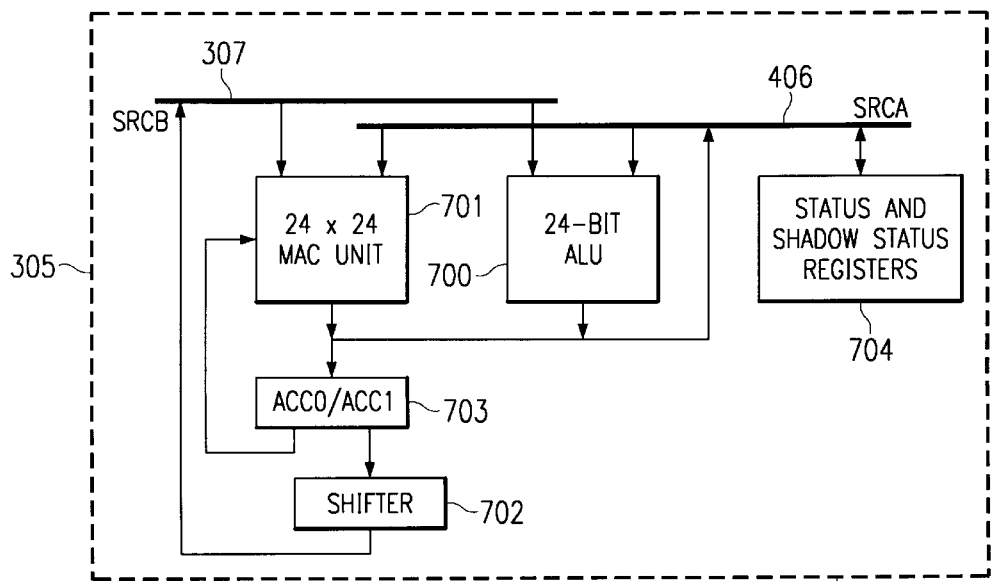
FIG. 7A is a diagram of the Execution Unit within a selected DSP.

Execution Unit (EU) 303 is generally the main processing block in each DSP 200. FIG. 7A is a diagram of a selected one of the Execution Units 303. As shown, it consists of an arithmetic/logic unit (ALU) 700, a multiply-accumulate unit (MAC) 701, a shift unit (SHF) 702, two 48-bit accumulator registers (ACC0/ACC1) 703 and status and shadow status registers 704. Arithmetic/logic unit 700 is used for the 24-bit arithmetic and logic operations. When arithmetic/logic instructions are executed, 24-bit operands are read from the SRCA (source A) and SRCB (source B) buses 306 and 307 and the 24-bit result is returned on SRCA bus 306. If an ACC 703 is specified as the destination, the 24-bit result gets written into the high 24 bits of a designated one of the 48-bit accumulators 703. The low 24 bits of the designated accumulator 703 remain unchanged. The arithmetic/logic unit also includes saturation logic for arithmetic operations.

Multiply-accumulate unit 701 is used for executing the multiply and multiply-accumulate instructions MPY (multiply), MPYL (multiply and load results in accumulator), MAC (multiply and add with accumulator contents), MACL (multiply, add with contents of accumulator and load result in accumulator), MSU (multiply and subtract from accumulator contents) and MSUL (multiply, subtract from contents of accumulator and load result in accumulator). Each of these instructions will be discussed in detail Below in conjunction with FIGS. 8A–8G. When any one of these instructions is executed, the 24-bit operands from SRCA bus 306 and SRCB bus 307 are first multiplied to generate a 48-bit result. When the MPY and MPYL instructions are executed, a zero is added to 48-bit result of the multiplication. The MAC and MACL instructions cause the 48-bit contents of a designated ACC 703 to be added to the multiplication result. When the MSU and MSUL instructions are executed, the 48-bit result of the multiplication is subtracted from a designated ACC 703. When an accumulator (ACC) 703 is specified as the destination, the low 24 bits of the result of a multiplication are always written to the low 24 bit positions of the selected 48-bit accumulator 703.

The high 24 bits of the result of the multiplication and addition (or subtraction) steps from the execution of the MPY, MAC and MSU instructions are driven on SCRA bus 406. If an accumulator 703 is specified as the destination, these 24 bits are also written into the high 24 bits of the given accumulator 703.

When any of the MPYL, MACL, and MSUL instructions are executed, the low 24 bits of the result of the addition are driven on SRCA bus 306. If an accumulator is specified as the destination, the low 24 bits of the result written into both the high and low 24-bit word positions of the designated accumulator 703.

Shift unit 702 allows for the scaling of the contents of a given accumulator 703 (e.g., as a result of a filter convolution). The shift (SHF) and shift low (SHFL) instructions each shift the 48-bit contents of the designated accumulator left by 1, 2, or 3 bits or right by one bit. The sign bit is extended during a shift right by one operation. When the SHF instruction is executed and an accumulator 703 is the destination, the 48-bit result of the shift is stored in the designated accumulator. When the SHFL instruction is executed and an accumulator 703 is the destination, the low 24 bits of the 48-bit result of the shift is written into both the low 24 bits and the high 24 bits of the designated accumulator. When an accumulator 703 is not the destination, the high 24 bits of the shift result are driven on bus SRCA 3406 during SHF execution and the low 24 bits during SHFL execution.

Barrel shift operations are performed in the MAC unit 701. Barrel shifting left for 24-bit operands can be accomplished by multiplying the operand by $2^N$ and storing the low result, where N designates the number of bit positions shifted. Barrel shifting right can be accomplished by multiplying by $2^{(24-N)}$.

Shift unit 702 and arithmetic/logic unit 700 are used for executing the divide instruction. The divide instruction (DIV) divides the contents of the designated accumulator 703 by the operand presented on SRCA bus 406 to perform one iteration of a non-restoring fractional division algorithm. Hence, the DIV instruction is repeated 24 times to complete a 24-bit division. After 24 iterations, the high 24 bits of the accumulator contain the partial remainder and the low 24 bits contain the quotient. Each DIV instruction first requires that an exclusive-OR (XOR) operation on the sign bits of the operands from SRCA bus 306 and the contents of the designated accumulator. The contents of the accumulator are then shifted left by one bit with the carry bit (C) shifted into the accumulator LSB position, except during the first iteration when the C bit is cleared. If the result of the XOR operation of the previous iteration was a logic one, the operand on SRCA bus 306 is added to the high 24 bits of the designated accumulator and the result stored back in the high 24 bits of the designated accumulator. If the result is zero, the operand from SRCA bus 306 is subtracted from the high 24 bits of the designated accumulator and the result stored back in the accumulator high 24 bits. The carry from an add or subtract sets the carry for the next iteration.

EU 700 operates in conjunction with seven status bits (V, C, Z, N, U, POV2, and POV3) and three control bits (RND, MPYSHF, and SAT). These are maintained in Status register, which is further described in the discussion of the Control and Status register section. Shadow copies of these bits are also located in a Shadow Status register 704, which supports context switching during interrupt service routines.

V is the overflow status bit which is set when an arithmetic operation overflows. The V bit is "sticky", i.e., once it is set, it remains set until explicitly cleared by the programmer. The V bit is cleared by writing a zero to its position in the Status Register.

C is the carry flag representing the carry out or borrow out resulting from the execution of an arithmetic instruction. The C bit is cleared by writing a zero to the appropriate bit position in the Status Register.

Z is the zero flag which is set high if the result of an arithmetic or logical operation is zero. Z is updated by the 48 bit result of the execution of the multiply, divide, and shift instructions and by the 24-bit result of the execution of the add, subtract, and logical instructions.

N is the negative flag and is high if the MSB of the result of an operation is high. If the result represents a number, then N specifies whether it is positive or negative. During execution of a MPYL, MACL, MSUL, or SHFL instruction N is determined by the internal 48-bit result, not the 24-bit data on the SRCA bus.

U is the unnormalized flag. U is set high if the result of an arithmetic operation is "unnormalized." A result is unnormalized if the MSB and the MSB minus one bits are the same. U is updated by the internal 48-bit result, not the 24-bit data on the SRCA bus.

POV2 is the 2-bit potential overflow flag. This bit is set if the MSB and MSB minus one bits are not the same. This bit is also sticky. The POV2 bit is cleared by writing a zero to its position in the Status Register.

POV3 is the 3-bit potential overflow flag. It is set if the MSB, MSB minus one, and MSB minus two bits are not all the same. This bit is sticky and is cleared by writing a zero to its register position.

The RND bit is the round mode control bit. When enabled, MPY, MAC, and MSU instruction results are rounded to 24 bits if the destination is 24-bits wide. The RND mode does not affect execution MPYL, MSUL, or MACL instructions and also has no effect on the operation of arithmetic/logic unit 700 or the shifter 702. Alternatively, 48-bit results from the execution of the MPY, MAC, and MSU instructions can be rounded to 24 bits by using a rounded accumulator (ACC0r, ACC1r) as the destination regardless of the state of the RND control bit.

The MPYSHF bit automatically shifts the multiplication result of MPY and MAC instructions left by one bit when set. The MPYSHF bit does not affect execution of the MPYL, MACL, or MSUL instructions.

The SAT mode bit enables saturation logic in arithmetic/logic unit 700 and/or MAC unit 701. When enabled, the SAT bit causes a result to be saturated in the case of a twos complement overflow from an arithmetic operation. The saturated result from arithmetic/logic unit 700 for 24-bit operations is a 24-bit number. The saturated result from MAC unit 701 for multiply or MAC operations is a 48-bit number. For the MPYL, MACL, and MSUL instructions, the saturated result is only a 24-bit number. The SAT bit does not affect SHF or SHFL instruction execution.

Each DSP core 200 supports up to sixteen individual hardware interrupts via interrupt interface 207 and PAUs 304. Interrupts are enabled by setting the IEN bit in control register 607 in accordance with TABLE 1. Each interrupt can be individually-disabled by clearing the corresponding mask bit (MSK0–MSK15) also in control register 607 in accordance with TABLE 1. Additionally, there is a non-maskable interrupt for the debugger that can be enabled or disabled with the NMIEN bit in the control register.

TABLE 1

Control Register

| Field | Bits | Description |
|---|---|---|
|  | 23:22 | Unused. Must be programmed low. |
| /MSK15 | 21 | Interrupt mask bit 15. When low, interrupt 15 cannot occur. |
| /MSK14 | 20 | Interrupt mask bit 14. When low, interrupt 14 cannot occur. |
| /MSK13 | 19 | Interrupt mask bit 13. When low, interrupt 13 cannot occur. |
| /MSK12 | 18 | Interrupt mask bit 12. When low, interrupt 12 cannot occur. |
| /MSK11 | 17 | Interrupt mask bit 11. When low, interrupt 11 cannot occur. |
| /MSK10 | 16 | Interrupt mask bit 10. When low, interrupt 10 cannot occur. |
| /MSK9 | 15 | Interrupt mask bit 9. When low, interrupt 9 cannot occur. |
| /MSK8 | 14 | Interrupt mask bit 8. When low, interrupt 8 cannot occur. |
| /MSK7 | 13 | Interrupt mask bit 7. When low interrupt 7 cannot occur. |

TABLE 1-continued

Control Register

| Field | Bits | Description |
|---|---|---|
| /MSK6 | 12 | Interrupt mask bit 6. When low, interrupt 6 cannot occur; |
| /MSK5 | 11 | Interrupt mask bit 5. When low, interrupt 5 cannot occur. |
| /MSK4 | 10 | Interrupt mask bit 4. When low, interrupt 4 cannot occur. |
| /MSK3 | 9 | Interrupt mask bit 3. When low, interrupt 3 cannot occur. |
| /MSK2 | 8 | Interrupt mask bit 2. When low, interrupt 2 cannot occur. |
| /MSK1 | 7 | Interrupt mask bit 1. When low, interrupt 1 cannot occur. |
| /MSK0 | 6 | Interrupt mask bit 0. When low, interrupt 0 cannot occur. |
| NMIEN | 5 | Non-maskable interrupt enable. When low, non-maskable interrupts cannot occur. NMIEN is high after a reset. |
| PWDN | 4 | Power Down. Writing a one puts the chip into power down mode. The reset pin must be toggled to exit power down. |
| IEN | 3 | Interrupt enable. When high, interrupts 0 to 15 can occur. |
| TRACE | 2 | Trace mode enable. When high, the processor will enter single step mode. |
| RS | 1 | Software reset. Writing a one resets the chip & all registers are initialized (except for host mode select and RAM remap registers). |
| DEC | 0 | Increment/decrement. When set, the program address registers are decremented when post modify is specified. When clear, they are incremented. |

The interrupts are priority encoded to resolve conflicts when multiple interrupts occur simultaneously. The non-maskable interrupt has higher priority than the maskable interrupts. Of the maskable interrupts, interrupt 0 is highest priority and interrupt 15 is lowest.

An interrupt is detected by program address unit 304 at the end of the instruction cycle during which the interrupt occurred. Since the next instruction has already been fetched, it is executed before the instruction at the interrupt vector location is executed. Thus, there is a one to two instruction cycle delay from the time the interrupt occurs until the instruction at the interrupt vector location is executed.

Interrupts can be long or short. A short interrupt occurs if the instruction at the interrupt vector location is anything but a JMPS (jump) instruction. After a "short interrupt" instruction executes, program control switches back to normal. The instruction at the interrupt vector location cannot have immediate data.

A long interrupt occurs if the instruction at the interrupt vector location is a JMPS instruction. When the jump occurs, the IEN bit is cleared to disable further interrupts. Also, the contents of the status and shadow status registers swap. When a return-from-interrupt (RETI) instruction is executed, the IEN bit is set, the status and shadow status registers are again swapped, and program control switches back to normal. Note that the status and shadow status registers do not swap on short interrupts.

There are two reset mechanisms for each DSP 200 as well as for the entire chip itself, hardware reset and software reset. A hardware reset is asserted with the presentation a low level on a RESET pin. A low-to-high transition on this pin initializes the hardware and causes the logic DSP 200 to begin execution at address 0x1000. The ROM code in program ROM 202 for that DSP 200 at this address may then perform further software initialization of the chip or optionally download code from a host to program RAM. A software reset is asserted by writing a one to the RS bit in the control register 607, which initializes the hardware and causes DSP 200 to begin execution at address 0x0000. In either case, all internal registers are reset to their initial state except for the host mode select bits in the host interface and the remapping registers in the RAM repair unit.

Status and Shadow Status registers 706 are connected to the SRCA bus 306. Since they are I/O mapped, they can be used as the SRCA operand or destination for most ALU operations. Control register 607 (FIG. 6) is connected to the SRCB bus and is loaded by the LD instruction and read by the MVP instruction. The status and shadow status register bitfields are set forth in TABLES 2 and 3 respectively. The bitfields for the control register are found in TABLE 1.

TABLE 2

Status Register

| Field | Bits | Description |
| --- | --- | --- |
|  | 23:13 | Unused. |
| MPYSRF | 12 | Multiplier shift mode control bit. |
| SAT | 11 | Saturation mode control bit. |
| RND | 10 | Round mode control bit. |
| POV3 | 9 | Potential overflow (3-bit) flag. (Sticky) |
| POV2 | 8 | Potential overflow (2-bit). flag. (Sticky) |
| STKPTR | 7:5 | Stack pointer. Points to the current program and repeat counters |
| N | 4 | Negative flag. |
| Z | 3 | Zero flag. |
| V | 2 | Overflow flag. (Sticky) |
| U | 1 | Unnormalized flag. |
| C | 0 | Carry flag. |

TABLE 3

Shadow Status Register

| Field | Bits | Description |
| --- | --- | --- |
|  | 23:13 | Unused. |
| MPYSHF | 12 | Multiplier shift mode control bit. |
| SAT | 11 | Saturation mode control bit. |
| RND | 10 | Round mode control bit. |
| POV3 | 9 | Potential overflow (3-bit) flag. (Sticky) |
| POV2 | 8 | Potential overflow (2-bit) flag. (Sticky) |
|  | 7:5 | Unused. Always reads zero |
| N | 4 | Negative flag. |
| Z | 3 | Zero flag. |
| V | 2 | Overflow flag. (Sticky) |
| U | 1 | Unnormalized flag. |
| C | 0 | Carry flag. |

A LD (load) instruction can be used to write the contents of accumulators 703 or immediate short (13 bits) data to a PAR 600, an MPAR 601, the control register(CR), the program counter (PC), the loop counter (LC), or the last PC and REP pushed onto the stack (PC-1 and LC-1). It can also write the contents of an accumulator 703 or immediate short data to program memory pointed to by the contents of a PAR 600.

The MVP (move program) instruction can move immediate long data, the contents of an accumulator 703, PAR 600, MPAR 601, Control Register 607, a Program Counter register 603 or a Loop Counter register. It can also move program memory 201 contents pointed to by the contents of PAR 600 to any destination described above and any of the stack pointer locations (STACKPC[0–7] and STACKLC [0–7]). The information in the specified PAR 600 can be post modified or not post modified.

The contents of a stack pointer 604 can be accessed by reading bits 5 through 7 of the Status register. Bits 5 through 7 of the Shadow Status register are always low.

Each of the instruction formats can be described in conjunction with FIGS. 8A–8G. TABLES 5–13 set out the bit encodings for each of the individual bitfields. For a detailed description of the instruction set, please refer to Appendix A.

Generally, the instruction set allows flexible addressing of two source operands and the destination of the result. In one instruction the main ALU operation is performed and up to three memory address pointers can be updated. The assembly code syntax is: OPCODE SRCA, SRCB, DEST.

FIG. 8A is a diagram describing the bitfields of the Arithmetic Logic Unit Instruction format. Each of these instructions includes an opcode field comprising bits 19–23 of the 23-bit instruction word. Bits 16–18 designate source B (srcB) and bits 8–15 designate source A (srcA). The destination is designated by bits 0–7.

TABLE 4 generally describes the opcode field encodings.

TABLE 4

Opcode Field (opcode):

| Opcode | Instruction | Opcode | Instruction |
| --- | --- | --- | --- |
| 00000 | NOP | 10000 | SHF |
| 00001 | AND | 10001 | SHFL |
| 00010 | OR | 10010 | MVP |
| 00011 | XOR | 10011 | SUBR |
| 00100 | ADD | 10100 | MAC1 |
| 00101 | ADDC | 10101 | MACL1 |
| 00110 | SUB | 10110 | MSU1 |
| 00111 | SUBC | 10111 | MSUL1 |
| 01000 | MPY | 11000 | JMPS |
| 01001 | MPYL | 11001 | JMP |
| 01010 | MAC | 11010 | LD/REP |
| 01011 | MACL | 11011 | RET/RET1 |
| 01100 | MSU | 11100 | TRAP |
| 01101 | MSUL | 11101 | Reserved |
| 01110 | MVD | 11110 | Reserved |
| 01111 | DIV | 11111 | Reserved |

Generally, the following operations can be specified in the opcode field: add source A with source B (ADD); add source A to source B and the carry bit (ADDC); divide iteration (DIV); jump to a new address (JMP); jump to subroutine (JMPS); load (LD); multiply source A with source B and add result with accumulator contents (MAC); multiply source A and source B and add with accumulator contents, and if destination is an accumulator, store the LSBs of the result in both halves of the designated accumulator (MACL); multiply source A with source B (MPY); multiply source A and source B, and if an accumulator is the destination, load the LSB's of the result into both halves (MPYL); multiply source A and source B and subtract result from contents of a designated accumulator (MSU); multiply source A with source B and subtract from a designated accumulator, and if an accumulator is the destination, store the LSB's of the result in both halves of the designated accumulator (MSVL);

move data from source to destination on source A bus (MVD); move data from the source B bus to destination (MVP); no operation (NOP); load loop counter (REP); return from subroutine or interrupt (RET/RET1); shift accumulator contents, and if accumulator is the destination, load 48-bit result, otherwise store 24 MSB at destination (SHF); shift accumulator contents, and if accumulator is destination, store 24 LSBs in both halves of the destination accumulator, otherwise store 24 LSBs in destination register SHFL; subtract source A from source B (SUB); subtract source A and carry bit from source B (SUBC); subtract source A and carry bit from source B (SUBC); subtract source B from source A (SUBR); and generate debug interrupt (TRAP).

TABLE 5 specifies the source A field (srcA) encoding for the three available addressing modes (direct, register indirect and register direct). In TABLE 5, the "direct address" represents 7-bit address within the current source page, the source page being determined by address register AR0 (data address unit 301, FIG. 5). ARx presents one of eight data registers 500 (AR7–AR0) within data address unit 301. MARx represents one of eight data modulo registers 501 (also in data address unit 301, FIG. 5). The term "I0REGx" represents one of thirty-two possible I/O register addresses. The enable bit ENable post-modify operations when set. The identification bit ID determines whether post-modify is increment (ID=0) or decrement (ID=1). The BR bit specifies bit-reversed addressing when set.

TABLE 5

| | | | Source A field (srcA) | | | | | |
|---|---|---|---|---|---|---|---|---|
| Mode | 15 | 14 | 13 | 12 | 11 | 10 | 9 | 8 |
| Direct | 0 | direct address | | | | | | |
| Register Indirect | 1 | 0 | ARx | | | BR | EN | ID |
| Register Direct | 1 | 0 | ARx | | | 0 | 0 | 0 |
| | 1 | 1 | MARx | | | 1 | 0 | 0 |
| | 1 | 1 | IOREGx | | | | | 1 |

TABLE 6 describes the source B field (srcB) encoding. In TABLE 6, PARx designates a PAR register 700 (FIG. 7A) and ACCx designates an accumulator 803 (FIG. 8, EO).

TABLE 6

| Source B Field (srcB) | | | |
|---|---|---|---|
| Mode | 18 | 17 | 16 |
| PAR0 indirect | 0 | 0 | 0 |
| PAR0 indirect w/ post modify | 0 | 0 | 1 |
| PAR0 direct | 0 | 1 | 0 |
| ACC0 | 0 | 1 | 1 |
| PAR1 indirect | 1 | 0 | 0 |
| PAR1 indirect w/ post modify | 1 | 0 | 1 |
| ACC1 | 1 | 1 | 0 |
| Immmediate | 1 | 1 | 1 |

TABLE 7 describes the encoding for the destination (dest) field for setting the direct, register indirect, and register direct addressing modes. The labels ARx, MARx, ACCx, IOREGx, EN, ID, BR interpreted as was done with regards to discussion above of TABLE 5. The label ACCxr designates one of the accumulators, with the result rounded to the most significant 24 bits.

TABLE 7

| | | | Destination Field (dest) | | | | | |
|---|---|---|---|---|---|---|---|---|
| Mode | 7 | 6 | 5 | 4 | 3 | 2 | 1 | 0 |
| Direct | 0 | direct address | | | | | | |
| Register Indirect | 1 | 0 | ARx | | | BR | EN | ID |
| Register Direct | 1 | 1 | ARx | | | 0 | 0 | 0 |
| | 1 | 1 | MARx | | | 1 | 0 | 0 |
| | 1 | 1 | ACCx | | | 0 | 1 | 0 |
| | 1 | 1 | ACCxr | | | 1 | 1 | 0 |
| | 1 | 1 | IOREGx | | | | | 1 |

The following examples of an ADD instruction illustrate possible addressing modes:

(1) add *AR2+, *PAR0, *AR3+/*SRCA=AR2 indirect with post increment; SRCB=PAR0 indirect; DEST=AR3indirect with post increment*/

(2) add *AR2, *PAR0m, *AR3/*SRCA=AR2 indirect; SRCB=PAR0 indirect with most modify; DEST=AR3 indirect*/

(3) add *AR2-, PAR0m, *AR3-/*SRCA=AR2 indirect with post decrement; SRCB=PAR0 register direct; DEST=AR3 indirect with post decrement*/

(4) add *AR2b+, 0x123456, *AR3b+/*SRCA=AR2 indirect with bit reverse post increment; SRCB=immediate DEST=AR3 indirect with bit reverse post increment*/

(5) add *AR2b-, ACC0, *AR3b-/*SRCA=AR2 indirect with bit reverse post decrement; SRCB=ACC0; DEST=AR3 indirect with bit reverse post decrement*/

(6) add *AR2b-, ACC0, *AR3b+/*SRCA=AR2 indirect with bit reverse post decrement; SRCB=ACC0; DEST=AR3 indirect with bit reverse post increment*/

(7) add AR2, ACC0, AR3/*SRCA=AR2registerdirect; SRCB=ACC0;DEST=AR3registerdirect*/

(8) add MAR2 ACC0, MAR3/*SRCA= MAR2registerdirect; SRCB=ACC0; DEST=MAR3 registerdirect*/)

(9) add 0x19, ACC0, ACC0/*SRCA=direct address, AR0 is the page register; SRCB=ACC0; DEST=ACC0*/ Any combination of addressing modes for SRCA, SRCB, and DEST are permitted.

(10) add 0x19, ACC0, 0x27/*SRCA=direct address (0x19), AR0 is the page register; SRCB=ACC0; DEST=direct address(0x27), AR1 is the page register*/

FIG. 8B describes the bit fields of a jump instruction. The bitfield comprised of bits 19–23 contains the opcode, the bitfield comprised of bits 15–18 contains the condition code (cc), and the bitfield comprised of bits 0–14 contains immediate data (scrD).

TABLE 8 depicts the encoding of the condition code field (cc). This field generally identifies logic conditions, such as overflow, carry state and the like.

TABLE 8

| | Condition Code Field (cc) | | | | |
|---|---|---|---|---|---|
| Condition | Label | 18 | 17 | 16 | 15 |
| carry | C | 0 | 0 | 0 | 0 |
| not carry | NC | 0 | 0 | 0 | 1 |
| equal to zero | EQ | 0 | 0 | 1 | 0 |
| not equal to zero | NE | 0 | 0 | 1 | 1 |

TABLE 8-continued

Condition Code Field (cc)

| Condition | Label | 18 | 17 | 16 | 15 |
|---|---|---|---|---|---|
| greater than or equal to zero | GE | 0 | 1 | 0 | 0 |
| less than zero | LT | 0 | 1 | 0 | 1 |
| less than or equal to zero | LE | 0 | 1 | 1 | 0 |
| greater than zero | GT | 0 | 1 | 1 | 1 |
| potential overflow 2 | POV2 | 1 | 0 | 0 | 0 |
| potential overflow 3 | POV3 | 1 | 0 | 0 | 1 |
| overflow | V | 1 | 0 | 1 | 0 |
| not overflow | NV | 1 | 0 | 1 | 1 |
| unnormalized | U | 1 | 1 | 0 | 0 |
| normalized | NU | 1 | 1 | 0 | 1 |
| Reserved |  | 1 | 1 | 1 | 0 |
| always | — | 1 | 1 | 1 | 1 |

TABLE 9 describes the Immediate Data Field (srcD). In TABLE 9, the label AC represents the selection of one of two accumulators 803 (FIG. 8), INT whether the ET instruction (INT=0) or RETI instruction (INT=1) is executed.

TABLE 9

Immediate Data Field (srcD)

| Mode | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| immediate | 0 | Immediate short data | | | | | | | | | | | | | |
| accumulator | 1 | AC | x | x | x | x | x | x | x | x | x | x | x | x | x |
| return | INT | x | x | x | x | x | x | x | x | x | x | x | x | x | x |

FIG. 8C is a diagram of the bitfields of a shift instruction. Bits 19–23 are the opcode, bits 8–18 are the shift control bits (shFctl) and bits 0–7 designate the destination. The opcode and destination encodings are the same as was described above. The shift control bits are encoded as shown in Table 10.

TABLE 10

Shift Control Field (shfctl)

| Mode | 18 | 17 | 16 | 15 | 14 | 13 | 12 | 11 | 10 | 9 | 8 |
|---|---|---|---|---|---|---|---|---|---|---|---|
| Fixed shift right by 1 | 0 | 0 | AC | x | x | x | x | x | x | 0 | 0 |
| Fixed shift left by 1 | 0 | 0 | AC | x | x | x | x | x | x | 0 | 1 |
| Fixed shift left by 2 | 0 | 0 | AC | x | x | x | x | x | x | 1 | 0 |
| Fixed shift left by 3 | 0 | 0 | AC | x | x | x | x | x | x | 1 | 1 |

In TABLE 10, bit 16 (AC) flags one of the two accumulators 803. The fixed shift modes are used in conjunction with the shf/shfl codes discussed above.

The divide instruction format is illustrated in FIG. 8D. The bitfield comprised of bits 19–23 contains p the opcode, bits 16–19 designate source B (srcB), bits 8–15 designate source A (srcA) and the bitfield comprised of bits 0–7 designates the destination. The source A, source B, destination and opcode fields are encoded as discussed above.

FIG. 8E is a diagram of the load instruction format. The bitfield comprised of bits 19–23 contains the opcode, bits 15–18 comprise the destination B bitfield (destB) and bits 0–14 comprise the immediate data bitfield (srcD). See the Tables above, along with TABLE 11, which describes the destination B field.

TABLE 11

Destination B Field (destB)

| Mode | 18 | 17 | 16 | 15 |
|---|---|---|---|---|
| PAR0 indirect | 0 | 0 | 0 | 0 |
| PAR0 indirect with post-modify | 0 | 0 | 0 | 1 |
| PAR0 direct | 0 | 0 | 1 | 0 |
| MPAR0 direct | 0 | 0 | 1 | 1 |
| Program counter (PC) | 0 | 1 | 0 | 0 |
| Previous program counter (PC-1) | 0 | 1 | 0 | 1 |
| Accumulator 0 | 0 | 1 | 1 | 0 |
| Accumulator 1 | 0 | 1 | 1 | 1 |
| PAR1 indirect | 1 | 0 | 0 | 0 |
| PAR1 indirect with post-modify | 1 | 0 | 0 | 1 |
| PAR1 direct | 1 | 0 | 1 | 0 |
| MPAR1 direct | 1 | 0 | 1 | 1 |
| Loop counter (LC) | 1 | 1 | 0 | 0 |
| Previous loop counter (LC-1) | 1 | 1 | 0 | 1 |
| Control register | 1 | 1 | 1 | 0 |
| Reserved | 1 | 1 | 1 | 1 |

FIG. 8F is a diagram of the program move instruction format. The opcode bitfield is comprised of bits 19–23, the move source B field (mvsrcB) is comprised of bits 14–18, the destination is designated by the field of bits 0–7, and bits 8–13 are undefined (don't care). TABLE 12 defines the Program Move Source B Field (mvsrcB). LCx designates one of the eight LC stack locations and PCx designates one of the eight PC stack locations. Immediate data is fetched from program memory and instructions with the immediate data for mvsrB are two words long.

TABLE 12

Program Move Source B Field (mvsrcB)

| Mode | 18 | 17 | 16 | 15 | 14 |
|---|---|---|---|---|---|
| PAR0 indirect | 0 | 0 | 0 | 0 | 0 |
| PAR0 indirect with post-modify | 0 | 0 | 0 | 1 | 0 |
| PAR0 direct | 0 | 0 | 1 | 0 | 0 |
| MPAR0 direct | 0 | 0 | 1 | 1 | 0 |
| Program counter (PC) | 0 | 1 | 0 | 0 | 0 |
| Previous program counter (PC-1) | 0 | 1 | 0 | 1 | 0 |
| Accumulator 0 | 0 | 1 | 1 | 0 | 0 |
| Accumulator 1 | 0 | 1 | 1 | 1 | 0 |
| PAR1 indirect | 1 | 0 | 0 | 0 | 0 |
| PAR1 indirect with post-modify | 1 | 0 | 0 | 1 | 0 |
| PAR1 direct | 1 | 0 | 1 | 0 | 0 |
| MPAR1 direct | 1 | 0 | 1 | 1 | 0 |
| Loop counter (LC) | 1 | 1 | 0 | 0 | 0 |
| Previous loop counter (LC-1) | 1 | 1 | 0 | 1 | 0 |
| Control register | 1 | 1 | 1 | 0 | 0 |
| Immediate | 1 | 1 | 1 | 1 | 0 |
| Stack Loop Counter | LCx | | | 0 | 1 |
| Stack Program Counter | PCx | | | 1 | 1 |

FIG. 8G is a diagram of the control instruction format which includes only one active field; the opcode field is defined by bits 19–23. Bits 0–18 are undefined (don't care).

TABLE 13 is a Flag and Mode Summary which summarizes which flags are updated by each instruction, and which mode affects each instruction. The label "4" stands for a normal update. The label "k" means that the flag is updated, always based on a 48-bit result. The label "0" represents a cleared register.

TABLE 13

Flag And Mode Summary

| Instruction | POV3 | POV2 | N | Z | V | U | C | SAT | RND | MPYSHF |
|---|---|---|---|---|---|---|---|---|---|---|
| ADD/ADDC | 4 | 4 | 4 | 4 | 4 | 4 | 4 | 4 | | |
| AND/OR/XOR | | | 4 | 4 | | | | | | |
| DIV | | | 4 | 4 | | 4 | 4 | | | |
| JMP/JMPS | | | | | | | | | | |
| LD/REP | | | | | | | | | | |
| MAC/MAC1 | 4 | 4 | 4 | 4 | 4 | 4 | 4 | 4 | 4 | 4 |
| MACL/MAC1 | | | 4 | 4 | 4 | k | k | 4 | | |
| MPY | 4 | 4 | 4 | 4 | 4 | 4 | 0 | 4 | 4 | 4 |
| MPYL | | | 4 | 4 | 4 | k | 0 | 4 | | |
| MSU/MSU1 | 4 | 4 | 4 | 4 | 4 | 4 | 4 | 4 | 4 | 4 |
| MSUL/MSUL1 | | | 4 | 4 | 4 | k | k | 4 | | |
| MVD/MVP | | | | | | | | | | |
| NOP | | | | | | | | | | |
| RET/RET1 | | | | | | | | | | |
| SHF/SHFL | | | k | k | k | k | 0 | | | |
| SUB/SUBC | 4 | 4 | 4 | 4 | 4 | 4 | 4 | 4 | | |
| SUBR | 4 | 4 | 4 | 4 | 4 | 4 | 4 | 4 | | |
| TRAP | | | | | | | | | | |

Figure 9:
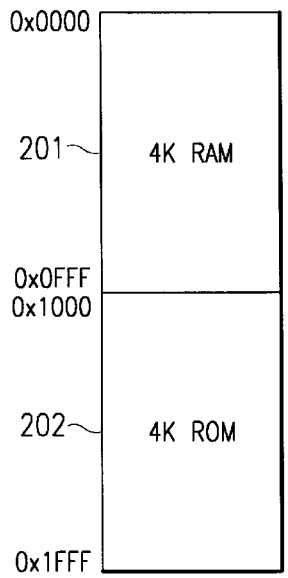
FIG. 9 is a diagram illustrating the organization each 8K program memory space.

The program memory maps are identical for both DSPA and DSPB. Each 8K program memory space is organized as shown in FIG. 9. Each DSP 200 is supported by 4K of program RAM 201 and 4K of program ROM 202. Addresses 0x0000-0x001F and 0x1000-0x1002 to program RAM 201 are also reserved for accessing interrupt and reset vectors. The remainder of program RAM 201 memory space is available for accessing program instructions. The program ROM 202 memory space is used to store boot, RAM self-test and debug software, as well as application specific tables and microcode.

Figure 7B:
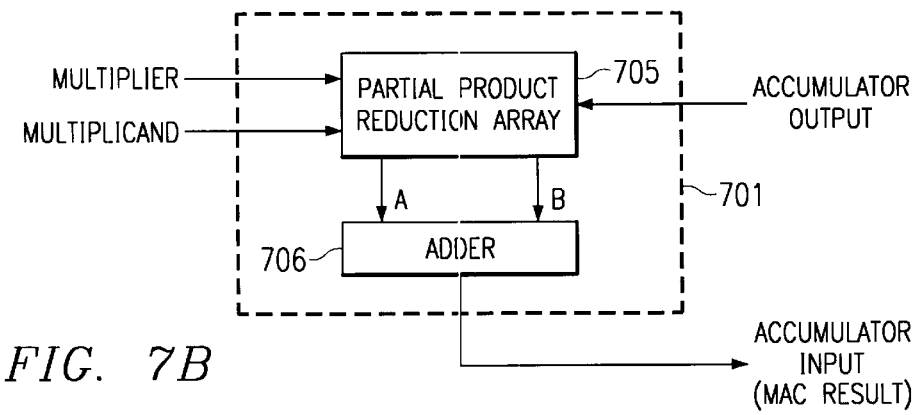
FIGS. 7B depicts the overall structure of a multiply-accumulate (MAC) unit within the execution unit of FIG. 7A.
Figure 7C:
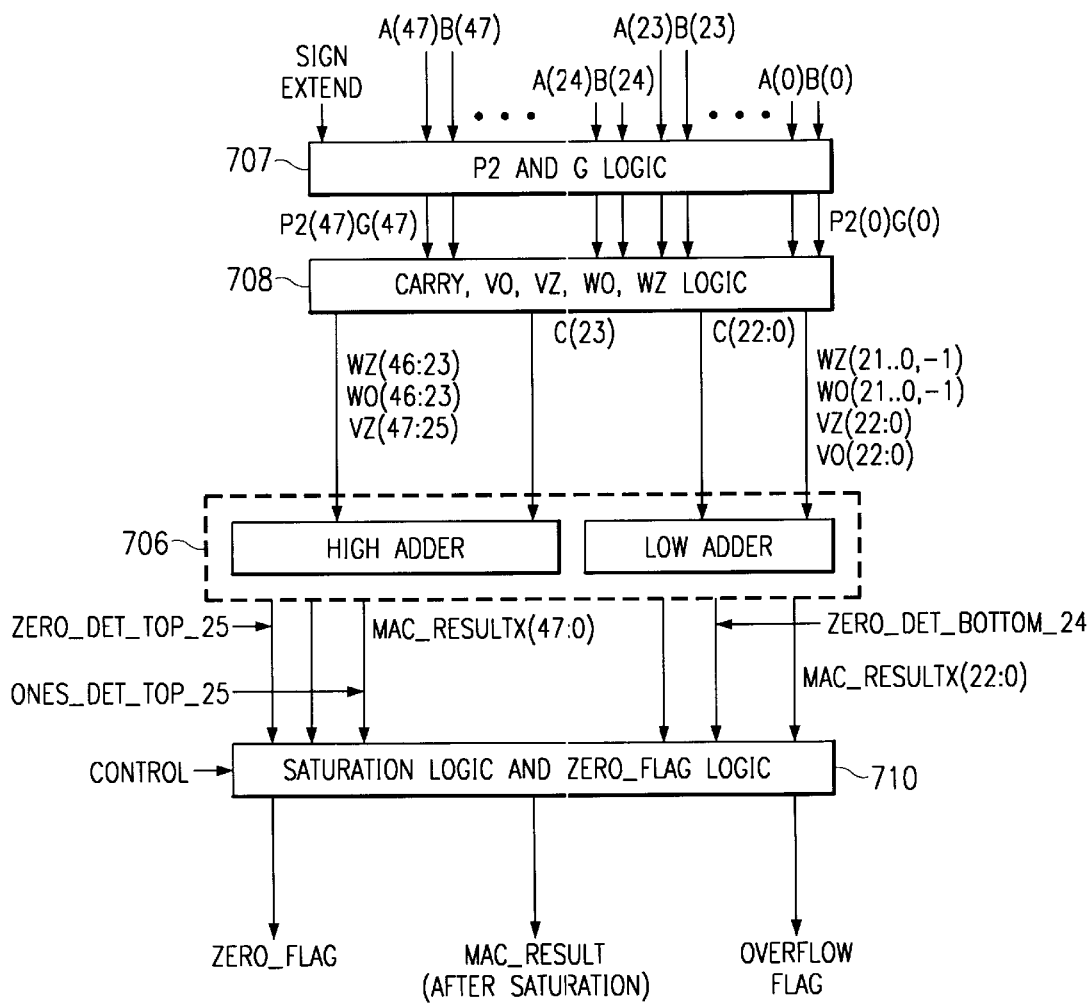
FIG. 7C depicts in detail the adder portion of the MAC unit of FIG. 7B.

FIGS. 7B and 7C are diagrams emphasizing multiply-accumulate (MAC) unit 701 within the execution unit 302 within a selected DSP core 200. In particular FIG. 7B depicts the overall structure of the selected MAC unit, while FIG. 7C depicts in further detail the adder portion. For purposes of the present t discussion, the following definitions apply:

$p(I)=a(I)\oplus(I)$ represents carry propagation;

$g(I)=a(I)\wedge b(I)$ represents carry generation;

$c(I)=[p(I)\wedge c(I-1)]\vee g(I)$ represents carry with $c(o)=0$; and $r(I)=p(I)\oplus c(I-1)$ represents the result of an addition.

According to the principles of the present invention, a method is provided which allows for fast zero detection flag generation and fast saturation of results in MACs 701. As shown in FIG. 7B, each multiply-accumulate unit 701 includes an array 705 which reduces the partial product additions down to two vectors (binary numbers) a and b and an adder 706. FIG. 7C provides additional detail in the form of a functional block diagram. A preferred method of fast zero detection flag generation is described as follows.

Assume that k is a vector of n elements where $k=<k(N-1)\ldots k(0)>$ and that k is the result of the addition of two other vectors a and b. Two new vectors v and w may be generated to aid in the detection of $k=a+b$ which are:

$$v(i)=(p(i)\wedge\overline{k(i)})\vee g(i)$$

$$w(i)=(p(i+1)\oplus k(1+i)$$

Vector v(I) and w(I) are used to generate a third vector z:

$$z(i)=v(i-1)\oplus w(i-1)$$

Which is bitwise added to get the result flag z.

An alternative and faster method of generating a propagate function is to use (at block 707) the alternative algorithm.

$$p2(i)=a(i)\vee b(i)$$

Normally an OR NOR gate in 1.5 to 3 times faster than a XOR gate. By using this equation (block 707) the addition itself will also get faster. This new term p2 is related to the p(I) as follows:

$$p(i)=p2(i)\wedge\overline{g(i)}$$

Vector v becomes:

$$v(i)=(p2(i)\wedge\overline{g(i)}\wedge\overline{k(i)})\vee g(i)$$

Vector w becomes:

$$w(i)=(\overline{g(1+i)}\wedge p2(i+1)\oplus k(1+i)$$

If a detection for all bits of vector k is zero, then two new vectors vz and wz are generated (block 708):

$$vz(i)=p2(i)\vee g(i)=p2(i)$$

$$wz(i)=(\overline{g(1+i)}\wedge p2(i+1))$$

Alternatively for all of the bits of vector k being one, we generate two new vectors vo and wo:

$$vo(i)=g(i)$$

$$wo(i)=(\overline{g(1+i)\wedge p2(i+1)})$$

Note that our two terms vz and vo are simply p2 and g and that wo are wz are complements of each other. This further simplifies the implementation since these signals can be used to generate signals which can be used to detect zero results and saturation control MAC units 701. Suppose that we have three 24 bit signed numbers x and y and z and we want to support the following functions:

1.) r=xy+acc—saturate to 48 bits detect 48 bit zero.
2.) r=x*y+acc—saturate to 24 bits detect 24 bit zero This may be done by noting that a 24 by 24 bit multiply followed by a 48 bit add may produce a result larger than 48 bits. If we desire both long and short precision outputs, results which do not need to be saturated are as follows:

| results | sign | sign extension |
|---|---|---|
| 48 bit MAC result | 48th bit = 1 | bits past 48th all ones |
| 48 bit MAC result | 48th bit = 0 | bits past 48th all zero |
| 24 bit MAC result | 24th bit = 1 | 24th through 48th all ones |
| 24 bit MAC result | 24th bit = 0 | 24th through 48th all zero |

The zero detect functions are:

| result desired | sign extension |
|---|---|
| 48 bit MAC zero | lower 24 are zero and 24th bit and upper 24 are zero |
| 24 bit MAC zero | lower 24 are zero |

Note that the first entry in the above table contains a redundancy, i.e., the 24th bit is counted twice. This allows the same function to be used for both zero detection and saturation control.

Figure 10:
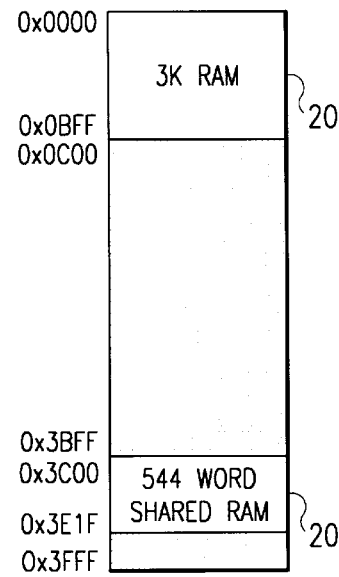
FIG. 10 is a diagram of the data memory space available to DSPA of FIG. 2.

FIG. 7C illustrates the process described above, FIG. 10 is a diagram of the data memory space available to DSPA 200a, which includes 3 Kilobytes of data RAM 203a and the 544 word (24-bits per word) memory space of shared data RAM 204. For DSPA, addresses 0x0C00-0x3BFF and 0x3E20-0x3FFF are not implemented.

Figure 11:
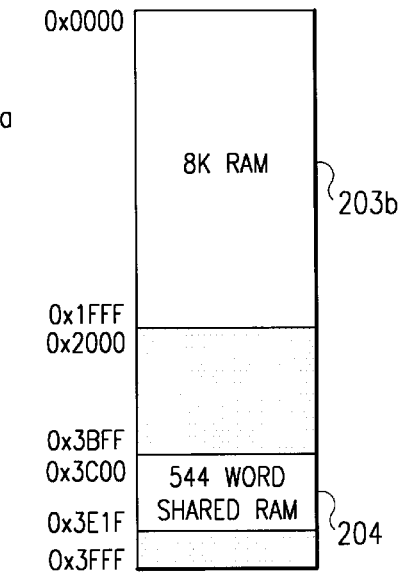
FIG. 11 is a diagram of the memory space available to DSPB of FIG. 2.

FIG. 11 is a diagram of the memory space available to DSPB 200b, which includes 8K of data RAM 203b and the 544 word memory space of shared data RAM 204. For DSPB, addresses 0x2000-0x3BFF and 0x3E20-0x3FFF are reserved.

Figure 12:
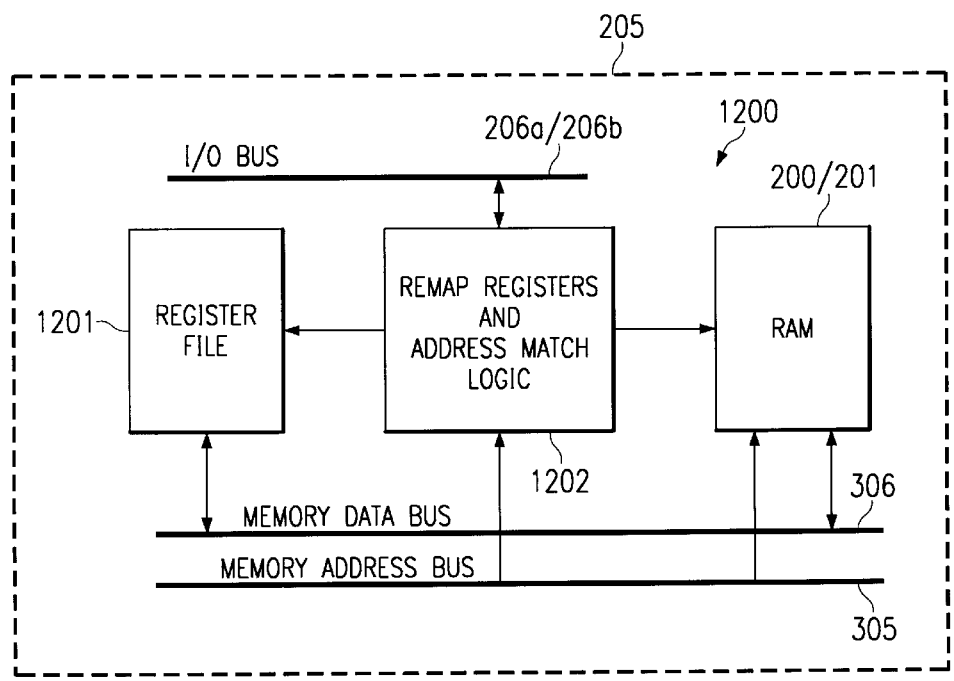
FIG. 12 is a diagram of a selected RAM repair units the RAM repair block shown in FIG. 13.

Due to the large amount of RAM included in device 200, a RAM repair unit 205 has been provided to improve manufacturing yields. A functional block diagram of a selected RAM repair units 1200 within RAM repair units block 205 is shown in FIG. 12. RAM repair unit 1200 includes a register file 1201 and remap registers and address match logic 1202. Each memory block (DSPA program memory 201a/202a, for example) has an associated register file as auxiliary memory that can be mapped to addresses within the memory block. Upon reset, the boot software can be instructed by the host to verify the repair registers, execute a memory test, and remap bad memory locations to register file 1201 locations.

Each location in register file 1201 has an associated remap register in circuit block 1201. The remap registers appear as a 'peripheral' to DSPs 200 and are accessed via the I/O buses 206. When a defective RAM location is identified, the corresponding address is written to an available remap register that is then enabled. Once enabled, the remap register monitors the memory address bus for addresses accessing the defective location. All future accesses to the defective location are redirected to the local register file instead of the main RAM block.

There are four repair circuits 1200 within block 205, one for each of the main memory buses 405 and 406, and I/O buses 206a and 206b. Each repair circuitry 1200 is statistically sized to provide enough extra remap locations to repair a high percentage of point failures anticipated for the RAMs.

For the DSPA program memory 201a, DSPA data memory 203a, and DSPB program memory 201b, there are eight memory remapping locations in the associated register file 1201. In the case of DSPB data memory 203b, there are sixteen memory remapping locations in the associated register file 1201. Data memory remap registers have a 14-bit address field covering the entire data memory range and program memory remap registers have a 12-bit address field to cover the lower 4K of program RAM. The remap registers are not initialized by hardware or software reset, and therefore require software initialization at startup.

Repair circuits 1200 are mapped to pages 4–5 of the I/O map for each DSP 200, with each DSP 200 can only access remap registers for its own memories. Each remap register controls one remap channel, and all remap channels are identical except for address width. An example remap register is described in TABLE 14.

TABLE 14

RAM Remap Register Bits

| Field | Bits | Description |
|---|---|---|
| EN | 23 | Remap enable. Enables the address comparator and register file location associated with this remap register. |
|  | 22:14/ 22:12 | Always read zero. |
| ADDR | 13:0/ 11:0 | Address of RAM location to be replaced. (Data Mem/ Program Mem). |

Program remap memory is assigned to the DSP I/O memory page 4 which includes I/O address 0x10 through 0x1F. Table 15 described this mapping in further detail.

TABLE 15

Program Memory Remap Page: Page 4 I/O Address 0x10 through 0x1F

| Register | Address | Description |
|---|---|---|
| PMAP0 | 0x10 | Program memory remap register 0 |
| PMAP1 | 0x11 | Program memory remap register 1 |
| PMAP2 | 0x12 | Program memory remap register 2 |
| PMAP3 | 0x13 | Program memory remap register 3 |
| PMAP4 | 0x14 | Program memory remap register 4 |
| PMAP5 | 0x15 | Program memory remap register 5 |
| PMAP6 | 0x16 | Program memory remap register 6 |
| PMAP7 | 0x17 | Program memory remap register 7 |
|  | 0x18 |  |
|  | 0x19 |  |
|  | 0x1A |  |
|  | 0x1B |  |
|  | 0x1C |  |
|  | 0x1D |  |
|  | 0x1E |  |
|  | 0x1F |  |

Shared memory block 204 provides a high-bandwidth communication channel between the two DSP cores 200. To each DSP core 200a or 200b, shared memory 204 operates like conventional RAM. However, shared memory 204 occupies the same logical addresses in each DSP address space. Control of data memory access is left to the software; there are no provisions in hardware to indicate or prevent access collisions.

In the event of an access collision, the hardware responds as follows:

(i) if both cores 200 are attempting to read shared memory 204 the same clock cycle, the address from DSPB is used for the memory access;

(ii) if both cores are attempting to read from shared memory 204, the data specified by the DSPB 200b generated address is read by both cores;

(iii) if both cores are attempting to write to shared memory 204 during the same clock cycle, the DSPB write operation is completed and the DSPA request is ignored.

The software protocol discussed below ensures that shared memory access collisions do not adversely affect the application running.

Each DSP core 200 supports a 32-word I/O space. The I/O space includes 3 page-indicator bits that are located in PAGE-A and PAGE-B registers in the IPC register block 302. Combined, these fields generate an 8-bit I/O register address.

To avoid context switch and control problems, the lower 16 addresses on all pages map to the same physical registers. Critical registers (such as IPC and Status registers) are mapped to these locations and are always accessible regardless of the page setting. The upper 16 addresses on each page are allocated to various input and output blocks.

Figure 13:
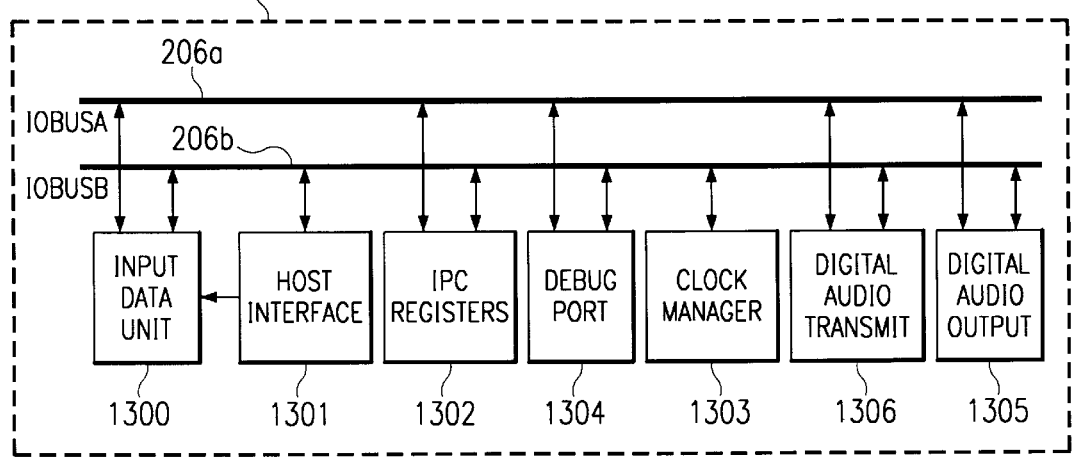
FIG. 13 is a diagram of the primary functional subblock of the I/O block of FIG. 1C.

FIG. 13 is a detailed functional block diagram of I/O block 102. Generally, I/O block 102 contains peripherals for data input, data output, communications, and control. Input Data Unit 1200 accepts either compressed analog data or digital audio in any one of several input formats (from either the CDI or DAI ports). Serial/parallel host interface 1301 allows an external controller to communicate with decoder 100 through the HOST port. Data received at the host interface port 1301 can also be routed to input data unit 1300.

IPC (Inter-processor Communication) registers 1302 support a control-messaging protocol for communication between processing cores 200 over a relatively low-bandwidth communication channel. High-bandwidth data can be passed between cores 200 via shared memory 204 in processor block 101.

Clock manager 1303 is a programmable PLL/clock synthesizer that generates common audio clock rates from any selected one of a number of common input clock rates through the CLKIN port. Clock manager 1303 includes an STC counter which generates time stamp information used by processor block 101 for managing playback and synchronization tasks. Clock manager 1303 also includes a programmable timer to generate periodic interrupts to processor block 101.

Debug circuitry 1304 is provided to assist in applications development and system debug using an external DEBUGGER and the DEBUG port, as well as providing a mechanism to monitor system functions during device operation.

A Digital Audio Output port 1305 provides multichannel digital audio output in selected standard digital audio formats. A Digital Audio Transmitter 1306 provides digital audio output in formats compatible with S/PDIF or AES/EBU.

In general, I/O registers are visible on both I/O buses, allowing access by either DSPA (200a) or DSPB (200b). Any read or write conflicts are resolved by treating DSPB as the master and ignoring DSPA.

Figure 14:
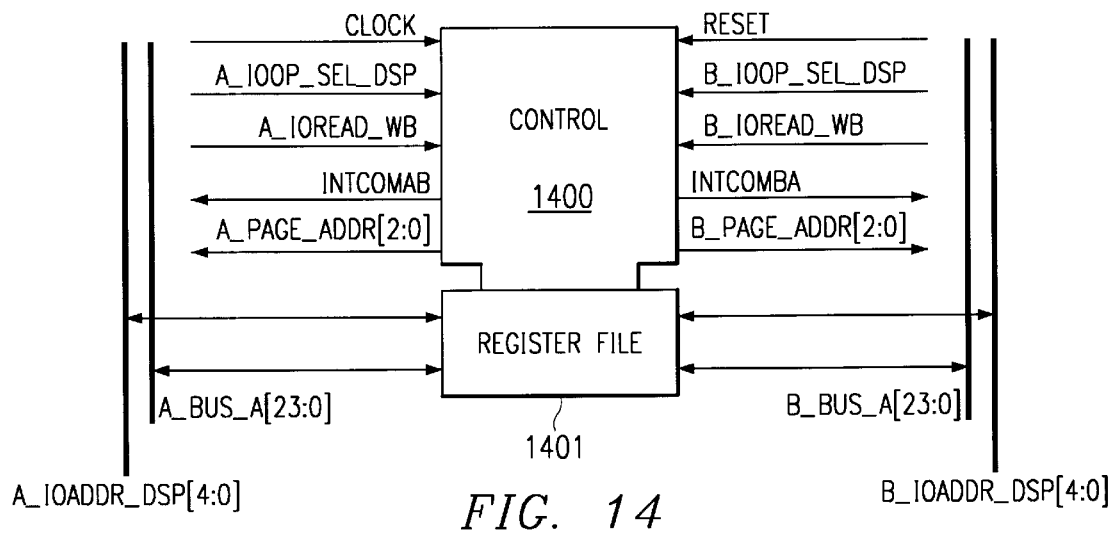
FIG. 14 is a functional block diagram of the interprocessor communication (IPC) block within the I/O block of FIG. 13.

FIG. 14 is a functional block diagram of the interprocessor communication block 1302 which includes control registers 1400 and a register file 1401. All of the IPC registers are available in all I/O pages, since they are mapped to I/O addresses 0x00 through 0x09. Therefore, DSP interprocessor communication is supported regardless of the I/O page setting.

Ten I/O mapped registers are available for interprocessor communication. There are two sets of registers, one for each processor 200. These registers are intended as a low bandwidth control and communication channel between the two DSP cores 200. In particular, command, command pending, and parameter registers are provided for use by the software to implement a communication protocol between processors 200. The command and parameter registers are 24-bits wide; the command pending registers are 8-bits wide. Interpretation of the register bit fields is also defined by software. Two of the registers (COM_BA and COM AB) generate hardware interrupts (intcomba and intcomab) in DSPA and DSPB respectively when written.

8-bit page registers are used to control the I/O page-mapping to the DSPs. The page allocation for these registers is provided in TABLE 16. Each DSP 200 supports 32 I/O addresses. The three least significant bits of PAGE_A and PAGE_B are used to generate the I/O page address for DSPA and DSPB respectively. This allows each DSP to access 8 pages of 32 registers. The upper 5 bits of the page registers are available to the software for signalling bits.

TABLE 16

PAGE ALLOCATIONS

| Addresses | Page 0 | Page 1 | Page 2 | Page 3 | Page 4 | Page 5 | Page 6 | Page 7 |
|---|---|---|---|---|---|---|---|---|
| 0x00–0x0F | Common Regs 406 | Common Regs 406 | Common Regs 406 | Common Regs 406 | Common Regs 406 | Common Regs 406 | Common Regs 406 | Common Regs 406 |
| 0x10–0x1F | Input Unit 300 | | Control | Output Unit 305 | Program Memory Remap | Data Memory Remap | | |

TABLE 17 generally described IPC Register Group 1, which can be written to by DSPA 200a and read by both DSPA 200a and DSPB 200b. This group includes three 24-bit registers for commands and parameters and one 8-bit I/O page register IPC register Group 2 is described in TABLE 18. This group can be written to by DSPB and read from by both DSPs 200. Similar to Group 1, Group 2 includes three 24-bit command and parameter registers and one 8-bit I/O page register.

Table 19 generally describes the Group 3 IPC Registers. This group consists of two 8-bit command registers. These registers can be written to and read by, either DSP 200. When write contention occurs, DSPB 200b given priority.

TABLE 17

IPC register group 1 - Written by
DSPA - read by both processors

| Name | No. Bits | Addr | Description |
|---|---|---|---|
| COM_AB | 24 | 0x00 | Command register message sent from DSPA to DSPB- When written generates an interrupt to DSPB |
| PAR_1_AB | 24 | 0x01 | Parameter 1 |
| PAR_2_AB | 24 | 0x02 | Parameter 2 |
| PAGE_A | 8 | 0x08 | Input output page register for DSPA I/O address - Three bits of page - 5 bits of semaphore |

TABLE 18

IPC register group 2 - Written by
DSPB - read by both processors

| Name | No. Bits | Addr | Description |
|---|---|---|---|
| COM_BA | 24 | 0x04 | Command register message sent from DSPA to DSPB - When written generates an interrupt to DSPA |
| PAR_1 BA | 24 | 0x05 | Parameter 1 |
| PAR_2_BA | 24 | 0x06 | Parameter 2 |
| PAGE_B | 8 | 0x09 | Input output page register for DSPB I/O address - Three bits of page - 5 bits of semaphore |

TABLE 19

IPC register group 3 - Written by
DSPB or DSPA - read by both processors (DSPB
wins write contentions)

| Name | No. Bits | Addr | Description |
|---|---|---|---|
| COM_P_AB | 8 | 0x03 | Command (from DSPA) pending register |
| COM_P_BA | 8 | 0x07 | Command (from DSPB) pending register |

Clock manager 1303 can be generally described as programmable PLL clock synthesizer that takes a selected input reference clock and produces all the internal clocks required to run DSPs 200 and audio peripherals.

Control of clock manager 1303 is effectuated through a clock manager control register (cmctl), described in TABLE 20. The reference clock can be selectively provided from an external oscillator, or recovered from selected input peripherals. The clock manager also includes a 33-bit STC counter, and a programmable timer which support playback synchronization and software task scheduling.

Figure 15A:
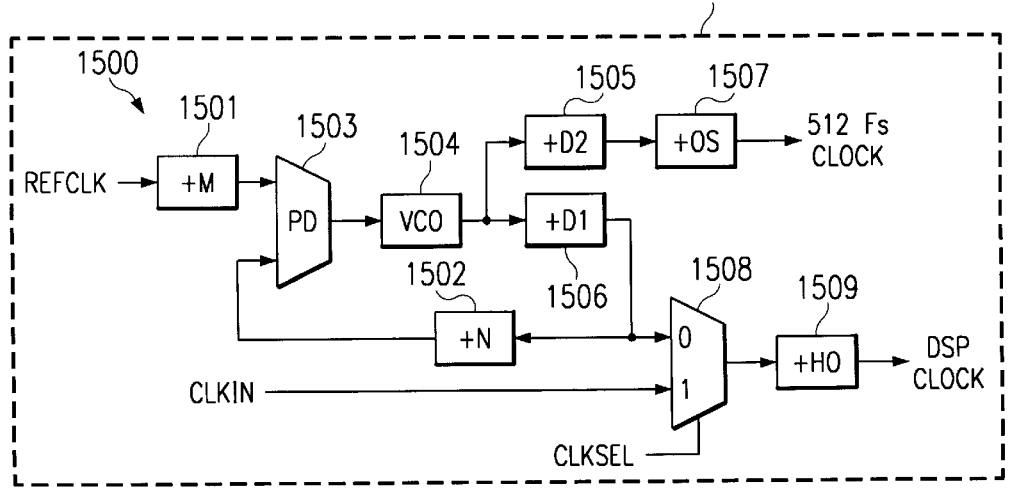
FIG. 15A is a diagram of the phased-locked loop circuitry (PLL) of clock manager of FIG. 13.

The phased-locked loop circuitry (PLL) of clock manager 1303 is shown in FIG. 15, generally at 1500. PLL includes input divider 1501, a divider 1502 in the feedback loop, phase-frequency detector 1503, voltage controlled oscillator (VCO) 1504, dividers 1505, 1506 and 1507 at the output of VCO 1504, an output multiplexer 1508 and output divider 1509. PLL 1500 is configured to produce the appropriate master clock for the desired sample rate. All other internal clocks required for the DSP and the peripherals are derived from this root clock.

PLL 1500 generates the master clock by locking a reference clock (REFCLK) to a divided down version of the master clock (CLKIN). Typically, the reference clock is input from the CLKIN pin, but other possibilities are the recovered clock from the S/PDIF input or the sample clock from input unit 1200. The reference clock source is selected by the REFCLK field in a clock manager control register (CMCTL) and divided by an 11-bit M value by divider 1501. The output of divider 1501 is input to the phase-frequency detector 1503. The other input to the phase-frequency detector is the divided version of the master clock. The output of the phase-frequency detector controls the output frequency of the VCO 1504.

TABLE 20

Clock Manager Control Register
(CMCTL) Page 2 Address 0x19

| Name | Bits | Description |
|---|---|---|
| /LOCK | 23 | PLL lock indicator. Low when PLL is locked. |
| /VBLOCK | 22 | VCO Bias lock indicator. Transitions low when the VCO bias current calibration sequence has been completed |
| HILO | 21 | Frequency indicator flag for VCO bias calibration. When: 0: VCO frequency liess than reference frequency 1: VCO frequency greater than reference frequency. |
| | 20:17 | Reserved. |
| VCOB | 16:11 | VCO Bias value. Controls bias current to the VCO |
| TCM | 10 | Test mode. Drives D1 and D2 1505, 1506 dividers with DSP clock instead of VCO output. Allows controlled test visibility for all dividers. |
| LDS | 9 | Lock detector sensitivity. When set, this bit uses a wider range to determine if PLL is in lock. |
| LKIEN | 8 | PLL lock interrupt enable. When set a rising edge of /LOCK generates an interrupt to the DSP. |
| BLEN | 7 | Bias lock enable. When set, enables the VCO bias calibration sequence. |
| VCOC | 6:3 | Loop filter capacitor value. |
| VCOEN: | 2 | VCO Enable. When clear, the VCO tuning voltage is set to its nominal value and the, VCO is enabled to track tuning voltage changes. |
| REFCLK | 1:0 | Reference clock source selector: 00: reference clock = CLKIN 01: reference clock = recovered S/PDIF clock 10: reference clock = SCLKN 11: reference clock =– CMPCLK |

TABLES 21 and 22 describe the Clock Manager divider registers 1 and 2, respectively assigned to DSP pages 2 at addresses 0x1A and 0x1B. These registers are used to set the divider circuits of PLL 1500.

TABLE 21

Clock Manager Divider Register 1 (CMDIV1) Page 2 Address 0x1A

| Name | Bits | Description |
| --- | --- | --- |
| RDSW | 23 | Read switch. When cleared, reading M, N, or OS values provides values written to modulo register. When set, reading M, N, or OS gives actual counter value for test visibility. |
| M | 22:12 | 11-bit value for divide-by-M counter. Cleared by reset. |
| N | 11:0 | 12-bit value for divide-by-N counter. Cleared by reset. |

TABLE 22

Clock Manager Divider Register 2(CMDIV2) Page 2 Address 0x1B

| Name | Bits | Description |
| --- | --- | --- |
|  | 23:11 | Reserved |
| D1 | 10:9 | D1 divider value, where:<br>11: divide-by-3<br>00: divide-by-4 (default value on reset)<br>01: divide-by-5<br>10: divide-by-6 |
| D2 | 8:7 | D2 divider value, where:<br>00: divide-by-1<br>01: divide-by-2<br>10: divide-by-3<br>11: divide-by-4 |
| OS | 6:2 | 5-bit value for divide-by-OS counter. Set to 1 (divide-by-2) on reset. Zero is invalid value for this field. |
| HO | 1:0 | Hold-off divider, where:<br>00: divide-by-1<br>01: divide-by-2<br>10: divide-by-3 (default value on reset)<br>11: divide-by-4 |

The output frequency range of VCO 1504 is 150 MHz to 270 MHz across process and temperature. VCO 1504 is controlled by the VCOEN and VCOB fields in the clock manager control register. These two control fields are used together when configuring and locking the PLL. Clearing the VCOEN bit fixes the VCO control voltage to its nominal value and causes the VCO to output its nominal clock frequency (approximately 200 MHz). When the VCOEN bit is cleared, the phase-frequency detector 1504 output has no effect on the VCO output frequency. The VCOB field is a six-bit value that controls the bias current to VCO 1504. The VCOB value can be adjusted to control the nominal frequency of VCO 1504. Upon reset, VCOEN is cleared, and the D1 and HO dividers (1506 and 1509 respectively) are set to their default values of ÷4 and ÷3, respectively, giving an open-loop DSP clock of 12.5 MHz to 22.5 MHz.

The PLL's internal VCO requires a filter capacitor to be connected to the FLT1 and FLT2 pins (discussed below). The typical value of the filter capacitor is 0.22 uf, which is sufficient for all allowable reference input frequencies. To achieve the best analog performance the capacitor is placed as close as possible to the FLT pins and proper layout precautions taken to avoid noise coupling onto the FLT pins.

The master clock output from VCO 1503 is divided down to generate the DSP clock, the 512 Fs clock, and the feedback clock to the phase-frequency detector controlling the VCO. Specifically, the master clock is divided by the D1 value by divider 1506 to generate the DSP clock, which is typically 50 MHz. The master clock is also divided by the D2 and OS values (respectively by dividers 1505 and 1507) to generate the 512 Fs Clock, which is used to synchronize the audio input and output blocks and is typically in the range of 8 MHz to 24 MHz. The DSP output from divider 1506 clock is further divided by the 12-bit N value in divider 1502 to generate the feedback clock for the PLL. The feedback clock range at the phase-frequency detector is extremely large, but in general will always be above 14 KHz.

Because of the wide range of feedback clock values and the bandwidth of the loop, there is an additional field that controls the on-chip loop filter components. The 4-bit VCOC field allows setting the optimum on-chip filter capacitance for the loop filter given the phase detector frequency. The proper VCOC value is determined by the effective feedback divider, which is calculated by multiplying the Di and N values. The preferred VCOC settings are provided in TABLE 23:

| D1 * N Value | VCOC |
| --- | --- |
| Less than 2,500 | 0000 |
| 2,500–5,000 | 1000 |
| 5,000–7,500 | 1100 |
| 7,500–10,000 | 1110 |
| Greater than 10,000 | 1111 |

The HO field also affects the DSP clock rate by inserting an additional divider to slow down the DSP clock during PLL configuration. This prevents the DSP clock from exceeding the maximum rated speed while the PLL is locking. Once locked, the HO field can be cleared, allowing the DSP clock to run at full speed.

The PLL can be bypassed completely by tying the CLKSEL pin high. This muxes the CLKIN input pin directly in as the DSP clock.

The TCM bit in the CMCTL register enables the clock manager test mode. This mode drives the D1 and D2 (1505 and 1506) dividers with the DSP clock instead of the VCO output. This gives controlled test visibility of the divider chains. Also, the DSP clock can be directed to the MCLK pin for test and debug of the PLL. Control for this feature is included in the Digital Audio Output section along with other MCLK pin configuration control.

Figure 15B:
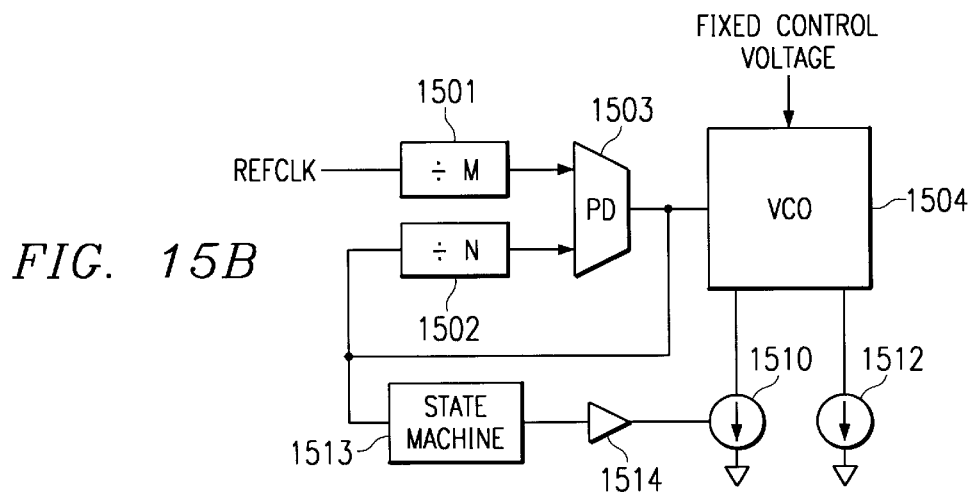
FIG. 15B generally depicts the circuitry used for VCO bias calibration.

In order to reduce VCO gain tolerances, a VCO bias current calibration circuit is included to compensate for process variations in the bias circuitry. The bias calibration is automatic, but can also be controlled manually if necessary. FIG. 15B generally depicts the circuitry used for VCO bias calibration, including a tuning current source 1510, bias current source 1512, state machine 1513 and D/A converter 1514.

The VCO calibration is enabled by writing a one to the bias lock enable bit (BLEN) after configuring the PLL registers for a given sample rate and reference clock. In particular, the PLL is configured such that the inputs to Phase Detector are equal. A fixed control voltage is applied to VCO and on a rising edge of BLEN, the calibration sequence is initiated. The VCOB field is reset to 0x20 (the middle of its range) and state machine 1513 adjusts the tuning bias current source 1513 searching for the optimum VCO bias value. Specifically, the optimum bias value is determined by optimizing the VCO output frequency for the output frequency selected in register for the fixed control voltage. Upon completion, the VCO bias lock (VBLOCK) flag is cleared, signifying that the bias value is "locked".

Alternatively, the VCO bias calibration can be performed under software control if the BLEN bit is cleared. The DSP can write values to the VCOB field and monitor the HILO flag after a N*32 DSP clock delay to determine if the VCO output frequency is higher or lower than desired. The delay is required to give a sufficient number of clocks at the phase-frequency detector to determine the relationship between the reference and feedback clocks.

Phase-frequency detector 1503 and an additional frequency comparator (not shown) are utilized to continuously monitor the PLL. When the PLL is locked, the LOCK flag will go low. If the PLL loses lock, the LOCK flag will be set. A low to high transition of the LOCK flag will cause an interrupt if the lock interrupt enable bit (LKIEN) is set.

The LDS bit in the CMCTL register controls the lock detector sensitivity. When set, the LDS bit relaxes the conditions used to determine whether the PLL is in lock. This can reduce lock time and sensitivity to noise, but could increase the risk of a false lock and allow more variation in the VCO output clock frequency. In general, the LDS bit should remain cleared for normal operation.

A preferred PLL configuration and lock procedure is as follows:

(1) write the desired divide ratio to the HO field, slowing the DSP clock;

(2) clear the VCOEN and BLEN bits to set the VCO to its nominal frequency and reset the VCO bias calibration circuit; configure the N, M, D1, D2, OS, and VCOC values as necessary for the desired sample rate and DSP frequency;

(3) if bias calibration is to be done automatically, set the BLEN bit to start the VCO bias calibration;

(4) wait for the VBLOCK flag to go low, indicating that the VCO bias has been set appropriately and set the VCOEN bit to enable PLL; alternatively, if bias calibration is to be performed under software control, leave the BLEN bit cleared, perform a software search for the optimum VCOB value by writing a VCOB value, waiting for an appropriate delay (N*32 DSP clocks), reading the HILO flag, and updating the VCOB value. Once the best VCOB value is found, set the VCOEN bit to enable the PLL; and (5) one the VCOEN bit is set, wait for the LOCK flag to go low, indicating that the PLL is locked and stable, and then clear the HO field to restore the DSP clock to the desired frequency.

Figure 16:
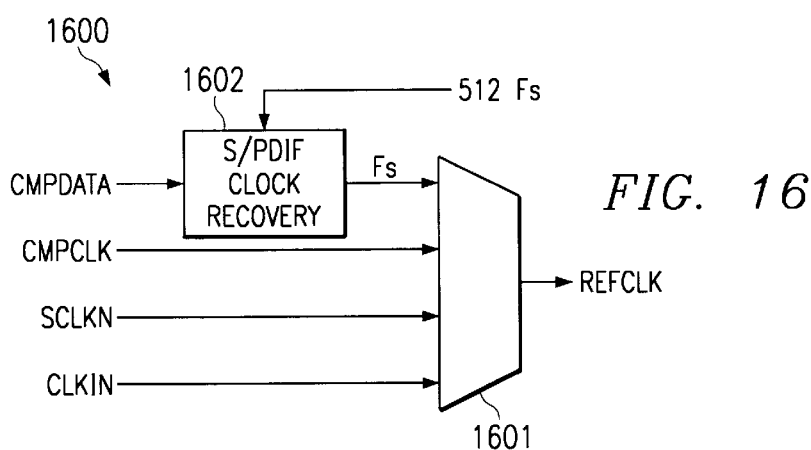
FIG. 16 is a block diagram of the reference clock sources controls.

FIG. 16 is a block diagram of the reference clock sources controls 1600. The PLL reference clock (REFCLK) has four possible sources that are routed through a multiplexer 1601 controlled by the REFCLK field in the CMCTL register. The default mode selects the CLKIN input pin as the reference clock. In the S/PDIF receive mode, the CMPDATA pin is routed to a S/PDIF clock recovery unit 1602 which uses the 512 Fs clock to extract the embedded Fs clock from the S/PDIF data stream. Note that the S/PDIF sample rate must be known in advance to configure the PLL correctly for clock recovery. In the I²S receive mode, the shift clock from the compressed data port (CMPCLK) or the digital audio input port (SCLKN) may be used as the reference clock. This allows the PLL to lock to an incoming fixed rate bitstream.

The following table shows the preferred register settings and resulting clock rates for selected supported reference clock frequencies and sample rates, including settings for the maximum DSP rates. Although not shown, other combinations of register values can be used to generate other VCO and DSP frequencies.

Figure 17:
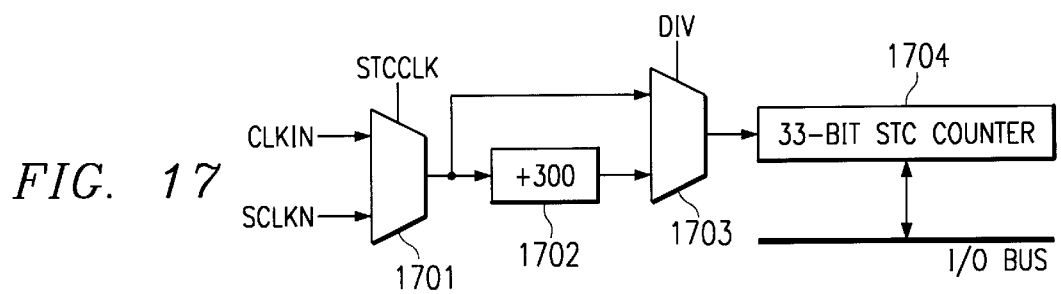
FIG. 17 is a diagram of STC counter circuitry.

FIG. 17 is a functional block diagram of STC counter circuitry 1700, which includes an input clock multiplexer 1701, divider 1702, multiplexer 1703 and STC counter 1704. STC counter 1704 is a free-running 33-bit counter that can be used to support synchronization of audio and video. The counter is loadable, but can only be accessed by DSPB 200b.

This counter is targeted to operate with a 90 KHz clock. The 90 kHz clock may be derived from a 27 MHz master clock provided at CLKIN (if available), or the counter may driven directly by CLKIN input. Alternatively, SCLKN may be substituted for the CLKIN pin by setting the STCCLK bit in the TCTL register. The selection of the counter clock is made via multiplexer 1703 the DIV bit in the timer control register (TCTL). When set, the DIV bit divides the clock at CLKIN by 300 and provides the divided clock to 33-bit-counter. The timer control register is described in TABLE 24.

TABLE 24

Timer/Counter Control Register (TCTL) Page 2 Address 0x1C

| Name | Bits | Description |
|---|---|---|
|  | 23:15 | Reserved |
| STCCLK | 14 | STC clock select.<br>0: CLKIN drives STC Couriter<br>1: SCLKN drives STC Counter |
| TIEN | 13 | Timer interrupt enable. When set, allows the programmable timer to generate interrupts to DSPB. Cleared on reset. |
| TIMEN | 12 | Timer enable. When high, the programmable timer is enabled. Cleared on reset. |
| STCEN | 11 | STC Counter Enable. When high, the 33-bit counter is enabled. Cleared on reset. |
| DIV | 10 | When set, CKLIN (SCLKN) is divided by 300 to generate clock for STC counter. When clear, CLKIN (SCLKN) drives to STC counter. |
| VALID | 9 | Read only status bit that is high when the 33-bit counter is guaranteed not to change state for at least the next two instruction cycles. |
| CNT9 | 8:0 | Contains the lower 9 bits of the 33-bit counter. This register should be written to before CNT24. |

TABLE 25

Count 24 (CNT24) Page Address 20x1D

| Name | Bits | Description |
|---|---|---|
| CNT24 | 23:0 | Contains the upper 34 bits of the 33-bit counter value. This register should always be written to after CNT9 field in TCTL. |

33-bit-counter 1704 is mapped to two I/O registers. The 24-bit count register (CNT24) (TABLE 25) contains the high order bits, and the CNT9 field of the timer control register (TCTL) contains the low order bits. The time control register is at DSP page 2 address 0x1C and the CNT24 register at page 2 address 0x1D. Since the external clock may not be exactly in phase with the internal DSP clock, the counter values may not be valid when the DSP reads the registers. When the VALID bit in the TCTL register is set, the counter value is stable and the internal timing guarantees that STC counter 1704 will not change state within the next two DSP instruction periods. STC counter 1704 is reset by writing values into the two counter registers CNT9 and CNT24. Preferably, the low-order 9-bit counter value followed by the high-order 24-bit counter value. The STCEN bit in register TCTL is used to enable the counter function. The STCEN bit value is initialized to zero after RESET.

Figure 18:
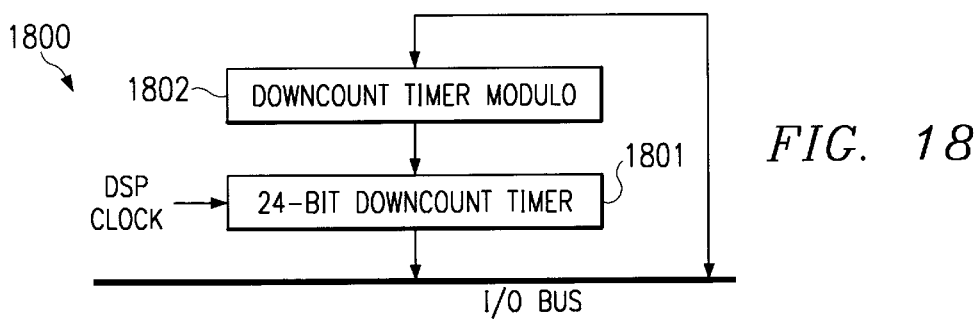
FIG. 18 is a diagram of the general purpose event timer.

FIG. 18 is a functional block diagram of a programmable timer 1800 which is provided as a general purpose event timer. The timer consists of a 16-bit downcourt timer 1801 and a downcounter timer modulo field 1802. The timer modulo register maintaining these two fields is described in TABLE 26.

TABLE 26

Timer/Counter Control Register
(TCTL) Page 2 Address 0x1C

| Name | Bits | Description |
|---|---|---|
|  | 23:15 | Reserved |
| STCCLK | 14 | STC clock select<br>0: CLKIN drives STC Counter<br>1: SCLKN drives STC Counter |
| TIEN | 13 | Timer interrupt enable. When set, allows the programmable timer to generate interrupts to DSPB. Cleared on reset. |
| TIMEN | 12 | Timer enable. When high, the programmable timer is enabled. Cleared on reset. |
| STCEN | 11 | STC Counter Enable. When high, the 33-bit counter is enabled. Cleared on reset. |
| DIV | 10 | When set, CLKIN(SCLKN) is divided by 300 to generate clock for STC counter. When clear, CLKIN (SCLKN) drives the STC counter. |
| VALID | 9 | Read only status bit that is high when the 33-bit counter is guaranteed not to change state for at least the next two instructions cycles. |
| CNT9 | 8:0 | Contains the lower 9 bits of the 33-bit counter. This register should be written to before CNT24. |

TABLE 27A

Timer Data Register
(TIMDAT) Page 2 Address 0x1E

| Name | Bits | Description |
|---|---|---|
| TIMDATA | 23:0 | Current timer value. Read-only. Read-only. |

TABLE 27B

Timer Modulo Register
(TIMMOD) Page 2 Address 0x1F

| Name | Bits | Description |
|---|---|---|
| TIMMOD | 23:0 | Timer modulo value. Zero is invalid value for normal timer operation. |

Figure 19:
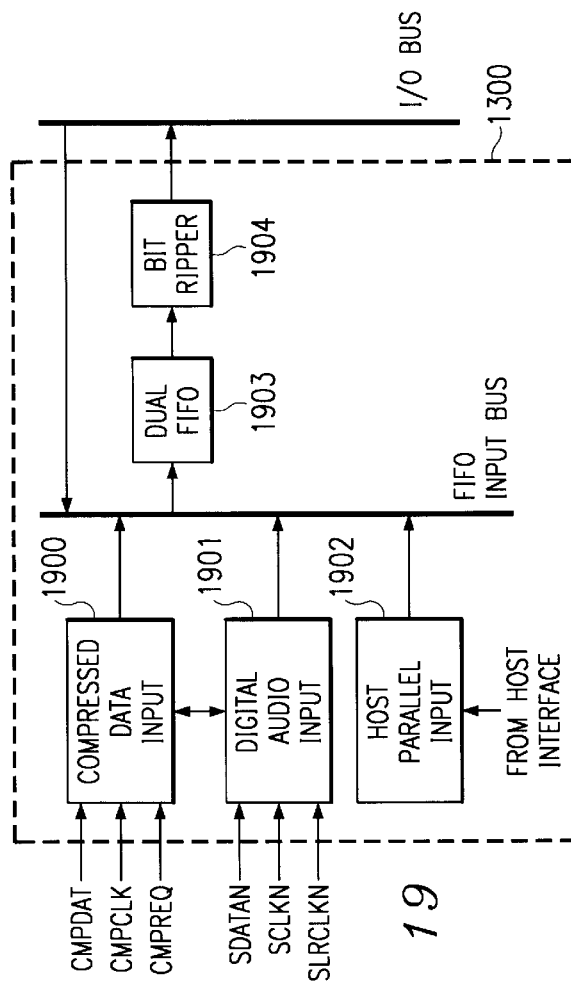
FIG. 19 is a detailed block diagram of the Input Data Unit of FIG. 13.
Figure 21:
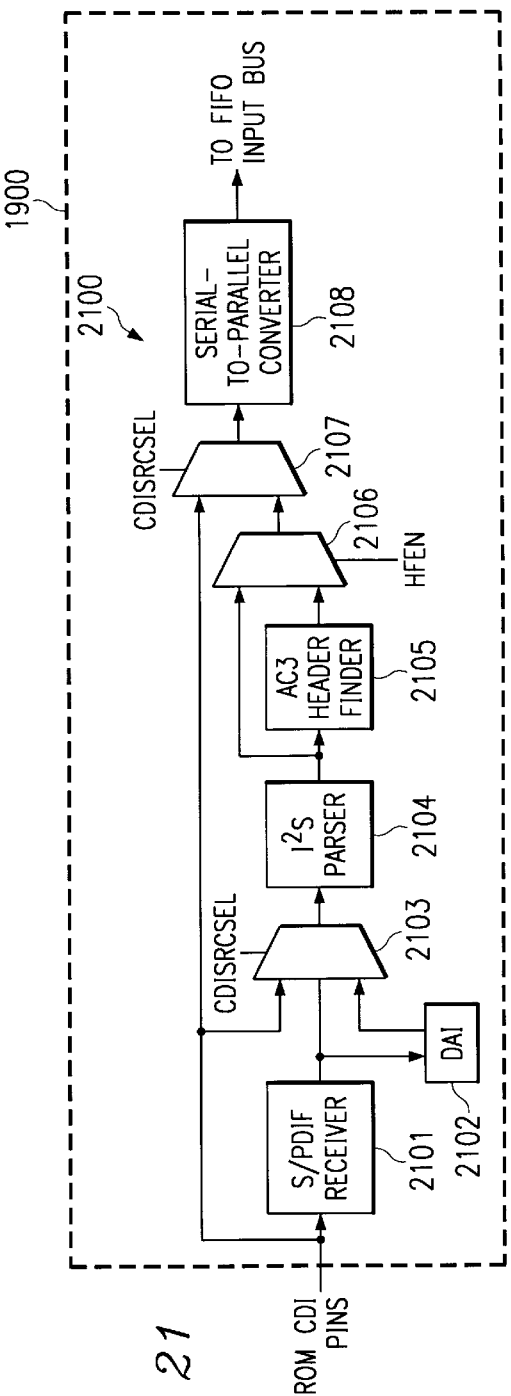
FIG. 21 is a diagram of the Compressed Data Input (CDI) port.

FIG. 19 is a more detailed block diagram of Input Data Unit 1200 (FIG. 13). Input Data Unit 1200 is made up of a compressed data input port (CDI) 1900, a digital audio input port (DAI) 1901, host parallel input 1902, a dual input FIFO 1903, and a bit-ripper 1904. The compressed data and digital audio inputs feed the input FIFO and support a variety of data input formats, including S/PDIF and I²S. Data can also be routed from host interface port 301 to the input FIFO via the host input port. The dual FIFO unit temporarily stores the data received from the input ports prior to its being processed by the DSPs. The input FIFO in turn feeds the bit-ripper block, which provides hardware assistance to the DSP cores in bit parsing routines. Control and configuration of Input Control Unit 1200 is effectuated through the registers described in TABLE 28.

Both DSPs 200a and 200b have access to Input Data Unit 1200. The I/O registers are allocated such that if both DSPs 200 attempt simultaneous I/O operations to FIFO 1903 or the input unit registers, DSPB 200b will complete its operation and DSPA 200a will be ignored. If only one DSP 200 accesses input unit 1200 at any one clock cycle, that DSP will get an I/O cycle. Software is assumed to allocate the input unit to only one of the two DSPs at any one time.

Dual FIFO 1903 may be loaded from any of the available sources, selected by the FBSRCSL and FCSRCSL bit fields of the Configuration, Control, and Reset register (CCR) (TABLE 28). However, only one source at a time may be selected to be input to a FIFO channel, and only one FIFO channel can be tied to any source at any one time.

TABLE 28

Connectivity Reset Control
Register (CCR) Page 0 Address 0x120

| Field | Bits | Description |
|---|---|---|
| CDISRCSEL | 23:22 | Selects data source & configuration for CDI port:<br>00: couples CDI pins directly to CDI serial-to-parallel converter 2108<br>01: couples S/PDIF receiver output to CDI port I²S parser 2104<br>10: couples CDI pins to CDI port I²S parser 2104<br>11: couples the DAI pins to CDI port I²S parser 2104. |
| BREVEN | 21 | Bit reverser enable. When set, enables bit reversing on bits 0–31 of each subframe received by S/PDIF data receiver. |
| HFEN | 20 | Header Finder enable. When set, enables header finder unit 2105 which detects AC3 header (F8724E1F) and bypasses null data without writing it to FIFO. |
| DREQPINEN | 19 | CMPREQ pin enable. When set, enables data request signal to be output to CMPREQ pin. |
| DRQEN | 18 | Data request enable bit. When set, this bit enables data request signal generation. |
| DREQPOL | 17 | Data request polarity. When set, the data request is active low. When cleared, the data request is active high. |
| DREQLEVSEL | 16 | Data request level select bit:<br>0: data request based on MF bit of selected FIFO<br>1: data request based on OV bit of selected FIFO |

TABLE 28-continued

Connectivity Reset Control
Register (CCR) Page 0 Address 0x120

| Field | Bits | Description |
|---|---|---|
| DREQFCSEL | 15 | Data request FIFO select. When set, data request is derived from FIFO C levels. When cleared, data request is derived from FIFO B levels. |
| DAISRCSEL | 14 | This bit selects the data source for DAI port:<br>0: couples DAI pins to DAI port I²S parser<br>1: couples S/PDIF receiver output to DAI port I²S parser |
| HBSWAP | 13 | This bit selects the byte order for host input ports:<br>0: MS byte first;<br>1: LS byte first. |
| H0OV | 12 | Sticky overflow flag for Host FIFO Input port 0, host address 0x2 |
| H0CLR | 11 | Clear for Host FIFO Input port 0 (re-starts byte counter) |
| H1OV | 10 | Sticky overflow flag for Host FIFO Input port 1, host address 0x3 |
| H1CLR | 9 | Clear for Host FIFO Input port 1 (re-starts byte counter) |
| CDIRST | 8 | Local reset for CDI port. |
| DAIRST | 7 | Local reset for DAI port |
| FIFORST | 6 | Local reset for the FIFO block. Clears both channels of input and output pointers; resets all FIFO control bits, configuration bits, and status flags. |
| FCSRCSEL | 5:3 | This bit selects the input data source for FIFO C 2603:<br>000: no source<br>001: DSP FIFO Input port, data written to FDATA by the DSP.<br>010: Host FIFO Input port 0<br>011: Host FIFO Input port 1<br>100: CDI FIFO Input port<br>101: DAI FIFO Input port |
| FBSRCSEL | 2:0 | This bit selects the input data source for FIFO B 2602<br>000: no source<br>001: DSP FIFO input port, data written to FDATA by the DSP.<br>010: Host FIFO Input port 0<br>011: Host FIFO Input port 1<br>100: CDI FIFO Input port<br>101: DAI FIFO Input port |

Figure 20:
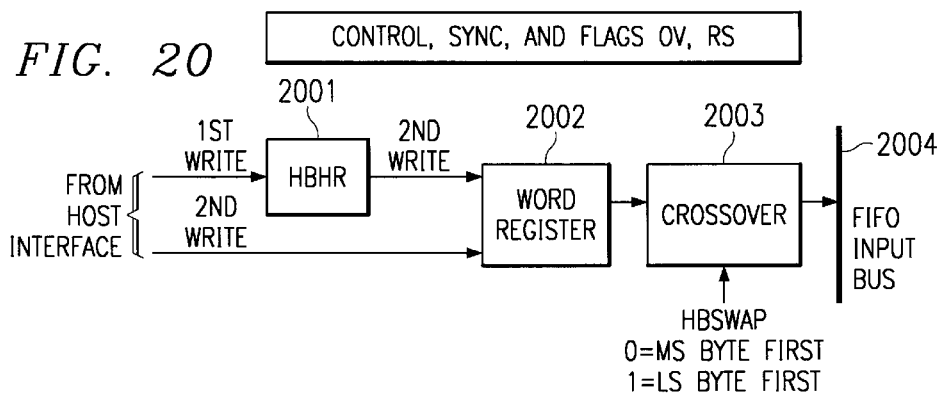
FIG. 20 is a diagram of one Host Parallel Input.

Host Parallel Inputs 1902 are located at address 0x2 and 0x3 of the Host Interface. These are identical data input ports, allowing an external device to write data directly into input FIFO 1903. Each port has a High Byte Holding register (HBHR) 2001, a 16-bit Word register (WR) 2002, an overrun bit (OV), a clear bit (CLR), crossover 2003 and synchronization logic. The OV and CLR bits for each are visible to the DSPs in the CCR register. A more detailed block diagram of one Host Parallel Input is provided as FIG. 20.

Each port 1902 receives data as a sequence of bytes. When the device 100 is reset, or when the given port's CLR bit is set (CLR=1), writing of FIFO 1903 by Host Parallel Input port 1902 is disabled. When the port's CLR bit is clear (CLR=0), writing of FIFO 1903 by Host Parallel Input 1902 port is enabled.

The first byte written to the given port 1902 by the host processor is written from the Host Interface 1301 into the HBHR 2001. The second write into the port by the host processor is written to the Word register (WR) 2002, along with a copy of the HBHR contents. This also initiates a write request in the synchronizer. In the next time-slot associated with writes to FIFO 1903 that is allocated to the given Host Input port 1902, the WR data is copied onto the FIFO Input Bus 2004 through selectable crossover 2003 and the write request in the synchronizer is cleared. The crossover places the first byte on the high half of FIFO Input Bus 2004 and the second byte on the low half of bus 2004 if HBSWAP=0 (MS byte first). If HBSWAP=1, the first byte is placed on the low half of bus 2004 and the second byte is placed onto the high half of bus 2004 (LS byte first).

Given that there is only one bus cycle allocated to writing each FIFO in every 4 clock cycles, the Host Input port 1902 can accept data no faster than once every 4 DSP clocks. Typically this cycle will be about 80 ns. Should the host processor attempt to write data at a higher rate, a host overflow will occur and the port's overflow bit (OV) will be set. This bit is sticky and will not clear until the processor is reset or one of the DSPs writes it with a zero.

Compressed Data Input (CDI) port 1900 can accept compressed data in several formats. CDI port 1900 consists of an S/PDIF receiver 2101 for decoding the Sony/Phillips Digital Interface Format, digital audio interface (DAI) 2102, an I²S Input parser 2104, AC-3 header finder 2105, serial-to-parallel converter 2108 to interface to the input FIFO, and multiplexer 2103, 2106, and 2107.

CDI port 1900 can accept data in the following formats: serial compressed data; serial data in I²S format; PCM data in I²S format; compressed data in S/PDIF format; or PCM data in S/PDIF format.

The CDISRCSEL field in the CCR register configures the compressed data port. For compressed data mode, the CDI pins are connected directly to serial-to-parallel converter 2108. To receive data in I²S formats, the CDI pins are coupled to the I²S Parser 2104. Alternatively, information from the DAI pins 2102 can be routed to the I²S Parser 2104. For S/PDIF format input, the CDI pins are connected to S/PDIF receiver 2101, whose output is then directed to I²S parser 2104 in either the CDI or DAI block. CDI port 2100 also includes AC-3 Header Finder block 2105, which strips out null characters in an AC-3 formatted stream to reduce the amount of data that must be stored in the input FIFO.

Figure 22:
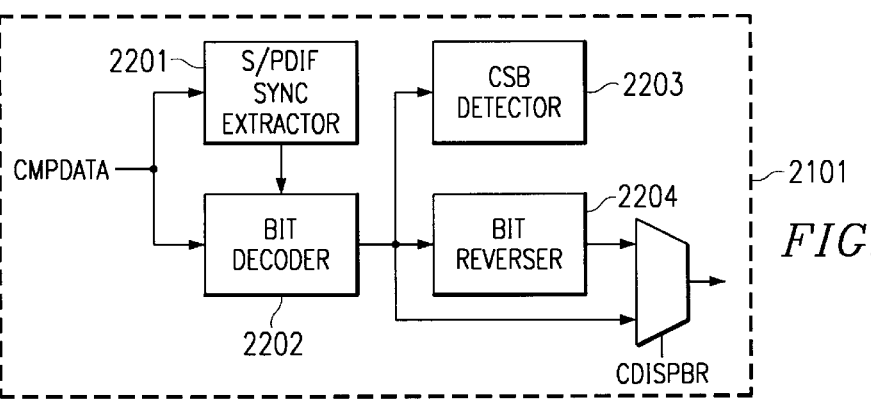
FIG. 22 is a detailed block diagram of S/PDIF data receiver.
Figure 23:
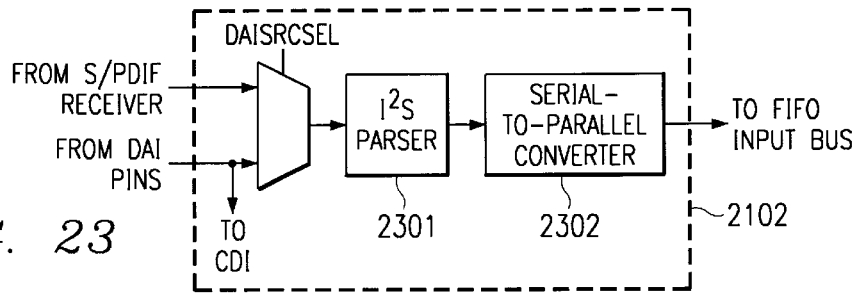
FIG. 23 is a diagram of the digital audio input (DAI) port.

S/PDIF receiver 2101 accepts a biphase encoded stream and extracts framed data to be passed on to the I²S parser. A more detailed block diagram of S/PDIF receiver 2101 is provided in FIG. 22. S/PDIF receiver 2101 includes a sync extractor 2201, a bit decoder 2202, a channel status block (CSB) detector 2203, and a bit reverser 2204.

Bit decoder 2202 recovers the encoded data, while sync extractor 2202 recovers the embedded clock of the S/PDIF input. S/PDIF receiver 2101 operates on 32-bit subframes, with a maximum of 24 bits of payload per subframe.

Bit reverser 2204, when enabled, reverses the bit order of the 32-bit subframe before passing the data to I²S parser 2104. This process inserts a one-subframe delay. The S/PDIF format incorporates a channel status bit in time slot 30 of each subframe. Channel status block detector 2203 monitors the S/PDIF data stream and captures 32 bits of a channel status block from successive S/PDIF subframes. The CSBSTRMSEL bit selects which frame to extract channel status block data from. The CSBBSEL field can be programmed to select time slot 28–31, allowing User, Validity, or Parity bits to be extracted instead. After 32 bits of channel status have been captured, the data is latched into registers CSBHI and CSBLO where they can be read by the DSP.

Channel status block detector 2303 sets the CSBINT bit after receiving each 32 bits of a channel status block and generates an interrupt to the DSP. The CSBINT bit is cleared when the CSBHI field is read from the CDICLK register. The CSBFST bit indicates whether the 32 bits received are the first 32 bits of a channel status block. Software is responsible for determining where subsequent 32-bit blocks fit in the 192-bit channel status block.

I²S parser 2104 accepts input data directly from the CDI or DAI pins, or recovered data from S/PDIF receiver 2101. The I²S parser can operate in slave mode (with clocks provided from an external source) or in master mode (with clocks derived from an internal 512 Fs clock from the clock manager). The CDIMCL bit is used to select the clock mode. In master clock mode, the CDIBCLKD field in the CDICTL register and the CDILRCLKD field in the CDICLK register control the rates of the CDI port serial bit clock and LR sample clock, respectively.

I²S parser 2104 employs a flexible data capture scheme based on the CDIBSTART and CDIBSTOP fields in the CDICTL register. The CDIBSTART and CDIBSTOP values indicate the first and last bits of the range to be captured from a subframe. Further, the CDIFRMSEL field controls whether to capture data from a particular subframe or from both subframes. The CDICLKPOL bit determines whether the shift clock (bit clock) is active on rising or falling edges.

The CDIMARKEN bit enables the subframe identifier injector block, which adds a 4-bit marker at the end of a captured data field. If LR clock is low, the code 0x9 is inserted in the data stream as it is sent to Serial-to-Parallel converter 2108. If LR clock is high, the code 0xA is inserted. These markers may be used by the software drivers to verify that data is aligned properly as it is read from FIFO 1903, since captured audio data may not align on 16-bit word boundaries.

A Dolby AC-3 stream embedded in an S/PDIF signal is comprised of a header, a block length indicator, and filler bits. Header Finder 2105 is provided to strip off most of the filler bits in the stream to reduce the amount of data sent to input FIFO 1903.

AC-3 Header Finder 2105 is enabled with the HFEN bit in the CCR register. When enabled, Header Finder 2105 delays data to the Serial-to-Parallel converter 2108 by 32 bit periods. Specifically, Header Finder 2105 scans the data stream searching for the 32-bit header constant 0xF8724E1F. Once the header is matched, Header Finder 2105 extracts the header and a 16-bit-data-block-length field. The data block length field is used to extract the payload bits from the stream. Since Serial-to-Parallel 2108 converter writes 16-bit words to FIFO 1903, an additional 16 bits of padding are added to the end of the payload to ensure that the full payload is flushed into the FIFO. The resulting record in FIFO 1903 includes the header constant, additional header information, the payload size, the payload data, and 16 filler bits.

Serial-to-Parallel 2108 converter accepts serial data from I²S Parser 2104 or Header Finder 2105 and converts it to 16-bit word. The 16-bit word is then synchronized to the DSP clock and written into input FIFO 1903 in the next available time slot. Serial-to-Parallel converter 2108 can be enabled and disabled with the CDI_EN bit in the CDICTL register.

Alternatively, Serial-to-Parallel converter 2108 can accept input data directly from the pins, and therefore also includes logic to generate requests and automatically control data flow into the FIFO. The bits to configure this function are located in the CCR register. The DRQEN bit enables the data request function, and the DRQPINEN bit enables the request logic to drive the CMPREQ pin. The DREQPOL bit determines if the request signal is active high or active low. The DREQFCSEL bit selects whether to use flags from FIFO B or FIFO C to generate requests, and the DREQLEVSEL bit selects either the MF or OV flag from the appropriate FIFO. After configuration, this compressed-data interface can be used to automatically assert the request line if the FIFO is not full, and de-assert the request line as the FIFO approaches a full condition.

Digital Audio Input port (DAI) 2102 is a simplified version of the CDI port 1900. The unit does not include an S/PDIF interface, although it can be coupled to receive data from the CDI port S/PDIF receiver. It also does not include the Header Finder and compressed data request logic.

I²S parser 2301 of DAI 2102 accepts input data directly from the DAI pins, or recovered data from S/PDIF receiver 2101. The data source is selected by the DAISRCSEL bit in the CCR. The I²S parser can operate in slave mode (with clocks provided from an external source) or in master mode (with clocks derived from an internal 512 Fs clock from the clock manager). The DAIMCL bit is used to select the clock mode. In master clock mode, the DAIBCLKD field in the DAICTL register controls the rate of the DAI port's serial bit clock. The LR sample clock is shared with CDI port 1900, and therefore its rate is determined by the LRCLKD field in the CDICLK register. Note that if both the CDI and DAI port for the I²S parsers are operating in master clock mode, the same sample rate is used.

I²S parser 2301 employs a flexible data capture scheme based on the DAIBSTART and DAIBSTOP fields in the DAICTL register. The DAIBSTART and DAIBSTOP values indicate the first and last bits of the range to be captured from a subframe. Further, the DAIFRMSEL field controls whether to capture data from a particular subframe or from both subframes. The DAICLKPOL bit determines whether the shift clock (bit clock) is active on rising or falling edges.

The DAIMARKEN bit enables the subframe identifier injector block, which adds a 4-bit marker at the end of a captured data field. If LR clock is low, the code 0x9 is inserted in the data stream as it is sent to the Serial-to-Parallel Converter. If LR clock is high, the code 0xA is inserted. These markers can be used by the software drivers to verify that data is properly aligned as it is read from the FIFO, since captured audio data may not align on 16-bit word boundaries.

Serial-to-Parallel converter 2302 accepts serial data from I²S parser 2301 and converts it to a 16-bit word. The 16-bit word is then synchronized to the DSP clock and written into input FIFO 1903 in the next available time slot. Serial-to-Parallel converter 2302 can be enabled and disabled with the DAIEN bit in the DAICTL register.

Figure 24:
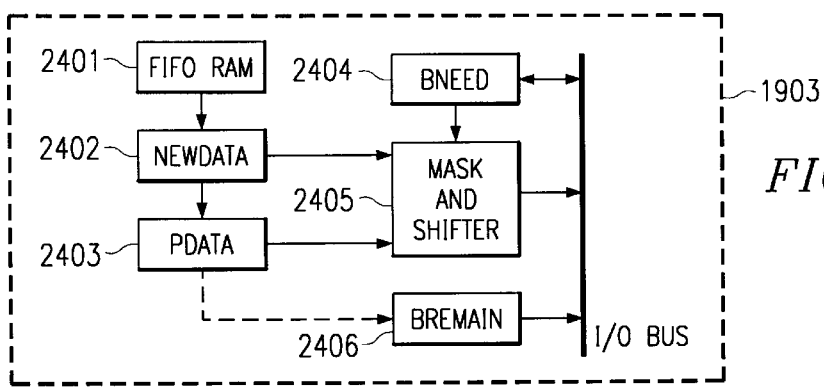
FIG. 24 is a block diagram of the Bit Ripper depicted in FIG. 19.

FIG. 24 is a block diagram of Bit Ripper 1904. The bit ripper allows the DSP to read a bit field from the FIFO RAM, where the bit field is right justified, of any width from 1 to 16 bits. This is useful in parsing Dolby AC-3, MPEG, or other serial bit streams composed of variable-width fields.

Bit Ripper 1903 includes a FIFO RAM 2401, NEWDATA register 2402, PDATA register 2403, BNEED 2404, Masker and shifter 2405, and BREMAIN register 2406.

Data from FIFO RAM 2401 feed the 16-bit NEWDATA register 2402, and then on into the PDATA (Previous Data) register 2043. The NEWDATA and PDATA registers form a data pipeline which feeds masker/shifter network 2405 that aligns and masks data read onto the I/O bus.

BREMAIN register 2406 holds a count of the bits remaining in PDATA register 2403, and is set to 16 when the first data word is copied from NEWDATA register 2402 to PDATA register 2403. In operation, the programmer sets BNEED register 2404 to the desired number of bits to be read to the I/O bus. If the value in BREMAIN register 2406 is greater than or equal to the value in BNEED register 2404, then data from PDATA register 2403 is shifted appropriately and read onto the I/O bus. If the value BREMAIN register 2406 is less than BNEED register 2403, the appropriate bits from the PDATA and NEWDATA registers are combined to produce the desired bit field on the I/O bus.

Figure 25:
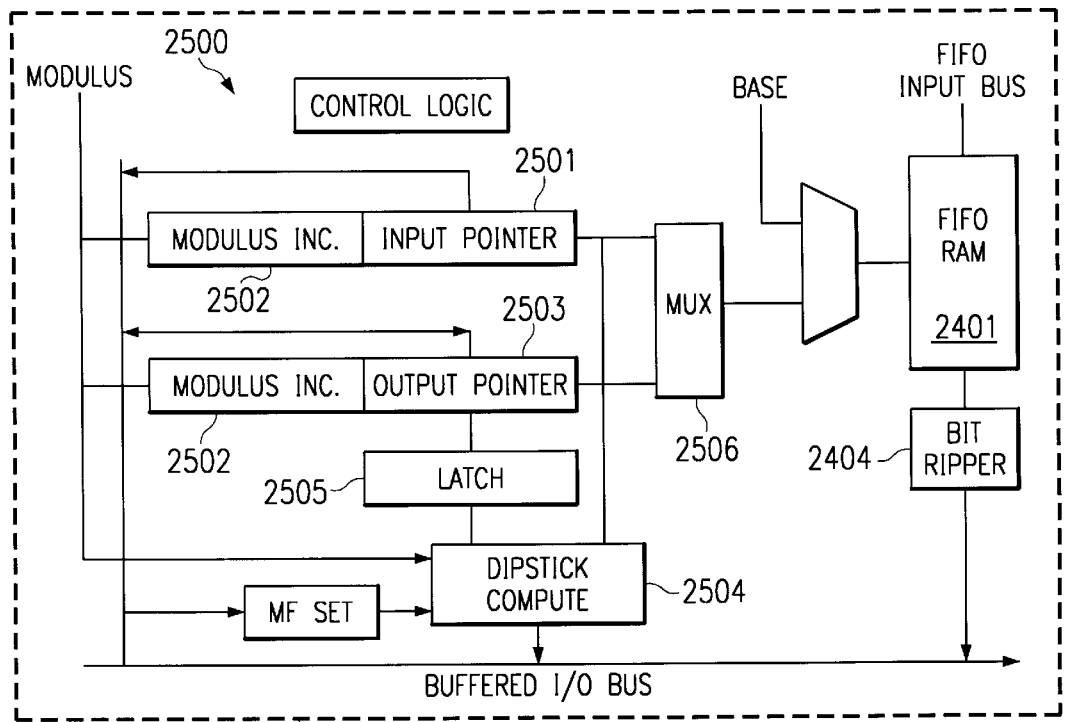
FIG. 25 is a detailed block diagram of a selected first-in-first-out (FIFO) of the dual FIFO unit shown in FIG. 19.

When data is read onto the I/O bus, the BREMAIN field is updated, and the PDATA and NEWDATA registers are updated as necessary. Note that while the BREMAIN and BNEED fields are 5-bits wide, only the values 0 through 16 are valid. FIG. 25 is a more detailed block diagram of a selected FIFO 2500 within dual FIFO unit 1903.

The DSP FIFO Input port accepts writes to I/O addresses, the same addresses used by the DSPs 200 for reading data from the FIFOs 1903. When data is written at this address, the low 16 bits of the 24-bit word are written into the selected FIFO. A one-instruction delay between writes is required.

Input FIFOs have a FIFO RAM 2401 of 4K by 16 bits, divided into two First-In First-Out buffers. FIFO RAM 2400 is read through Bit Ripper 1904, which positions bit fields on the I/O bus. Dual FIFO 1903 with Bit Ripper 1904 provides two channels of First-In, First-Out (FIFO) storage totaling 8K bytes. Data from each of the active Input Units 300 is written into a channel of FIFO 1903 for later processing by the DSPs 200. The two channels of FIFO, read through Bit Ripper 1904, allows DSPs 200 to read arbitrary length bit fields, from one to sixteen bits long.

Each input FIFO has a readable Input Pointer 2501. When data to be written to the corresponding FIFO is available on the FIFO Input Bus, the address from Input Pointer 2501 is added to a base address of the corresponding FIFO in the common FIFO RAM 2401, to form an address in the RAM 2401 where the word is written. The Input Pointer is then incremented modulo a Modulus register 2502 that represents the size of the FIFO.

Multiplexer 2506 selects between the input and output pointers. When data is read from the FIFO 2401, it is read through bit ripper 2404 as described above. The value in Output Pointer 2503 is added to, and thus is relative to, the same Base as used with the Input Pointer of the FIFO. The value in Output Pointer 2503 is advanced, modulo the same Modulus in register 2502 as for the Input Pointer, as needed when words are read into the NEWDATA register of bit ripper 1903. While the funnel shifters and BNEED register of bit ripper 1903 are common to both FIFOs, there are separate PDATA, NEWDATA, State, and BRemaining registers for each FIFO. It is therefore possible to switch between reading the FIFO channels without having to reinitialize the data pipeline in the FIFO's Bit Ripper.

Input Pointer 2502 is readable and Output Pointer 2503 is both readable and writable. It is therefore possible to clear data from the FIFO by reading the input pointer and writing its contents to the output pointer. Output Pointer value enters dipstick logic 2504 through a latch 2505, which may either retain data or be transparent. Latch 2505 is under control of the OPTRFRZ (output pointer freeze) bit.

The OPTRFRZ bit permits the programmer to peek ahead in the FIFO at data that has not yet been completely processed. For example, should a program have detected a valid Dolby AC-3 header, and desire to verify that another header occurs at the indicated bit position in the FIFO, the program may set the OPTRFRZ bit. When set, this bit maintains the OV dipstick wall at current location to prevent data from being overwritten while the program repositions the output pointer to look for the next header. If the header is verified valid through presence of another header at the indicated position, the program may then restore the output pointer to the original position, drop the wall by clearing the OPTRFRZ bit, and resume processing the data.

When the OPTRFRZ bit is used to peek ahead in the FIFO, the following is the preferred sequence if the pointer is to be restored to the original location:

a. SET the OPTRFRZ bit;

b. Read the output pointer to be restored, modulo subtract 2 from it, and save in Temp1 (a first temporary register);

c. Read the BREMAIN value, subtract it from 16, and save in Temp2 (a second temporary register);

d. Write the value in output pointer register 2503 to the desired peek ahead location and peek-ahead read as needed;

e. To restore the FIFO state, copy Temp1 contents into output pointer register 2503 (the subtract repositions the pointer at the data to be read into the PDATA and NEWDATA registers); and f. Read Temp2 bits from the FIFO to reposition the BRemaining register.

Dipsticks, such as FIFO Empty, FIFO FULL, and FIFO Mostly Full (the MF bit) are computed by dipstick computer 2504 from the differences (modulo the pointer Modulus) between the latched Output Pointer and the Input Pointer. FIFO Empty occurs when the Output Pointer is equal to the Input Pointer and both the PDATA and NEWDATA registers are empty. FIFO FULL occurs when the Input Pointer is 3 less than the Output Pointer. FIFO Mostly Full occurs when, modulo Modulus, the difference (Input Pointer-Output Pointer) is more than a programmable MF Set value. This bit is intended to be used to throttle block transfers of data from a host computing system into the FIFO.

Note that the MFSet value is a 4-bit field set by the programmer, and zero extended to 12 bits. This means that the mostly full level, like the modulus, is only be set in 512 byte units. Because the Input Pointer and Output Pointer are readable, software may compute additional dipstick levels.

When FIFO FULL is detected, a sticky Overflow bit, the OV bit, is set. This bit once set remains set until cleared by a write of the bit to a zero. When the FIFO Empty is detected, filling of the NEWDATA and PDATA registers of Bit Ripper 1903 from the FIFO RAM 2401 is inhibited. The DAV (Data Available) bit is set when either both the NEWDATA and PDATA registers are full, or when the difference between the Input Pointer and the Output Pointer is greater than two.

Figure 26:
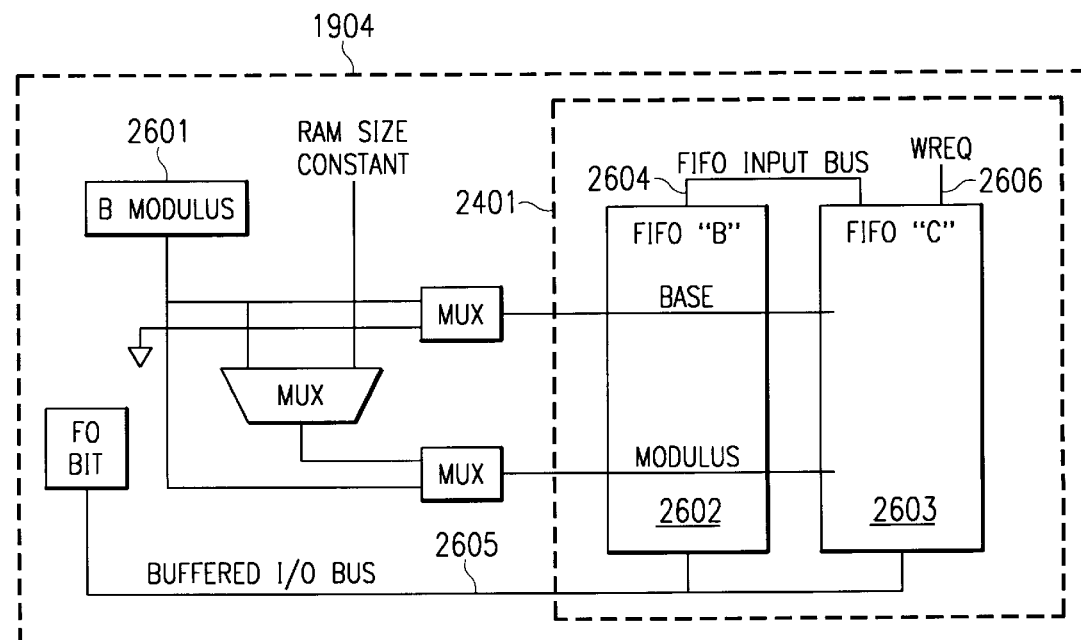
FIG. 26 is a diagram illustrating the sharing of FIFO RAM by two first-in-first-out registers (memories)
Figure 27:
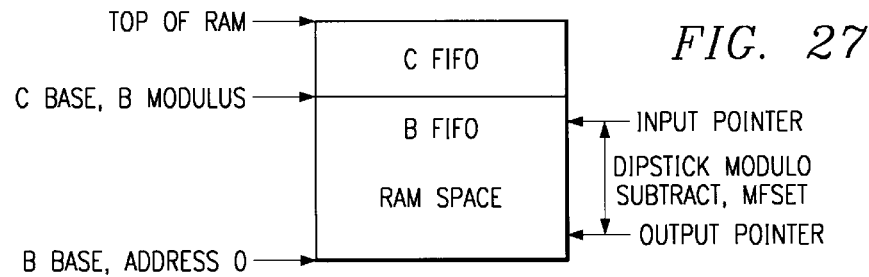
FIG. 27 is a diagram illustrating the allocation of RAM 2401 memory space between the dual FIFOs.

FIG. 26 is a conceptual diagram of dual FIFO 1904, illustrating the sharing of FIFO RAM 2401 by two first-in-first-out registers (memories). FIG. 27 illustrated the allocation of Ram 2401 memory space between the FIFOs.

The full Input FIFO Subsystem 1904 has two channels of FIFO within FIFO RAM 2401, with the FIFO bit selecting the active FIFO for reading, and a FIFO RAM allocation register, (FIFO B Modulus register 2601.) The value in the B Modulus register determines where the two FIFOs 2602 and 2603 labeled as the "B" FIFO and the "C" FIFO, are divided in the common 4K words of RAM. When FCSEZ=0, such that the "B" FIFO 2602 is active, the base address is selected to be a ZERO constant, while when FCSEZ=1, such that the "C" FIFO 2603 is active, the base address is selected to be the B Modulus. In order to conserve register and subtract bits, the 12-bit B modulus value derives its most significant five bits from a programmable register, the least significant eight bits bring a ZERO constant.

Similarly, when FIFO "B" is active, the Modulus is selected to be the B Modulus value in register 2601. When FIFO "C" is active, the Modulus is selected to be the size of the RAM minus the B Modulus value.

While only one FIFO is active for reading at any one time, according to the FCSEZ bit, either FIFO may be written at any time. FIFO input bus 2604 is common to both FIFOs B and C, as is a tri-state RAM data input-output bus 2605, and is time-shared between two FIFO input time slots and a pair of FIFO output time slots. FIFO input bus 2606 has an associated Write Request (WREQ) line 2606.

Figure 28:
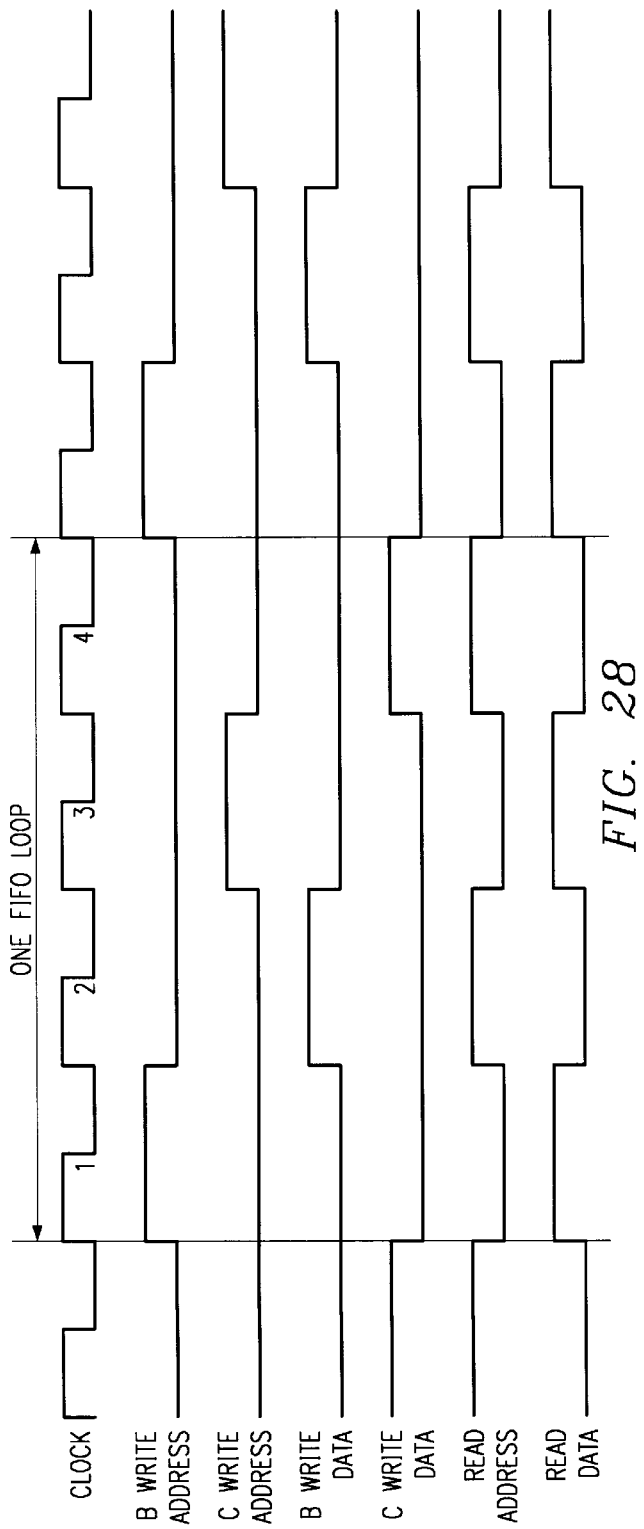
FIG. 28 is a diagram illustrating the pipelining of data through the dual FIFOs.

FIG. 28 is a timing diagram illustrating the pipelining of data through FIFOs B and C (2602 and 2603). In order to provide adequate time for the address computations (in particular, the dipsticking computation that must be completed in time to inhibit a write if the FIFO is full), a two-level pipeline is used in the FIFO system. In a first cycle, if the selected input unit places a write request on FIFO WREQ line 2606, the "B" channel input pointer is incremented and the "B" channel dipsticks are computed. Data are transferred over the FIFO input bus and written to memory in the following cycle. In a second cycle, while any FIFO "B" data is being written, the active output pointer is incremented, with the data read being transferred to the Bit Ripper NEWDATA register in the following cycle. In a third cycle, if the selected input unit places a write request on the FIFO WREQ line 2606, the "C" channel input pointer is incremented and the "C" channel dipsticks are computed. The data are transferred over the FIFO input bus and written to memory in the following cycle. In a fourth cycle, while any FIFO "C" data are being written, the active output pointer is incremented, with the data read being transferred to the Bit Ripper NEWDATA register in the following cycle. FIFO subsystem 1903 therefore may take one loop, or 2 instruction times, from the time that the FCSEL bit is changed to the time that data is present at Bit Ripper 2404 ready to be read. Similarly, upon reading data through Bit Ripper 2404, new data will be ready to be read during the second instruction after a read.

In order to increase the test visibility of input unit 300, the following features are incorporated into I/O block 102. First, the DSP FIFO input port permits writing of an arbitrary pattern to the FIFO. Second, a selected DSP 200 may generate a pattern that is treated by the hardware as if it were a pattern on the inputs to the CDI or DAI port pins. Software generated S/PDIF, I²S, or serial data patterns can test this hardware. Third, a DSP 200 may read the input pins to the DAI port and to the CDI port, allowing a quick verification of connectivity to these pins in a system, and also providing a parallel input port use for the 2 pins of the CDI port that are not used when this port is in S/PDIF mode.

Input unit 200 registers and controls bit fields are described in TABLES 29–39.

TABLE 29

Input Unit Test Register (IUTST)
Page 0 Address 0x11

| Field | Bits | Description |
|---|---|---|
| CDIPINS | 23:21 | These are CDI input pins composing the CDI port. They allow direct read of pin data:<br>23: LRCLOCK (Pin 29)<br>22: SCLK (Pin 28)<br>21: DATA (Pin 27) |
| CDIPOVD | 20:18 | These are override pins for CDI pins. When the CDIOV bit is set, these bits replace the CDIPINS pins as input signals to CDI for testing. |

TABLE 29-continued

Input Unit Test Register (IUTST)
Page 0 Address 0x11

| Field | Bits | Description |
|---|---|---|
| CDIOV | 17 | This is the CDI input override enable pin. When clear, CDI pins operate normally. When set, CDIPOVD field drives CDI inputs for testing. |
| CDILPBK | 16 | This pin sets the CDI Loopback test mode. When set, output data from DAO is routed internally to CDI inputs for loopback testing. |
| DAPINS | 15:13 | These are the DAI input pins composing the DAI port. They allow direct read of pin data:<br>15: LRCLOCK (Pin 26)<br>14: SCLK (Pin 25)<br>13: DATA (Pin 24) |
| DAIPOVD | 12:10 | These are the Override data for DAI pins. Then the DAIOV pin is set, these bits replace pins as input signals to DAI for testing. |
| DAIOV | 9 | These are DAIOV input override bit. When clear, DAI pins operate normally. When set, DAIPOVD field drives DAI inputs for testing. |
| DAILPBK | 8 | These are the DAI Loopback test mode enable bit. When set, output data from DAO is routed internally to DAI inputs for loopback testing. |
| Reserved | 7:0 | Always reads low. |

TABLE 30

FIFO B Pointer Register (FBPTR) Page
0 Address 0x12

| Field | Bits | Description |
|---|---|---|
| FBINPTR | 23:12 | These bits represent the FIFOB input pointer (Read only) |
| FBOUTPTR | 11:0 | These bits represent FIFO B output pointer. A Write to this field clears F_BREMAIN |

TABLE 31

FIFO C Pointer Register (FCPTR) Page
0 Address 0x13

| Field | Bits | Description |
|---|---|---|
| FCINPTR | 23:12 | These bits represent the FIFO C input pointer (read only) |
| FCOUTPTR | 11:0 | These bits represent the FIFO C output pointer. A Write to this field clears F_BREMAIN |

TABLE 32

FIFO Control and Status Register (FCTLST) Page 0 Address 0x14

| Field | Bits | Description |
|---|---|---|
| FCMFSET | 23:20 | FIFO C mostly full level setting field. |
| FBMFSET | 19:16 | FIFO B mostly full level setting field. |
|  | 15:14 | Reserved. Always reads zero. |
| FCSEL | 13 | This is FIFO C Select bit:<br>0: FIFO B active, uses low ram<br>1: FIFO C active, uses high ram |
| FBSIZE | 12:8 | This field sets FIFO B size. FIFO C starts at RAM base address +FBSIZE |
| FCOUTPTRFRZ | 7 | When this bit is set, the FIFO C output pointer is frozen, allowing peek-ahead in FIFO. |
| FC_OV | 6 | This is the FIFO C overflow flag. |
| FC_DA | 5 | This is the FIFO C Data Available flag which indicates that data is available in FIFO C. Requires at least 17–31 bits, because both prior data and new data registers must contain data. This bit is set when either 17–31 bits in FIFO bit ripper registers OR when 3 words are in the FIFO RAM |
| FC_MF | 4 | This is the FIFO C mostly full flag. |
| FBOUTPTRFRZ | 3 | When this bit is set, FIFO B output pointer is frozen, allowing peek-ahead in FIFO |
| FB_OV | 2 | This is the FIFO B overflow flag. |
| FB_DA | 1 | This is the FIFO B Data Available bit which indicates that data is available in FIFO B. Requires at least 17–31 bits, because both prior data and new data registers must contain data when this bit is set. Set when either 17–31 bits in FIFO bit ripper registers OR when 3 words are in the FIFO RAM. |
| FB_MF | 0 | This is the FIFO B mostly full flag. |

TABLE 33

FIFO Data Register (FDATA) Page 0 Address 0x15

| Field | Bit | Description |
|---|---|---|
| Reserved | 23:16 | This field always reads zero. |
| F_DATA | 15:0 | A Read gives right-justified data from bit ripper 2404. A Write sends 16-bit data word to FIFO (For test purposes only) |

TABLE 34

FIFO Bits Register (FBITS) Page 0 Address 0x16

| Field | Bits | Description |
|---|---|---|
| Reserved | 23:8 | Always reads zero. |
| F_BREMAIN | 7:0 | This field indicates the number of bits remaining in bit ripper. |
| F_NEED | 4:0 | This field indicates the number of FIFO bits needed. This number of bits is grabbed by subsequent read instructions of FIFO B or C. |

TABLE 35

Compressed Data Control Register (CDICTL) Page 0 Address 0x17

| Field | Bits | Description |
|---|---|---|
| CDI_EN | 23 | When set, this bit enables CDI serial to parallel conversion and writes to FIFO. When cleared, CDI serial to parallel converter 2108 is disabled and no data is written to FIFO. |
| CDIBSTART | 22:16 | This field indicates first bit number of field to capture within a subframe. |
| CDIMARKEN | 15 | This is the Marker Inject Enable bit. When set, a marker (0xA or 0x9) is inserted between input samples as data is written to FIFO. |
| CDIBSTOP | 14:8 | This field indicates the last bit number of field capture within a subframe. Bits are numbered starting from 0, increasing count. |
| CDIFRMSEL | 7:6 | This is the Subframe capture select field:<br>00: disable unit, no data captured<br>01: capture data only from LRCLK low subframe<br>10: capture data only from LRCLK high subframe<br>11: capture data from both subframes |
| CDICLKPOL | 5 | This is the Bit clock polarity select bit. In slave clock mode, this bit selects active edge of SCLK. In master clock mode, it determines output polarity of SCLK:<br>0: Serial data captured on rising edges of SCLK.<br>1: Serial data captures on falling edges of SCLK. |
| CDICLKMODE | 4 | Master clock mode select bit. When this bit is set, SCLK and LRCLK are outputs derived from internal divider clocks. Notes: This bit Divider is common to S/PDIF, CDI and DAI parsers. If both the CDI and DAI ports are used in master clock mode, the |

TABLE 35-continued

Compressed Data Control Register (CDICTL) Page 0 Address 0x17

| Field | Bits | Description |
|---|---|---|
|  |  | LRCLK for both will be identical. This bit should be cleared for S/PDIF mode. |
| CDIBCLKD | 3:0 | This is the Bit clock divider field which controls the SCLK frequency. The SCLK frequency is 512Fs clock divided by [(CDIBCLKD/2)+1]. |

TABLE 36

Compressed Data Clock Register (CDICLK) Page 0 Address 0x18

| Field | Bits | Description |
|---|---|---|
|  | 23 | Reserved. This bit always reads zero. |
| CDI_LRCLKD | 23:16 | This is the Sample clock divider field which controls LRCLOCK frequency in the master clock mode. LRCLK frequency is SCLK divided by (CDI_LRCLKD+1). Range is 2–256 in 2 cycles steps. |
|  | 15:14 | Reserved. Always reads zero. |
| CSBBITSEL | 13:12 | These are the low two bits of the bit number in the subframe from which Channel Status Block Detector will capture a block. High bits are always 111; therefore 10= capture channel status block from bit 30. |
|  | 11 | Reserved. Always reads zero |
| CSBSTRMSEL | 10 | This bit chooses the subframe from which CSB data is to be extracted: 1: detect channel status block when LRCLOCK is high, 0: detect channel status block when LRCLOCK is low. |
| CSBINT | 9 | This bit is set whenever a channel status block is detected. It is cleared whenever the CSBHI field is read from the CDICLK register. A rising edge of this bit also triggers an interrupt to the DSP. |
| CSBSTART | 8 | When set, this bit indicates that current CSBHI/CSBLO values are the first 32 bits of the channel status block. |
| CSBHI | 7:0 | These bits comprise High 8 bits of channel status block. |

TABLE 37

Channel Status Block Low Register (CSBLO) Page: 0 Address 0x19

| Field | Bit | Description |
|---|---|---|
| CSBLO | 23:0 | This field contains the Low 24 bits of channel status block. |

TABLE 38

Digital Audio Input Control Register (DAICTL) Page 0 Address 0x1A

| Field | Bit | Description |
|---|---|---|
| DAI_EN | 23 | When set, this bit enables serial to parallel conversion and DAI writes to FIFO. When cleared, DAI serial to parallel converter 2302 is disabled and no data is written to FIFO. |
| DAIBSTART | 22:16 | This field indicates the first bit number of the field to capture within a subframe. |
| DAIMARKEN | 15 | Marker Inject Enable bit. When this bit is set, a marker (0xA to 0x9) is inserted between input samples as data is written to the FIFO. |
| DAIBSTOP | 14:8 | This field indicates the last bit number of the field to capture within a subframe. Bits are numbered starting from 0, increasing count. |
| DAIFRMSEL | 7:6 | This is the subframe capture select field; 00: disable unit, no data captured 0:1 capture data only from LRCLK low subframe 10: capture data only from LRCLK high subframe 11: capture data from both subframes. |
| DAICLKPOL | 5 | Bit clock polarity select bit. In salve clock mode, this bit selects active edge of SCLK. In master clock mode, this bit determines the output polarity of SCLK: 0: Serial data captured on rising edges of SCLK. 1: Serial data captured on falling edges of SCLK. |
| DAICLKMODE | 4 | This is the master clock mode select bit. When set, SCLK and LRCLK become outouts derived from internal divider clocks. Note: the Divider is common to S/PDIF, CDI and DAI parsers. If both CDI and DAI ports are used in master clock mode, the LRCLK for both will be identical. This bit should be cleared for S/PDIF mode. |

TABLE 38-continued

Digital Audio Input Control Register
(DAICTL) Page 0 Address 0x1A

| Field | Bit | Description |
|---|---|---|
| DAIBCLKD | 3:0 | This is the Bit Clock divider field which controls the SCLK frequency. The SCLK frequency is 512Fs clock divided by [(CDIBCLKD/2) +1]. |

Figure 29:
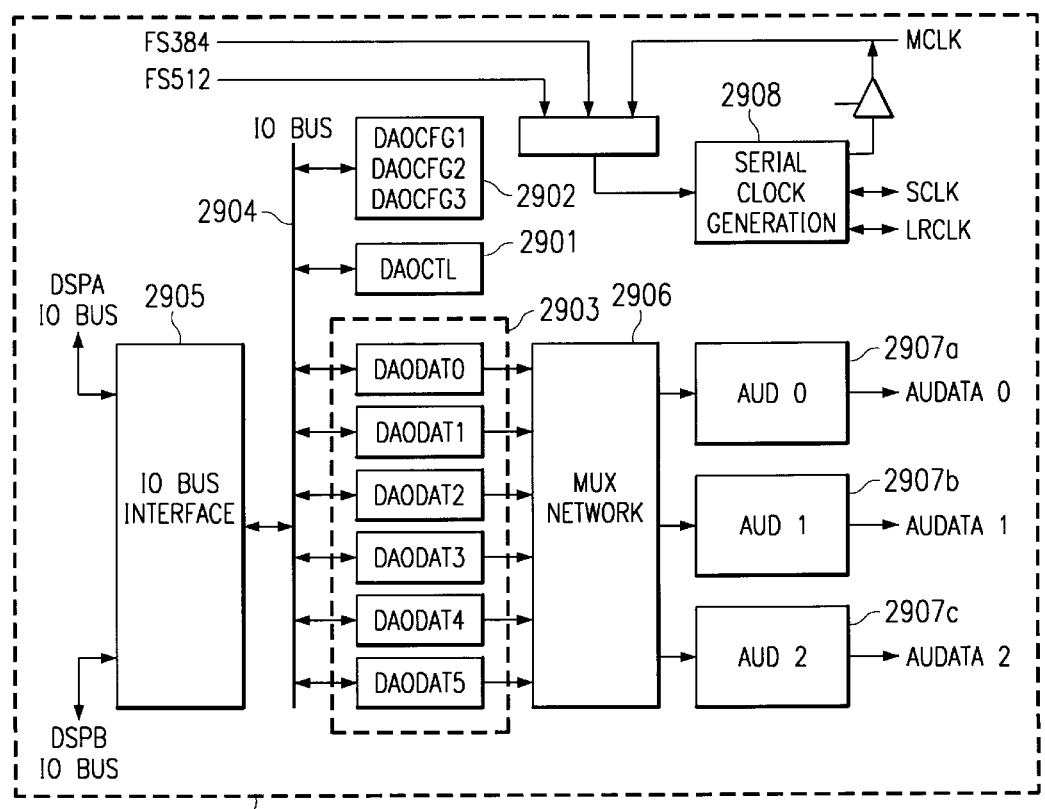
FIG. 29 is a block diagram of the data output (DAO) port.

Digital Audio Output (DAO) part 305 can transmit up to six channels of audio sample data in I²S compatible format. A block diagram of the DAO 305 port is provided in FIG. 29.

Digital Audio Output port 305 consists of a six-channel FIFO 2901 (DAODAT0–DAODAT5), three channel-configuration registers 2902 (DAOCFG1–DAOCFG3) and one port-control register 2903 (DAOCTL). Each FIFO can contain 32 words with a width of 20 bits. FIFO 2901 and registers communicate with DSPs 200 through a dedicated I/O bus 2904 and bus interface 2905. The outputs of six-channel FIFO 2901 are controlled by a multiplexer network 2906 which selectively pass data to audio output formatters 2907a–2907b. DAO 305 further includes a serial clock generator 2908 which generates clocks SCLK and LRCLK discussed below.

Port-control register 2903 specifies the clock ratios and allocates channels (DAODATA03–DAODATA5) to the three data output pins (AUDATA0–AUDATA3). Also, port-control register 2903 contains a FIFO word-counter, Half Empty flag, and Empty flag. Since all active audio channels run synchronously, channel 0 (DAODAT0) is assumed as the master FIFO channel. Hence, the FIFO status flags and "dipstick" represent the situation in the channel 0 FIFO.

Mux network 2906 provides flexibility in assigning FIFO channel data to output formatter blocks (AUD0–AUD2). AUD0 block 2907a can support up to six channels. However, the AUD1 (2907a) and AUD2 (2907b) blocks only carry two channels each. Therefore, the AUDATAX (described below) output pins can be configured in 6/0/0, 4/2/0, 4/0/2, and 2/2/2 channel data modes. Channel configuration schemes and FIFO mappings are shown in the following TABLE 39.

TABLE 39

Channel Configuration Modes

| Mode | LRCLK = 0 | LRCLK = 1 |
|---|---|---|
| 0 | AUDAT0 = {Ch1, Ch3, Ch5} | AUDATA0= {Ch0, Ch2, Ch4} |
| 1 | AUDATA0 = {Ch1, Ch3} AUDATA1 = {Ch5} | AUDATA0= {Ch0, Ch2}, AUDATA1 = {Ch4} |
| 2 | AUDATA0= {Ch1, Ch3} AUDATA2 = {Ch5} | AUDATA0= {Ch0, Ch2} AUDATA2 = {Ch4} |
| 3 | AUDATA0= {Ch1}, AUDATA1 = {Ch3}, AUDATA2= {Ch5}} | AUDATA0= {Ch0} AUDATA1 = {Ch2} AUDATA2= {Ch4} |
| 4 | AUDATA0= {Ch0, Ch2, Ch4} | AUDATA0= {Ch1, Ch3, Ch5} |
| 5 | AUDATA0= {Ch0, Ch2} AUDATA1 = {Ch4} | AUDATA0 = {Ch1, Ch3} AUDATA1 = {Ch5} |
| 6 | AUDATA0= {Ch0, Ch2} AUDATA2 = {Ch4} | AUDATA0= {Ch1, Ch3} AUDATA2 = {Ch5} |
| 7 | AUDATA0= {Ch0} AUDATA1 = {Ch2} AUDATA2= {Ch4} | AUDATA0= {Ch1} AUDATA1 = {Ch3} AUDATA2 = {Ch5} |

DAO port Control register 2903 is used to specify the clock ratios, channel configuration scheme, and monitors the FIFO 2903 status. It is read/writable except the fields FIFOCNT, HEMP, and EMPT, which are read-only. The TEST bit enables the FIFO test mode that allows access (write/read) to FIFOs 2901 for testing purposes.

Figure 30:
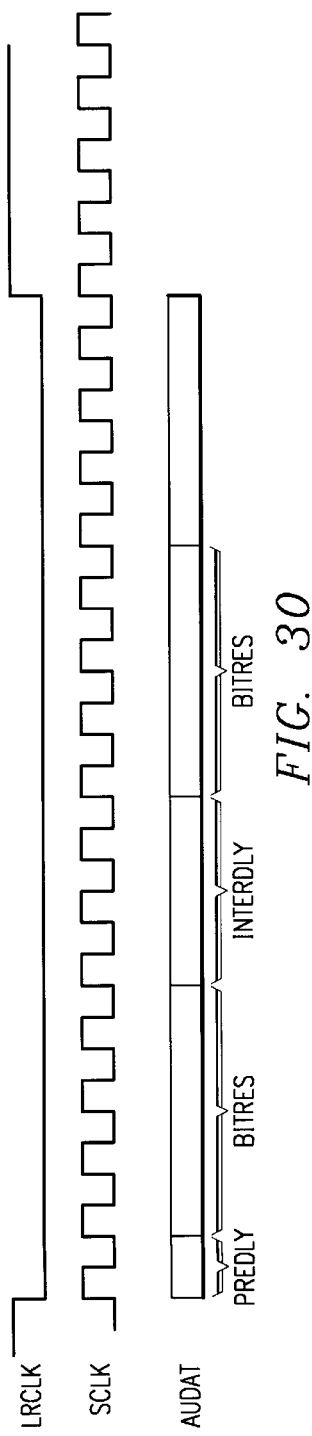
FIG. 30 is a typical audio output waveform.

The Channel Configuration Registers 2902 (DAOCFG1, DAOCFG2, DAOCFG3) correspond to three output data pins: AUDATA0, AUDATA1 and AUDATA2. They define the relations of each data pin vs. LRCLK and SCLK, respectively. The channel configuration fields provide a flexible mechanism for specifying the data output formats. The PREDLY field specifies the number of SCLK cycles to wait after an LRCLK edge before outputting sample data. The BITRES field specifies the number of-bits per sample (up to 20) to be output and the INTERDLY field specifies the number of SCLK cycles to wait before outputting the next data sample. A typical output waveform is shown below in FIG. 30. Note that the INTERDLY field only applies to AUDATA0 channel, since the other outputs (AUDATA1 and AUDATA2) can only carry two channels. The channel control registers are read/writable.

DSPs 200 views each FIFO (DAODAT0 to DAODAT5) as an I/O registers one can write and read FIFO to perform first-in-first-out function for testing purpose when in test mode (TEST=1). DAO port 305 occupies ten IO register addresses and all ten registers are assumed to be allocated to one DSP 200 at a time. In the case of an I/O address contention within the DAO I/O address range, the DSPB operation will proceed, and the attempted DSPA operation will be ignored. Audio output port 305 communicates with an external DAC (not shown) through output pins AUTDAT0, AUDATA1, AUDATA2, and I/O pins MCLK, SCLK, and LRCLK (preferred pinouts are described below). When an external MCLK is provided, the port takes MCLK as input and generates within serial clock generation circuitry 2908 LRCLK and SCLK. In slave mode, an external SCLK and LRCLK are provided and the MCLK input is ignored. In master mode, DAO 305 uses the 512 Fs/384 Fs input from clock manager 1303 to generate all three clocks.

DAO port 305 can generate 4 interrupts: (1) FIFO half empty, when FIFOCNT (dipstick) decreases from 16 to 15; (2) FIFO empty, when FIFOCNT (dipstick) decreases from 1 to 0; (3) rising edge of LRCLK; and (4) falling edge of LRCLK.

The frequency of LRCLK is always equal to the audio sample rate(Fs). SCLK is the clock for serial output bit stream. Transitions of LRCLK can be aligned to either falling edge of SCLK or rising edge of SCLK by defining EDGE bit in register DAOCTL (2903) Also, data bits on pin AUDATAx are sent out after either the falling edge of SCLK or rising edge of SCLK according to EDGE bit. MCLK is the master clock for the external DAC. MCLK can be 512 Fs, 384 Fs, or 256 Fs. SCLK can be 512 Fs (only when MCLKRT=1), 256 Fs, 128 Fs, 64 Fs, 48 Fs, and 32 Fs. Note that all combinations of clock rates are not available in some modes. AUDATA0, AUDATA1, AUDATA2 are low until OENs (output enables) are set and LRCLK and SCLK float until CLKEN is set. MCLK is always floating unless EXTMCLK=0 and CLKEN=1 (assuming clock generator 2908 provides MCLK and clocks are enabled).

To enable port 305, the CLKEN bit in the DAOCTL 2905 register and the appropriate OENs in each DAOCFGx (2902) register are set high. After port 305 is configured to the proper mode, about 1 to 2 FS periods of delay occurs until the port starts to send out data. During this delay period, MCLK/LRCLK/SCLK are generated and aligned properly. The CH0 sample is always sent out first through AUDATA1 pin in 6/0/0 configurations. In 2/2/2 configurations, CH0, CH2 and CH3 (channels 1, 2, and 3) samples are always sent out first through formatters 2907a–2907c (AUDATA1, AUDATA2 and AUDATA3); respectively.

The preferred startup sequence for DAO port 305 is as follows. First, reset the FIFO pointers and disable the clocks. Then disable the data outputs. Configure the channels as desired and fill the FIFOs 2901. Then set the output enables and clock enable begin transmitting data.

The CKTST bit in DAOCTL 2903 register is included for test purposes. When set, the CKTST bit causes the DSP Clock to be output on the MCLK pin. This allows monitoring of the PLL and clock manager circuitry for test and debug purposes. The CKTST bit should be cleared for normal operation.

Descriptions of all DAO Registers and bit mappings are provided in the following TABLES 40 and 41.

TABLE 40

Port Control Register (DAOCTL)
Page 3 Address 0x1F

| Field | Bits | Description |
|---|---|---|
| | Bit[23] | unused |
| SLAVE | Bit[22] | Slave mode. When set, both SCLK and LRCLK are inputs. MCLK is ignored. |
| CKTST | Bit[21] | Clock test. When set, DSP clock is output on MCLK pin. Should be cleared for normal operation. |
| RSTFIFO | Bit[20] | When 1, reset read pointers, write pointers and FIFOCNT (Dipstick). |
| EDGE | Bit[19] | When 0, transitions of LRCLK are aligned with falling edge of SCLK, and data bits are shifted out by falling edge of SCLK; When 1, transitions of LRCLK are aligned with rising edge of SCLK, and data bits are shifted out by rising edge of SCLK |
| TEST | Bit[18] | When 1, enter test mode. DSP can exercise (read and write) FIFOs for testing purpose. |
| CHANMOD | Bit[17:15] | Channel configuration. Setting corresponds to mode defined in channel configuration mode table above. When 000, set mode 0 from table. When 111, set mode 7 from table. |
| CLKEN | Bit[14] | Clock Enable. When 1, SCLK, LRCLK and MCLK (if EXTMCLK = 0) send out clocks. When 0, SCLK and LRCLK are logic "0"; MCLK is on only when CLKEN = 1 and EXTMCLK = 0, otherwise MCLK is tri-state. |
| EXTMCLK | Bit[13] | When 1, use external MCLK as input. MCLK ratio need to be given as MCLKRT. When 0, the port generate MCLK as output according to the ratio of MCLKRT. |
| MCLKRT | Bit[12:11] | Ratio of MCLK. 00: MCLK = 256Fs 01: MCLK = 384Fs 10: MCLK = 512Fs 11: MCLK = 128Fs |
| SCKRT | Bit[10:8] | Ratio of SCLK. 000: SCLK = 32Fs 001: SCLK = 64Fs 010: SCLK = 128Fs (only when MCLK is 512Fs or 256Fs) 011: SCLK = 256Fs (only when MCLK is 512Fs or 256Fs) |

TABLE 40-continued

Port Control Register (DAOCTL)
Page 3 Address 0x1F

| Field | Bits | Description |
|---|---|---|
| | | 100: SCLK = 512Fs (only when MCLK is 512Fs) 101: SCLK = 48Fs (only when MCLK is 384Fs) |
| EMPT | Bit[7] | Empty. EMPT is set when Ch0 FIFO involved is empty. Read-only. Set on reset. |
| HEMP | Bit[6] | Half Empty. Set high when Ch0 FIFO is half empty (Dipstick is less than 16). Read-only. Set on reset. |
| FIFOCNT | Bit[5:0] | "Dipstick" attached to Ch0 FIFO, show the number of words waiting to be sent out in Ch0 FIFO. Read-only. |

TABLE 41

Channel Config Registers
(DAOCFG1–DAOCFG3) Page 3 Address 0x1 C-0x1E

| Name | Bits | Description |
|---|---|---|
| | Bit[23:21] | unused |
| OEN | Bit[20] | Output enable. When 0, corresponding AUDATAx is low. |
| INTERDLY | Bit[19:13] | # of SCLK delays between two successive samples. Only for config register of AUDATA1 (DAOCFG1). It could be 0. (range:0–127) |
| BITRES | Bit[12:8] | # of bit per sample data (range 1 to 20), which is equal to the value of BITRES + 1. |
| PREDLY | Bit[7:0] | # of SCLK delay between LRCLK transition and first sample data. It could be 0. (range: 0–255) |

Figure 31:
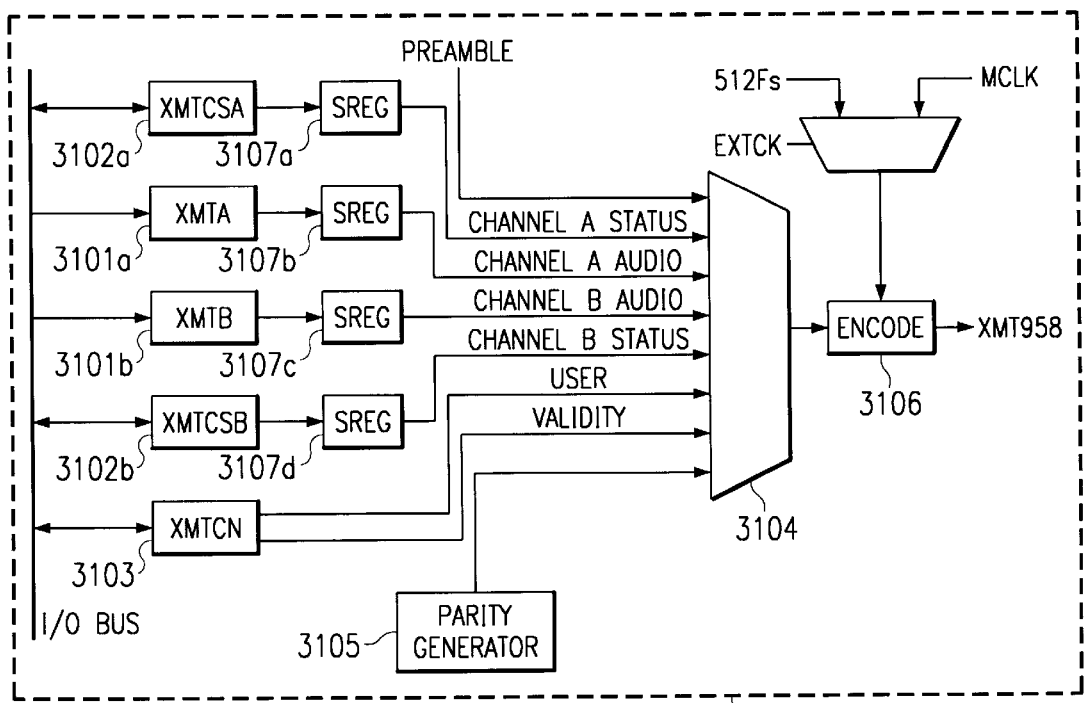
FIG. 31 is a diagram of the digital audio transmitter of FIG. 13.

FIG. 31 is a diagram of digital audio transmitter 306. The transmitter encodes digital audio data according to the Sony Phillips Digital Interface Format (S/PDIF), also known as IEC-958, or the AES/EBU interface format. The encoded data is output on the XMT958 pin. Transmitter 306 has two FIFOs for audio data 3101a and 3101b (XMTA, XMTB), two 16-bit read/write registers for channel status data 3102a and 3102b (XMTCSA, XMTCSB), and a read/write control register 3103 (XMTCN). FIFOs 3101 are 24 bits wide and 32 words deep. The registers and bitfields of transmitter 306 are provides in TABLES 42 through 46.

TABLE 42

Transmitter Control Register (XMTCN)
Page 3 Address 0x11

| Name | Bits | Description |
|---|---|---|
| TSTNAND | 23 | When set, output of internal NAND tree for input level testing is routed to XMT958 pin. Should be cleared for normal operation. |
| XMTTEST | 22 | When set, allows read/write access to FIFOs for testing. |
| | 21:19 | Reserved. |
| CLKRT | 18 | Selects external MCLK rate if |

TABLE 42-continued

Transmitter Control Register (XMTCN)
Page 3 Address 0x11

| Name | Bits | Description |
|---|---|---|
| | | EXTCK is set. |
| | | 0 = MCLK of 256Fs |
| | | 1= MCLK of 512Fs |
| EXTCK | 17 | When 1, use MCLK pin as master clock for the S/PDIF transmitter. MCLK must be either 256Fs or 512Fs. |
| RSTFIFO | 16 | Reset FIFO. When 1, resets read pointers, write pointers, and dipstick value. |
| SBP | 15 | S/PDIF Bypass. When set, the S/PDIF input pin is routed directly to the XMT958 output pin. Allows transparent pass-through of S/PDIF data. |
| V | 14 | Validity bit. |
| U | 13 | User bit. |
| OE | 12 | Output Enable. When high, XMT958 pin is enabled. When it is low, XMT958 is low. |
| CSMD | 11 | Channel Status Mode. When low, XMTCS is read once per block. When high, XMTCS is read every 32 subframes. |
| BLKST | 10 | Block Start. A low to high transition specifies a new channel status block boundary. This bit is normally high. When low, the FIFO is disabled. |
| BYTCK | 9 | Byte Clock. Status bit that is the channel status byte clock. It is high for 16 subframes and low for 16 subframes. Read only. |
| CBL | 8 | Channel status Block Clock. Status bit that goes high at the block boundary and low 64 subframes later. Read-only. |
| EMPT | 7 | FIFO empty. Set when Ch0 FIFO is empty. Read-only. Set on reset. |
| HEMP | 6 | FIFO half empty. Set when Ch0 FIFO is half empty (dipstick less than 16). Read-only. Set on reset. |
| FIFOCNT | 5:0 | Dipstick attached to channel 0 FIFO. Shows number of words left in the FIFO. Read-only. |

TABLE 43

Transmitter Data FIFO A(XMTA) Page 3
Address 0x14

| Name | Bits | Description |
|---|---|---|
| XMTA | 23:0 | Transmit data for channel A. |

TABLE 44

Transmitter Channel Status Register
A(XMTCSA) Page 3 Address 0x12

| Name | Bits | Description |
|---|---|---|
| XMTCSA | 23:8 | Channel status for channel A. |
| | 7:0 | Reserved. |

TABLE 45

Transmitter Data FIFO B(XMTB) Page 3
Address 0x15

| Name | Bits | Description |
|---|---|---|
| XMTB | 23:0 | Transmit data for channel B. |

TABLE 46

Transmitter Channel Status Register
B(XMTCSB) Page 3 Address 0x13

| Name | Bits | Description |
|---|---|---|
| XMTCSB | 23:8 | Channel status for channel B. |
| | 7:0 | Reserved. |

TABLE 47

FIFO Data Registers (DAODAT0–DAODAT5) Page 3
Address 0x16-0x1B

| Field | Bit | Description |
|---|---|---|
| FIFODAT | Bit[23:4] | Audio Data up to 20-bit per sample. MSB is always Bit[23]. LST varies based upon the resolution of sample data (BITRES). |
| | Bit[3:0] | unused. |

The audio and channel status data are read from their registers and multiplexed by a multiplexer 3104 with the validity and user bits from control register 3102, and the parity bit from parity generator. Preamble generation and biphase encoding to the S/PDIF format are handled automatically by encoder 3106. In all modes, the data in XMTA/XMTCSA and XMTB/XMTCSB registers correspond to Channels A and B of a S/PDIF encoded stream. This allows independent control over each channel, regardless of the type of data being transmitted.

Channel status data can be input in two different modes determined by the CSMD field in register XMTCN. In the first mode (CSMD=0), register XMTCSA (3102*a*) and register XMTCSB (3102*b*) store the 16 most important channel status bits for consumer audio data according to the S/PDIF standard. These are bits 0–5, 8–15, 24, and 25, defined as follows: Bit 0 must be low to divine the consumer format for the channel status; Bit 1 defines whether the information being transferred is audio or non-audio data; Bit 2 is the copy bit; Bits 3 through 5 are the emphasis bits; Bits 8 through 15 define the category code and whether the data is from an original or copied source; and Bits 24 and 25 define the sample frequency. XMTCS registers 3102 must be loaded once by the programmer and are read once per block by the transmitter. All other bits are transmitted as zero. The LSB of XMTCS registers is the LSB of the channel status bits.

The CBL status bit in XMTCN register 3103 goes high at a channel status block boundary and XMTCS registers are loaded into the corresponding shift register 3107 at the same time. CBL transitions low 64 subframes later.

In the second channel status mode (CSMD=1), all the bits in a data block can be controlled. The XMTCS registers 3102 are loaded every 32 subframes and are serially shifted by shift registers into 16 transmitted subframes for each channel (32 subframes total). This allows independent control of channel status data for both channels.

The BYTCK status bit (the channel status byte clock) in XMTCN register 3103 always transitions high at a block boundary. It is high for 16 subframes and low for 16 subframes, corresponding to one byte transmitted from each of the XMTCS registers 3102 during each phase of BYTCK. XMTCS registers 3102 are loaded into the corresponding shift registers 3107 by the transmitter at each rising edge of BYTCK.

Data from the XMT FIFOs 3101a and 3101b are loaded into the shift registers 3107b and 3107c of the transmitter at the sample rate specified in the clock manager. FIFOs 3101 can generate an interrupt to the given DSP 200 on half-empty and empty conditions. The validity (V) and user (U) bits in XMTCN register 3103 are read by the transmitter at the same time data from a XMT FIFO 3101 is read. These bits are transmitted with the audio data.

Figure 32:
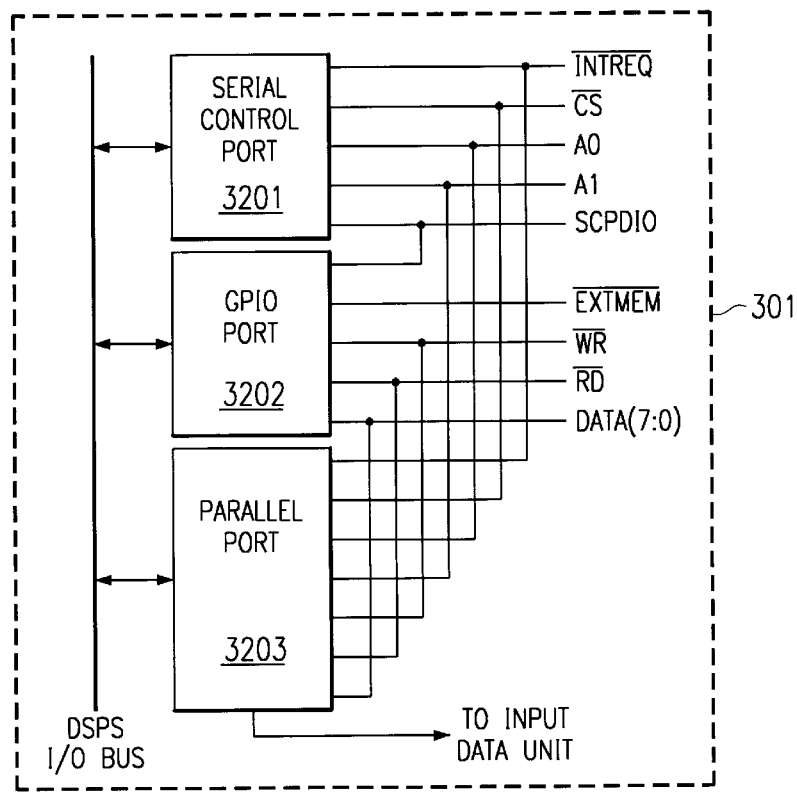
FIG. 32 is a diagram of host interface of FIG. 13.

FIG. 32 is a diagram of host interface 301, the primary components of which are serial control port 3201, (general purpose I/O port 3202, and parallel port 3203). Host interface supports communication between Decoder 100 and an external host controller. The host interface can be configured to operate in I²C or SPI compatible serial formats, or Motorola or Intel style parallel formats. The host interface also provides limited support for external memory.

TABLES 48–57 describe the pinouts, register definitions and bitfield definitions:

TABLE 48

Mode Selection Values

| RD | WR | SCPDIO | INTREQ | Host Interface Mode |
|---|---|---|---|---|
| 1 | 1 | 1 | — | Motorola Parallel |
| 1 | 1 | 0 | — | Intel Parallel |
| 1 | 0 | — | 1 | SPI Serial |
| 1 | 0 | — | 0 | SPI Serial, Auto-Boot |
| 0 | 1 | — | 1 | I2C Serial |
| 0 | 1 | — | 0 | I2C Serial, Auto-Boot |
| 0 | 0 | — | — | Illegal combination (defaults to I2C Serial) |

TABLE 49

Host Message (HOSTMSG) A1:A0 = 00

| Name | Bits | Description |
|---|---|---|
| HOSTMSG | 7:0 | Host data to/from DSP. A read or write of this register by the host causes an interrupt to the DSP. |

TABLE 50

Host Control Register (CONTROL) A1:A0 = 01

| Name | Bits | Description |
|---|---|---|
|  | 7 | Reserved - always write 0 |
| HIP1RST | 6 | Initializes Host Input port channel 0. |
| HIP0RST | 5 | Initializes Host Input port channel 1. |
| MFC | 4 | When high, indicates that input FIFO C is almost full. Read-only. |
| MFB | 3 | When high, indicates that input FIFO B is almost full. |

TABLE 50-continued

Host Control Register (CONTROL) A1:A0 = 01

| Name | Bits | Description |
|---|---|---|
| HINBSY | 2 | Read-only. Set when host writes to HOSTMSG. Cleared when DSP reads data from HOSTMSG. The host can read this bit to determine if the last host message has been read. |
| HOUTRDY | 1 | Read-only. When set, indicates HOSTMSG has been written by DSP and should be read by the host. Set when DSP writes to HOSTMSG; cleared when host reads from HOSTMSG. |
| HATTN | 0 | Read-only. Host attention. When host sets this bit, an interrupt is generated to the DSP. Write-only by host. |

TABLE 51

Host Input port 0 Data Input (HIP0) A1:A0 = 10

| Name | Bits | Description |
|---|---|---|
| HIP0 | 7:0 | Data to input unit. This register allows the host to write data directly into the input FIFO of the Input Data Unit. Write-only. Refer to the Input Unit section for details on input unit configuration. |

TABLE 52

Host Input port 1 Data Input (HIP1) A1:A0 = 11

| Name | Bits | Description |
|---|---|---|
| HIP1 | 7:0 | Data to input unit. This register allows the host to write compressed data directly into the input FIFO of the Input Data Unit. Write-only. Refer to the Input Unit section for details on input unit configuration. |

TABLE 53

Host Interface Pin Functions

| Pin | I2C Serial | SPI Serial | Intel Parallel | Motorola Parallel | External Memory |
|---|---|---|---|---|---|
| /INTREQ /CS | /INTREQ Unused (tie high) | /INTREQ /CS | /INTREQ /CS | /INTREQ /CS | /INTREQ /CS |
| /RD * | Unused (tie low) | Unused (tie high) | /RD | R/W | /EMOE (GPIO11) |
| /WR * | Unused | Unused | /WR | DS | /EMWR |

TABLE 53-continued

Host Interface Pin Functions

| Pin | I2C Serial | SPI Serial | Intel Parallel | Motorola Parallel | External Memory |
|---|---|---|---|---|---|
| A0 | (tie high) SCL | (tie low) SCK | A0 | A0 | (GPIO10) SCK/SCL |
| A1 | Unused (tie high) | CDIIN | A1 | A1 | CDIIN |
| /EXTMEM * | GPIO8 | CPIO8 | GPIO8 | GPIO8 | /EXT-MEM (GPIO8) |
| SCPDI0 * | SDA | CDIOUT | GPIO9 | GPIO9 | SDA/CDIOUT |
| DATA[7:0] | GPIO[7:0] | GPIO[7:0] | DATA[7:0] | DATA[7:0] | GPIO[7:0] |

TABLE 54

Host Control Register (HOSTCTL)
Page 2 Address 0x10

| Name | Bits | Description |
|---|---|---|
| MODE | 23:20 | 4-bit field indicating the sampled values of the mode selection lines (/RD,/WR, /SCPDIO, INTREQ) See table above for explanation of modes. Read only. Sampled on rising edge of /RESET; not affected by software reset. |
| BOND | 19:17 | Bond option. Three-bit field indicating the die bond option. Read only. |
|  | 16:11 | Reserved. |
| HATIEN | 10 | Host attention interrupt enable. When host port is in parallel mode and this bit is set, a rising edge of the HATTN bit in the CONTROL register generates an interrupt. |
| /INTREQ_IN | 9 | Always reads the value of the /INTREQ pin. Can be used to determine if another external device has asserted the /INTREQ line. Read-only. |
| /INTREQ | 8 | Interrupt request. This bit controls the interrupt request line in parallel mode. When low, the /INTREQ pin is low. When high, the /INTREQ pin is high. In serial mode, the SCP can also control the /INTREQ pin. Set on reset. |
| HOSTCTL | 7:0 | Read-only copy of the Host Control register. All bits in the host control register are under hardware or host control. |

TABLE 55

General Purpose I/O Register (GPIO)
Page 2 Address 0x11

| Name | Bits | Description |
|---|---|---|
| GPOE | 23:12 | Output enable control signals for GPIO [11:0]. When set, the corresponding GPIO pin is an output. Cleared on reset. |
| GPIO | 11:0 | General-purpose I/O data. A read gives corresponding GPIO pin value. A write sets up data to be driven on pin if the corresponding GPOE bit is set. |

TABLE 56

Serial Control Port Control Register
(SCPCN) Page 2 Address 0x12

| Name | Bits | Description |
|---|---|---|
| ADDR | 23:17 | Address. Seven-bit address of the audio decoder. (AD6–AD0) Cleared at reset. |
| AEN | 16 | Address enable. When high, message address is compared to ADDR. At reset, AEN is set high. |
| ORIEN | 15 | Output ready interrupt enable. When high, low to high transition of ORDY generates interrupt. |
| IRIEN | 14 | Input ready interrupt enable. When high, low to high transition of IRDY generates interrupt. |
| ORDY | 13 | Output ready status bit. Read only. High when SCPOUT is empty. |
| IRDY | 12 | Input ready status bit. Read only. High when SCPIN is full. |
| RJIEN | 11 | Reject interrupt enable. When high, a low to high transition of REJ generates interrupt. This interrupt is shared with HATTN interrupt. |
| REJ | 10 | Reject status bit. Read only. High when input data rejected. |
| FSTB | 9 | Fast mode bit. This bit is set low coming out of reset. When the bit is low, the SCP is configured to operate at much higher bit rates. This mode is useful for downloading the initial program to memory. When the bit is high the SCP conforms to the timing requirements of I²C and SPI formats in slow mode. |
|  | 8:0 | Reserved. |

TABLE 57

Host Data Register (HOSTDATA)
Page 2 Address 0x13

| Name | Bits | Description |
|---|---|---|
|  | 23:8 | Reserved. |
| HOSTDATA SCPIN/ | 7:0 | Host data register. In parallel mode, reads/writes the HOSTMSG register. In |

TABLE 57-continued

Host Data Register (HOSTDATA)
Page 2 Address 0x13

| Name | Bits | Description |
|---|---|---|
| SCPOUT | | serial mode, reads/writes the SCPIN/SCPOUT fields in the Serial Control port Data register. |

Generally, the Host Interface has a total of 16 signal pins. Many pins serve different functions depending on the communications mode.

The host interface mode selection occurs as Decoder 100 exits a reset condition. The rising edge of reset signal received on the RESET pin samples the RD, WR, and SCPDIO (see below) pins to determine the communication mode. At the same time, the INTREQ pin is sampled to determine whether Decoder 100 should initiate an automatic boot cycle. Note that while RESET is low, the INTREQ and SCPDIO pins are configured as inputs. The sampled state of these pins is readable by DSPB 200b in the MODE field of the HOSTCTL register. The MODE bits are read only; the mode cannot be modified by software.

When a parallel mode is selected, four 8-bit registers within parallel port 3203 are visible to the external host. These four registers support host messages to and from the DSP 200b and direct input of data to the input buffers. These registers and their functions from the host's perspective are as follows.

When a parallel mode is selected, DSPB 200b communicates with the host via its HOSTCTL and HOSTDATA registers. The serial control port is disabled when in parallel mode. The GPIO register (GP10 port 3202) may be used to control the GPIO8 and GPIO9 (general purpose I/O) functions on the EXTMEM and SCPDIO pins if desired.

Decoder 100 is configurable to communicate with Intel and Motorola host devices, as defined by the respective vendors.

When serial mode is selected, the host communicates with DSPB 200 via the serial control port (SCP) 3201, DSPB 200b can read and write data to SCP 32 via the HOSTDATA register, which is also referred to as SCPIN and SCPOUT. Serial control port 3201 can operate in I$^2$C or SPI compatible modes. The operating mode is determined at reset as described above. In either mode, the serial control port 3201 performs eight-bit transfers and is always configured as a slave. As a slave, it cannot drive the clock signal nor initiate data transfers. The port can request to be serviced by activating the INTREQ pin. The parallel interface is disabled when in serial mode, but the GPIO controls are still available and can be used to control an external memory.

For normal I$^2$C operation the SCL/SCK, SDA, and INTREQ signals are used. SCL/SCK (pin A0) is the serial clock input that is always driven by an external device. SDA (pin SCPDIO) is the serial data Input/Output signal. INTREQ is the active low request signal, which is driven low when there is valid data in the serial control port 3201 output (SCPOUT) register.

As an I$^2$C compatible port, data is communicated on SDA and is clocked by the rising edge of SCL/SCK. The Signets I$^2$C bus specification provides details of this interface, although this specification allows for rise times of the SCL/SCK line up to 1 us, which Decoder 100 does not allow. Decoder 100 will generally allow rise times on the SCL/SCK line up to 50 nsec. In cases where Decoder 100 will be used in a system where a longer rise time on SCL/SCK is expected, a CMOS compatible buffer should be used. The buffer should only be used for the SCL/SCK direct connection to Decoder 100.

Figure 33:
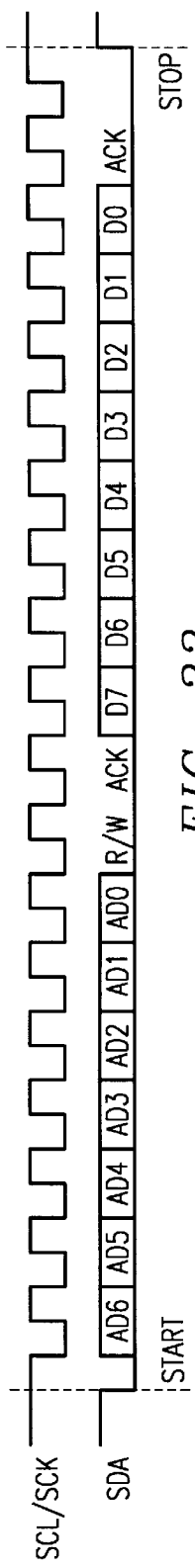
FIG. 33 is a diagram illustrating the relative timing necessary for an $I^2C$ write operation for a single byte.

FIG. 33 illustrates the relative timing necessary for an I$^2$C write operation for a single byte. A 'write' is defined as the transfer of data from an I$^2$C bus master to serial control port 3201. A transfer is initiated with a start condition followed by a 7-bit address and a read/write bit (set low for a write). This address is the address assigned to the device being written to during the transfer. This address is stored in the SCPCN register. Immediately following power up, Address Checking Enable (AEN) bit is set and the I$^2$C address is cleared. This causes the SCP 3201 to only respond to a transaction to address zero the AEN bit must be set to compare the address of the intended I$^2$C device on the bus to its internal address; therefore, Decoder 100 will respond to any address on the I$^2$C bus if AEN is cleared. If Decoder 100 is the only device on the I$^2$C bus, address checking is optional; however, I$^2$C bus protocol is still required. In other words, the address bits and read/write bit are still required.

If a write to Decoder 100 is specified, 8 bits of data on SDA will be shifted into the input shift register. When the shift register is full, the 8-bit data is transferred to the Serial Control port 3201 Input (SCPIN) register on the falling edge of the 8th data bit. An acknowledge bit (ACK) is sent back to the master and the input ready (IRDY) flag is set. This flag generates an interrupt if the input ready interrupt enable (IRIEN) bit is set high.

The I$^2$C bus master can continue to send data, but it will be rejected if the IRDY flag has not yet been cleared. This flag is cleared by reading the SCPIN register. If a byte is rejected, the reject (REJ) flag is set. A rising edge of the REJ flag generates an interrupt if the reject interrupt enable (RJIEN) bit is set high. The REJ flag is cleared by reading the SCPIN register. If there is a failure to acknowledge, it is possible that the byte was rejected and it should be transmitted again. If the second attempt fails the Decoder 100 should be issued a hardware reset to reinitialize the communication path.

Figure 34:
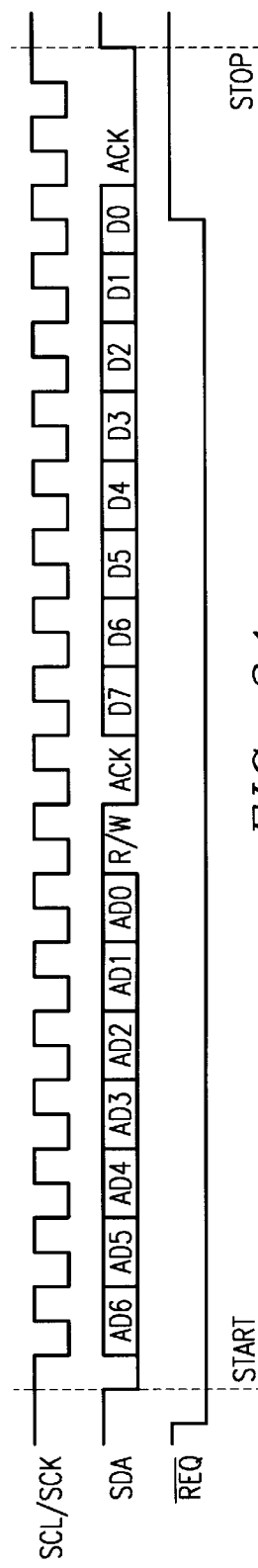
FIG. 34 is a diagram illustrating the relative timing of a single byte read of $I^2C$ data.

If DSPB 200b wants to send a byte to the bus master, it first writes the byte to the Serial Control port 3201 Output (SCPOUT or HOSTDATA) register. Note the DSPB 200b only sends 8 bits per transfer to the SCPOUT register. A write to the SCPOUT sets the request pin INTREQ active low and the output ready (ORDY) bit low. The bus master must recognize the request and issue a read operation to DSP 200b. FIG. 34 is a diagram illustrating the relative timing of a single byte read. The I$^2$C bus master must send the 7-bit address (if address checking is enabled it must match the address in the SCPCN register) and the read bit. Decoder 100 will acknowledge the address and the read bit. After the acknowledge (ACK) on (the falling edge of SCL/SCK), the serial shift register is loaded with the byte to be sent and the most significant bit is placed on the SDA line. In addition, the ORDY is set high. A rising edge of the ORDY bit will generate an interrupt if the output ready interrupt enable (ORIEN) bit is set high.

The 8-bit value in the serial shift register is shifted out by the bus master. The data is valid on the rising edge of SCL/SCK and transitions immediately following the falling edge. For I$^2$C protocol, the INTREQ line will be de-asserted immediately following the rising edge of the last data bit, of the current byte being transferred, if there is no data in the SCPOUT register. The INTREQ line is guaranteed to stay de-asserted (high) until the rising edge of the SCL/SCK for the acknowledge (ACK). This signals the host that the transfer is complete.

If there is data placed in the SCPOUT register prior to the rising edge of SCL/SCK for the last data bit, then INTREQ will remain asserted (low). Immediately following the falling edge of SCL/SCK for the acknowledge (ACK), the new data byte will be loaded into the serial shift register. The host should continue to read this new byte. It is important to note that once the data is in the shift register, clocks on the SCL/SCK line will shift the data bits out of the shift register. A STOP condition on the bus will not prevent this from occurring. The host must read the byte prior to any other bus activity or the data will be lost.

If data is placed in the SCPOUT register after the rising edge of SCL/SCK for the last data bit, but before the rising edge of SCL/SCK for the acknowledge (ACK), INTREQ will not be asserted until after the rising edge of SCL/SCK for the acknowledge (ACK). This should be treated as a completed transfer. The data written to SCPOUT will not be loaded into the shift register on the falling edge of SCL/SCK for the acknowledge (ACK). Therefore, a new read operation is required to read this byte.

For normal SPI operation the SCK, CS, CDIIN, CDIOUT and INTREQ signals are used. SCK (pin A0) is the serial clock input that is always driven by an external device. CS is the active low enable signal. CDIIN (pin A1) is the control data input. CDIOUT (pin SCPDIO) is the control data output. INTREQ is the active low request signal, which is driven low when there is valid data in the serial control port 3201 output SCPOUT register. As an SPI compatible port, data is communicated on the CDIIN and CDIOUT pins and is clocked by the rising edge of SCL/SCK. CS is used to select the device on which the CDIIN and CDIOUT signals will be valid.

Figure 35:
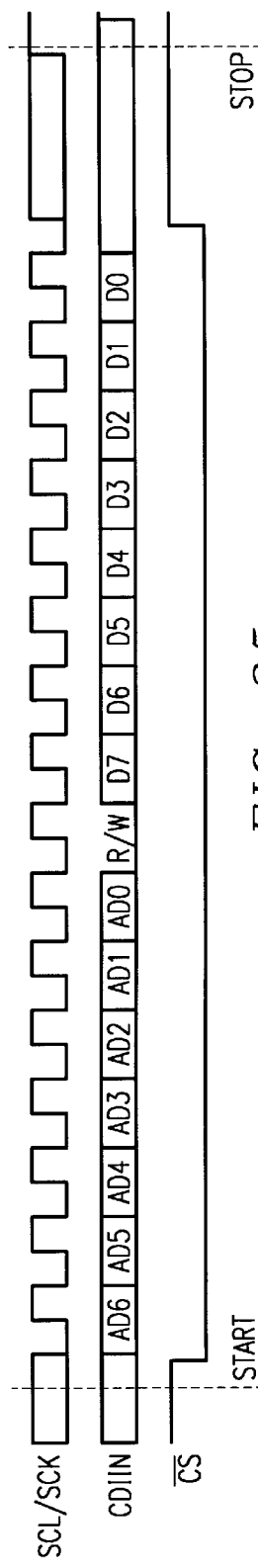
FIG. 35 is a diagram illustrating the relative timing necessary for an SPIF write operation for a single byte.

FIG. 35 is a diagram illustrating the relative timing necessary for an SPI write operation for a single byte. A 'write' is defined as the transfer of data from an SPI bus master to the serial control port 3201 via the CDIIN pin. A transfer is initiated with CS pin being driven active low. This is followed by a 7-bit address and a read/write bit (set low for a write). For SPI mode, this address is typically not used, however it is still necessary to clock an address across the bus SPI followed by the read/write bit.

If a write to Decoder 100 is specified, 8 bits of data on the CDIIN pin will be shifted into the input shift register. When the shift register is full, the 8-bit data is transferred to the Serial Control port Input (SCPIN) register on the falling edge of the 8th data bit and the input ready flag (IRDY) flag is set. This flag generates an interrupt if the input ready interrupt enable (IRIEN) bit is set high.

The bus master can continue to send data, but it will be rejected if the IRDY flag has not yet been cleared. This flag is cleared by reading the SCPIN register. If a byte is rejected, the reject (REJ) flag is set. A rising edge of the REJ flag generates an interrupt if the reject interrupt enable (RJIEN) bit is set high. The REJ flag is cleared by reading the SCPCN register. There is no external hardware mechanism to detect that a byte transferred has failed. However, the microcode executing on Decoder 100 can provide for a solution that would notify the host if a failure had occurred using the REJ bit internally.

Figure 36:
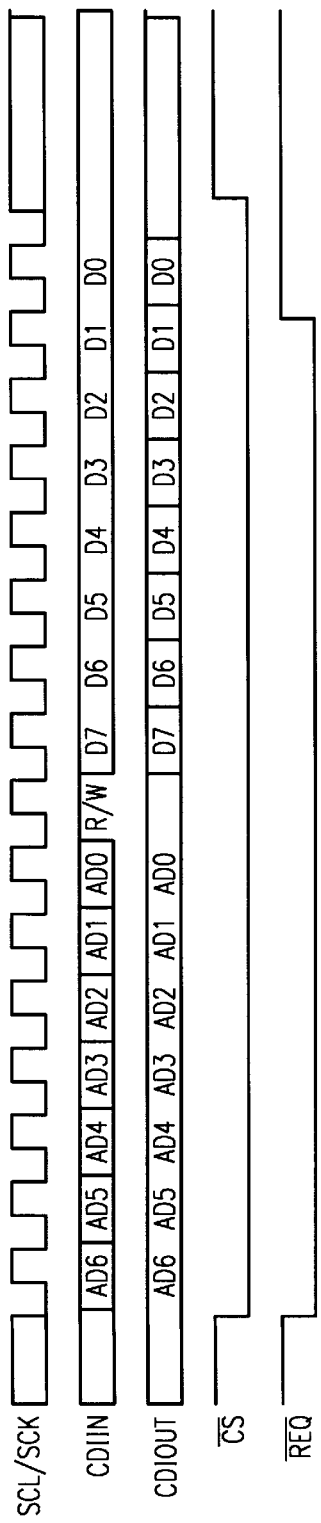
FIG. 36 is a diagram showing the relative timing of a single byte read in the SPIF format.

If DSPB 200*b* wants to send a byte to the SPI bus master, it first writes the byte to the Serial Control port Output (SCPOUT) register. Note DSP 200*b* only sends 8 bits per transfer to the SCPOUT register. A write to the SCPOUT sets the request pin (INTREQ) active low and the output ready (ORDY) bit low. The bus master must recognize the request and issue a read operation to DSP 200*b*. FIG. 36 is a diagram showing the relative timing of a single byte read.

In this case, the bus master must send the 7-bit address (if address checking is enabled it must match the address in the SCPCN register) and the read bit. After the falling edge of SCL/SCK for the read/write bit, the serial shift register is loaded with the byte to be sent and the most significant bit is placed on the CDIOUT line. In addition, the ORDY bit is set high; a rising edge of the ORDY bit will generate an interrupt if the output ready interrupt enable (ORIEN) bit is set high.

The 8-bit value in the serial shift register is shifted out by the bus master. The data is valid on the rising edge of SCL/SCK and transitions immediately following the falling edge. For the SPI protocol, the INTREQ line will be de-asserted immediately following the rising edge of the second to last data bit, of the current byte being transferred, if there is no data in the SCPOUT register. The INTREQ line is guaranteed to stay de-asserted (high) until the rising edge of the SCL/SCK for the last data bit. This signals the host that the transfer is complete.

If there is data placed in the SCPOUT register prior to the rising edge of SCL/SCK for the second to last data bit, then INTREQ flag will remain asserted (low). Immediately following the falling edge of SCL/SCK for the last data bit, the new data byte will be loaded into the serial shift register. The host should continue to read this new byte. It is important to note that once the data is in the shift register, clocks on the SCL/SCK line will shift the data bits out of the shift register. The host should read the byte prior to any other bus activity or the data will be lost. If the CS bit signal is de-asserted SCK/SCL will not shift the data out; however, the data is still in the shift register. Once CS bit becomes active (low) each SCL/SCK will shift the data out of the register.

If data is placed in the SCPOUT register after the rising edge of SCL/SCK for the second to last data bit, but before the rising edge of SCL/SCK for the last data bit, INTREQ flag will not be asserted until after the rising edge of SCL/SCK for the last data bit. This should be treated as a completed transfer. The data written the to the SCPOUT register will not be loaded into the shift register on the falling edge of SCL/SCK for the last data bit. In other words, a new read operation is required to read this byte.

The debugging facility consists of an on-chip serial Debug port 304, a cable to connect a PC-compatible parallel port to the Debug port pins (DBCLK, DBDA), and software to run on that computer. The software allows the computer to load programs, set breakpoints, read and write registers and memory, and single step programs.

Each DSP 200 includes a debug ROM containing the interrupt service routine that interprets commands sent from the computer. Commands can be directed to either DSP core 200*a* or 200*b*, but only to one at a time. Debug port 304 is shared between the two DSP cores 200: each DSP has its own Debug port Status register.

Debug port 304 can generate a debug interrupt to either DSP. This interrupt is a unique signal that can interrupt the processor independent of the state of the IEN control bit. This interrupt can be enabled or disabled by setting or clearing the Non-Maskable Interrupt Enable (NMIEN) control register bit. The default state is enabled (NMIEN=1). The NMIEN bit is cleared (NMIEN=0) when a debug interrupt occurs and it is set when an RETI instruction is executed. Writing to the control register can also change the state of NMIEN.

Figure 37:
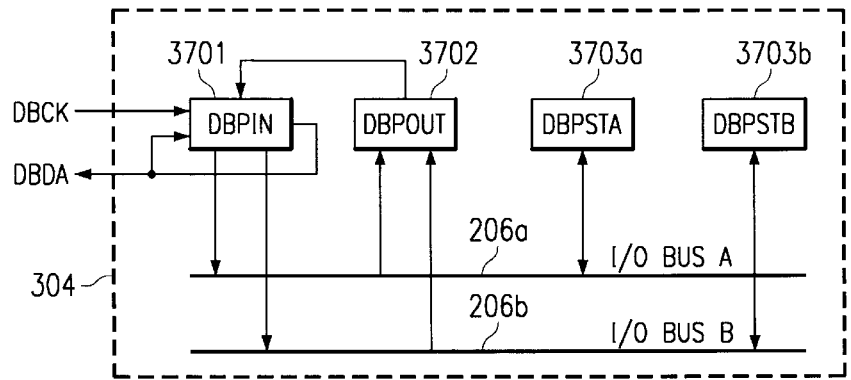
FIG. 37 is a diagram of the Debug Port of FIG. 13.

FIG. 37 is a diagram of Debug Port 304. The internal serial Debug port hardware consists of a 24-bit input shift register 3701 (DBPIN), a 24-bit output register (DBPOUT), and two status registers (DBPSTA, DBPSTB). The register and bitfield definitions for Debug Port 304 are provided.

The DBPIN and DBPOUT registers 3701 and 3702 are mapped to I/O address 0x0C, which appears in the lower half of all I/O pages. The DPBST 3703*a* and 3703*b* registers are mapped to I/O address 0x0D. Although they occupy the same logical address, each DSP 200 has its own DBPST 3703 register and cannot access the other DSP's debug status register (this is similar to the STATUS/SHADOW registers in the DSP cores).

Figure 38:
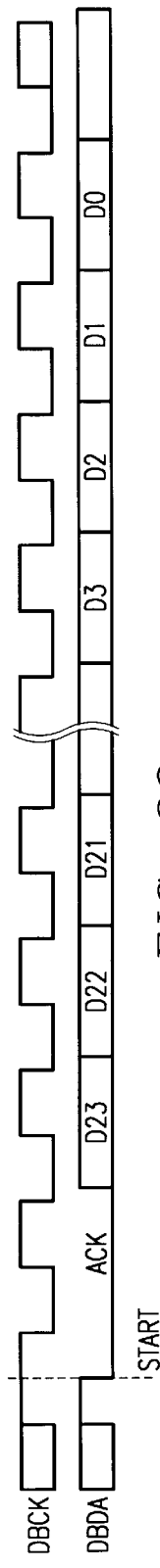
FIG. 38 illustrates an example of the write timing sequence during debugging.

The host PC can initiate a write to Debug port 304 by issuing a 'write start' sequence, which is a falling edge of signal DBDA with clock DBCK held high. An example of the write timing sequence is shown in FIG. 38. Debug port 304 acknowledges the start sequence by a low output on the DBDA line after the first falling edge of clock DBCK. The host then shifts in 24 data bits, MSB first, through DBPIN register 3701. Once the 24th data bit is received, debug port 304 generates a debug interrupt to the appropriate DSP based on a DBINT flag within the corresponding status register 3703 and the MSB of DBPIN register 3701.

If the DBINT flag is cleared in both the DBPSTA (3703*a*) and DBPSTB (3703*b*) registers, the MSB of the DBPIN value is used to determine which DSP to interrupt (1=DSPA, 0=DSPB), and the IRDY flag in the associated DBPST register 3703 is set. If the DBINT flag is set in DBPSTA or DBPSTB (3703*a* or 3703*b*), then the associated DSP 200 is interrupted regardless of the DBPIN value. Note that in either case, the IRDY flag for that DSP 200 not interrupted is not set. This allows independent polling or interrupt driven communication between the host and the DSPs.

The IRDY flag is cleared by software by a write from the DSP after each input word is received. If the DBINT flag is set in both the DBPSTA and DBPSTB registers, a DBERR flag is set and both DSPs 200 are interrupted. This scheme supports a command message system where the first word of a message utilizes the MSB of DBPIN to interrupt a specific DSP core 200. If needed, that DSP core 200 can then gain exclusive interrupt privileges for the remaining words of the message by setting its DBINT. After parsing the complete message, the DSP can then release exclusive interrupts and return to the command mode by clearing DBINT. The debugger should coordinate messaging so that both DSPs do not request exclusive interrupt privileges at the same time. However, a DBERR flag common to both DSPs is provided to indicate this condition if it occurs.

Figure 39:
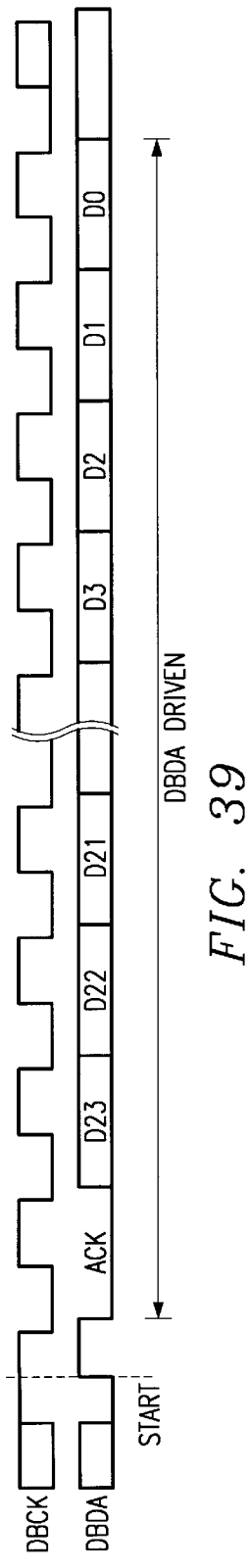
FIG. 39 is an example of the read timing sequence during debugging.

A DSP 200 can also transmit data back to the host, although the host must initiate such a read. An example of the read timing sequence is shown in FIG. 39. The given DSP 200 writes to DBPOUT register 3702 to send a word of data to the host. Writing DBPOUT 3702 register clears the ORDY bit. The host PC can then initiate a read from debug port 304 by issuing a 'read start' sequence that is a rising edge of signal DBDA with clock DBCK held high. Debug port 304 will acknowledge the start sequence by a low output after the first falling edge of clock if there is valid data in DBPOUT to send (ORDY=0). If the given DSP 200 has not written to DBPOUT register 3702, bit ORDY is high and Debug port 304 will output a high level to the host during the acknowledge phase to indicate that there is no data to send.

A valid acknowledge sequence also causes the contents of the DBPOUT register 3702 to be transferred to DBPIN shift register 3701. The host then shifts out of DBPIN register 3701 24 data bits MSB first. Once the 24th data bit is transmitted, Debug port 304 releases the DBDA line and sets the ORDY bit. This rising edge of ORDY generates an interrupt back to the given DSP 200, if the DBINT flag is set. This provides a mechanism for interrupt-driven transmission of multi-word messages from either DSP 200 to the host processor. If the DBINT flag is cleared, no interrupt is generated by ORDY.

Figure 40:
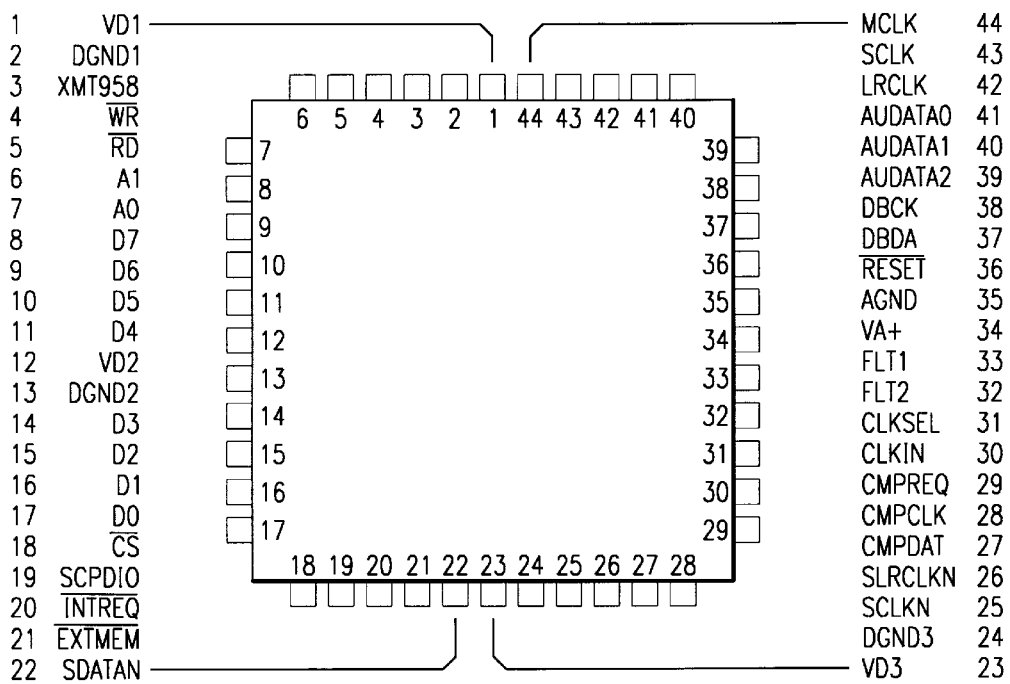
FIG. 40 is a diagram of a representative pin organization for decoder 100.

FIG. 40 is a diagram of a representative pin organization of Decoder 100. The particular pins can generally be described as follows:

Power Supplies:

VD1, VD2, VD3—Positive Digital Power Supply (Pins 1, 12 and 23). The +3.3V supply is connected to these pins to power the digital portion of the chip.

DGND1, DGND2, DGND3—Digital Ground Digital power supply ground.

VA+—Positive Analog Power Supply (Pin 34) The analog +3.3V supply for the PLL. The PLL performance is highly dependent on the quality of this supply.

AGND—Analog Ground (Pin 35) Analog power supply ground.

Compressed Data Input:

CMPDAT—Compressed Data Input (Pin 27) Audio data input to CMPDAT is clocked into the device by CMP-CLK. The compressed data input port may be configured to accept data in several I$^2$S compatible formats or as a simple data stream. When the CDI port is configured in S/PDIF receive mode, the CMP-DAT pin is a TTL input for biphase encoded data.

CMPCLK—Compressed Data Clock (Pin 28) CMPCLK is used to clock serial audio data on CMPDAT into the device. CMPCLK can be configured as an input in slave mode or as an output in master mode. The active edge and data formats are programmable and are controlled by the CDI port configuration.

CMPREQ—Compressed Data Request (Pin 29) CMPREQ can be used to delineate left and right audio data, or as a data request output. For serial audio formats, the CMPREQ pin can be configured as a slave mode input clock or master mode output clock running at the sample rate frequency. For compressed data formats, the CMPREQ pin can be used to request data from an external source. THE CMPREQ pin functions are programmable and are controlled by the CDI port configuration.

Digital Audio Input:

SCLKN—Serial Bit Clock (Pin 25) SCLKN is used to clock serial audio data on SDATAN into the device. SCLKN can be configured as an input in slave mode or as an output in master mode. The active edge and data formats are programmable and are controlled by the DAI port configuration.

SLRCLKN—Serial Sample Rate Clock (Pin 26) SLR-CLKN is used to delineate left and right audio data. The SLRCLKN pin can be configured as an input in slave mode or as an output in master mode. The SLRCLKN pin functions are programmable and are controlled by the DAI port configuration.

SDATAN—Serial Audio Data Input (Pin 22) Audio data input to SDATAN is clocked into the device by SCLKN. The DAI port may be configured to accept data in several I$^2$S compatible formats or as a simple data stream. The SDATAN pin functions are controlled by the DAI port configuration.

Digital Audio Transmitter:

Decoder 100—S/PDIF Transmit Output (Pin 3) Biphase mark encoded data is output at logic levels from the decoder 100 pin. This output typically connects to the input of an RS-422 or optical transmitter.

Clock Manager:

CLKIN—Clock Input (Pin 30) A clock input to the CLKIN is used to synchronize the PLL. The permissible frequency range is from 32 KHz to 50 MHz. A typical clock input is 27 MHz for an MPEG system, or a multiple of the audio SCLK rate for other applications.

CLKSEL—Clock Select Input (Pin 31) When CLKSEL is high, the CLKIN pin bypasses the PLL and drives the DSP clock directly. When low, CLKIN can be a reference input to the PLL. Note that CLKSEL should be tied directly to either digital power or ground for proper operation.

FLT1, FLT2—PLL Filter Capacitor (Pin 33, 32) A capacitor (typically 0.22 uF) connected across these pins filters the control voltage for the on-chip VCO. Trace lengths to these pins should be minimized. Note that FLT1 (Pin 33) should be connected to the positive terminal of the capacitor.

Control:

DBCK, DBDA—Debug Clock, Debug Data I/O (Pin 38,37) These pins are used for the serial debug port. DBCK clocks the data into or out of the debug port. DBDA is a bi-directional data I/O. Software and a cable are available to interface the debug port to a PC. It is required that a pullup be used on the DBDA pin for proper operation. When not in use, both pins should be pulled up to the digital supply through an external resistor.

/RESET—Chip Reset (Pin 36) The decoder 100 enters a reset state while /RESET is low. When in reset, all internal registers are initialized and the chip is disabled.

Host Interface:

/INTREQ—Interrupt Request Output (Pin 20) This open drain pin is driven low when the DSP needs servicing from an external device. In serial host mode, a DSP write to the serial control port will cause /INTREQ to go low. In the parallel mode, the DSP can control the /INTREQ pin to request servicing from an external host. The /INTREQ pin is also used to enable autoboot mode if held low at the rising edge of /RESET. A pullup resistor is required for proper operation.

/CS—Chip Select (Pin 18) This pin serves as the active low chip select input for Intel or Motorola parallel mode and for SPI serial mode. For I$^2$C compatible serial mode, the /CS pin should be tied high.

/RD—Read Strobe (Pin 5) In Intel parallel mode, this pin is the active low read strobe. In Motorola parallel mode, this pin is the /RW select input. In either serial mode, this pin may be used as a general purpose I/O pin. The /RD pin is sampled at the rising edge of /RESET to determine the host interface mode.

/WR—Write Strobe (Pin 4) In Intel parallel mode, this pin is the active low write strobe. In Motorola parallel mode, this pin is the /DS data strobe input. In either serial mode, this pin may be used as a general purpose I/O pin. The /WR pin is sampled at the rising edge of /RESET to determine the host interface mode.

A0—Host Address 0 (Pin 7) In parallel mode, A0 is bit 0 of the 2-bit host interface register address. In serial mode, the A0 pin is the serial clock input (SCK in SPI mode or SCL in I$^2$C mode)

A1—Host Address 1 (Pin 6) In parallel mode, A1 is a bit 1 of the 2-bit host interface register address. In SPI serial mode, the A1 pin is the serial data input pin (CD1). In I$^2$C serial mode, this pin is unused and should be tied high.

SCPDIO—Serial Control Port Data (Pin 19) In I$^2$C serial mode, SCPDIO functions as an open drain bidirectional data pin (SDA). In SPI serial mode, SCPDIO is the serial data output pin (CDOUT). In either parallel mode, this pin may be used as a general purpose I/O pin. The SCPDIO pin is also sampled at the rising edge of /RESET to determine the parallel host interface mode.

D7:D0—Parallel Host Data (Pins 8–11, 14–17) In parallel host mode, these pins are an 8-bit bidirectional data bus. In serial host mode, these pins may be used as general purpose I/O pins. Alternatively, if a serial host mode is selected and the autoboot function is enabled, these pins act as a multiplexed address and data bus to access an external memory.

/EXTMEM—External Memory Chip Select (Pin 21) The /EXTMEM pin acts as an active low chip select for an external memory if autoboot mode is selected. Otherwise, the/EXTMEM pin may be configured as a general purpose I/O pin.

Digital Audio Output:

MCLK—Audio Master Clock (Pin 44) This pin is the master clock for the audio output unit. In slave mode, the MCLK pin is an input which can drive the digital audio output and transmitter ports. In master mode, MCLK is generated from the Internal PLL. The frequency of MCLK is selectable in software.

SCLK—Audio Output Bit Clock (Pin 43) This clock is used to shift data out on the AUDATA2–AUDAT0 pins. The SCLK pin can be configured as an input in slave mode or as an output in master mode. The SCLK rate is programmable and is controlled by the DAO port configuration.

LRCLK—Audio Output Sample Clock (Pin 42) This signal indicates which channel is currently being output on the AUDATA2–AUDAT0 pins, and is the same rate as the sample rate. The LRCLK pin can be configured as an input in slave mode or as an output in master mode. The LRCLK rate is programmable and is controlled by the DAO port configuration.

AUDATA2:AUDATA0—Audio Data Outputs (Pins 39–41) Two complement MSB first serial data is output on these pins. The data is clocked by SCLK and the channel is determined by LRCLK. The DA0 supports multiple data formats for the AUDATA pins. Data formats are programmable and are controlled by the DAO port configuration.

The principles of the present invention further allow for methods of decoding compressed audio data, as well as for methods and software for operating decoder 100. These principles will be discussed in further detail below. Initially, a brief discussion of the theory supporting the derivation of these principles will be undertaken.

The Host can choose between serial and parallel boot modes during the reset sequence. The Host interface mode and autobit mode status bits, available to DSPB 200*b* in the HOSTCTL register MODE field, control the boot mode selection. Since the host or an external host ROM always communicates through DSPB, DSPA 200*a* receives code from DSPB in the same fashion, regardless of the host mode selected.

As applications become more complex it is all the more necessary to adopt a top-down design approach, i.e. specify the hardware requirements based on the application, particularly the application software implementation. Typical algorithm-dependent requirements are processor speed, memory, precision (resolution), dynamic range and distortion. Of these, processor speed and memory requirements are highly dependent on the particular implementation and cannot be easily mapped from one system to another.

In addition, in a dual-processor environment like decoder 100, it is important to partition the application optimally between the two processors to maximize processor usage and minimize inter-processor communication. For this the dependencies and scheduling of the tasks of each processor must be analyzed. The algorithm must be partitioned such that one processor does not unduly wait for the other and later be forced to catch up with pending tasks.

After a firm understanding of the application, the first step is to develop first-generation DSP code for each major module of the algorithm. This step will also reveal any possible tradeoffs between hardware and software implementation, e.g. special hardware for CRC or optimized DSP instructions etc. As mentioned above, the design process is iterative since hardware/software optimization performed later in the design process will alter many initial estimates, which in turn may affect other design decisions.

For example, in most audio decompression tasks including Dolby AC-3, the algorithm being executed consists of 2 major stages: 1) parsing the input bitstream with specified/computed bit allocation and generating frequency-domain transform coefficients for each channel; and 2) performing the inverse transform to generate time-domain PCM samples for each channel. After generating initial DSP code for each major module one has a reliable estimate of MIPS (processor usage) and memory requirements. In addition, the bandwidth, scheduling and type of data flowing from one module to the next is also known. Based on this and the hardware resources available in each processor, and accounting for other housekeeping tasks the algorithm can be suitably partitioned.

Once the partition is known, the MIPS and memory requirements for each processor can be generated. Adding in estimates for the I/O and control tasks the overall processor speed and memory requirements can be derived.

The first-generation DSP code also reveals the dynamics of the overall decode process. This information is very important in determining the scheduling of tasks of each processor and thereby the interprocessor communication requirements.

Usually, the application will explicitly specify the desired output precision, dynamic range and distortion requirements. Apart from the intrinsic limitation of the compression algorithm itself, in an audio decompression task the inverse transform (reconstruction filter bank) is the stage which determines the precision of the output. Due to the finite-length of the registers in the DSP, each stage of processing (multiply+accumulate) will introduce noise due to elimination of the lesser significant bits. Adding features such as rounding and wider intermediate storage registers can alleviate the situation.

For example, Dolby AC-3 requires 20-bit resolution PCM output which corresponds to 120 dB of dynamic range. The decoder uses a 24-bit DSP which incorporates rounding, saturation and 48-bit accumulators in order to achieve the desired 20-bit precision.

In addition, analog performance should at least preserve 95 dB S/N and have a frequency response of +/−0.5 dB from 3 Hz to 20 kHz.

In a complex real-time system (embedded or otherwise) each sub-system has to perform its task correctly, at the right time and cohesively with all other sub-systems for the overall system to work successfully. While each individual sub-system can be tested and made to work correctly, first attempts at integration most often result in system failure. This is particularly true of hardware/software integration. While the new design methodology, according to the principals of the present invention, can considerably reduce hardware/software integration problems, a good debug strategy incorporated at the design phase can further accelerate system integration and application development. A major requirement of the debug strategy that it should be simple and reliable for it to be confidently used as a diagnostic tool.

Debuggers can be of two kinds: static or dynamic. Static debugging involves halting the system and altering/viewing the states of the various sub-systems via their control/status registers. This offers a lot of valuable information especially if the system can automatically "freeze" on a breakpoint or other trapped event that the user can pre-specify. However, since the system has been altered from its run-time state, some of the debug actions/measurements could be irrelevant, e.g. timer/counter values.

Dynamic debugging allows one to do all the above while the system is actually running the application. For example, one can trace state variables over time just like a signal on an oscilloscope. This is very useful in analyzing real-time behavior. Alternatively, one could poll for a certain state in the system and then take suitable predetermined action.

Both types of debugging require special hardware with visibility to all the sub-systems of interest. For example, in a DSP-based system-on-a-chip (see FIG. 1) the debug hardware would need access to all the sub-systems connected to the DSP core, and even visibility into the DSP core. Furthermore, dynamic debugging is more complex than its static counterpart since one has to consider problems of the debug hardware contending with the running sub-systems. Unlike a static debug session, one cannot hold off all the system hardware during a debug session since the system is active. Typically, this requires dual-port access to all the targeted sub-systems.

While the problems of dynamic debugging can be solved with complicated hardware there is a simpler solution which is just as effective while generating only minimal additional processor overhead. Assuming that there is a single processor (like a DSP core), in the system with access to all the control/state variables of interest, a simple interrupt-based debug communication interface can be built for this processor. The implementation could simply be an additional communication interface to the DSP core. For example, this interface could be 2-wire clock+data interface where a debugger can signal read/write requests with rising/falling edges on the data line while holding the clock line high, and debug port sends back an active low acknowledge on the same data line after the subsequent falling edge of the clock.

A debug session involves read/write messages sent from an external PC (debugger) to the processor via this simple debug interface. Assuming multiple-word messages in each debug session, the processor accumulates each word of the message by taking short interrupts from the main task and reading from the debug interface. Appropriate backup and restore of main task context are implemented to maintain transparency of the debug interrupt. Only when the processor accumulates the entire message (end of message determined by a suitable protocol) is the message serviced. In case of a write message from the PC, the processor writes the specified control variable(s) with specified data.

In case of a read request from the PC, the processor compiles the requested information into a response message, writes the first of these words into the debug interface and simply returns to its main task. The PC then pulls out the response message words via the same mechanism—each read by the PC causes an interrupt to the processor which reloads the debug interface with the next response word till the whole response message is received by the PC.

Such a dynamic debugger can easily operate in static mode by implementing a special control message from the PC to the processor to slave itself to the debug task until instructed to resume the application.

When there are more than one processor in the system the conventional debug strategy discussed above can be directly extended, since there is already provision for dual port access to all the sub-systems of interest. However, to use the above simplified strategy in a dual-DSP system like decoder 100 requires changes.

Each processor in such a system will usually have dedicated resources (memory, internal registers etc.) and some shared resources (data input/output, inter-processor communication, etc.). A dedicated debug interface for each processor is also possible, but is avoided since it is more expensive, requires more connections, and increases the communication burden on the PC. Instead, the preferred method is using a shared debug interface through which the PC user can explicitly specify which processor is being targeted in the current debug session via appropriate syntax in the first word of the messaging protocol. On receiving this first word from the PC, the debug interface initiates communication only with the specified processor by sending it an initial interrupt. Once the targeted processor receives this interrupt it reads out the first word, and assumes control of the debug interface (by setting a control bit) and directs all subsequent interrupts to itself. This effectively holds off the other processor(s) for the duration of the current debug session. Once the targeted processor has received all the words in the debug message, it services the message. In case of a write message, it writes the specified control variable(s) with the specified data and then relinquishes control of the debug interface so that the PC can target any desired processor for the next debug session.

In case of a read request, the corresponding read response has to make its way back from the processor to the PC before the next debug session can be initiated. The targeted processor prepares the requested response message, places the first word in the debug interface and then returns to its main task. Once the PC pulls this word out, the processor receives an interrupt to place the next word. Only after the complete response message has been pulled out does the processor relinquish the debug interface so that the PC can start the next debug session with any desired processor.

Since there are multiple processors involved, this scheme advantageously effectively prohibits unsolicited transactions from a processor to the PC debugger. This constraint precludes many contention issues that would otherwise have to be resolved.

Since the PC debugger can communicate with every processor in the system, the scope of control and visibility of the PC debugger includes every sub-system that can be accessed by the individual processors. This is usually quite sufficient for even advanced debugging.

Whether static or dynamic, all the functions of a debugger can be viewed as reading state variables or setting control variables. However, traps and breakpoints are worthy of special discussion.

During a debug session, when the PC user desires to setup a breakpoint at a particular location in the program of the processor, it has to backup the actual instruction at that location and replace it with a trap instruction. The trap is a special instruction designed such that the processor takes a dedicated high priority interrupt when it executes this instruction. It basically allows a pre-planned interruption of the current task.

In the single-processor strategy, when the processor hits a trap it takes an interrupt from the main task, sends back an unsolicited message to the PC, and then dedicates itself to process further debug messages from the PC (switches to static mode). For example the PC could update the screen with all the system variables and await further user input. When the user issues a continue command, the PC first replaces the trap instruction with the backed-up (original) instruction and then allows the processor to revert to the main task (switches to dynamic mode).

In the multi-processor debug strategy, unsolicited messages from a processor to the PC are prohibited in order to resolve hardware contention problems. In such a case, the breakpoint strategy needs to be modified. Here, when a processor hits a trap instruction, it takes the interrupt from its main task, sets a predetermined state variable (for example, Breakpoint_Flag), and then dedicates itself to process further debug messages from the PC (switches to static mode). Having setup this breakpoint in the first place, the PC should be regularly polling the Breakpoint_Flag state variable on this processor—although at reasonable intervals so as not to waste processor bandwidth. As soon as it detects Breakpoint_Flag to be set, the PC issues a debug message to clear this state variable to setup for the next breakpoint. Then, the PC proceeds just as in the single-processor case.

All other program flow debug functions, such as step into, step over, step out of, run to cursor etc. are implemented from the PC by appropriately placing breakpoints and allowing the processor to continue and execute the desired program region.

Based on application and design requirements, a complex real-time system, such as audio decoder 100, is usually partitioned into hardware, firmware and software. The hardware functionality described above is implemented such that it can be programmed by software to implement different applications. The firmware is the fixed portion of software portion including the boot loader, other fixed function code and ROM tables. Since such a system can be programmed, it is advantageously flexible and has less hardware risk due to simpler hardware demands.

There are several benefits to the dual core (DSP) approach according to the principles of the present invention. DSP cores 200A and 200B can work in parallel, executing different portions of an algorithm and increasing the available processing bandwidth by almost 100%. Efficiency improvement depends on the application itself. The important thing in the software management is correct scheduling, so that the DSP engines 200A and 200B are not waiting for each other. The best utilization of all system resources can be achieved if the application is of such a nature that can be distributed to execute in parallel on two engines. Fortunately, most of the audio compression algorithms fall into this category, since they involve a transform coding followed by fairly complex bit allocation routine at the encoder. On the decoder side the inverse is done. Firstly, the bit allocation is recovered and the inverse transform is performed. This naturally leads into a very nice split of the decompression algorithm. The first DSP core (DSPA) works on parsing the input bitstream, recovering all data fields, computing bit allocation and passing the frequency domain transform coefficients to the second DSP (DSPB), which completes the task by performing the inverse transform (IFFT or IDCT depending on the algorithm). While the second DSP is finishing the transform for a channel n, the first DSP is working on the channel n+1, making the processing parallel and pipelined. The tasks are overlapping in time and as long as tasks are of the same complexity, there will be no waiting on either DSP side.

Decoder 100, as discussed above, includes shared memory of 544 words as well as communication mailbox (IPC block 1302) consisting of 10 I/O registers (5 for each direction of communication).

One set of communication registers looks like this (a) AB_command_register (DSPA write/read, DSPB read only)

(b) AB_parameter1_register (DSPA write/read, DSPB read only)

(c) AB_parameter2_register (DSPA write/read, DSPB read only)

(d) AB_message_semaphores (DSPA write/read, DSPB write/read as well)

(e) AB_shared_memory_semaphores (DSPA write/read, DSP B read only) where AB denotes the registers for communication from DSPA to DSPB. Similarly, the BA set of registers exists.

Shared memory 204 is used as a high throughput channel, while communication registers serve as low bandwidth channel, as well as semaphore variables for protecting the shared resources.

Both DSPA and DSPA(200) can write to or read from shared memory 204. However, software management provides that the two DSPs never write to or read from shared memory in the same clock cycle. It is possible, however, that one DSP writes and the other reads from shared memory at the same time, given a two-phase clock in the DSP core. This way several virtual channels of communications could be created through shared memory. For example, one virtual channel is transfer of frequency domain coefficients of AC-3 stream and another virtual channel is transfer of PCM data independently of AC-3. While DSPA is putting the PCM data into shared memory, DSPB might be reading the AC-3 data at the same time. In this case both virtual channels have their own semaphore variables which reside in the AB_shared_memory_semaphores registers and also different physical portions of shared memory are dedicated to the two data channels. AB_command_register is connected to the interrupt logic so that any write access to that register by DSPA results in an interrupt being generated on the DSP B, if enabled. In general, I/O registers are designed to be written by one DSP and read by another. The only exception is AB_message_sempahore register which can be written by both DSPs. Full symmetry in communication is provided even though for most applications the data flow is from DSPA to DSP B. However, messages usually flow in either direction. So there is another set of 5 registers with BA prefix, for communication from DSPB to DSPA.

The AB_message_sempahore register is very important since it synchronizes the message communication. For example, if DSPA wants to send the message to DSPB, first it must check that the mailbox is empty, meaning that the previous message was taken, by reading a bit from this register which controls the access to the mailbox. If the bit is cleared, DSPA can proceed with writing the message and setting this bit to 1, indicating a new state, transmit mailbox full. The DSPB may either poll this bit or receive an interrupt (if enabled on the DSPB side), to find out that new message has arrived. Once it processes the new message, it clears the flag in the register, indicating to DSPA that its transmit mailbox has been emptied. If DSPA had another message to send before the mailbox was cleared it would have put in the transmit queue, whose depth depends on how much message traffic exists in the system. During this time DSPA would be reading the mailbox full flag. After DSPB has cleared the flag (set it to zero), DSPA can proceed with the next message, and after putting the message in the mailbox it will set the flag to I. Obviously, in this case both DSPs have to have both write and read access to the same physical register. However, they will never write at the same time, since DSPA is reading flag until it is zero and setting it to 1, while DSPB is reading the flag (if in polling mode) until it is 1 and writing a zero into it. These two processes a staggered in time through software discipline and management.

When it comes to shared memory a similar concept is adopted. Here the AB_shared_memory_semaphore register is used. Once DSPA computes the transform coefficients but before it puts them into shared memory, it must check that the previous set of coefficients, for the previous channel has been taken by the DSPB. While DSPA is polling the semaphore bit which is in AB_shared_memory_semaphore register it may receive a message from DSPB, via interrupt, that the coefficients are taken. In this case DSPA resets the semaphore bit in the register in its interrupt handler. This way DSPA has an exclusive write access to the AB_shared memory_semaphore register, while DSPB can only read from it. In case of AC-3, DSPB is polling for the availability of data in shared memory in its main loop, because the dynamics of the decode process is data driven. In other words there is no need to interrupt DSPB with the message that the data is ready, since at that point DSPB may not be able to take it anyway, since it is busy finishing the previous channel. Once DSPB is ready to take the next channel it will ask for it. Basically, data cannot be pushed to DSPB, it must be pulled from the shared memory by DSPB.

The exclusive write access to the AB_shared_memory_semaphore register by DSPA is all that more important if there is another virtual channel (PCM data) implemented. In this case, DSPA might be putting the PCM data into shared memory while DSPB is taking AC-3 data from it. So, if DSPB was to set the flag to zero, for the AC-3 channel, and DSPA was to set PCM flag to 1 there would be an access collision and system failure will result. For this reason, DSPB is simply sending message that it took the data from shared memory and DSPA is setting shared memory flags to zero in its interrupt handler. This way full synchronization is achieved and no access violations performed.

When designing a real time embedded system both hardware and software designers are faced with several important trade-off decisions. For a given application a careful balance must be obtained between memory utilization and the usage of available processing bandwidth. For most applications there exist a very strong relationship between the two: memory can be saved by using more MIPS or MIPS could be saved by using more memory. Obviously, the trade-off exists within certain boundaries, where a minimum amount of memory is mandatory and a minimum amount of processing bandwidth is mandatory.

An example of such trade-off in the AC-3 decompression process is decoding of the exponents for the sub-band transform coefficients. The exponents must arrive in the first block of an AC-3 frame and may or may not arrive for the subsequent blocks, depending on the reuse flags. But also, within the block itself, 6 channels are multiplexed and the exponents arrive in the bitstream compressed (block coded) for all six channels, before any mantissas of any channel are received. The decompression of exponents has to happen for the bit allocation process as well as scaling of mantissas. However, once decompressed, the exponents might be reused for subsequent blocks. Obviously, in this case they would be kept in a separate array (256 elements for 6 channels amounts to 1536 memory locations). On the other hand, if the exponents are kept in compressed form (it takes only 512 memory locations) recomputation would be required for the subsequent block even if the reuse flag is set. In decoder 100 the second approach has been adopted for two reasons: memory savings (in this case exactly lk words) and the fact that in the worst case scenario it is necessary to recompute the exponents anyway.

The proper input FIFO is important not only for the correct operation of the DSP chip itself, but it can simplify the overall system in which decoder 100 reside. For example, in a set-top box, where AC-3 audio is multiplexed in the MPEG2 transport stream, the minimum buffering requirement (per the MPEG spec) is 4 kbytes. Given the 8 kbyte input FIFO in decoder 100 (divisible arbitrarily in two, with minimum resolution of 512 bytes), any audio bursts from the correctly multiplexed MPEG2 transport stream can be accepted, meaning that no extra buffering is required upstream in the associated demux chip. In other words, demux will simply pass any audio data directly to the codec 100, regardless of the transport bit rate, thereby reducing overall system cost.

Also, a significant amount of MIPS can be saved in the output FIFOs, which act as a DMA engine, feeding data to the external DACs. In case there are no output FIFOs the DSP has to be interrupted at the Fs rate (sampling frequency rate). Every interrupt has some amount of overhead associated with switching the context, setting up the pointers, etc. In the case of the codec 100, a 32 sample output is provided FIFO with half-empty interrupt signal to the DSP, meaning that the DSP is now interrupted at Fs/16 rate. Subsequently, any interrupt overhead is reduced by a factor of 16 as well, which can result in 2–3 MIPS of savings.

In the dual DSP architecture of decoder 100 the amount of shared memory is critical. Since this memory is essentially dual ported resulting in much larger memory cells and occupying much more die area, it is very critical to size it properly. Since decoder 100 has two input data ports, and the input FIFO is divisible to receive data simultaneously from the two ports, the shared memory was also designed to handle two data channels. Since the size of one channel of one block of AC-3 data is 256 transform coefficients a 2*256 element array has been allocated. That is, 256 PCM samples can be transferred at the same time while transferring AC-3 transform coefficients. However, to keep two DSP cores 200*a* and 200*b* in sync and in the same context, an additional 32 memory locations are provided to send a context descriptor with each channel from DSPA to DSPB. This results in the total shared memory size of 544 elements, which is sufficient not only for AC-3 decompression implementation but also for MPEG 5.1 channel decompression as well as DTS audio decompression.

The PCM buffer size is another critical element since all 6 channels are decompressed. Given the AC-3 encoding scheme (overlap and add), theoretically a minimum of 512 PCM data buffer is required. However, given a finite decoder latency, another buffer of 256 samples for each channel is required so that ping-pong strategy can be employed. While one set of 256 samples is being processed, another set of 256 is being decoded. A decode process must be completed before all samples in PCM buffer are played, but given a MIPS budget this is always true. So, no underflow conditions should occur.

A more detailed description of the system software and firmware can now be provided. Decoder 100 supports two boot loader programs, one residing in each ROM 202 associated with each of the two DSP cores 200. DSPB (200*b*) acts as a main interface to the Host, as in runtime, accepting application code for both DSPs 200, loading its own program or data memory 202*b*/203*b*, and in addition, transferring the application code for DSPA to the boot loader residing in DSPA (200*a*), which in turn loads its program memory 202*a* and data memory 203*a*.

The Host interface mode bits and autoboot mode status bit are available to DSPB in the HOSTCTL register [23:20] (MODE field). Data always appears in the HOSTDATA register one byte at a time. The only difference in DSPB boot loader code for different modes, is the procedure of getting a byte from the HOSTDATA register. Once the byte is there, either from the serial or parallel interface or from the external memory in autoboot mode, the rest of DSPB boot loader code is identical for all modes. Upon determining the mode from the MODE bits, DSPB re-encodes the mode in the DBPST register in the following way: 0 is for autoboot, 1 for Serial Mode, and 2 for Parallel Mode. This more efficient encoding of the mode is needed, since it is being invoked every time in the procedure Get_Byte_From_ Host. During application run-time, the code does not need to know what the Host interface mode is, since it is interrupt-driven and the incoming or outgoing byte is always in the HOSTDATA register. However, during boot procedure, a polling strategy is adopted and for different modes different status bits are used. Specifically, HIN-BSY and HOUTRDY bits in the HOSTCTL register are used in the parallel mode, and IRDY and ORDY bits from SCPCN register are used in the serial mode.

Each DSP has an independent reset bit in its own CONTROL register (CR) and can toggle its own reset bit after successful boot procedure. DSPA soft reset will reset only DSPA core and will not alter DSPA's MAPCTL, PMAP, and DMAP memory repair registers. DSPB soft reset will reset DSPB core as well as all I/O peripherals, but will not alter DSPB's MAPCTL, PMAP, and DMAP memory repair registers. Synchronized start is not an issue since the downloaded application code on each DSP handles synchronization.

Three major subroutines are described here. The first one is Get_Byte_From_Host, which is mode-sensitive (checking is done on the encoded value in DBPTMP register). The byte is returned in the AR6 register.

The second subroutine is Send_Byte_To_Host, which takes the byte in AR6 and sends it to the Host. This routine is not mode-sensitive, since when a byte is to be sent to the Host, the previous byte has already been picked up. This is true since messages returning to the Host are only byte-wide and only of two kinds, solicited or unsolicited.

Solicited
BOOT_START
DSPA/DSPB_MEMORY_FAILURE
BOOT_SUCCESS
BOOT_ERROR_CHECKSUM (in which case the Host is waiting for the response)
Unsolicited
BOOT_ERROR_ECHO
BOOT_ERROR_TIMEOUT (in which case the Host is sending or waiting to send image data and therefore has no pending byte to read).

In either case, DSPB can safely send out a byte without checking whether the resource is busy.

The third important subroutine is Get_Word_From_Host. This subroutine returns one 24 bit word in the COM_BA register after using ACC0 and AR6 as a temporary storage. Actually, Get_Byte_From_Host is invoked three times within Get_Word_From_Host and the incoming byte in AR6 is shifted appropriately in ACC0. The Get_Word_From_Host subroutine also updates the checksum by using ADD instead Of XOR. The running checksum is kept in register PAR_2_BA. Note that there is no Send_Word_To_Host subroutine, since all replies to the Host are a full byte wide.

Figure 41:
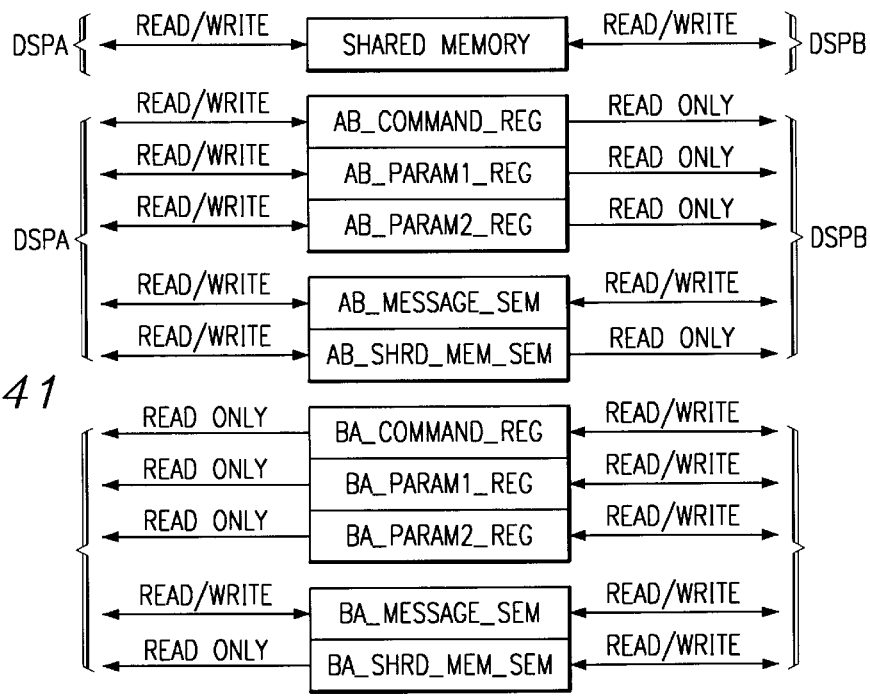
FIG. 41 is a diagram of the interprocessor communications (IPC) registers.
Figure 42A:
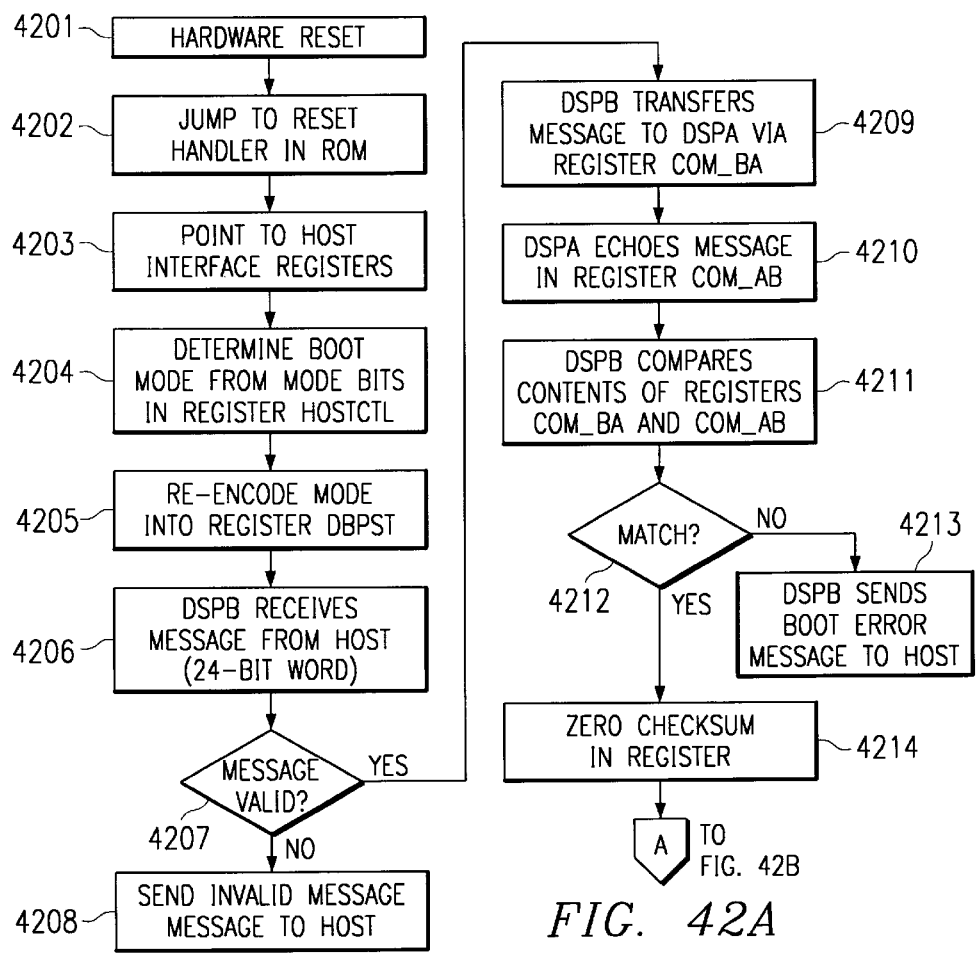
FIG. 42A is a diagram describing a boot loading routine.
Figure 42B:
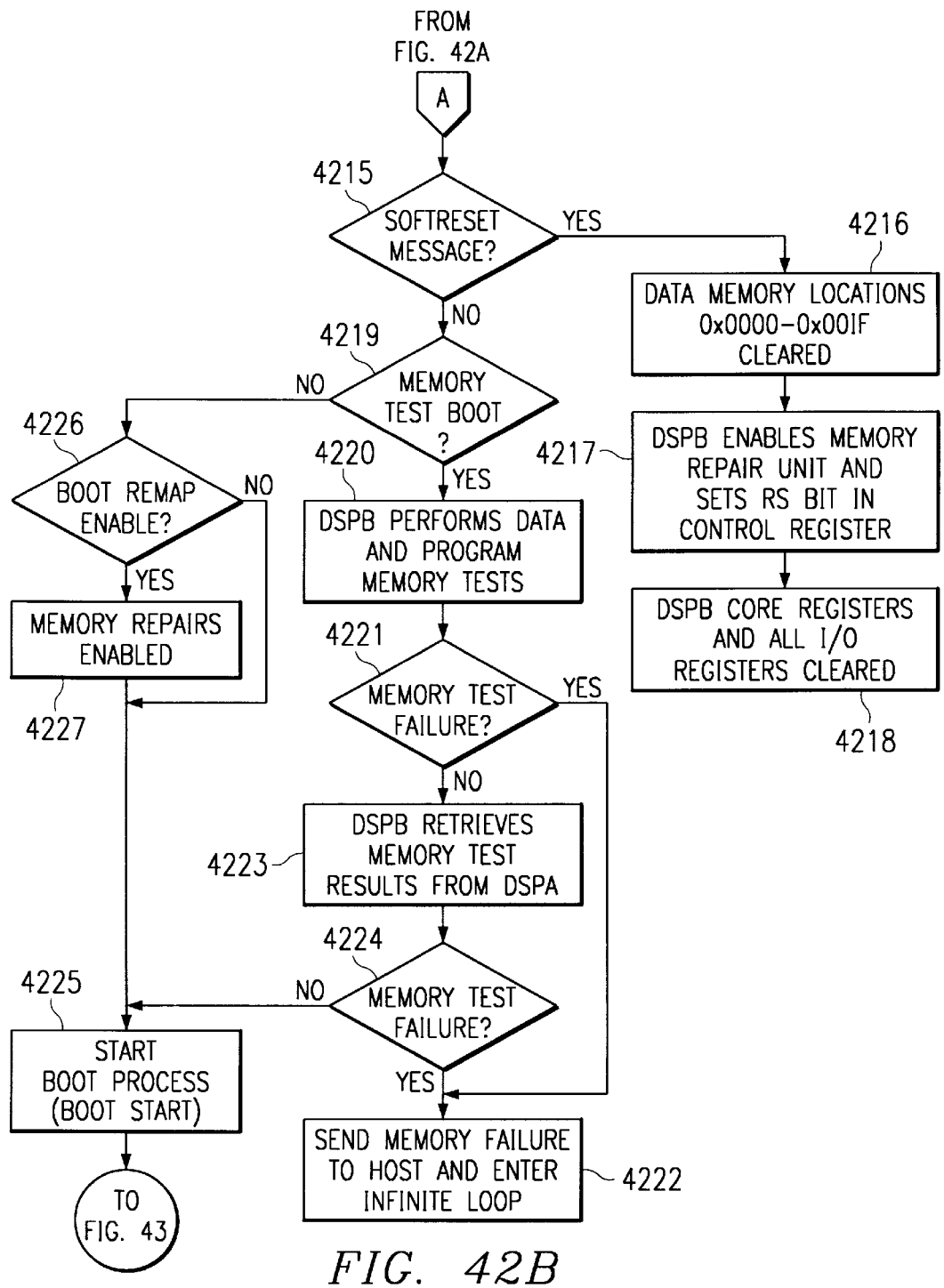
FIG. 42B is a diagram continuing to describe a boot loading routine.

The boot routine can now be described in conjunction with the flow chart of FIG. 42, along with description of the interprocessor communication protocol of FIG. 41. Upon hardware reset (Step 4201) the code will jump to address 0x1000, which is the first address in the ROM, where a jump to the Reset_Handler subroutine is installed (Step 4202). In the Reset_Handler subroutine, the PAGE_B register is initialized to point to I/O PAGE_2, since the Host interface registers reside there (Step 4203). Then, the code determines the boot mode from the MODE bits in the host control (HOSTCTL) register (Step 4204) and re-encodes the mode in the DBPST register (Step 4205), as described above.

At this point DSPB is waiting for the Host to send a message. There is no timeout here. The Host must send a message describing what should happen next (Step 4206). The message itself is a 24-bit word. Four types of messages can arrive at this point. They are SOFTRESET (0x000001), BOOT_REMAP_ENABLE (0x00002), BOOT_REMAP_DISABLE (0x00003) and MEMTEST_BOOT (0x000004). If the incoming message is not within this range (1 . . . 4) (Step 4207), DSPB sends back the INVALID_MSG_BYTE (0xfb) to the Host (Step 4208). If the message is valid, DSPB will send the same message to DSPA. The subroutine Send-Word-To-DSPA-Check-Echo is used to transfer the message from DSPB to DSPA (Step 4209) via the COM_BA register. Since the message is already in the COM_BA register, this subroutine only needs to set the bit in the command pending register COM_P_BA. In order to ensure reliable communication, DSPA will echo the message in the COM_AB register (Step 4210). DSPB compares the value in register COM_BA and COM_AB (Step 4211) and if they do not match (Step 4212), DSPB sends the Host the BOOT_ERROR_ECHO_BYTE (0xfc)(Step 4213). Also, a timeout counter is used when waiting for echo, to avoid a deadlock situation. On timeout, DSPB interrupts the Host and sends it BOOT_ERROR_TIMEOUT_BYTE (0xfa), which indicates a communication problem with DSPA. In fact, the Host should also have timeouts of its own in order to detect communication problems with DSPB itself.

PAR_2_BA register (which contains the checksum) has to be zeroed at this point (Step 4214) since the first word from the Host (boot type message) does not contribute to the checksum.

If the message is SOFTRESET (Step 4215), DSPB will enable memory repair module (set MSB in the MAPCTL register), zero out the data memory location 0X0000-0X001f (Step 4216), and set the RS bit in the control register (Step 4217), which performs soft reset. All registers are reset in DSPB core as well as all I/O registers (Step 4218)(the DSPA soft reset clears only the DSPA core registers). However, the memory repair module is not affected at all, i.e., MAPCTL and all DMAP/PMAP registers are not reset. It is important to note here that DMAP/PMAP registers are not affected by either hardware or software reset, while MAPCTL is affected by hardware reset and not by software reset. Also, the four MODE bits in the host control register (HOSTCTL) register are not affected by either reset.

If the message from Host is MEMTEST_BOOT (Step 4219), DSPB will clear all DMAP/PMAP registers and perform both data and program memory tests (Step 4220), in that order. If either test fails, DSPB branches to Memory_Failure (Step 4221) where it sends DSPB_MEMORY_FAILURE_BYTE (0xfd) to the Host and terminates in an infinite loop (Step 4222). On the other hand, if DSPB memory tests are successful, it asks DSPA for its memory test results by sending it DSPA_MEMORY_CHECK_MSG (0x00001)—or any other word for that matter. By now, DSPA has certainly concluded its own memory test (since it has less memory to test) and echoes back or inverts the word received from DSPB, to indicate success or failure, respectively. The echo back enables DSPB to continue with the boot process. Otherwise, DSPB sends DSPA_MEMORY_FAILURE_BYTE (0xfe) to the Host and terminates in an infinite loop.

If both DSPA and DSPB performed memory tests successfully (with possible repair), the boot process can start (Step 4225). At this point, the Host is actually waiting for a message that could be BOOT_START_BYTE (0x01), DSPA_MEMORY_FAILURE_BYTE (0xfe), or DSPB_MEMORY_FAILURE_BYTE (0xfd). Alternatively, the Host might have already received either BOOT_ERROR_ECHO_BYTE (0xfc), due to IPC problems, or BOOT_ERROR_TIMEOUT (0xfa), due to DSPA timeout.

If the message is BOOT_REMAP_ENABLE (Step 4226), DSPB sets the MSB in the MAPCTL register (Step 4227), thus enabling whatever memory repair was done sometime earlier (Step 4227)(using the MEMTEST_BOOT message), and issues the BOOT_START message to the Host. (If the message is BOOT_REMAP_DISABLE, DSPB simply issues the BOOT_START message to the Host (leaving MAPCTL==0 and memory repair disabled). This mode is used in case we suspect the memory repair module itself, and want to leave it disabled all the time.)

Figure 43:
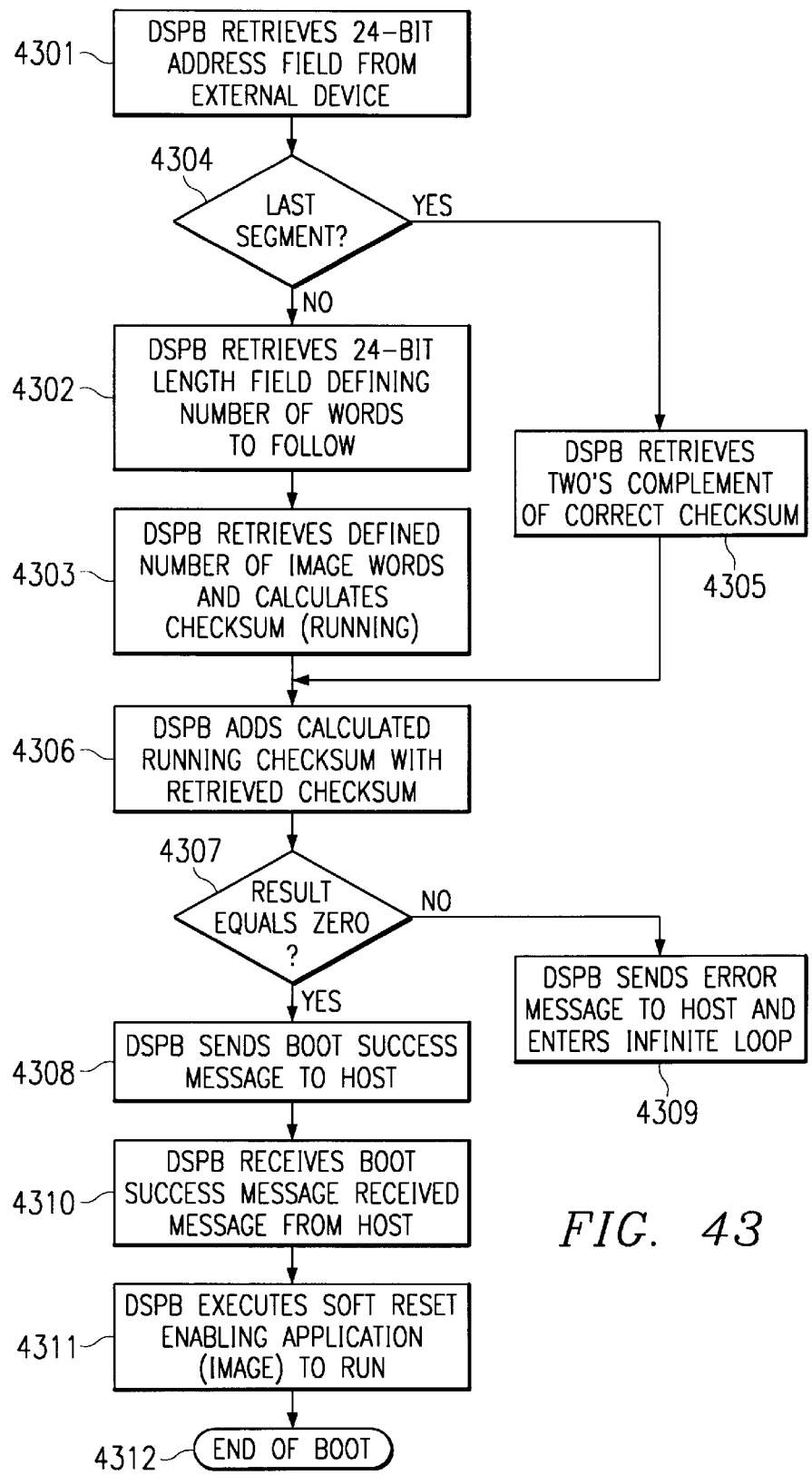
FIG. 43 is a diagram of a boot routine referenced to DSPB.

The boot process itself can now be further described with reference to FIG. 43. DSPB retrieves 24-bit words from the Host (or an independent boot ROM) using the Get_Word_From-Host subroutine. The loadable image has several segments and every segment has the following structure: a three-byte address field (retrieved from the external source at Step 4301), a three-byte length field (retrieved at Step 4302), and as many three-byte data (image) words to follow as indicated in the length field and retrieved at Step 4303. As each image word is retrieved, DSPB calculates a running checksum.

The most significant bit (MSB) of the address field discriminates between the DSPA and DSPB segments (MSB=1 for DSPA and 0 for DSPB), while MSB-1 of the same field determines whether the segment to be loaded is for program or data memory (MSB-1=1 for program memory and 0 for data memory).

For any segment other than the last segment, upon receiving the first word of the segment, DSPB determines whether it is the segment for DSPA by examining the MSB of the address field. If the MSB=1, DSPB calls the Load_DSPA_Segment routine and transfers the entire segment to DSPA. In order to transfer the proper number of words to DSPA, DSPB keeps a running counter in a register PAR_1_BA, which is initialized by the length field of the segment, and which is the next word received after the address. The data transfer between the two cores is performed using Get_Word_From_Host and Send_Word_To_DSPA_Check_Echo subroutines.

If the segment is not for DSPA (but it is rather for DSPB itself), DSPB examines the MSB-1 of the address field to determine whether it is a program or data memory segment. Depending on which memory is to be loaded, either registers PAR0 or AR2 are initialized as the memory pointer in the Load_PMEM_Segment (PAR0) and Load_DMEM_Segment (AR2) routines. Also, the PAR_1_BA register is used as a word counter and is initialized by the length field, which is the next word received after the address. Then the appropriate number of words are loaded into program or data memory.

This process (Step 4301–4304) is repeated for all segments until the final segment is encountered.

The last segment (Step 4304) has a special structure wherein the address field is 0xffffff and the word that is retrieved at Step 4305 is the twos complement of the checksum that is calculated over the entire loadable image. Since the running checksum is calculated using add operations, the final result in DSPB should be 0 after adding the running checksum to the retrieved checksum at Step 4306. If the result of the addition equals zero, DSPB sends the BOOT_SUCCESS_BYTE(0X02) command to DSPA (Step 4309), DSPB then sends BOOT_SUCCESS_BYTE to the host, waits for BOOT_SUCCESS_RECEIVED message from the host and then resets itself. If the checksum result is non-zero (Step 4307), DSPB sends the BOOT_ERROR_CHECKSUM_BYTE (0xff) to the Host (Step 4208), and terminates in an infinite loop.

After the host processor receives the boot success message at Step 4310 and sends a boot success received message to DSPB, DSPB at Step 4311 initiates a soft reset enabling the downloaded image (program) to run.

During the boot process itself, the Host can receive unsolicited messages (always single-byte) in the event of a DSPA timeout or IPC (interprocessor communication) errors. If a memory test is performed, then either BOOT_START or DSPA/B MEMORY_FAILURE messages can be sent to the Host (these are both solicited messages).

Figure 44A:
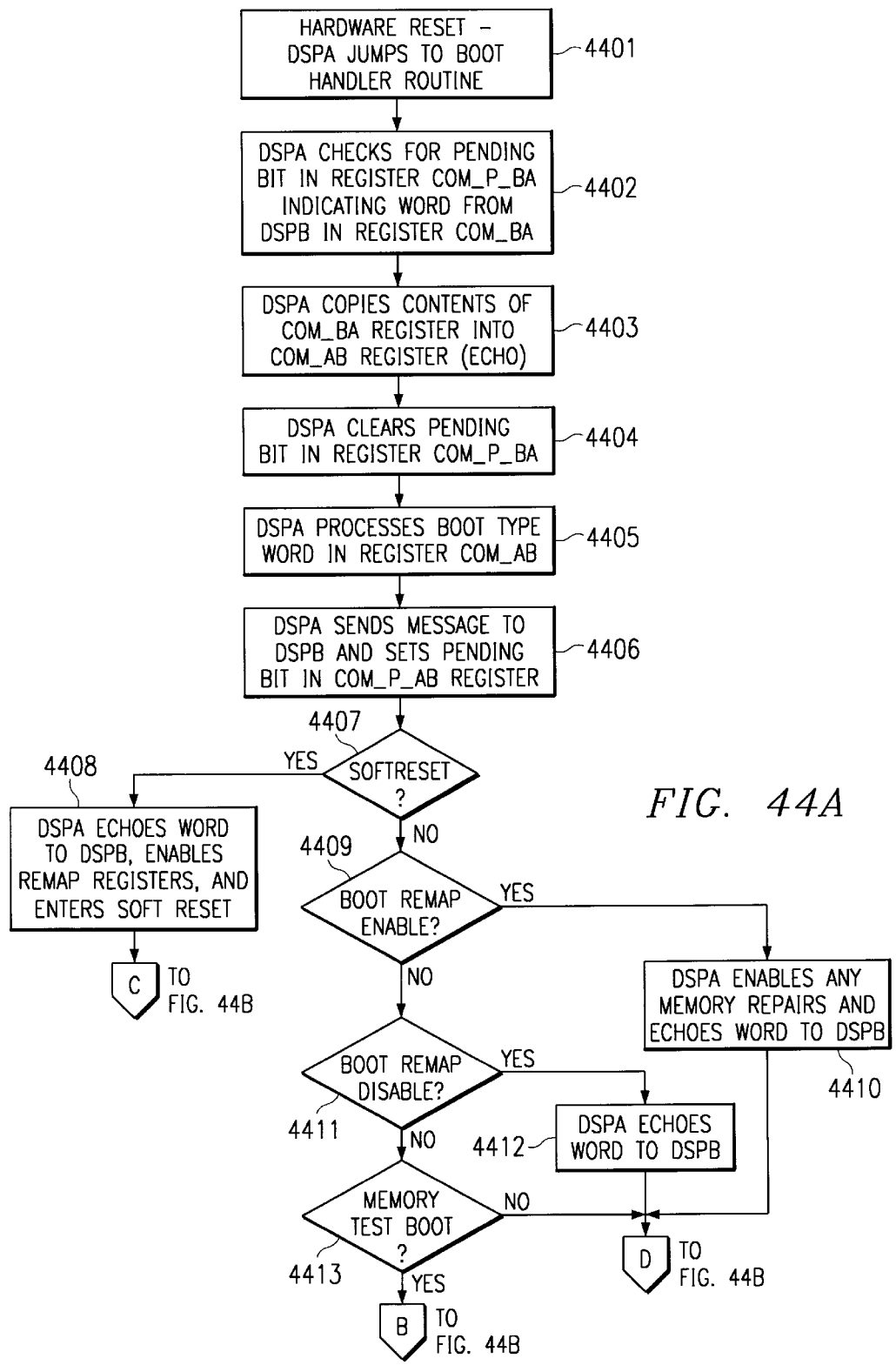
FIG. 44A is a diagram of a boot routine referenced to DSPA.
Figure 44B:
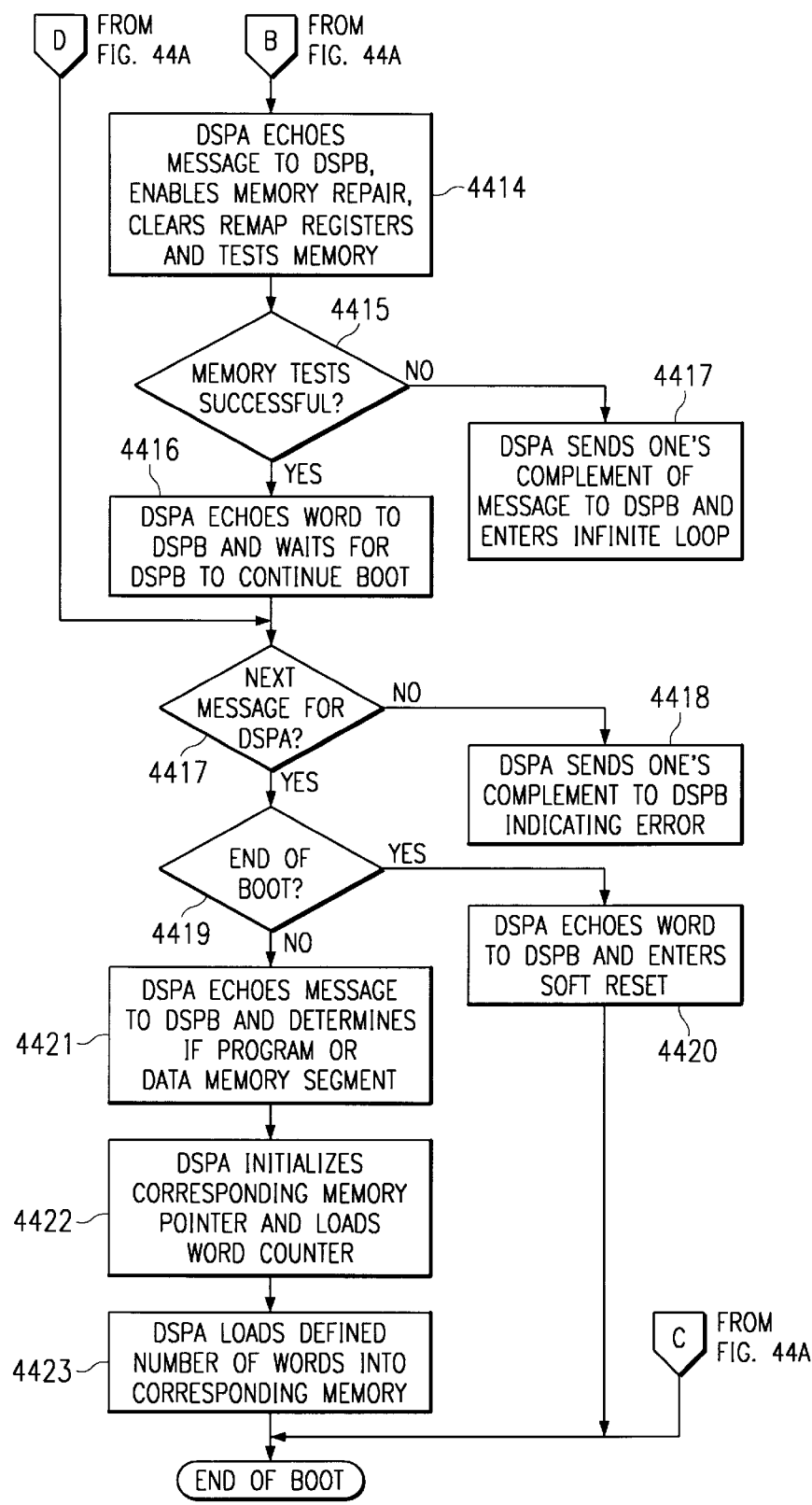
FIG. 44B is a diagram continuing a boot routine referenced to DSPA.

The DSPA boot code execution is described in conjunction with FIG. 44. Upon hardware reset DSPA boot code starts executing at address 0x1000 by jumping into the Reset_Handler routine (Step 4401). In this routine, DSPA is using the Get_Word_From_DSPB and Send_Word_To_DSPB routines. In Get_Word_From_DSPB, DSPA checks the pending bit in the COM_P_BA register (Step 4402) which is set after DSPB has put a word in the COM_BA register. Once the pending bit is set, DSPA copies the contents of the COM_BA register into the COM_AB register (echo at Step 4403) and clears the COM_P_BA bit (Step 4404). DSPA at Step 4405 processes the boot type word in register COM_AB the current word, and then invokes Send_Word_To_DSPB, which simply sets the pending bit in the COM_P_AB register (Step 4406).

If the boot-type word is a SOFTRESET (software reset) message (Step 4407), DSPA echoes the word back to DSPB (it always performs the echo to allow DSPB to continue), enables remap registers (by setting the MSB in the mapping control register MAPCTL register), and performs soft reset by loading control register appropriately (Step 4408). This Soft Reset clears only DSPA core registers. After the soft reset is performed, the end of boot for DSPA is complete.

If the word is BOOT_REMAP_ENABLE (Step 4409), DSPA sets the MSB in the MAPCTL register, thus enabling any required memory repairs that had been performed earlier (using MEMTEST_BOOT message). At step 4414, DSPA also echoes the word back to DSPB, and waits for DSPB to proceed with the boot.

If the message is BOOT_REMAP_DISABLE (Step 4409), DSPA simply echoes the message back to DSPB (leaving any memory repairs disabled), and waits for DSPB to proceed with the boot (Step 4416).

If the message is MEMTEST_BOOT (Step 4413), DSPA echoes the message to DSPB enables any memory repairs, clears all remap registers and then performs data and program memory tests (in that order at Step 4414). After the memory test and repair procedure is completed, DSPA will wait for DSPB to query the result of the memory tests with a message. If memory tests are passed (with possible remap) at Step 4415, DSPA echoes this message at Step 4416 and waits for DSPB to proceed with the boot. Otherwise, DSPA sends back the ones complement of the message to DSPB to indicate error at Step 4420. DSPB in turn detects the inverted message and sends DSPA_MEMORY_FAILURE_BYTE (0xfe) to the Host and decoder 100 terminates in an infinite loop.

If any other word is received, it is treated as the starting address specification of the next segment. DSPA then checks (Step 4417) whether the MSB=1 (which indicates that the segment is intended for DSPA), and if not, jumps to Step 4418 to BOOT_ERROR, which sends back the ones complement of the message to DSPB to indicate an error.

Once DSPA is waiting for the boot image from DSPB, it checks whether it received 0xffffff, which indicates END_OF_BOOT (Step 4419). In this case, DSPA simply echoes the message back (which enables DSPB to send BOOT_SUCCESS to the Host), and performs soft reset by setting the RS bit in the CR (Step 4420).

If end of boot has not been reached, DSPA echoes the word and examines the MSB-1 of the address field to determine whether it is a program or data memory segment at Step 4421. Depending on which memory is to be loaded, either DSPA the PAR0 or AR2 registers are initialized as the memory pointer in their respective Load_PMEM_Segment and Load_DMEM_Segment routines. Also, the PAR_1_AB reset is used as a word counter and is initialized by the length field, which is the next word received after the address (Step 4422). Then the appropriate number of words are loaded into program or data memory (Step 4423) from the host or external boot ROM. When this Step is complete, end of boot is reached.

Figure 45:
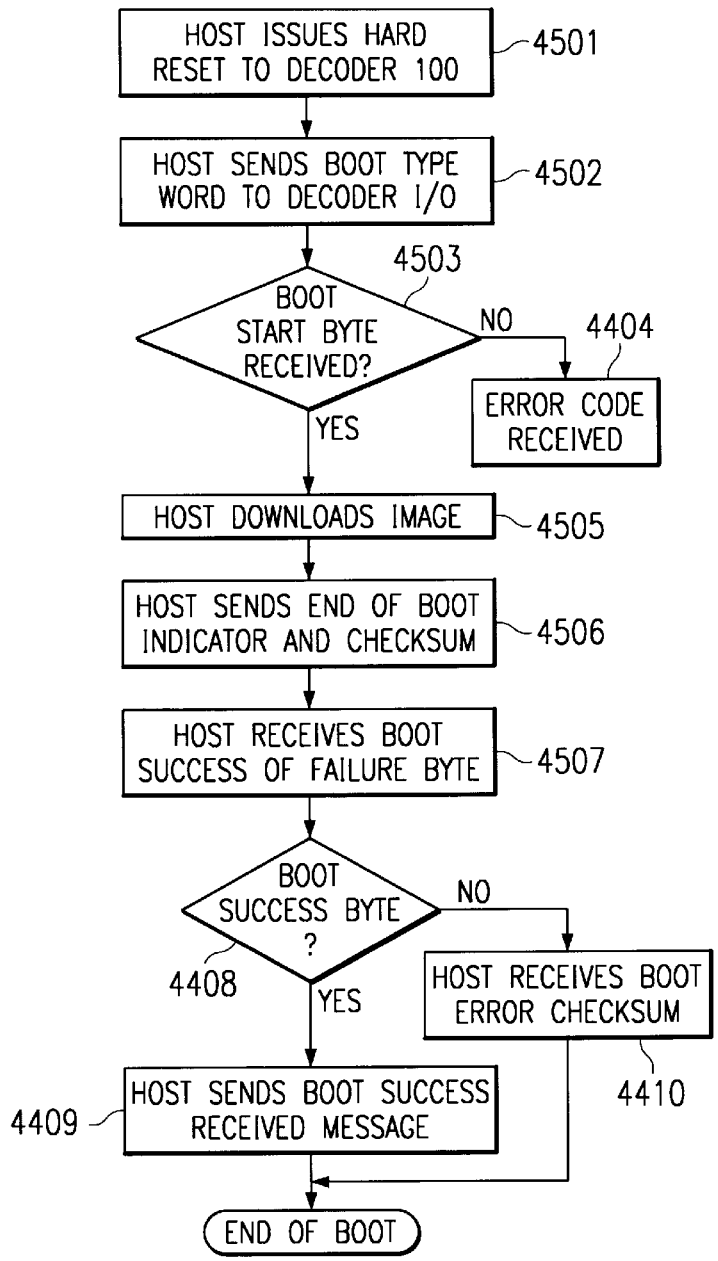
FIG. 45 is a diagram of a boot routine reference to the host.

The boot sequence from the host's perspective is described in conjunction with FIG. 45:

(1) Host issues hard reset and sets the mode bits appropriately to set Host mode (Step 4501);
(2) Host sends 3-byte BOOT_TYPE message (Step 4502):
  (a) SOFTRESET (0x000001): enables memory remap on both DSPs and issue softreset.
  (b) BOOT_REMAP_ENABLE (0x000002): enables remapping (to whatever previous setting the MAP registers had), sends out BOOT_START byte (0x01) and waits for image download.
  (c) BOOT_REMAP_DISABLE (0x000003): disables Remapping completely, sends out BOOT_START byte (0x01) and waits for image download.
  (d) MEMTEST_BOOT (0x000004): Performs Memory test on both DSPs.

The host then waits for a boot start byte from decoder 100 at Step 4503. In addition, for boot modes 2–4 (those that involve download), the first byte coming out of decoder 100 may be one of the following error codes instead of BOOT_START (Step 4504):

BOOT_ERROR_ECHO (0xfc): Indicates an interprocessor communications (IPC) error, i.e., DSPA did not echo DSPB's IPC message correctly.
BOOT_ERROR_TIMEOUT (0xfa): DSPB timed out after sending DSPA an IPC message and DSPA failed to echo it back.

(After any error report, both DSPs terminate in an infinite loop.)

(e) Once the host observes the BOOT START response from Decoder, it starts sending in the bytes from the downloadable (.LD) file using the procedure and structure discussed above in conjunction with FIG. 43 (Step 4505).

(f) The last 6 bytes of the .LD file contain the 0xffffff End_Of_Boot indicator, and the 3-byte Checksum (Step 4506).

(g) Host receives a boot success or error byte (Step 4507). If checksum is correct (Step 4508), the decoder will report BOOT-SUCCESS byte (0x02) to the host and will wait for host to respond with the message BOOT_SUCCESS_RECEIVED (0x000005) (Step 4509). Once this message is received by the decoder 100, soft reset will happen and downloaded application will take control of the chip.

(h) If checksum is wrong then decoder 100 will report BOOT ERROR CHECKSUM byte (0xff) to the host (Step 4510) and both DSPs will terminate in an infinite loop.

Since the decoder 100 has substantial on-chip memory, special memory repair (remap) hardware, has been implemented to increase silicon yield in the event of defective memory locations. Remap registers are provided for program and data memory that contain bad addresses. When a particular remap register is enabled, all data transfers to the corresponding memory address are substituted by accesses to a secondary 24-bit memory cell. On average, 2 bad memory locations per kiloword can be repaired.

As elaborated in the above discussion of the "boot loader," at reset the Host has the option of initiating four kinds of reset: SOFTRESET (no memory check and no boot), BOOT_REMAP_DISABLE, BOOT_REMAP_ENABLE (but no memory check), and MEMTEST_BOOT.

The BOOT_REMAP_DISABLE reset clears the mapping control (MAPCTL) register MSB on both DSPs, and then boots new code. This permits a complete bypass of the memory repair hardware.

The BOOT_REMAP_ENABLE reset sets the MAPCTL register (MSB=1). Since the PMAP/DMAP registers are not cleared at reset and retain their previous settings, any previous memory repair remains effective. Thus, as long as the first reset after powerup is a boot with memory check (MEMTEST_BOOT), subsequent resets can bypass the memory check, but still need to enable the MAPCTL register using BOOT_REMAP_ENABLE.

The following is a pseudo_microcode description of the generic memory check performed as part of MEMTEST_BOOT, the fourth kind of reset. In ROM, data and program memory tests are separate modules called by the reset handler in succession (data memory is checked first, since program memory check uses four data locations).

Memory-Test:
Initialize page register, memory pointer to first memory location to be checked, and MAP register pointer to first usable remap register.

Memory_Test_Loop:
Load 0x5a5a5a into current memory location and read back.

Jump to Memory_Error if read-back failed.

Load 0xa5a5a5 into current memory location and read back.

Jump to Memory_Error if read-back failed.

Memory_Test_Loop_Continue:
If this was the last location, return from test successfully.

Otherwise, increment pointer to next location and go back to Memory_Test_Loop.

NOTE: Code should ensure that, after testing, each memory location is left with a value different from 0x5a5a5a in order to detect address decoding problems. Ideally, a unique address-related value should be left in the memory location.

Memory-Error:
If we are out of MAP registers exit to Memory Failure.

Otherwise, remap the current memory location with current MAP register.

Check the remapped location by writing and reading 0x5a5a5a and 0xa5a5a5.

If the remapped memory is still bad, clear the current MAP register, increment MAP register pointer and repeat Memory_Error.

Otherwise, remap was successful, so increment MAP register pointer and rejoin Memory_Test_Loop_Continue.

Memory_Failure:
Report memory failure error to DSPB or Host as appropriate.

Spin in infinite loop. (Actually, do anything, since chip is unusable!).

Debugging of the decoder 100 may be performed in one of two available modes: Slave Mode and Non-Intrusive Mode. In Slave Mode, the specified DSP is halted and then dedicatedly responds to messages from the PC Debugger until instructed to continue maincode execution.

In the Non-Intrusive Mode, the PC Debugger can request reads (and even writes, if explicitly enabled by the GUI user) from/to either DSP with only minimal intrusion on the application code being currently executed. This allows for dynamic debugging and watching/scoping variables in near-real-time. In order to maintain non-intrusiveness, constraints are placed on the PC Debugger to limit the bandwidth of messages that it can issue to the decoder during Non-Intrusive Mode. Also, certain safety constraints are placed on the PC Debugger that prevent interference with the running application.

Figure 46:
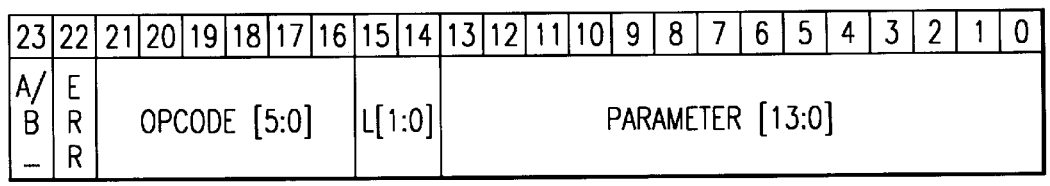
FIG. 46 is a diagram of the debug command word structure.

The Debug Command Word Structure is depicted in FIG. 46. Each Debug message between the PC and decoder 100 consists of a 24-bit command word followed by zero, one, two, or eight data words, as specified by a length field within the command word. The command fields are interpreted as detailed below:

A/B_=one-bit DSP specification. Interpreted by hardware in Command-Parse Mode to generate Debug_INT (debug interrupt) to the specified DSP. Not interpreted by software, since only the relevant DSP will receive the Debug_INT interrupt.

1=DSPA debugger command. Debug_INT on DSPA.
0=DSPB debugger command. Debug_INT on DSPB.

ERR=one-bit error specification, applicable only to the Command Word read back from decoder 100. This bit is ignored (Don't Care) in the Command Word written into decoder 100. Thus it is relevant only for the first word of the response to Read commands. When set, this bit informs the PC Debugger that one or more of the following errors has occurred in the Debug monitor code: DBERR was set in DBPST, or ORDY was set while attempting to input a word, or IRDY was set while attempting to output a word. This bit is stickily set by DSPA/B and has to be explicitly cleared by the PC Debugger, either by writing to Data memory location 0x10, or issuing a RESET (either through Debug commands or directly to the decoder).

OPCODE [5:0]=six-bit opcode. Interpreted by software.

L [1:0]=Length specification (code). Interpreted by software to latch the above DSP specification and set DBINT (see below) to generate DEBUG_INT only on the specified DSP for the number of data words following the command word:

00=No words follow (one-word message)
01=one word follows (two-word message)
10=two words follow (three-word message)
11=eight words follow (nine-word message)

PARAMETER [13:0]=Opcode-dependent Parameter specification. Interpreted by software.

Figure 47A:
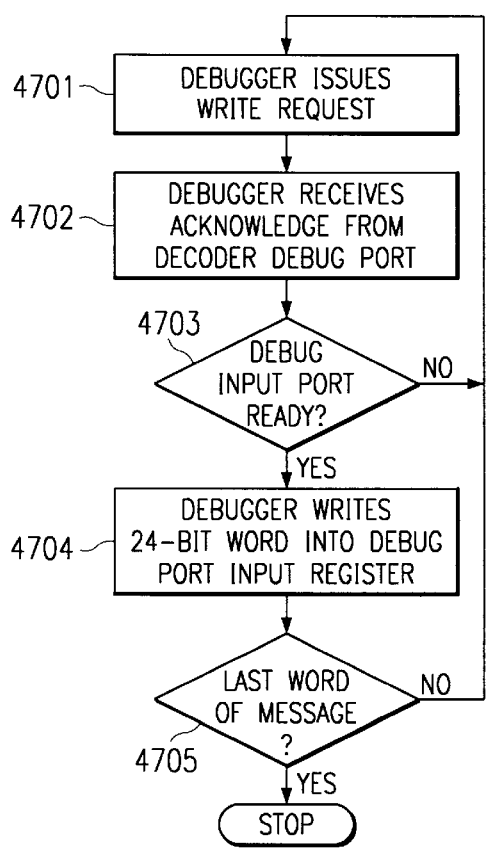
FIG. 47A is a diagram illustrating one method of handshaking between the decoder and an external debugger.
Figure 47B:
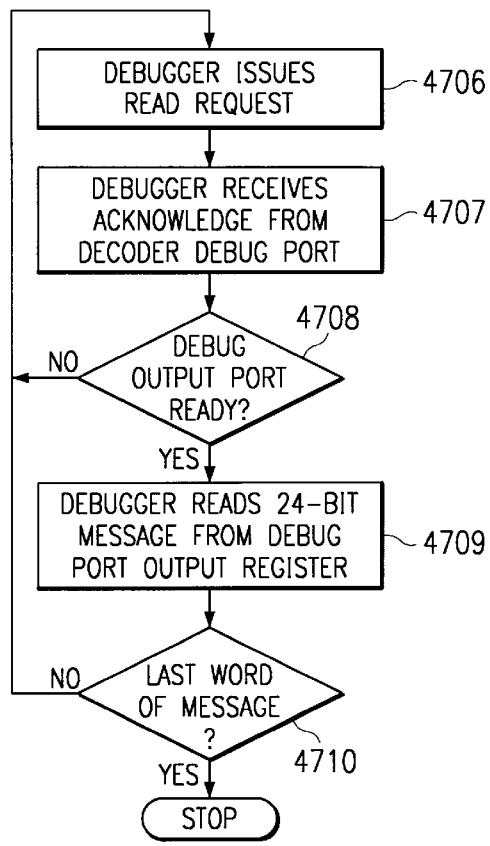
FIG. 47B is a diagram illustrating a second method of handshaking between the decoder and an external debugger.

The debug handshaking between decoder 100 and an external PC debugger system can be described in detail in conjunction with FIGS. 47, 47A and 47B. Additionally, the debug registers discussed below are further described in Tables 58–60.

TABLE 58

Debug port Status Register (DBPST)
Pages 0–7 Address 0x0D

| Name | Bits | Description |
| --- | --- | --- |
| DBERR | 23 | Debug interrupt error. This bit is the logical AND of the DBINT bits from the two DBPST registers. When set, this bit indicates that both DSPs are requesting exclusive interrupt privileges. Read-only. |
| ORDY | 22 | Output ready. When low, valid data is in DBOUT register waiting to be read by host. When high, DBOUT is empty and may be written with new output data. A rising edge of ORDY causes an interrupt if DBINT is set. Read-only. |
| IRDY | 21 | Input ready. When high, valid data is waiting in DBIN to be read by the DSP. The IRDY bit is cleared when written by the DSP. |
| DBINT | 20 | Debut interrupt control. When set, the associated DSP is granted exclusive interrupt privileges from the debug port until cleared. |
| TEMP | 19:0 | Reserved bits. These bits are used by the debug software for temporary variable storage. |

TABLE 59

Debug port Input Register (DBIN)
Pages 0–7 Address 0x0C

| Name | Bits | Description |
| --- | --- | --- |
| DBIN | 23:0 | Debug port input data. Read-only. |

TABLE 60

Debug port Output Register (DBOUT)
Pages 0–7 Address 0x0C

| Name | Bits | Description |
| --- | --- | --- |
| DBOUT | 23:0 | Debug port output data. Write-only. |

A debug session begins with the PC Debugger writing a debug message into the Debug port 1304. For each 24-bit write (FIG. 47A), the PC debugger issues a write request (Step 4701) by generating a falling edge of DBDA 15 while holding DBCK (debug clock) high. It does not write any data until it confirms that IRDY (input ready) is low (Step 4703)(i.e., DSP has read out the last word written in) by reading an active-low ACK (acknowledge) on DBDA after the first falling edge of DBCK (Step 4702). If no ACK is received, it repeats the write request until it receives an ACK. It then writes in twenty-four bits of the message (Step 4704). Each 24-bit write into data input register follows the handshake procedure until the last word of the message is written to decoder 100 (Step 4705).

Similarly, for a 24-bit read from the decoder 100, the PC Debugger issues a read request by generating a rising edge of DBDA while holding DBCK high (Step 4706). It does not read any data till it confirms ORDY (output ready) is low (Step 4708)(i.e., DSP has written the next word to be read out) by reading an active-low ACK on DBDA after the first failing edge of DBCK (Step 4707). If no ACK is received, it repeats the read request till it receives an ACK. It then reads out 24-bits of the message. Each 24-bit read out of the data output register follows this above handshake procedure.

Debug port 1304 uses two I/O addresses in the lower (unpaged) half of the IO space: 0xa and 0xb. The DBIN and DBOUT registers share the 0xa address and contain the 24-bit word received from the PC Debugger, or to be transmitted to the PC Debugger, respectively. There are two status registers: the DBPST(A) register for DSPA and DBPST(B) register for DSPB. Both these share the same IO address 0xb, and are visible only to their respective DSPs.

The DBPST(A/B) status registers have identical fields consisting of DBERR (debugging interrupt error), ORDY (output ready), IRDY (input ready), and DBINT[1:0](debug interrupt control) bitfields. The DBTMP register is a scratchpad register space for software backup of AR1 during a debug session. The ORDY bit, which is read-only in register DBPST(A/B), is identical for both DSPs 200a, 200b (i.e., copies of the same bit in DBPST(A) and DBPST(B)) and indicates whether the DBOUT register is empty or full. Since there is only one Host to receive output words from either DSP 200a, 200b, one ORDY flag is sufficient. Furthermore, at any given time only one DSP is expected to send words to the PC Debugger. In the following text, the term ORDY references the ORDY bit generally for both DSPs 200a, 200b, although each DSP 20a, 200b can read only its corresponding ORDY(A/B) bit from its own DBPST(A/B) register.

In contrast, each DSP 200 has its own IRDY bit (set by hardware, read-writable by a given DSP) that indicates whether register DBIN has a pending word for that DSP 200. Since only one DBIN register is shared among both DSPs 20a, 200b, only the intended recipient of the incoming word has its IRDY bit set. The IRDY bit also indicates to the given DSP whether a received interrupt (DEBUG_INT) was for reading from (IRDY=1) or writing to (ORDY=1 and IRDY=0) the PC Debugger.

The DBINT field is read-writable and exists in order to ensure that only the DSP 200a, 200b targeted for a particular debug message receives the DEBUG_INT interrupt and also that only its IRDY bit is updated for input data words following the command word.

The pair of bits DBINT(A/B)(from the DBPST(A) and DBPST(B) registers, respectively) determine the three valid states of the Debug port hardware: 00=Command_Parse Mode, 10=INT DSPA Mode, and 01=INT DSPB Mode. Each DSP 200 can set or clear its own DBINT bit. The invalid state of 11 will set the DBERR bits in DBPST(A/B) and will also result in an interrupt for both DSPs. Just like the ORDY bit, the DBERR(A) and DBERR(B) error bits are also copies of the same DBERR bit. The Debug ISR on each DSP 200 first checks DBERR and aborts to an error handler if a clash is detected.

When selected, Command-Parse Mode (DBINT(A/B)=00) has a special effect during reads from the Host. When the debug port receives the incoming command word into the DBIN register, the hardware issues the DEBUG_INT interrupt and updates appropriate IRDY bit only for the DSP 200 specified in the A/B_field of register DBIN. However, in the case of writes to the Host, after the Host has pulled out the outgoing word from the DBOUT register, no interrupts are generated to any DSP 200a, 200b. Thus, the hardware will operate in this Mode for the first (or only) word of an incoming message.

In INT DSPA (interrupt DSPA) Mode (DBINT(A/B)=10), every 24-bits shifted in (or out) generates interrupt DEBUG_INT and sets the IRDY(A) bit only (or the ORDY bit for output). Likewise, in INT DSPB (interrupt DSPB) Mode (DBINT(A/B)=01), every 24-bits shifted in (or out) generates a DEBUG_INT and sets the IRDY(B) bit only (or the ORDY bit only for output). Debug ROM microcode has the burden of ensuring that the states of DBINT(A/B) are correctly switched (including the DBERR checking bits) by the appropriate DSP 200a, 200b to cover all debug scenarios.

The IRDY and ORDY bits are effectively WRITE_BUSY and READ_BUSY signals to the PC Debugger. The active-low ACK mentioned above is therefore generated as the logical OR of the IRDY(A) bit and the IRDY(B) bit for writes by the Host. Since ORDY(A)==ORDY(B)==ORDY (identical for both DSPs 200a, 200b), it is directly used for the active-low ACK (acknowledge) during reads by the Host. Thus, the PC Debugger can write to the decoder 100 only it both DSP 200a, 200b, report no pending input words (this implies that the previous word has been read and processed). Also, the PC Debugger can read from the decoder only if a pending output word is indicated.

Figure 48A:
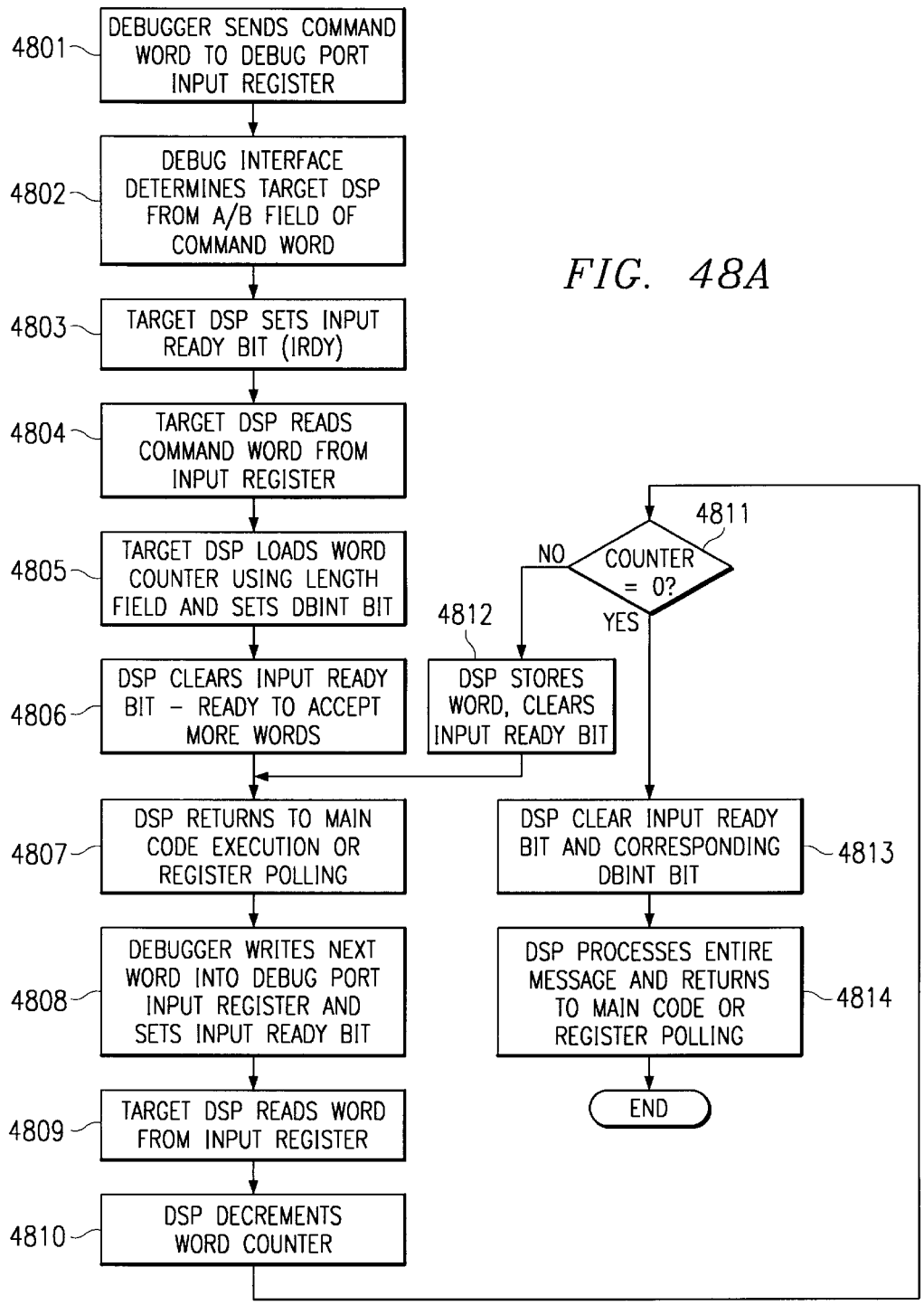
FIG. 48A is a diagram illustrating a typical debugging session between an external debugger and the decoder referenced from the debugger.
Figure 48B:
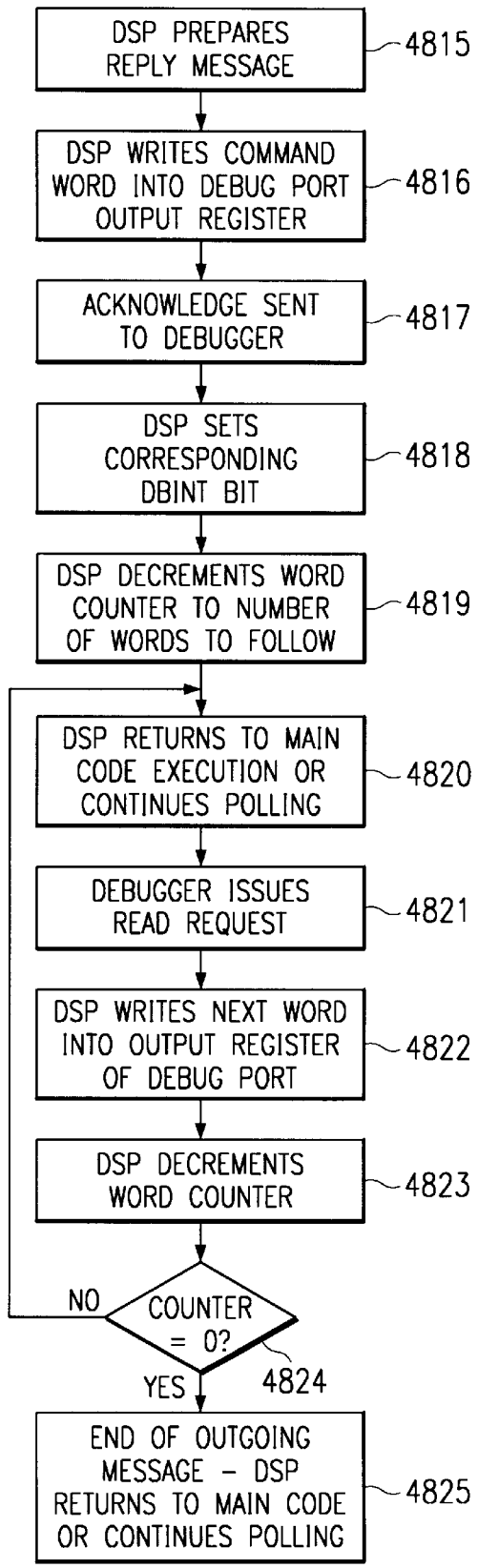
FIG. 48B is a diagram illustrating a typical debugging session between an external debugger and the decoder referenced from the decoder.

A typical Non-Intrusive debug session is detailed below in conjunction with FIG. 48. The session is initiated by a message from the PC Debugger to debug port 1304 of decoder 100.

Using an ACK (acknowledge) handshake, the PC Debugger shifts in the first 24-bits of the message, i.e., the command word, into debug register DBIN (Step 4801). Since DBINT(A/B)==00 at startup, hardware issues DEBUG_INT to DSPA or DSPB depending on the value of the A/B field of the command word (Step 4802). Hardware also sets the corresponding input ready bit IRDY(A) or IRDY(B) according to the value of the A/B_field.

Without loss of generality, assuming that A/B_==1, the IRDY(A) bit is set, and DSPA is at Step 4803. If target DSPA is executing main code, DSPA main code execution is interupted. If target DSPA has been simply polling the debug port registers, for debug words from te debugger. DSPA continues to poll those registers. DSPA then jumps to the Debug ISR and confirms that DBEPR==0 (if not, Debug_Error_Handler is invoked). Then DSPA determines a read condition by checking that bit IRDY(A)==1, and then reads in the command word from the DBIN register at Step 4804.

Next, DSPA determines from the length field that, for example, two more words are yet to arrive from the Host, sets a word-counter to two, and also sets the DBINT(A) bit to 1 (Step 4805). The DBINT bit, when sent, insures that all the following words are passed directly to the target DSP. DSPA then explicitly clears the IRDY(A) bit (Step 4806), which in turn enables an active-low ACK to the PC Debugger (since the IRDY(B)==0 all along) to write more words if necessary, (two more words in this case). When the DBINT(A/B) bits=10, the debug port is instructed to interrupt DSPA when the next word arrives, and if DSPA is executing main code, returns DSPA to the main code (Step 4807). Otherwise, DSPA continues polling the debug register for a new word.

When the PC Debugger writes the next twenty-four bits into the DBIN register (Step 4808)(after the correct handshake), a DEBUG_INT is again generated to DSPA and, the IRDY(A) bit is set high, since bits DBINT(A/B)==10. If DSPA is executing main code, DSPA accepts the interrupt, if no debug error is detected, DSPA again determines that a read is pending by verifying that bit IRDY(A)==1, and reads in the 24-bit data from DBIN (Step 4809). (Alternatively, DSPA may only be polling for a change in bit IRDY, and no interrupt is necessary).

DSPA then decrements the word-counter (Step 4810). If the word-counter is non-zero (Step 4811), DSPA simply saves the current message-word, and explicitly clears IRDY(A), which enables ACK to the PC Debugger (Step 4412). The previous setting of bits DBINT(A/B)==10 is retained here. Once the word-counter reaches zero (Step 4811) (all words in incoming message received), DSPA clears DBINT(A) and explicitly clears the IRDY(A) bits (Step 4813). Thus, bits DBINT(A/B)==00, which indicates the end of the incoming message, and the debug port is reset to the default Command-Parse Mode. DSPA then processes the received debug message and accordingly continues with maincode, if being executed, or returns to polling the debug registers and initiates a reply back to Host (Step 4814) if necessary.

In the event that a reply is required to the PC Debugger, the decoder 100 responds with a similar transaction (in the reverse direction) for which the PC Debugger is waiting. Such a message is always in response to a request from the PC Debugger since unsolicited messages are precluded in the decoder 100 debug scheme.

In the event that a reply is solicited by the PC Debugger (FIG. 48B), still within the Debug handler initiated by the last incoming word, DSPA processes the complete incoming message (command word plus any associated data) and prepares, for example, a three-word message (command plus two data words) to be sent back to the PC Debugger (Step 4815). The PC Debugger is expecting this response (since it requested it), and is spinning in a loop, issuing read requests, and waiting for active-low ACK (bit ORDY(A)==bit ORDY(B)==ORDY). Since the DBOUT register is empty to begin with, ORDY=1, and the PC Debugger receives negative (high) ACKS. DSPA initiates the reply message by writing the command word (first word of reply message) into DBOUT register (Step 4816). This clears ORDY (output ready) bit (ORDY=0) and in turn enables the active-low acknowledge (ACK) to the PC Debugger (Step 4817). DSPA then decrements the word-counter (to two), and since there are more words to be sent, it writes DBINT(A/B)=10 (Step 4818)and returns to maincode execution, if maincode was running, or continues to poll the debug I/O registers (Step 4820).

When the PC Debugger reads the twenty-four bits from debug output (DBOUT) register (after receiving the active-low ACK), the output ready (ORDY) bit goes high, and a DEBUG_INT interrupt is again generated to DSPA since bits DBINT(A/B)==10. DSPA either accepts an interrupt or polls the debug I/O registers (Step 4821) and determines that a write is pending since bit IRDY(A)==0 (checking bit ORDY==1 is not necessary since bit IRDY(A)==0 and the DEBUG INT interrupt implies that ORDY==1), and then writes the next 24-bit word of the outgoing message into register DBOUT (Step 4822). DSPA then decrements the word-counter (Step 4823), and if it is non-zero, returns to maincode (leaving bit DBINT(A)==1) until the next DEBUG_INT. If the counter went to zero (Step 4824), DSPA clears the DBINT(A) bit. This effectively indicates the end of the outgoing message, and reverts the debug port hardware to Command-Parse Mode (bits DBINT(A/B)== 00). DSPA then returns to maincode until a new debug session is initiated by the PC Debugger.

Slave Mode debugging is very similar to the Non-Intrusive Mode example described above. First, DSP(A/B) 200a, 200b is explicitly halted by the PC Debugger using a HALT command, or if DSP(A/B) hit a breakpoint previously set by the PC Debugger. Once halted, the given DSP 200a, 200b spins in a Slave loop polling the IRDY(A/B) bits rather than returning to maincode. The PC Debugger sends DSP (A/B) 200a, 200b messages that are interpreted, processed, and responded to (if required) in much the same way as in the Non-Intrusive Mode. The DBINT settings are managed in the same manner as in Non-Intrusive Mode, which enables the appropriate update of the IRDY(A/B) bits, and possibly a debug interrupt to the other DSP if it is in Non-intrusive mode.

A debug message consists of a command word followed by associated data, if any. Commands are classified as CONTROL commands, WRITE commands, and READ commands. The first two types of commands are unidirectional, i.e., from the PC Debugger to decoder 100. READ commands are bi-directional: first, the PC Debugger sends a one-word READ REQUEST to decoder 100. After processing the request, decoder 100 (either DSPA or DSPB, as requested) sends back a READ RESPONSE. The READ REQUEST and READ RESPONSE have identical opcode syntax. However, any length information in the READ REQUEST is not interpreted as length of the incoming Request message. Instead it is treated as the length associated with the READ RESPONSE message.

Decoder 100 does not restrict any messages in Non-Intrusive Mode or Slave Mode. All control commands (except JUMP TO PATCH) are either applicable in Non-Intrusive Mode or Slave Mode, but not both. All WRITE and READ commands are valid in either mode. The PC Debugger has the responsibility to access only appropriate subsets of messages during each mode, both from the perspective of validity, as well as induced overhead in Non-Intrusive Mode.

Messages are single-word unless specified otherwise. When listed, only valid data lengths are specified and others can be considered as invalid. The unused bit field (Bit 22) is forced to 0. All opcodes specified are for DSPB (A/B_==0). Setting the MSB, i.e., adding 0x80 to the MSB byte, results in the corresponding opcode for DSPA (A/B_==1).

The control commands are depicted in FIGS. 49A–49E. Specifically, there are the RESET_B, (FIG. 49A), HALT_B (FIG. 49B), CONINUE_B (FIG. 49C), SINGLE_STE_B (FIG. 49D) and JUMP_TO_PATCH_B (FIG. 49E).

The CONTINUE command switches to Non-Instructive Mode and is valid only in Slave Mode. The HALT command switches to Slave Mode and is valid only in Non-intrusive Mode. SINGLE STEP is valid only in Slave Mode. JUMP_TO_PATCH transfers debug monitor control to a specified Patch Address that should contain an appropriate debug patch routine.

The patch routine can be loaded with the application code itself, or can be inserted at run-time by appropriate Debug monitor commands. The patch routine should be designed to backup and restore all variables it uses (with the possible exception of those already globally backed-up by the Debug monitor code), and then return to the Debug ROM to resume the Slave Mode loop, or exit gracefully in Non-Intrusive Mode.

The Write and Read Commands are depicted in FIGS. 50A–50AD.

Non-Intrusive writes (on the fly) should occur only when explicitly enabled by the user in the GUI. This feature is disabled as the default in the PC Debugger. The ROM code will of course accept any valid message that comes through the Debug port. Therefore, the PC Debugger has to be disciplined to work appropriately in different modes.

Opcodes are chosen such that the LSB of the six-bit field is a READ/WRITE_BAR indicator (only for the commands shown below, not for CONTROL commands). RD_commands have two versions as mentioned above: The READ REQUEST issued by the PC Debugger carries the L[1:0] field, but this does not indicate the length of the READ REQUEST message. Instead it denotes the length of the READ RESPONSE message sent by decoder 100 back to the PC Debugger. The ROM microcode detects the READ/WRITE BAR bit of the opcode, and on all RD_messages the microcode interprets the length code appropriately.

L[1:0] is fixed in most commands below, and in others, any invalid cases are explicitly mentioned.

FIG. 50A is a diagram of the WRITE TO DATAB of command (WR_DMEM_B) at address 0x08, and is followed by one, two or eight datawords specified in the length field (L[1:0]==00 valid).

FIG. 50B is a diagram of the READ DATA MEMORY B command (RD_DATA_MEMORY_B) at address 0x09 of one, two, or eight datawords. The READ REQUEST itself is followed by no data words.

FIG. 50C is a diagram of the READ/WRITE PROGRAM MEMORY B command (WR_PORG_MEMORY_B) to address 0x0a and is followed by a one, two or eight datawords depending on the value in the length field.

FIG. 50D is a diagram of the READ PROGRAM MEMORY B request (RD_PROG_MEMORY_) which requests one, two or eight datawords as defined in the length field. It should be noted that READS (and WRITES, if explicitly enabled in the gui) to data program memory can be performed non-intrusively (on the fly). However, the PC Debugger shall be disciplined not to request L=10 or 11 (two or eight word dumps/writes) on the fly. These shall be available only in Slave Mode (after a HALT command is issued) on the relevant DSP. The PC Debugger delivery mechanism should be designed for a maximum 0.25 MIPs load on the chip in the non-intrusive mode, i.e., about 1% of the processor capability. Typically, this load should be well below 1%, for example, about 0.1%.

FIG. 50E is a diagram of the WRITE I/O REGISTER B command (WR_I/OREG_B) at address 0x0c which is followed by one dataword.

FIG. 50F is a diagram of the READ I/O REGISTER B, (RD_I/OREG_B) which returns one dataword from address 0x0d. It should be noted that it is assumed that pages 0 and 1 are "owned" by DSPA and pages 2 and 3 are "owned" by DSPB. The PC Debugger backend has this information and probes only the appropriate DSP for the pages it "owns", although the above syntax is generalized. Thus, the PC Debugger prevents collisions during non-intrusive I/O register access.

FIG. 50G is a diagram of the WRITE REGISTERS AR0–7 (WR_ALL_AR_E) which is followed by eight datawords to address 0x0e.

FIG. 50H is a diagram of the READ REGISTERS AR0–7 request (RD_ALL_AR_B) which has no following datawords but eight datawords are returned from address 0x0f.

FIG. 50I is a diagram of the WRITE AR REGISTERS 0–7 (WR_AR_[0–7]_B) at addresses 0x10, 0x12, 0x14, 0x16, 0x18, 0x1a, 0x1c, and 0x1e.

FIG. 50J is a diagram of the READ REGISTERS AR 0–7 (RD_AR[0–7]_B) from addresses 0x11, 0x13, 0x15, 0x17, 0x19, 0x1b, 0x1d, and 0x1f. This READ request should contain logic 0's in the lower fourteen bits.

FIG. 50K is a diagram of the WRITE TO ALL MAR REGISTERS (WR_ALL_MAR_B) to address 0x20 and is followed by eight data words (MAR0–7).

FIG. 50L is a diagram of the READ ALL MAR REGISTERS Request (RD_ALL_MAR_B) which returns eight words (MAR0–7) from address 0x21.

FIG. 50M is the WRITE ER Register 0 command (WR_PAR0_B) which writes Registers PAR 0 at address 0x22.

FIG. 50N is a diagram of the READ Register PAR0 Register at address 0x23 (RD_PAR0_B).

FIG. 50O is a diagram of the WRITE Register PAR1 at address 0x24 (WR_PAR_1_B).

FIG. 50P is a diagram of the READ Register PAR1 Register at address 0x25 (RD_PAR1_B).

FIG. 50Q is a diagram of the WRITE Register MPAR0 Register at address 0x26 (WR_MPAR0_B).

FIG. 50R is a diagram of the READ Register MPAR0 Register at address 0x27 (RD_MPAR_B). This READ request should contain 0's in the lower eleven bits.

FIG. 50S is a diagram of the WRITE Register MPAR1 Register at address 0x28 manned (WR_MPAR1_B).

FIG. 50T is a diagram of the READ MPAR Register at 0x29 request (RD_MPAR1_B). This READ request should contain 0s in the lower eleven bits.

FIG. 50U is a diagram of the WRITE Accumulator 0 at address 0x2a command (WR_ACC0_B). This WRITE command writes two datawords, the high and low datawords discussed above.

FIG. 50V is a diagram of the READ Accumulator 0 at address 0x2b Request (RD_ACC0_B). This request results in an access to the high and low accumulator words.

FIG. 50W is a diagram of the WRITE Accumulator 1 at address 0x2c Command (WR_ACC1_B). This command writes two datawords to the high and low data positions in accumulator 1.

FIG. 50X is a diagram of the READ Accumulator 1 at address 0x2d Request (RD_ACC1_B), which returns the high and low words from Accumulator 1.

FIG. 50Y is a diagram of the WRITE Register CR at address 0x2e command (WR_CR_B).

FIG. 50Z is a diagram of the READ CR Register at 0x2f request (RD_CR_B).

FIG. 50AA is a diagram of the WRITE Program Counter at address 0x30 command (WR_PC_B). It should be noted that this non-intrusive write is not allowed by the PC Debugger.

FIG. 50AB is a diagram of the READ ALL the PCC stack locations at address 0x31 (RD_ALL_STACKPCS_B). This request returns eight words from locations STACKPC0–7.

FIG. 50AC is a diagram of WRITE TO LOOP COUNTER at address 0x32 (WR_LC_B) and, non-intrusive writes are not allowed by the PC Debugger.

FIG. 50AD is a diagram of the READ ALL LOOP COUNTER STACK LOCATIONS at address 0x33 (RD_ALL_STACKLCS_B). This request returns eight datawords (STACKLC0–7).

Currently unused opcodes are: three CONTROL command opcodes (0x05 . . . 0x07), six WRITE command opcodes (0x34, 0x36, 0x38, 0x3a, 0x3c, 0x3d), and six READ command opcodes (0x35, 0x37, 0x39, 0x3b, 0x3d, 0x3f).

The following is a pseudocode description of the Debug monitor on each DSP (i.e. Debug Rom code). Both DSPs 200 have almost identical code and differ only in checking the A/B_field of the opcode, and accessing their respective PAGE_A/B registers. The objective of the pseudocode is to describe the structure of the code and discuss any special considerations.

Thirty-two data memory locations (0x0000-0x001f) are reserved for debugger use and are not be altered by application microcode. The soft reset module in the Reset _Handler clears all these data memory locations, which also puts the target DSP in Non-Intrusive Mode by default (Slave_MODE_FLAG==0) and also clear any pending breakpoint (Slave_MODE_FLAG==0).

The Debug handler begins with:

Debug_Handler: Backup global context and set DMEM page to 0: Backup AR 1 in DBPTMP first so one can use Direct DMEM addressing Destination. Then set AR 1==0, backup AR0, AR2, MAR2 (zero it), STATUS, and ACC0 Hi/Lo.

If IRDY==O in DBPST, then this is output—branch to Debug_Start_Output. Otherwise this is input, so continue below with:

/****************** INPUT BRANCH OF
THE MAIN LOOP ********************/

Debug_Start_Input: (IRDY==1, i.e. input) If DBERR==1 or ORDY==1, then this is an error. Set MSB_1 of Debug_Buffer_Base. This bit is sticky and will be set in every echo to the PC Debugger, till it is reset by PC Debugger (by clearing out DMEM[0x10] or by issuing Soft Reset).

If DBINT==0, this is a command word. Set DBINT to take control of the debug port. Extract L1L0 from the command word (Bits 15:14) and setup Debug_Word_Count as 1, 2, 3 or 9 appropriately. Move DBPIN into Debug_Buffer_Base (without destroying the sticky ERR bit).

If this is a read request (LSB of opcode==1) then jmp D_S_I_No_More_Words to process the request. Otherwise, move Debug_Word_Count into Debug_Running_Word_Count and decrement it. If zero, the write message was single-word, so jmp D_S_I_No_More_Words to process it. Otherwise setup Debug_Buffer_Pointer to receive the next word (Debug_Buffer_Base+1) and jmp Debug_Resume to terminate this debug interrupt/iteration.

Else (If DBINT==1), this is a data word. Move DBPIN into Debug_Buffer_Pointer with postincrement of pointer. Decrement Debug_Running_Word_Count.

If non-zero jmp Debug_Resume to terminate this debug interrupt/loop. Else, one has received all the words for this message, continue below with:

D_S_I_No_More_Words: Clear DBINT for next session from PC. Isolate opcode from Bits 22:16 and jump to appropriate opcode handler.

/*************** OUTPUT BRANCH OF THE MAIN LOOP******************/

Debug_Start_Output: (IRDY==0, i.e. output) If DBERR==1 or ORDY==0, then this is an error. Set MSB_1 of Debug_Buffer_Base (sticky ERR bit)

If Debug_Running_Word_Count==0, this is a false interrupt. Ignore with jmp Debug_End_Output. A false interrupt can happen at the end of a Trap ISR if a debug request from PC collided with the TRAP instruction. In such a case, the TRAP ISR will be taken first due to higher priority. The trap handler rejoins the Debug handler in Slave Mode, which would then service the collided Debug request and any further requests. After the Continue to the TRAP ISR, the pending (queued up) Debug INT due to the original collided Debug request will cause a false interrupt. This is interpreted by ROM code as Non-Intrusive Output mode (since after Continue, Slave_Mode_Flag=IRDY==0, and ORDY==1). We can thus recognize the false interrupt as Output mode with Running Word Count==0, since nothing is left to be sent. In normal operation, this can never happen since we always clear DBINT after sending out the last word. So simply ignore this false interrupt.

Else, send next word from Debug_Buffer Pointer into DBPOUT with post-increment. Decrement Debug_Running_Word Count. If zero jmp Debug_End_Output. Otherwise there are more words to be sent. If not in Slave Mode, jmp Debug_Exit to gracefully return to main code. If in Slave Mode, spin till ORDY==1 and then loop back with jmp Debug_Start_Output.

Debug_End_Output: Clear DBINT and jmp Debug_Resume to terminate this debug interrupt/iteration.

/************ END OF A DEBUG INTERRUPT/ITERATION *************/

Debug_Resume: If in Slave Mode this has to be input (since Debug_End_Output above covers the output case), clear IRDY and spin till IRDY==1. Then jmp Debug_Start_Input. If not in Slave Mode, continue below:

Debug-Exit: Clear IRDY Then restore global context—first restore AR1, AR2, MAR2, ACC0 Hi/Lo, STATUS, and only at the end restore AR0 (source DMEM page). Then reti.

/*********** OPCODE HANDLERS *************/

In general, each opcode handler performs its function according to the specifications discussed above in "Debug Messages". Resources that are not globally backed-up should be locally backed-up and restored here. Also care should be taken to ensure proper state of MAR, MPAR and CR in case of post modify.

After processing, if there is no read response message to be sent back to PC debugger (control/write message), the DSP continues with jmp Debug_Resume.

If there is a read response message to be sent back to the PC Debugger, then the echo command word should be left untouched in Debug_Buffer_Base and the remaining data words should be filled up in this buffer. If the requested resource is amongst those globally backed-up, then the backed-up value should be returned. Then jmp Debug_Kick_Start_Output which sets up the Debug_Running_Word_Count from Debug_Word_Count, initializes Debug_Buffer_Pointer to Debug_Buffer_Base (first word back to PC Debugger), sets DBINT to maintain possession of the debug port, clears IRDY, and jmp Debug_Start_Output. This initiates the return message to the host and the rest of the transaction is carried on via interrupts/polling as described above.

Some opcode handlers needing special consideration are further discussed below:

Reset: Particularly for DSPA, clear IRDY since DSPA soft reset from CR will not reset the Debug port.

Halt: Set Slave_Mode_Flag and jmp Debug_Resume.

Continue: Clear Slave_Mode_Flag and Debug_Breakpoint_Active_Flag. Also clear TRACE bit in CR just in case we were just now single-stepping before this. jmp Debug_Resume.

Single_Step: Clear Slave_Mode_Flag, set TRACE bit in CR and Jmp debug_Resume.

Jump_To_Patch: Simply jmp to address in lower 13 bits of Command word. Depending on what the downloaded path does, it should rejoin with jmp 0x1005 (which leads to Debug_Resume) if there is no response to PC debugger, Or rejoin with jmp 0x1006 (which leads to Debug_Kick_Start_Output) if there is a prepared response to PC debugger.

Wr/Rd_IOREG: If STATUS is requested, this should be interpreted as maincode STATUS which is currently available as SHADOW due to hardware pointer swap on taking the interrupt. Similarly, if SHADOW is request, the backed-up STATUS should be returned.

Also, when the PAGE_A/B registers are requested, depending on which DSP, return backed-up PAGE_A on DSPA and backed-up PAGE_B on DSPB.

For other registers since there is no indirect access to IOREGs, first the page specification is decoded from the command word, and place in PAGE_A/B (after backup). While modifying PAGE_A/B, it is important not to mess up the semaphores since the other DSP might be accessing/using them right now.

Then an in-place instruction is constructed in PMEM Location 0x1d with a return jump in 0x1e to read/write the specified register from/into the Debug_Buffer_Base+1 DMEM location (dataword).

The Trap handler begins with:

Trap_Handler: Backup global context and set DMEM page to 0 as in the Debug_Handler. The code has to be replicated here since one cannot afford a level of stack to use a jmps. Then simply set Debug_Breakpoint_Active-flag=1 in DMEM and simply rejoin the Halt opcode handler above with jmp Dbg_Halt. This emulates a halt, which sets Slave_Mode_Flag and then implements the Slave loop. By now PC Debugger should be polling Debug_Breakpoint_Active_Flag and once it detects that it is 1 it recognizes the trapped event, and should proceed appropriately.

The PC Debugger Backend can now be described. The PC Debugger is assumed to connect with supporting external hardware, for example, on the evaluation board. In write mode, this hardware accepts one 24-bit word at a time from the PC and pushes it into decoder 100 via DBCK and DBDA using the ACK mechanism to sense chip IRDY and avoid collisions. A minimum spacing (details below) between 24-bit words is ensured during Non-Intrusive Mode to limit the MIPS overhead on the DSP.

In Read Mode, the evaluation board hardware accepts a read request from the PC and pulls one 24-bit word from the chip, again using the ACK mechanism to sense chip ORDY and avoid collisions. Here also, Non-Intrusive Mode has the constraint of a minimum period between two PC read requests.

If the chip has not already been downloaded and reset, then the debugger should clear out the following DMEM variables to ensure a clean state—Slave_Mode_Flag (0x00), Debug_BreakPoint_Active_Flag (0x0f). There is no harm in clearing this unconditionally in order to guarantee a clean startup state.

The following is a list of primitive GUI functions and their mapping to sequences of Debugger commands. As before, two versions of commands are available, one for each DSP:

(i) Halt: PC Debugger issues a HALT message to the DSP(s). This switches debugging from Non-Intrusive to Slave Mode and updates all GUI windows for the relevant DSP. This command is valid only in Non-Intrusive Mode.

(j) Continue/Go: PC Debugger issues a CONTINUE message to the DSP(s). Continue command switches debugging from Slave Mode to Non-Intrusive Mode. This command is valid only in Slave Mode.

(k) Single_Step: PC Debugger issues SINGLE_STEP and the DSP simply sets the TRACE bit in each CR and then exits the Debug ISR. After executing a single instruction, the DSP traps back to the Slave_Loop. The PC Debugger should poll (see Breakpoint discussion below) and update the GUI once the single step has been completed. This command is valid only in Slave Mode. Even though Single_Step could be implemented by a sequence of RD_CR, WR_CR to set the TRACE bit, and CONTINUE, a dedicated command is implemented in the Debug ROM to simplify GUI code.

(l) Go_From/Jump_To: The PC Debugger first issues WR_PC to indicate the new PC location and then a CONTINUE. This command is valid only in Slave Mode.

(m) Run to Cursor: The PC Debugger sets up a temporary Breakpoint (see below) at the specified Cursor location and issues a CONTINUE. After polling and determining that the breakpoint has been hit, the breakpoint is deleted by the PC Debugger. This command is valid only in Slave Mode.

(n) Step over: The PC Debugger analyzes the program (local copy) and sets up a temporary Breakpoint (see below) at the next instruction, and then issues a CONTINUE. The DSP then runs over any possible subroutine call(s) and halts before executing the next instruction. The PC Debugger then deletes this temporary breakpoint.

(o) Step through: Same as Single_Step.

(p) Reset: PC Debugger issues the RESET command to the appropriate DSP; this sets the RS bit in the CR (works in both Non-Intrusive and Slave Mode).

(q) Data Memory, Program Memory, IO Registers, AR/MAR, PAR/MPAR, ACC0/1, PC, LC:

Slave Mode:

All visible windows in the GUI are updated using corresponding messages for each of the above registers. Also, writes to each of the above are implemented with their corresponding messages.

Exception: Only PC/LC and PCMINUS/LCMINUS can be written while complete STACKPC/LC[0:7] can be read. In addition to visible windows, some standard entities (ACC0/1, IOREG etc.) are updated with every HALT or SINGLE_STEP.

Non-Intrusive Mode:

Only selected windows are updated. By default, the GUI does not update any windows or accept any writes to windows. Every variable that is desired to be dynamically updated or written to must be explicitly enabled in the GUI to do so. Even then, all read/write messages to decoder 100 can only be single-word (L=00) and have to be sufficiently spaced to ensure non-intrusiveness. Consequently, there is a constraint to the number of such updated variables based on maintaining non-intrusiveness.

If we allow a maximum of 1% Debug overhead in Non-Intrusive Mode, and it we assume that each Debug ISR visit is about thirty instructions on average, this amounts to one Debug interrupt every 3000 instructions. At 25 MIPS, this means each 24-bit word transfer to/from the chip (i.e., IRDY and ORDY interrupts) has to be spaced at least 120 us apart. This amounts to about 200K bps transfer rate for back-to-back transfers, although typically the clock would be at a higher rate (maximum 2 MHZ), and the transfers duty-cycled accordingly, not to exceed the above average throughput.

Thus, the PC Debugger has the burden of not exceeding this maximum rate in Non-Intrusive Mode. This, in turn, translates to a constraint on the number of variables/registers that can be peeked or poked in real-time for a given DSP. A simple way of limiting this would be to constrain the above maximum rate, and allow the GUI to peek/poke anything within this limit. If the user exceeds the peeking/poking limit, the request will be rejected and the user will be warned to back off existing watches in order to view any new variables non-intrusively.

(r) Scopes, Buffer Extraction:

These are implemented using Non-Intrusive memory reads. Since this is bandwidth-limited there is an upper limit to the sampling rate of any given memory location. The PC Debugger periodically (based on PC internal timer) samples the specified variable and creates a scope buffer for display on the GUI. These can be set only in Slave Mode, although they are updated and viewable at any time.

(s) Buffer Injection:

This is allowed only during Slave Mode. PC Debugger uses WR_DATA/PMEM commands to inject the buffer into specified data locations.

(t) Active and Polled Watches:

These are implemented using Non-Intrusive memory reads. They can be set only in Slave Mode. However, they are updated and viewable in both Non-Intrusive and Slave Mode.

A POLLED WATCH periodically (user_specified period) polls the specified entity using RD_DMEM or RD_PMEM, etc., commands.

(u) Breakpoints:

Breakpoints can be set or deleted in Slave Mode only.

The PC Debugger takes a user-specified breakpoint location and reads that program location from the device using Rd_PMEM and stores this in a local breakpoint buffer. It then replaces that location in the DSP with a trap instruction using Wr_PMEM.

Deleting breakpoints is accomplished by simply restoring the original instruction at the specified location, and clearing that location from the local breakpoint buffer.

A CONTINUE resumes DSP operation, but the PC Debugger now knows that a Breakpoint has been set.

In the decoder, no unsolicited messages are allowed. Therefore, a DSP 200 cannot proactively report that it has hit a breakpoint. This constraint is required to eliminate write collisions between the PC Debugger and the two DSPs (that can occur when one DSP has to report a breakpoint stop while a message is being written by the PC Debugger to the other DSP). Enforcing this constraint saves on-chip and off-chip hardware.

In decoder 100, after setting a breakpoint and letting the given DSP 200 run, the PC Debugger has the burden of periodically (this can be at considerably large intervals, for example, 100 ms) polling the corresponding DSP (only if that DSP has any breakpoints set) to see if it has stopped. There is no explicit message for this. However, there is one predetermined location in Data Memory (Breakpoint_Active) that serves as a flag. This is read, non-intrusively, using the Rd_DMEM command. If this word is non-zero, it indicates that the DSP has indeed stopped at a breakpoint and is spinning in the Slave Loop awaiting commands.

Once the PC Debugger ascertains that the DSP has stopped at a Breakpoint (if the GUI has not commanded a HALT already), it updates the GUI just as it would do on a HALT GUI instruction, and also indicates the breakpoint location in the code window. For the latter it uses the Rd_All_PC command to read the STACKPC[0–7], and the Rd_IO_Register to read the STATUS register. It then calculates the Stack Pointer, and then the value of PCMINUS, which is the breakpoint location.

This process is also executed when returning from a single-step (TRACE-generated) TRAP.

Interprocessor Communication (IPC) and Protocol can now be described in further detail in view of the discussion above and FIG. 41. The Dual DSP processor architecture according to the principles of the present invention, is advantageously very powerful in the effective use of available MIPS. However, it is important to remember that the target application must be such that it is relatively easy to split processing between the two engines. Both AC-3 and MPEG-2 multichannel surround applications possess this quality. The essential element to an efficient implementation of these applications is the effective communication between the two engines. In decoder 100 the shared resources between the two processors are the 544×24 word data memory 204 and the communication register file 1302 consisting of ten I/O registers.

These shared resources can advantageously synchronize the 2 DSPs for the task at hand.

1. Shared Data Memory

The basic concept behind the shared memory is that of master and Slave. DSPB is defined as the master in the system, and is also the master of the write access to the shared memory. In the case of a read access DSPA is the master of the shared memory 1302. Both processors are allowed to write and read to and from the shared memory.

The concept of the Access Token is introduced here. Most of the discussion that follows concentrates on write token, however, the same concept applies to read token as well. It is possible that one processor has the ownership of write token and the other has the ownership of the read token. It is also possible that one processor has the ownership of both tokens.

Figure 51A:
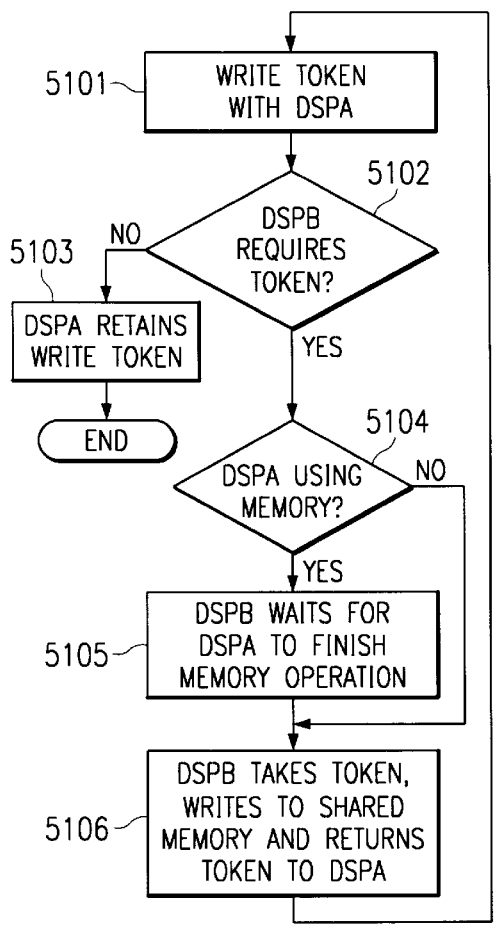
FIG. 51A is a flow diagram of an exemplary write sequence to shared memory.

FIG. 51A is a flow diagram of an exemplary write to shared memory by DSPB, assuming that the token is with DSPA initially at Step 5101. In case of write access, only the processor that has the token can proceed with the write operation. DSPB, as the master, controls the ownership of the token. DSPA has the token as the default (Step 5103), but it does not control the token's ownership. This is because most of the time the data-flow through shared memory is from DSPA to DSPB (e.g., a set of transform coefficients plus a descriptor is written by DSPA and read by DSPB). DSPB takes the token from DSPA only when it needs it (Step 5102). As soon as DSPB is finished with its write, it passes the token back to DSPA (Step 5106). If DSPA is using memory at the moment when DSPB wants to take the token back (Step 5104), DSPB must wait for DSPA to complete the current access (Step 5105). The arrangement is designed to ensure that there are no incomplete accesses. In order to fully implement this process another variable is introduced that indicates whether DSPA is actually using shared memory when it does have the token. That is, DSPA can possess the token but may or may not be actively accessing the shared memory at the time that DSPB wants it.

In the pseudo-code that controls the access to shared memory, variable WR_PRIVILEGE_A plays the role of write token. When WR_PRIVILEGE_A=1, DSPA has the token. When WR_PRIVILEGE_A=0, DSPB has the token. WR_PRIVILEGE_A can be read by both DSPA and DSPB, but it can be written only by DSPB. The second variable, WR_USE_A, indicates whether DSPA is really using shared memory or not. When DSPA has the token (WR_PRIVILEGE_A=1) and WR_USE_A=1, then DSPA is writing to shared memory, When WR_PRIVILEGE_A=1 and WR_USE_A=0, DSPA has the token but is not accessing the shared memory.

When WR_PRIVILEGE_A=0, DSPB has the token and it is assumed that it is using the shared memory, since DSPB is designed to pass the token back to DSPA when DSPB's memory access is complete. The table below summarizes the possible states regarding shared memory access.

TABLE 67

Shared Memory Access Variables

| WR_PRIVILEGE_A | WR_USE_A | Description |
| --- | --- | --- |
| 1 | 0 | DSPA has the token but it is not accessing the shared memory |
| 1 | 1 | DSPA has the token and it is accessing the shared memory |
| 0 | 0 | DSPB has the token but it is not accessing the shared memory |
| 0 | 1 | Illegal state (not allowed), since this condition indicates that DSPA does not have the token and is accessing the shared memory |

The two variables, WR_PRIVILEGE_A and WR_USE_A, actually reside in two separate I/O registers that are visible to both DSPs. They act as semaphore variables that control physical access to the shared memory. These two I/O registers are in addition to the existing IPC register file that consists of eight registers (and will be detailed later in this document). Also, these two I/O registers do not need to be twenty-four bits in length; eight bits are sufficient. It is important to note that the nature of the access to these two I/O registers is such that DSPB will never write to the register that contains WR_USE_A and DSPA will never write to the register that contains WR_PRIVILEGE_A. Rather, they will only read from those registers, respectively.

Code that DSPA has to execute before it can write to shared memory is:

Wait-1: and AIR_PRIVILEGE_A, 1, Junk (test whether write token is available)
jmpwait_1, EQ
DISABLE INTERRUPTS
mvp1, WR_USE_A (token available, try to use shared memory)
nop (extra instruction needed for sync-ing)
nop and WR_PRIVILEGE_A, 1, Junk (check again whether token is still in possession)
jmp Continue_1, NE
ENABLE INTERRUPTS
mvp0, WR_USE_A (unsuccessful attempt, almost got it)
jmpwait_1 (go back and wait for the resource)
Continue_1:ENABLE INTERRUPTS
{token obtained and the access to shared memory is safe}
{after some event like interrupt from DSPB or similar decoding event}
{reset WR_USE_A to zero so that DSPB can take the token if it wants to}
mvp0, WR_USE_A On the other hand, if DSPB needs the shared memory, it will attempt to get the token from DSPA. The piece of code that it runs looks like this:

Wait_3: ENABLE INTERRUPTS
Wait_2: and WR_USE_A, 1, ACC
jmpWait_2, NE (DSPA is using shared memory so wait)
DISABLE INTERRUPTS
xorWR_USE_A, ACC, Junk (check again if the value is consistent)
jmpWait_3, NE (almost got it, but unsuccessful)
mvp0, WR_PRIVILEGE_A (take the token back)
ENABLE INTERRUPTS
{access the shared memory}
mvp1, WR_PRIVILEGE_A (return the token to DSPA)

To summarize, writes to shared memory only DSPB can write the variable WR_PRIVILEGE_A and only DSPA can write the variable WR_USE_A. Both DSPs can read either variable at any time. A potential problem can arise when DSPA is setting the WR_USE_A and DSPB is reading it at the same time. If this happens in exactly the same instruction cycle, it will be resolved by introducing a two-instruction delay and check for the WR_PRIVILEGE_A again on DSPA side. Also DSPB reads the value of WR_USE_A twice to ensure that the value is valid before taking away the token from DSPA. It is important to note that this critical piece of code must not be interrupted, otherwise the timing of execution is corrupted and the communication would not be reliable.

Figure 51B:
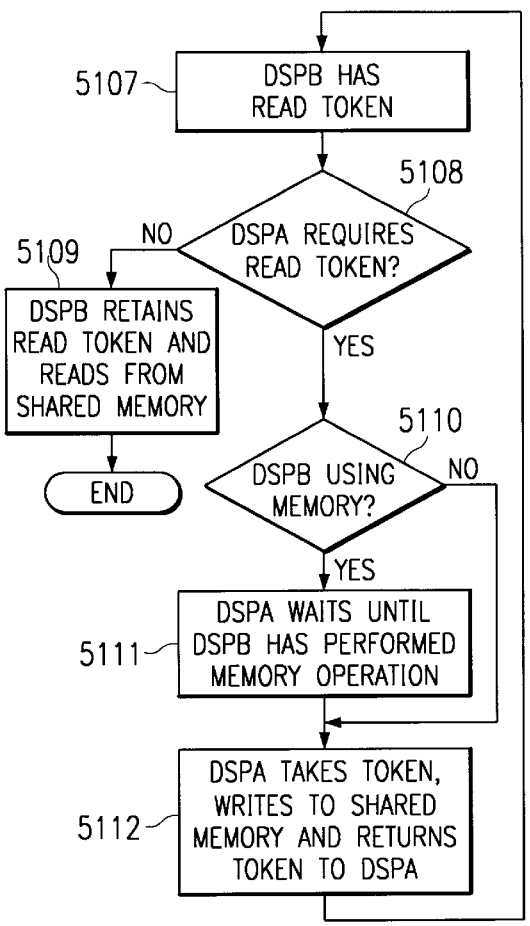
FIG. 51B is a flow chart of a typical read sequence to shared memory.

A very similar concept is introduced for read accesses where RD_PRIVILEGE_B and RD_USE_B variables are used. FIG. 51B is a flow chart of a typical read sequence to shared memory by DSPA. Steps 5107–5112 are analogous to the steps shown in FIG. 51A. In this case the roles of DSPA and DSPB are reversed and it is DSPA that controls the ownership of the read token, but by default it is DSPB that really owns the token. In case that DSPA needs a read token it will take it away from DSPB, just like DSPB was taking away the write token.

This concept is important since most of the time it is DSPA that writes to shared memory and it is DSPB that reads from shared memory. So, DSPB needs to write to shared memory on exception basis, just like DSPA needs to read from shared memory on the exception basis. In order to minimize the overhead of switching the token ownership the roles of DSPA and DSPB are as described above. Note, that while DSPB is generally a master in the system, in case of read token it is DSPA that is the master. This is the only exception to the master-Slave concept, where DSP is always the master. We could have had DSPB to be the master in this case as well, however, every read access from shared memory by DSPB will suffer from unnecessary overhead of taking away the read token from DSPA.

Figure 52:
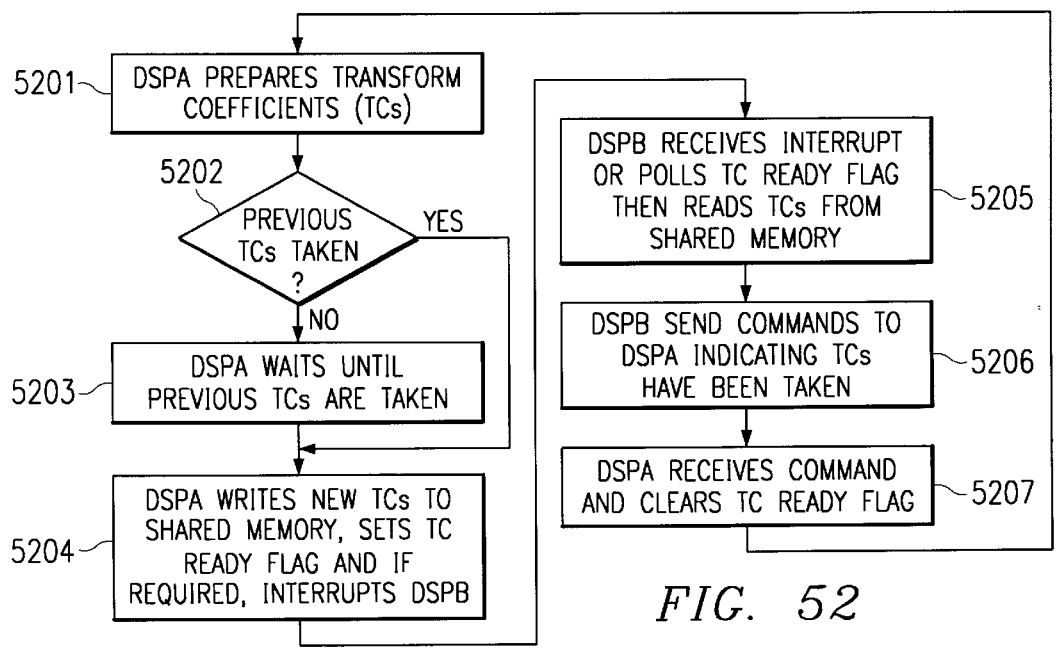
FIG. 52 depicts the case of typical interrupt-driven exchange between processors.

It is important to emphasize the fact that read and write tokens along with RD/WR USE variables simply control the physical access to the shared resources. In the case of the transfer of a Transform Coefficient (TC)(shown in FIG. 52 and 53), such as in an AC-3 application, an additional logical level in the communication protocol has to be implemented. FIG. 52 depicts the case of typical interrupt-driven exchange and FIG. 52 the case of a typical exchange controlled by register polling.

Once DSPA has the TCs ready (Step 5201) it must check whether the previous TCs are taken (Step 5202). If not, DSPA must wait because it is ahead anyway (Step 5203). If the previous set of TCs is taken, the physical access to the shared memory must be obtained through the procedure described above, Once that is accomplished, the TCs are written, along with the descriptor, and the flag TC_READY is set in the I/O register (the same register that contains the WR_USE_A bit)(Step 5204). DSPB polls this bit regularly in its main loop code to check whether new TCs are ready. Note that there is no need to interrupt DSPB. Once DSPB sees that TC_READY is set (DSPB can read this I/O register), DSPB obtains the read access to the shared memory and it starts the processing of that audio channel and, in the case of AC-3, performs the pretwiddle subroutine (Step 5205). Following this, DSPB sends a command (TCS_TAKEN) to DSPA, informing DSPA that the TCs are taken (Step 5207). DSPA receives an interrupt based on this command, and in the interrupt handler, clears the variable TC_READY, thus enabling the next set of TCs to be written to shared memory.

A similar concept is valid for PCM data transfer. Flag PCM_DATA_READY is set by DSPA. Once DSPB reads PCM data from the shared memory it sends a message PCM_DATA_TAKEN, This message generates an interrupt on DSPA side and DSPA will clear bit PCM_DATA_READY. Note that the compressed-audio data transfer and PCM data transfer can occur at the same time, that is, DSPB can read the TCs while DSPA can write the PCM data into the second half of shared memory.

Only in the case of AC-3 2/0 mode, in which rematrixing can be employed, can the shared memory contain TCs of both channels. This is understood by the software. In this case, the PCM data transfer will have to be time-multiplexed with the TC transfer. This is really not a problem since in this mode the computational load is about 35–40% of the usual 5.1 channel decoding case.

The AB_semaphore_token register (FIG. 41) has the following format:

TABLE 62

| AB_semaphore_token register | | | |
|---|---|---|---|
| RD_PRIVILEGE_B | WR_USE_A | PCM_DATA_READY | TC_READY |

Note that DSPA can both write and read into this register and that DSPB can only read from this register.

The BA_semaphore_token register has the following format:

TABLE 63

| BA_semaphore_token register | | | |
|---|---|---|---|
| WR_PRIVILEGE_A | RD_USE_B | BA_DATA1_READY | BA_DATA2_READY |

Note that DSPB can both write and read into this register and that DSPA can only read from this register 1. Communication Register File The communication register file (FIG. 41) consists of eight registers. They are split into two groups of four registers each, as shown below.

```
COMMAND_AB [23:0]
PARAMETER_0_AB [23:0]
PARAMETER_1_AB [23:0]
COMMAND_AB_PENDING [0]
AB_semaphore_token
  register
COMMAND_BA [23:0]
PARAMETER_0_BA [23:0]
PARAMETER_1_BA [23:0]
COMMAND_BA_PENDING [0]
BA_semaphore_token
  register
```

The first group of four registers is used by DSPA to send commands to DSPB, along with appropriate parameters. The second set of registers is used by DSPB to send commands and parameters to DSPA. So, the communication protocol is completely symmetrical.

Figure 53A:
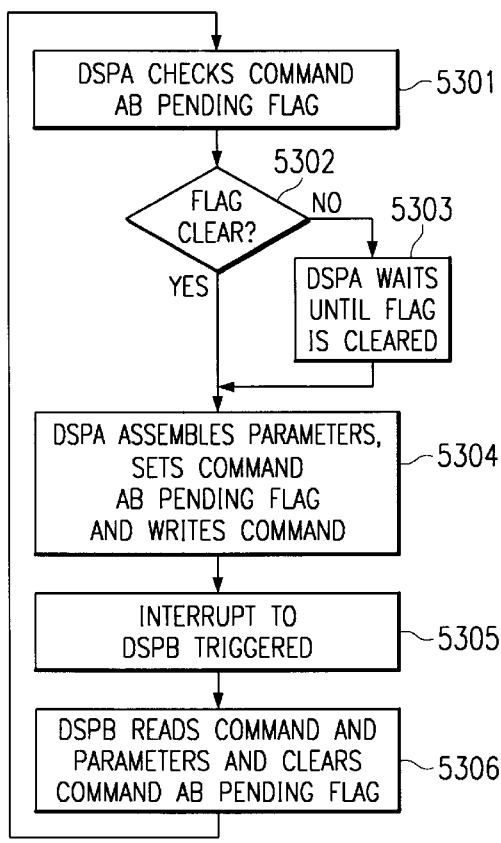
FIG. 53A depicts an interrupt-driven command exchange between DSPA and DSPB.

Consider the case when DSPA is sending a command to DSPB as shown in FIG. 53A. Before DSPA can send a command, it must check the COMMAND_AB_PENDING flag to make sure that the previous command from A to B was taken by DSPB (Step 5301). If it is appropriate to send the message (Step 5302), DSPA assembles the parameters, sets the COMMAND_AB_PENDING flag and writes the command itself (Step 5304). Otherwise, DSPA waits at Step 5303. The event of writing the COMMAND_AB_PENDING triggers a DSPB interrupt (Step 5305), which in turn reads the command and its parameters and at the end clears the COMMAND_AB_PENDING flag (Step 5306). This allows DSPA to then send another command if necessary.

Figure 53B:
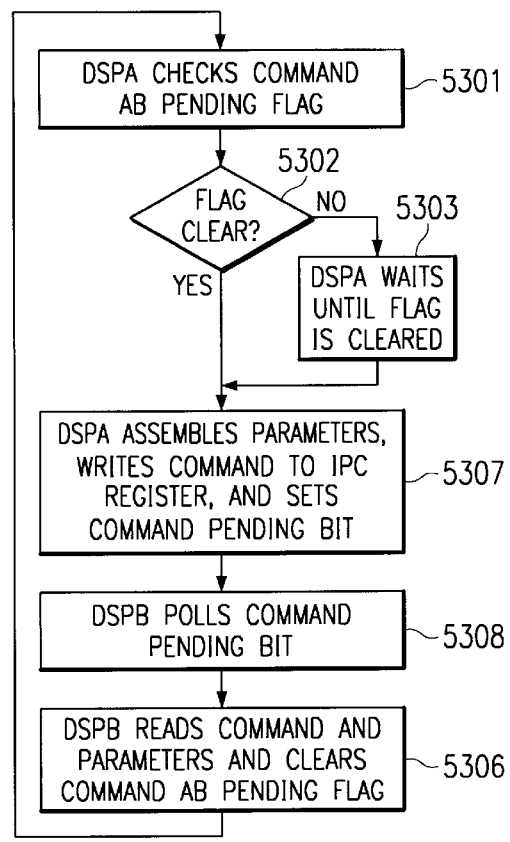
FIG. 53B is a diagram of a command exchange DSPA and DSPB controlled register polling.

In the illustration of FIG. 53B, steps 5304 and 5305 have been replaced with Steps 5307 and 5308 respectively. In step 5307, DSPA prepares the TCs, writes a command to the A command IPC register, and then sets the AB pending flag. At Step 5308, DSPB polls the AB pending bit to determine if data is ready to be read.

It should be noted that both DSPs have write access to the COMMAND PENDING register but the software discipline will ensure that there is never a conflict in the access. If DSP(A/B)200a, 200b cannot issue the command because the COMMAND_AB_PENDING bit is set, it will either wait or put a message into a transmit queue. Once the command is received on the other side, the receiving DSP can either process the command (if is a high-priority command) or store it into a receive queue and process the command later. Scheduling of command execution will be such that minimum latency is imposed in the system. Regular checking at the channel resolution (about 1 ms) will ensure minimal latency in processing commands.

When one processor is not accepting messages, a time-out is required to inform the Host about the potential problem. If DSPA is not responding to messages from DSPB, the Host will be notified by DSPB. If DSPB is not responding to DSPA, then, most likely, it is not responding to the Host either, and Host will know that explicitly. If DSPB is not responding to DSPA, but it is responding to the Host, DSPA will stall, will stop requesting data, the output buffers will underflow and the demux (or upstream delivery engine) will overflow in pushed systems or time-out in pulled systems.

The exact syntax and semantics of the IPC messages will be determined later. The initial list of messages includes:
Messages from A to B:
  1) sync search and lock conditions (various modes—PES, AC-3)
  2) CRC problems to initiate error concealment procedure in DSPB
  3) bitstream status and info
  4) decode status and info
  5) TC and PCM data transfer (no commands necessary as explained earlier)
  (descriptors that come synchronously with the TCs convey a lot of information: decode context as well as PTS for A/V sync: see A/V sync section)
Messages from B to A:
  1) Kick_start_sync_search_and_decode (or simply go)
  2) control and status messages that DSPA needs to execute on behalf of DSPB based upon the Host's request, including initialization and run time messages (setting up the registers in the input block etc.)
  3) TCs_taken (PCM_data_taken)
  4) boot messages (in case that DSPB boots DSPA).
D. Host Processor Interface DSPB interacts with the Host Processor either through the Parallel Interface or the Serial Control Port. The Host chooses which one of these will be used by setting the Mode-pins during reset.

Additionally, the Parallel Interface can be configured in either the Intel or Motorola mode, and the Serial Control Port can operate in either I²C mode or SPI mode.

However, all the different modes of operation mentioned above are transparent to DSPB during application runtime. This is because DSPB is interrupt-driven and all the above generate the same interrupt to DSPB and submit/accept eight-bit data in the same HOSTDATA register. Every time the Host sends a byte to the decoder 100, DSPB receives an interrupt so that it can read out the data, and thus allow the Host to send in the next byte, if any. Similarly, every time the Host pulls out a byte from decoder 100, DSPB receives an interrupt so that it can fill up the next byte to be sent out, if any. This scheme minimizes the waiting-time of DSPB and allows efficient utilization of the time between bytes for application and other OS tasks.

Each message between the Host and the decoder 100 consists of a 24-bit command word followed by zero or one data words, as specified by a length bit within the command word.

The command fields are interpreted as follows:

L=1-bit length specification. If set, this indicates that one data word follows (6-byte message), otherwise no data word follows (3-byte message)

OPCODE=7-bit opcode specification. LSB of opcode is 0 for Write/Control commands, and 1 for Read commands. Note: Write commands will usually have L=1 (data word follows), and Read commands will always have L=0. However, the Read Response from decoder 100 to Host will have L=1, indicating that the (read) data word follows the command word. PARAMETER= up to 16-bit opcode-specific parameter.

Figure 54:
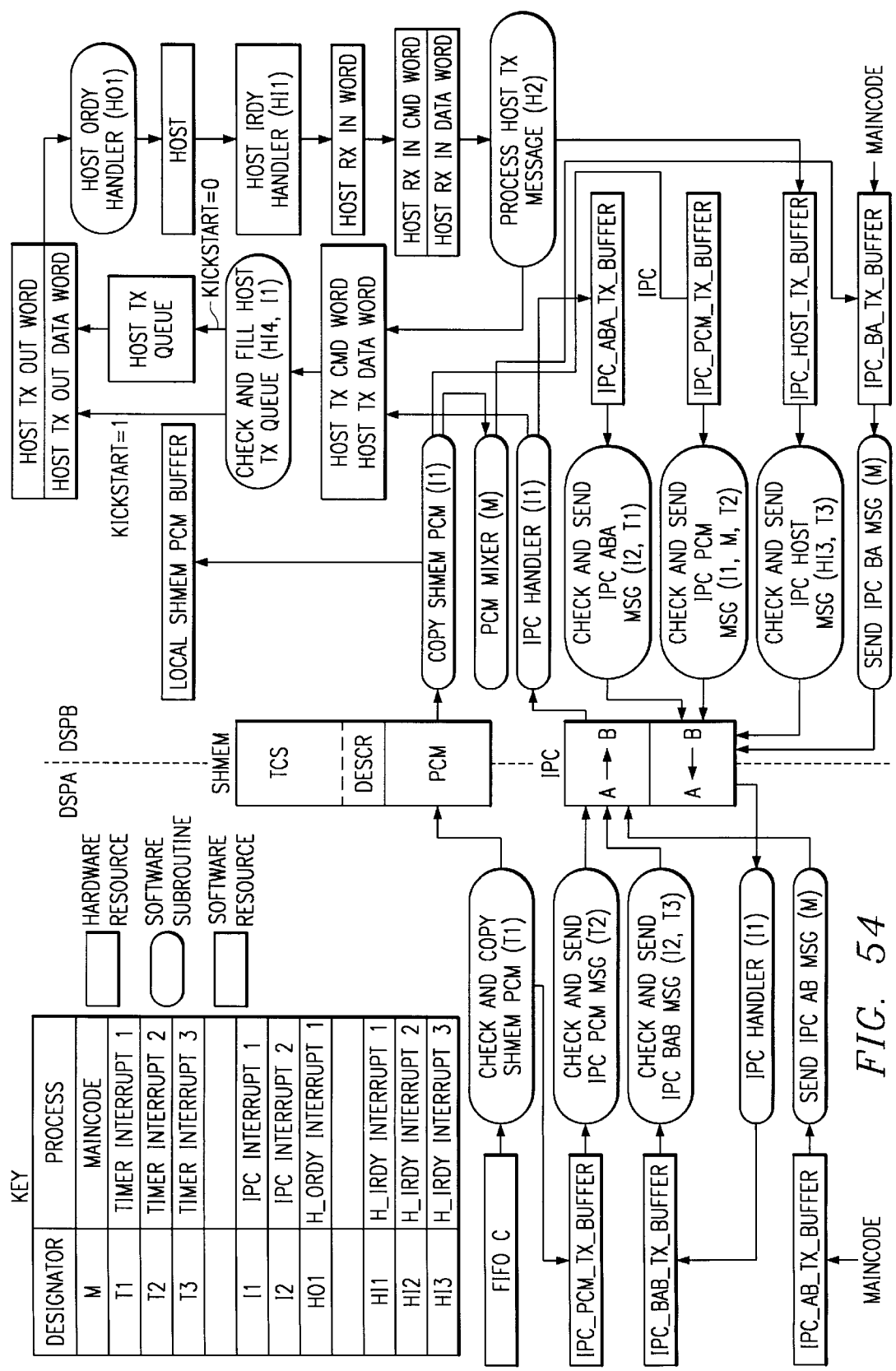
FIG. 54 illustrates the principles of operation of the host interface.

The Principles of Operation of the host interface can be described in conjunction with FIG. 54. Each time DSPB receives a Host ORDY Interrupt (Block 5401), it checks to see if there are any more bytes to be sent from the TX transmit queue (Block 5402). Transmit queue is implemented as a circular buffer and if it goes empty, a kickstart is needed to get the transmit process going. Once the first byte of the outgoing message is sent the process will be interrupt driven. The transmit process will continue as long as there are words in the transmit queue. In this case DSPB simply fills up HOSTDATA with the next outgoing byte. If there are no more bytes to be sent, it returns gracefully from the handler and sets the indicator that a kickstart is needed for next message to go out. The top of the queue (Block 5403) has a special name: Host_Tx_Out_Word and Host_Tx_Out_Data_Word, which represent next 6 bytes to be transmitted to the host.

If DSPB detects that it is in RX Mode (Block 5404), then it needs to remove the byte from HOSTDATA and process it. In order to assemble the bytes into 3-byte words (Block 5405), there is a BYTE_COUNTER, that is cleared before the start of every new word (or end of every word, with startup value=0). In addition, there is a WORD_COUNT that is cleared before the start of every new message (or end of every message, with startup value=0). Thus, WORD_COUNTER==0 if the current word being assembled is the command word, and WORD_COUNTER==1 if the current word being assembled is the data word (if any).

IN_BYTE=HOSTDATA.

If BYTE_COUNTER==0 && WORD_COUNTER==0, then

MESSAGE_LENGTH=(MSB of IN_BYTE)+1.

IN_BYTE is appropriately assembled (shift factor based on BYTE_COUNTER) into IN_WORD_0 (if WORD_COUNTER=0) or IN_WORD_1 (if WORD_COUNTER==1).

If Byte_Counter==2, then {
reset Byte_Counter
increment Word Counter
If Word_Counter==Message_length, process this message.
As a result of processing, the message and IPC message to DSPA could be sent to the host or the reply from DSPB stored into TX_Queue
Gracefully exit Handler.
}

The TX queue can be filled with outgoing messages in the following ways:

(1) as a result of Process_RX_Message (solicited response directly processed by DSPB)(Block 5405) to 5406).

(2) as a result of IPC_Handler (Block 5406)(either unsolicited message from. DSPA mainline code, or IPC_BAB message response from DSPA (Block 5408), of which the original IPC request to A was generated due to Process_RX_MEssage requesting information in DSPA)

(3) as a result of a mainline DSPB application code

In each of these cases, the Queue (assuming no overflow problems) is simply filled up with the 3- or 6-byte message, which is sent out as described above.

3. Host Messages

Just as with Debug messages, a Host message consists of a command word followed by the associated data word, if required. Commands from the Host to decoder 100 consist of CONTROL commands, WRITE commands, and READ commands. WRITE commands (and most CONTROL commands) are unidirectional, i.e., from the Host to decoder 100. READ commands always involve both directions, First, the Host sends a one-word READ REQUEST to decoder 100. After processing the request, DSPB sends back a READ RESPONSE. This is very similar to the communication scheme implemented in the Debugger.

However, unlike the Debugger, the one-bit length field (L) in each Host message always has the same meaning. Thus, the READ REQUEST will always have L=0, and the READ RESPONSE will have L=1, although the Opcodes are identical for both. (In the debugger, the length field is always ignored for READ REQUESTS).

Another major departure from the Debugger strategy is that messages from decoder 100 to the Host can be unsolicited. Such messages cover the cases of Lost Sync, Error Concealment (due to bad CRC or bitstream inconsistency), etc.

Another major departure from the Debugger strategy is that messages from decoder 100 to the Host can be unsolicited. Such messages cover the cases of Lost Sync, Error Concealment (due to bad CRC or bitstream inconsistency), etc. FIGS. 55A–55BE are diagrams representing the Host commands.

TABLE 64

Definition of Audio Manager Indices:

| Index | Variable | Dataword Content |
|---|---|---|
| 0x00 | Audio_Mgr_Control | Bit 4: IEC958_Enable = 0/1 = Disable/Enable IEC958 parsing of Compressed Data Input. Bit 0: Kickstart_Enable = 0/1 = Disable/Enable Kickstart of application. Default = 0x000000 |
| 0x01 | Pink_Noise_Control | Bit 4: White_Noise_Enable = 0/1 = Pink/White Noise output. Bits 3:0 = Output_Channel = 0 . . . 5 = L, C, R, Ls, Rs, LFE channel output. > 5 = Disabled. Default = 0x7fffff |
| 0x02 | C_Delay | 0 . . . 5 = mS delay. Default* = 0 |
| 0x03 | PCM_Precision | 1 . . . 20 = Precision of output PCM. Default* = 20. |
| 0x04 | Ls_Delay | 0 . . . 15 = mS delay (automatic + 15 for ProLogic). Default* = 0 |
| 0x05 | Rs_Delay | 0 . . . 15 = mS delay (automatic + 15 for ProLogic). Default* = 0 |
| 0x06 | Master_Volume | 0.0–1.0. Default* = 1.0 |
| 0x07 | L_Volume | 0.0–1.0. Default* = 1.0 |
| 0x08 | C_Volume | 0.0–1.0. Default* = 1.0 |
| 0x09 | R_Volume | 0.0–1.0. Default* = 1.0 |
| 0x0a | Ls_Volume | 0.0–1.0. Default* = 1.0 |
| 0x0b | Rs_Volume | 0.0–1.0. Default* = 1.0 |
| 0x0c | LFE_Volume | 0.0–1.0. Default* = 1.0 |
| 0x0d | Mute | 0/1 = Unmute/mute audio. Default = 0 |
| 0x0e | DAO0_Channel[a] | 0 . . . 5 = Channel type[b] for Digital Audio Output 0. Default* = 0(L) |
| 0x0f | DAO1_Channel[a] | 0 . . . 5 = Channel type[b] for Digital Audio Output 1. Default* = 2(R) |
| 0x10 | DAO2_Channel[a] | 0 . . . 5 = Channel type[b] for Digital Audio Output 2. Default* = 3(Ls) |
| 0x11 | DAO3_Channel[a] | 0 . . . 5 = Channel type[b] for Digital Audio Output 3. Default* = 4(Rs) |
| 0x12 | DAO4_Channel[a] | 0 . . . 5 = Channel type[b] for Digital Audio Output 4. Default* = 1 © |
| 0x13 | DAO5_Channel[a] | 0 . . . 5 = Channel type[b] for Digital Audio Output 5. Default* = 5 (LFE) |

TABLE 65

Definition of AC3 INDICES:

| Index | Variable | Dataword Content |
|---|---|---|
| 0x00 | AC3_Control | Bit 4: LFE_Enable = 0/1 = Disable/Enable LFE channel decoding Bit 0: AC3_Enable = 0/1 = Disable/Enable AC3 decoding. Default* = 0x000000 |
| 0x01 | Output_Mode_Control | Bit 8: Reserved. Always write 0. Bits 5:4: Dualmode = 0 . . . 3 = –u setting of Dolby C decoder. Valid only if acmod=0 (dual mono) 0 = Stereo 1 = Left Mono 2 = Right Mono 3 = Mixed-Mono. Bits 3:0: Output_Mode = 0 . . . 7 = –o setting of Dolby C decoder 0 = 2/0 L, R Dolby Surround compatible 1 = 1/0 C 2 = 2/0 L, R 3 = 3/0 L, C, R 4 = 2/1 L, R, S (Ls = Rs = S – 3dB) 5 = 3/1 L, C, R, S (Ls = Rs = S – 3dB) 6 = 2/2 L, R, Ls, Rs 7 = 3/2 L, C, R, Ls, Rs Default = 0x000007 NOTE: Undesired Channel outputs should be explicitly muted by setting the corresponding Ch_Vol (see Audio Manager) to 0.0 |
| 0x02 | Compression_Control | 0 . . . 3 = –k setting of Dolby C decoder 0 = Custom Mode 0 (Analog Dialnorm) 1 = Custom Mode 1: (Digital Dialnorm) 2 = Line Out Mode 3 = RF Remodulation Mode Default* = 1 |
| 0x03 | Cut_x | 0.0–1.0 = Compression cut scale factor = –x setting of Dolby C decoder. Default* = 0.0 |
| 0x04 | Boost_y | 0.0–1.0 = Compression cut scale factor = –y setting of Dolby C decoder. Default* =0.0 |
| 0x05 | fscod | 0 . . . 3 = Current fscod value. READ-ONLY except if input is PCM-only, in which case this should be set by Host to indicate Fs as: 0 = 48 KHZ 1 = 44.1 KHZ 2 = 32 KHZ 3 = Reserved 4 = 96 KHZ No default should be assumed. Should be explicitly set before using PCM-only input. |
| 0x06 | bsmod | 0 . . . 7 = Current bsmod value. READ-ONLY |
| 0x07 | acmod | 0 . . . 7 = Current acmod value. READ-ONLY |
| 0x08 | dsurmod | 0 . . . 3 = Current dsurmod value. Valid only in 2/0 mode (acmod=2). READ-ONLY |
| 0x09 | clev | 0.0–1.0 = Current center mixing level (interpreted stream value) Valid only if 3 front channels exist; READ-ONLY |
| 0x0a | slev | 0.0–1.0 = Current surround mixing level (interpreted stream value). Valid only if a surround channel exists. READ-ONLY |
| 0x0b | lfeon | 0/1 = Current lfeon value. READ-ONLY |
| 0x0c | dialnorm | 0 . . . 31 = Current dialnorm value. READ-ONLY |
| 0x0d | compr | 0xffffff = Nonexistent in stream. 0x00–0xff = Current compr value. READ-ONLY |
| 0x0e | dialnorm2 | 0 . . . 31 = Current dialnorm2 value. Valid only in 1+1 dual mono mode (acmod=0). READ-ONLY |
| 0x0f | compr2 | 0xffffff = Nonexistent in stream. 0x00–0xff = Current compr2 value. Valid only in 1+1 dual mono mode (acmod=0). READ-ONLY |
| 0x10 | bsid | 0 . . . 31 = Current bsid value. READ-ONLY |
| 0x11 | langcod | 0xffffff = Nonexistent in stream. 0 . . . 255 = Current langcod value. READ-ONLY |
| 0x12 | mixlevel_roomtyp | 0xffffff = Nonexistent in stream. 0x00 . . . 0x7f: Bits 6:2: current mixlevel. Bits 1:0: current roomtyp. READ-ONLY |
| 0x13 | langcod2 | 0xffffff = Nonexistent in stream. |

TABLE 65-continued

Definition of AC3 INDICES:

| Index | Variable | Dataword Content |
|---|---|---|
| | | 0 . . . 255 = Current langcod value. Valid only in 1+1 dual mono mode (acmod=0). READ-ONLY |
| 0x14 | mixlevel2_roomtyp2 | 0xffffff = Nonexistent in stream. 0x00 . . . 0x7f: Bits 6:2: current mixlevel2. Bits 1:0: current roomtyp2. Valid only in 1+1 dual mono mode (acmod=0). READ-ONLY |
| 0x15 | copyrightb | 0/1 = Current copyrightb value. READ-ONLY |
| 0x16 | origbs | 0/1 = Current origbs value. READ-ONLY |

TABLE 65

Definition of PRO_LOGIC INDICES:

| Index | Variable | Dataword Content |
|---|---|---|
| 0x00 | ProLogic_Control | Bit 8: Autobalance_Enable = 0/1 = Disable/Enable Autobalance. Bit 4: Btype_NR_Enable = 0/1 = Disable/Enable B-Type Noise Reduction. Bit 0: ProLogic_Enable = 0/1 = Disable/Enable ProLogic decoding. Default* = 0x000111 |

TABLE 67

Definition of BASS MANAGER INDICES:

| Index | Variable | Dataword Content |
|---|---|---|
| 0x00 | Bass_Mgr_Control | Bit 12: Full_Range_Center_Enable = 0/1 = Disable/Enable Full Range Center output. Valid only for Config 3. Bit 8: Subwoofer_Enable = 0/1 = Disable/Enable Subwoofer output. Valid only for Config 3 and Config 4. Bits 7–4: Bass_Mgr_Config = 0 . . . 5 = As per Dolby Licensee Information Manual: 0 = Config 0 1 = Config 1 2 = Config 2 3 = Config 3 4 = DVD Config 5 = Alternative Config 2 Bit 0: Bass_Mgr_Enable = 0/1 = Disable/Enable Bass Manager post-processing. Default* = 0x000010 |
| 0x01 | C_Bass_Mgr_Level | 0.0–0.1 = Level adjustment for C channel output. Valid only for Config 2. No default should be assumed. Should be explicitly set (suggested value = 0.25) before enabling Bass Manager in Config 2. |
| 0x02 | Reserved | |
| 0x03 | Ls_Bass_Mgr_Level | 0.0–0.1 = Level adjustment for Ls channel output. Valid only for Config 2. No default should be assumed. Should be explicitly set (suggested value = 0.25) before enabling Bass Manager in Config 2. |

TABLE 67-continued

Definition of BASS MANAGER INDICES:

| Index | Variable | Dataword Content |
|---|---|---|
| 0x04 | Rs_Bass_Mgr_Level | 0.0–0.1 = Level adjustment for Rs channel output. Valid only for Config 2. No default should be assumed. Should be explicitly set (suggested value = 0.25) before enabling Bass Manager in Config 2. |

FIG. d55A is a diagram of the Write I/O Register (WR_IO_REGISTER) command at address 0x00. The Write Type bits [9:8] is 00, for Write Data, 01 or 11=OR with mask, and 10=AND with mask.

FIG. 55B is a diagram of the Read I/O Register (RD_IO_REGISTER) command at address 0x01.

FIG. 55C is a diagram of the Read I/O Register Response (RD_REGISTER_RESPONSE) command at address 0x0.

FIG. 55D is a diagram of the Write Data Memory (WR_DMEM) command at address 0x02.

FIG. 55E is a diagram of the Read Data Memory (RD_DMEM) command at address 0x03.

FIG. 55F is a diagram of the of the Read Data Memory Response (RD_DMEM_RESPONSE) command at 0x03.

FIG. 55G is a diagram of the Write Program Memory (WR_PMEM) command at 0x04.

FIG. 55H is a diagram of the Read Program Memory (RD_PMEM) command at 0x05.

FIG. 55I is a diagram of the Read Program Memory Response (RD_PMEM_RESPONSE) command at address 0x05.

FIG. 55J is a diagram of the Auxiliary Data Ready (AUXDATA_READY) command at address 0x06.

FIG. 55K is a diagram of the Read Auxiliary Data (RD_AUXDATA) command at address 0X07.

FIG. 55L is a diagram of the Read Auxiliary Data Response (RD_AUXDATA_RESPONSE) command at address 0x07.

FIG. 55M is a diagram of the of the Write Audio Manager (WR_AUDIO_MGR) command at address 0x88. The Write Type Bit [15:14] is 00 for Write Data, while 01 or 11=OR mask, and 10=AND mask.

FIG. 55N is a diagram of the Read Audio Manager (RD_AUDIO_MGR) command at address 0x09.

FIG. 55O is a diagram of the Read Audio Manager Response (RD_AUDIO_MGR_RESPONSE) command at address 0x89. The corresponding audio manager indices are defined in TABLE 64.

FIG. 55P is a diagram of the Write AC3 (Wr_AC3) command at address 0x8a. The parameter Field [15:14] is the Write Type field with 00=Write Data, 01 or 11=OR mask, and 10=AND mask.

FIG. 55Q is a diagram of the Read AC3 (Rd_AC3) command at address 0x0b.

FIG. 55R is a diagram of the Read AC3 Response (Rd_AC3_Response) command at address 0x8b. The corresponding AC3 Indices are provided in TABLE 66.

FIG. 55S is a diagram of the Write MPEG (WR_MPEG) command at address 0x8c. The parameter field [15:14] is a WriteType field where (00=Write data, 01 or 11=OR mask, and 10=AND mask.

FIG. 55T is a diagram of the Read MPEG (Rd_MPEG) command at address 0x0d.

FIG. 55U is a diagram of the Read MPEG Response (Rd_MPEG_Response) command at address 0x8d.

FIG. 55V is a diagram of the Write ProLogic (Wr_ProLogic) command at address 0x8e. The parameter field [15:14] is a WriteType field wherein 00=Write data, 01 or 11=OR mask, and 10=AND mask.

FIG. 55W is a diagram of the Read ProLogic (Rd_ProLogic) command at address 0x0f.

FIG. 55X is a diagram of the Read ProLogic Response (Rd_ProLogic_Response) command at address 0x8f. The definitions of the ProLogic Indices are found in TABLE 66.

FIG. 55Y is a diagram of the Write DAS (Wr_DAS) command at address 0x90. The parameter field [15:14] is a WriteType wherein 00=Write data, 01 or 11=OR mask, and 10=AND mask.

FIG. 55Z is a diagram of the Read DAS (Rd_DAS) command at address 0x11.

FIG. 55AA is a diagram of the Read DAS Response (Rd_DAS_Response) command at address 0x91.

FIG. 55AB is a diagram of the Write SDDS (Wr_SDDS) command at address 0x92. The parameter field [15:14] is a WriteType wherein 00=Write data, 01 or 11=OR mask, and 10=AND mask.

FIG. 55AC is a diagram of the Read SDDS (Rd_SDDS) command at address 0x13.

FIG. 55AD is a diagram of the Read SDDS Response (Rd_SDDS_Response) command at address 0x93.

FIG. 55AE is a diagram of the Write Bass Manager (Wr_Bass_Mgr) command at address 0x94. The Parameter field [15:14] is a WriteType wherein 00=Write data, 01 or 11=OR mask, and 10=AND mask.

FIG. 55AF is a diagram of the Read Bass Manager (Rd_Bass_Mgr) command at address 0x15.

FIG. 55AG is a diagram of the Read Bass Manager Response (Rd_Bass_Mgr_Response) command at address 0x95. The corresponding BASS MANAGER Indices are provided in TABLE 67.

TABLE 68

| Index | Variable | Dataword Content |
|---|---|---|
| 0x00 | Bass_Mgr_Control | Bit 12: Full_Range_Center_Enable = 0/1 = Disable/Enable Full Range Center output. Valid only for Config 3. Bit 8: Subwoofer_Enable = 0/1 = Disable/Enable Subwoofer output. Valid only for Config. 3 and Config 4. Bits 7–4: Bass_Mgr_Config = 0 . . . 5 = As per Dolby Licensee Information Manual: 0 = Config 0 1 = Config 1 2 = Config 2 3 = Config 3 4 = DVD Config 5 = Alternative Config 2 Bit 0: Bass_Mgr_Enable = 0/1 = Disable/Enable Bass Manager post-processing. Default* = 0x000010 |
| 0x01 | C_Bass_Mgr_Level | 0.0–0.1 = Level adjustment for C channel output. Valid only for Config 2. No default should be assumed. Should be explicitly set (suggested value = 0.25) before enabling Bass Manager in Config 2. |
| 0x02 | Reserved | |

TABLE 68-continued

| Index | Variable | Dataword Content |
|---|---|---|
| 0x03 | Ls_Bass_Mgr_Level | 0.0–0.1 = Level adjustment for Ls channel output. Valid only for Config 2. No default should be assumed. Should be explicitly set (suggested value = 0.25) before enabling Bass Manager in Config 2. |
| 0x04 | Rs_Bass_Mgr_Level | 0.0–0.1 = Level adjustment for Rs channel output. Valid only for Config 2. No default should be assumed. Should be explicitly set (suggested value = 0.25) before enabling Bass Manager in Config 2. |

FIG. 55AH is a diagram of the Write 3D Manager (Wr_3D_Mgr) command at address 0x96. The parameter field [15:14] is a WriteType wherein 00=Write data, 01 or 11=OR mask, and 10=AND mask.

FIG. 55AI is a diagram of the Read 3D Manager (Rd_3D_Mgr) command at address 0x17.

FIG. 55AJ is a diagram of the Read 3D Manager (Rd_3D_Mgr_Response) command at address 0x97.

FIG. 55AK is a diagram of the Write Effects Manager (Wr_Effects_Mgr) command at address 0x98. The parameter field [15:14] is a WriteType wherein 00=Write data, 01 or 11=OR mask, and 10=AND mask.

FIG. 55AL is a diagram of the Read Effects Manager (Rd_Effects_Mgr) command at address 0x19.

FIG. 55AM is a diagram of the Read Effect Manager Response (Rd_Effects_Mgr_Response) command at address 0x99.

FIG. 55AN is a diagram of the Write PCM Synthesizer (Wr_PCM_Synthesizer) command at address 0x9a. The parameter field [15:14] is a WriteType wherein 00=Write data, 01 or 11=OR mask, and 10=AND mask.

FIG. 55AO is a diagram of the Read PCM Synthesizer (Rd_PCM_Synthesizer) command at address 0x1b.

FIG. 55AP is a diagram of the Read PCM Synthesizer Response (Rd_PCM_Synthesizer_Response) command at address 0x9b.

FIG. 55AQ is a diagram of the Write PCM Mixer (Wr_PCM_Mixer) command at address 0x9c. The parameter field [15:14] is a WriteType wherein 00=Write data, 01 or 11=OR mask, and 10=AND mask.

FIG. 55AR is a diagram of the Read PCM Mixer (Rd_PCM_Mixer) command at address 0x1d.

FIG. 55AS is a diagram of the Read PCM Mixer Response (Rd_PCM_Mixer_Response) command at address 0x9d.

FIG. 55AT is a diagram of the Write Reserved Manager (Wr_Reserved_Mgr) command at address 0x9e. The parameter field [15:14] is a WriteType wherein 00=Write data, 01 or 11=OR mask, and 10=AND mask.

FIG. 55AU is a diagram of the Read Reserved Manager (Rd_Reserved_Mgr) command at address 0x1f.

FIG. 55AV is a diagram of the Read Reserved Manager Response (Rd_Reserved_Mgr_Response) command at address 0x9f.

FIG. 55AW is a diagram of the Write STC (Wr_STC) command at address 0xa0. The parameter field [9] is a Force_Enable_AVSync, Parameter field [8:0] is an upper 9 bits of the 33 bit PCR.

FIG. 55AX is a diagram of the Read Stack (Rd_STC) command at address 0x21.

FIG. 55AY is a diagram of the Read STC Response (Rd_STC_Response) command at address 0xa2.

FIG. 55AZ is a diagram of the Unused (Unused) command at address 0xa2.

FIG. 55BA is a diagram of the Read PTS (Rd_PTS) command at address 0x23.

FIG. 55BB is a diagram of the Read PTS Response (Rd_PTS_Response) command at address 0xa3.

FIG. 55BC is a diagram of the Channel Change (Channel_Change) command at address 0xa4.

FIG. 55BD is a diagram of the Channel Change Acknowledge (Channel_Change_Ack) command at address 0x25.

More possible messages: Soft_Reset, Run, Skip_Frame, Repeat_Frame

F. Startup and Sync Search

For the current implementation, see decoder 100 AC-3 and Operating System Software Documentation.

This section describes (by way of example) the strategy of employing main and auxiliary read pointers to implement two passes over the data. Typically, one pass is for CR checking and the other for actual decoding as required by the application. In fact, the scheme is generalized and can easily be extended to perform any number of passes.

The Input Data Manager discussion above covers all the actual hardware requirements and settings and also specifies details of the following software modules that are functionally described below and used later in this section.

Input_Initialize: Initializes the input block according to different input configurations as demanded by Host.

Use_FIFO_B: If currently using B, do nothing. Else switch to FIFO B from FIFO C. Any required backup/restore of pointers should be performed here.

Use_Auxiliary_FIFO_B: If currently using FIFO C, call Use_FIFO_B first. Then set LE latch to freeze wall for INPTB (hardware name for FIFO B Write pointer) and backup.

OPTB_Backup=(OPTB-2) modulo FIFO B size; where OPTB is the hardware name for FIFO B Read pointer. Also, backup Dummy_Bits=16-Bremaining. Now, the next bitrip by software will still yield the next bit in the stream, but using an auxiliary pointer without lifting the wall for the INPTB pointer.

Move_Auxiliary_FIFO_B: (Number_of_bits): If not currently using FIFO B in Auxiliary mode, abort with error code. Else, modify OPTB and do required dummy bit rips so that the next bit ripped by software will be from the relative offset specified. Number of bits should be considered as modulo size of FIFO on bits. Note that the relative offset could be negative also.

Un_Use_Auxiliary_FIFO_B: If not using Auxiliary FIFO B, abort with error code. Else, restore OPTB to previously backed-up OPTB_Backup, perform Dummy_Bits number of bit rips, and clear LE to unfreeze the wall for INIPT B.

The above four are defined similarly for FIFO C as well.

1. An example of AC=3 Sync Search

All bit rips are assumed to occur after ensuring that the FIFO has sufficient data. To keep the algorithm readable from a high-level perspective, this is not explicitly indicated at each bitrip below, and is assumed to reside within a lower-level bitrip module. It is also assumed that this module inserts appropriate waits before bit rips, according to whether the hardware is in Startup Mode or in Run-time Mode.

In hardware, the pointers index 16-bit words in memory, and fractional words (bits) are implemented separately. However, software shall always refer to locations and offsets in the FIFO in terms of bits. Low-level modules for bit ripping, changing pointers, FIFOs, etc., shall take care of the mapping between the number/depth of bits to the actual hardware register settings.

All variables shown in all caps are the names of registers as defined in the hardware spec. Variables shown with initial caps are software variables.

0. Startup: Input_Initialize. Set Sync_Lost Flag.
1. Use_Auxiliary_FIFO_B
2. Sync_Search: /*Ready to rip bits in Auxiliary mode. Need to look for 0x0b77.*/

Rip 16 bits. Check for 0x0b77 (AC_3 Syncword)

```
While (sync is not found)
{
        Set Sync_Lost flag.
        Throw away MSB.
        Rip one more bit.
        Concatenate as LSB of existing word.
}
3. Sync_Confirm: /* Just found 0x0b77. Need to
confirm that there is syncword where the next frame
should begin. **/
Rip 16-bit CRC1 and then 8 bits of frmsizecod and
fscod from bitstream.
if (there are any invalid values/combinations) then
{
        if (!Sync_Lost) /* Run_time mode.*/
        {
        Do error concealment strategy for current audio
frame. This could be simply a message to DSP 2 to
mute the next frame.
}
    /* sync was false, so get back to the bit past the
false sync */
        Move_Auxiliary_FIFO_B(-24 bits)
        Go to Sync_Search.
}
4. Compute Frame_Size = Number of bits in this
frame.
if (In SPDIF mode) then
{
        Move_Auxiliary_FIFO_B (_24)/* Go back all the
        way to read 1st bit after sync */)
        Go to CRC_Check /* No need to check two
        syncwords in SPDIF mode */
}
Move_Auxiliary_FIFO_B (Frame_Size-40 /* 16-bit sync,
16-bit CRC1 and 8-bits of frmsizecod and fscod
already ripped */)
5. Rip 16 *bits.
If (these 16 bits are not 0xb77) then
{
        if (!Sync_Lost) /* Run-time mode */
        {
        Do error concealment strategy for current audio
frame. This could be simply a message to DSP 2 to
mute the next frame.
        }
        /* Sync was false, so get back to the bit past
        the false sync */
        Move_Auxiliary_FIFO_B(16-Frame_Size /* Go back
all the way to the false sync, but skip it */)
        Go to Sync_Search.
}
Move_Auxiliary_FIFO_B (16-Frame_Size /* Go back all
the way to read 1st bit after sync.*/)
6. CRC_Check: /* Found two 0xb77-s with correct
offset, so good confidence for sync now. */
From frmsizecod and fscod, compute CRC1_Num_Bits =
5/8 CRC1 position. CRC2 is one word before the next
frame start (already known).
```

-continued

7. Still using Auxiliary FIFO B, go through the
CRC routine byte at a time for CRC1_Num_Bits.
8. If (CRC1 is bad) then
{
    if (Sync_Lost) /* Start Up mode */ then
{/*The sync found is assumed false. We should get
at least one sync confirmed with CRC before
decoding; */
9. Move_Auxiliary_FIFO_B(16-CRC1_Num_Bits) /* Go
back all the way to the false sync, but 1 bit after
it */
Go *to Sync_Search.
}
else /* Bad CRC1 in run time, but let's assume
still in sync and fast forward to next frame */
        {/* No need to do any more CRC, whole frame is
        bad! */
        Do error concealment routine for current audio
        frame.
        Un_Use_Auxiliary_RFO_B /* Switch back to main
        pointer to thaw INPTB wall */
        Increment OPTB by Frame_Size*/16 *(words) to skip
        one full frame.
10. Use_Auxiliary_FIFO_B /* Back to auxiliary
pointer that will be the same as Main pointer, i.e.,
poised for next frame */
        Go to Sync_Search. /* We will most probably
        still be in sync. */
}
}
/* Otherwise good CRC 1. We can decode and play the
first two blocks. */
Clear Sync_Lost flag. /* Good frame sync position
and good CRC1 can be assumed as OK. Sync */
Un_Use_Auxiliary_FIFO_B /* Use main pointer. now */
Decode syncinfo, bsi, and 2 audblks.
12. Use_Auxiliary_FIFO_B /* Auxiliary pointer will
now be at the start of Block 2 */
Since we know number of bits drawn in the frame till
now, and also the 5/8 CRC1 position, we can compute
offset N_1 = offset to 5/8 CRC1 Position from
current position.
Move_Auxiliary_FIFO_B(N_1)
Continue the CRC check byte at a time till end of
frame (CRC2 position).
13. If (CRC2 is bad) then
{
/* Bad CRC2, but CRC1 was good and we, played 2
blocks, so let's assume still in sync and fast
forward to next frame, irrespective of whether
run-time or first frame*/
Do error concealment routine for remaining 4 blocks.
Un_Use_Auxiliary_FIFO_B /* Switch back to main
pointer to thaw INPTB walll */
Set OPTB to start of next frame, i.e., increment by
(Frame_Size_Block2 position)/16 words.
Use_Auxiliary_FIFO_B /* Back to auxiliary pointer
that will now be the same as Main pointer, i.e.,
poised for next frame */
}else
{
/* Here, CRC2 is OK, so we need to go back to main
pointer and decode remaining 4 blocks */
        Un_Use_Auxiliary_FIFO_B/* Switch back to main
pointer */
Decode remaining 4 audblks and auxdata.
}
Go to Sync_Search. /* We should still be in sync and
should start on the next frame. */

One more layer of control logic has to be added above the elementary stream processing for the PES packets. This layer will, in concept, be similar to the logic described above, but will extract A/V sync and other information, and processing of the payload will revert to the control strategy detailed above.

The problem is simplified if Audio frames are guaranteed to be nicely aligned always at the start of PIES payload. It so, one needs only to check the position within the PIES packet at the end of every audio frame, and if the PIES header is next, process it.

If alignment cannot be guaranteed, then every bitrip called by the decode module has to be monitored to see if the PES boundary has been hit. This burden increases with the number of fields involved and can raise MIPS usage considerably.

The following discussion is a high-level description of the AC-3 and Operating System software written for AC3 decode. The code for each DSP is described separately. Furthermore, the maincode AC-3 application code is described independent of the operating system tasks, which are mostly handled within interrupts.

FIG. 54, introduced above, illustrates the interaction of the 2 DSPs at the operating system level, particularly the usage of hardware and software resources and the hierarchical software-modules used.

The AC-3 application is also described in the following sections hierarchically using simple pseudo code. Each step of the pseudocode is briefly described in the sub-section heading and further explained in the body of the sub-section or using sub-sub-sections.

A/* */C-style comment in the sub-section heading refers to a branch label that will be used to reenter that portion of the pseudocode.

1.0 DSPA AC-3 Application Pseudocode

After reset (download and/or soft reset), DSPA has all its DSP registers (but not DMEM/PMEM or other IOREGs) cleared and starts executing from location 0x0000 which starts with the first subsection described below.

1.1 Startup initialize

Setup IO pages, DMEM pages.

Clear out IPC Tx (transmit) buffers.

Clear variables for PCM pass thru to DSPB.

Clear out control variables like kickstart, AC3 enable, PCM Mixer control, IEC958 enable.

Clear counters for CRC errors, sync lost and bitstream inconsistencies.

Setup default DSP mode in STATUS (MPYSHF, RND, SAT all OFF).

Enable IPC and timer interrupts.

1.2 Wait for kickstart from DSPB

Main code loops till IPC interrupt from DSPB sets kickstart flag.

1.3 Enable DAI port

Already initialized to required setup by DSPB (either default or via host messages). Enabling the port allows the data into FIFOC.

1.4 Wait for AC3 enable from DSPB

Main code loops till IPC interrupt from DSPB sets AC3 enable flag.

In case of PCM-only input, this will never happen, so DSPA will wait here indefinitely and PCM pass thru module in Timer interrupt will supply the PCM from FIFOC (DAI) to DSPB for further processing and playback.

1.5 /* Find_Sync: */Switch to FB Main Rd Ptr Simply clear the freeze bit: confirm using the main read pointer of FIFO B when accessing the bitripper.

1.6 Sync Search if (IEC958 enabled) do a bit-wide search for 0xf872, 0x4e1f, 0x????1, 0x????., Do a bit-wide search for 0x0b77.

1.7 /* Frame_Loop: */Initialize Frame

Zero out certain AC-3 variables to reset context and setup defaults for Block 0: blknum, previous cplinu/cplbegf/cplendf, delta bit allocation parameters, dynrng, dialnorm, −1 into all parameters with "exist" fields, *PAR1=1.

1.8 Initialize Block

Zero out AC-3 context for Channel 0 of a fresh block: Chnum, coupling channel flag, lfe channel flag, mantissa counts (for grouping), 1.9 Wait for FB Dipstick==3

This is to ensure that the bitripper is full of data and has been stabilized, such that it is not in a transient phase just after obtaining 0x0b77. Dipstick is computed from the FBPTR/FCTLST register values as subtraction of (OPTR-IPTR)modulo FBSIZE 1.10 Backup main, switch to auxiliary FB Rd Ptr Backs up FB_OPTR and BREMAIN into main variables and sets freeze bit.

1.11 Process syncinfo and do CRC1

Zero out CRC syndrome. Wait for 2 words in FB, extract CRC1, fscod and frmsizecod. Determine size of frame and ⅝ frame, and wait for dipstick==⅝ frame. Blast thru CRC1 over the ⅝ frame size.

1.12 If CRC1 is bad, initiate error concealment and jump to Confirm_Sync

Increment Num_CRC1_Errors log.

if(Framenum==0) jump to Find-Sync, i.e. sync is not yet established.

Send CONCEAL_FRAME_BAD_CRC1 message to DSPB, which will increment its Error_Conceal_Frame_Count and conceal that many frames.

Clear TC_BUFFER_FULL semaphore in PAGE_A.

Switch to main FB Rd ptr.

Rip through remaining ⅜ of frame word by word.

jmp Confirm_Sync (which also fixes wrap around problem of input FIFO).

1.13 (if CRC1 is good) Backup aux, restore main FB Rd Ptr

Backs up FB_OPTR and BREMAIN into aux variables. Then restores FB_PTR as backed up main FB_PTR-2, while implementing modulo with current FB Size if required. Then rips out 16-(backed up main BREMAIN) if it is non-zero. Finally, clears Freeze bit.

1.14 Increment Framenum (with wrap around at 0x7fffff)

1.15 Skip syncinfo and Process BSI

Just skip over syncinfo fields (16 bits of crc1, and 8 bits of fscod+frmsizecod) since they have been processed before in the CRC1 pass.

Then parse bsi section of AC-3 syntax. Defaults of −1 are retained if certain variables are absent in the stream.

1.16 /* audblk_Loop: */Parse audblk 1.16.1 Initialize Block

Zero out AC-3 context for Channel 0 of a fresh block: Chnum, coupling channel flag, lfe channel flag, mantissa counts (for grouping), 1.16.2 Parse rest of block info For current blknum, parse all block-level variables:

dynamic range compression info (dynrng), coupling strategy info (frequency range, banding structure, coupling coordinate info, phaseflags for acmod==2, rematrix info for acmod==2), coupling exponent strategy and exponents, exponent strategy and exponents for each chnum,=0 . . . nfchans−1, lfe exponent strategy and exponents, bit-allocation parametric information, coupling channel and fbw channel delta bit allocation information.

Exponents are stored in packed form (3-per array element) and can be reused easily.

Finally, skip over unused dummy data in stream by extracting skip1 and trashing that many bytes.

1.17 /* audblk_Channel_Loop: */Do bit allocation and get TCs for each channel

The loop starts with chnum==0, lfe_Channel_Flag==0, and Coupling_Channel_Flag==0. All the modules below are sensitive to these state variables, and accordingly decode:

1. fbw Channel[chnum] if lfe_Channel_Flag==0 and Coupling_Channel_Flag!=1.
2. Coupling Channel if lfe_Channel_Flag==0 and Coupling_Channel_Flag==1 (chnum=don't care)
3. LFE Channel otherwise.

1.17.1 Decode exponents

Decode the packed exponents from differential form into the final exponents. If fbw channel, this works only on the uncoupled portion. If coupling channel, slightly different processing is done with respect to first value (only used as reference). If lfe channel, the values are decoded like fbw but with different start/end. Output exponents are in dedicated array (253 elements)

1.17.2 if special case of zero bit-allocation, zero out bap and jmp audblk_Extract_Mantissas If csnroffst==fsnroffst[ch=0 . . . nfchans−1]==lfefsnroffst==0, then this block has zero bit allocation. Simply fudge all the bit allocation pointers to 0 and rejoin where the mantissas are extracted.

1.17.3 Compute Power Spectral Density (psd)

Input=decoded exponents. Straight implementation from AC-3 spec. Output psd is in shared array of 256 elements.

1.17.4 Compute Banded Power Spectral Density (bndpsd)

Input=psd. Implementation is done in different phases (ranges of frequency bins) to optimize code. Output bndpsd is in dedicated array of 50 elements.

1.17.5 Compute Excitation function (excite)

Input=bndpsd. Implementation is done in different phases (ranges of frequency bins) to optimize code. Output bndpsd is in shared array of 50 elements.

1.17.6 Compute Masking curve (mask)

Input=mask. Straight implementation of AC-3. Output is in-place shared with excite.

1.17.7 Apply delta bit allocation

Input=mask. Straight implementation of AC-3. Output= in-place modified mask.

1.17.8 Compute Mantissa bit allocation

Input=mask and psd. Straight implementation from AC-3 spec. Output=in-place replacement of psd 1.17.9 /* audblk_Extract_Mantissas: */Extract Mantissas from stream Input =Mantissa-Bits and bit-stream. Extracts mantissas from bitstream using Mantissa_bits array—considers grouping and dithering also. Output=in-place modification of Mantissa_Bits, except for Coupling channel where output is in dedicated packed array Enc_Coupling_Mant_flag_Exp_Base. This array packs the exponents also for later use. This array also indicates if mantissa is zero due to zero bit-allocation (as opposed to zero from stream) which will trigger dithering (if enabled) during decoupling.

1.17.10 if Coupling_Channel_Flag==1, mark coupling channel as done, decouple TCs for chnum, and jmp audblk_Next_Channel Set Coupling_Channel_Flag=−1

Decouple Transform Coefficients (TCs): For current chnum (first coupled channel), the remaining TCs are filled by decoupling the coupling channel mantissas+exponents with specified coupling coordinates for this chnum. Output is the coupled part of TC array is filled up.

jmp audblk_Next_Channel 1.17.11 (else fbw/lfe channel) Compute Transform Coefficients (TCs)

Using exponents (untouched so far) and mantissas, compute the TCs for fbw channel (uncoupled portion) or lfe channel. Mantissas are shifted by exponents into TC_Base (dedicated output array) unless (acmod==2 && chnum==1) in which case these are R' TCs which are stored in-place overwriting Mantissas awaiting rematrixing.

1.17.12 if lfe_Channel_Flag send TCs+Descriptor to DSPB and jmp audblk_End

Done with this block if LFE channel was just processed; pass on result to DSPB and end the block.

1.17.13 (else fbw channel) if chincpl[ch] extract coupling channel OR perform decoupling Here, this fbw channel needs decoupling to finish the set of TCs.

If Coupling_Channel_Flag==0 (as opposed to −1) then this is the first coupled channel. The next channel in the stream is coupling channel. So set Coupling_Channel_Flag to 1 and jmp audblk_Channel_Loop to extract the coupling. After coupling channel mantissas+exponents are extracted the above loop branches to decouple the first fbw channel and the loop repeats.

If Coupling_Channel_Flag==−1 then this is not the first coupled channel. Coupling channel has already been extracted. So simply perform Decoupling (as described above).

1.17.14 /* audblk_Next_Channel: */if acmod==2 do rematrixing if (chnum==0) then we have L' channel and need to extract R' channel and then perform rematrixing to obtain L/R. So don't send TCs to DSPB yet, simply jmp audblk_Next_Channel_Continue2 which goes ahead and processes R' channel (unrematrixed TC output in R_Prime_TC_Base shared with Mantissa_base etc.)

if(chnum==1) then perform rematrixing: Implementation as in AC-3 spec. using L' in TC_Base and R' in R Prime TC_Base. Processing is split into different bands for optimization. Result is in-place with R in R_Prime_TC_Base and L in TC_Base.

Now, since rematrixing is done, set chnum=0 and send TCs and descriptors to DSPB. Then after DSPB has picked it up, set chnum=1, copy over R_Prime_TC_Base to TC-Base and continue below:

1.17.15 /* audblk_Next_Channel_Continue: */Send TCs+Descriptors to DSPB 1.17.16 /* audblk_Next_Channel_Continue2: */Increment chnum. If not last fbw channel, jmp audblk_Channel_Loop.

1.17.17 else if lfeon set LFE_Channel_Flag=1 and jmp audblk_Channel_Loop.

1.17.18 (else no LIFE and last fbw done)/* audblk_End: */Exit gracefully

Backup cplinu, cplbegf and cplendf into prev_variables for potential reuse next time and also for checking bitstream inconsistencies. return to caller.

1.18 Increment blknum. if blknum==2 check CRC2:

1.18.1 Backup main, restore aux FB Rd Ptr

Similar procedure as explained before: Backs up FB_OPTR and BREMAIN into main variables. Set freeze right away. Then restores FB_PTR as backed up aux FB_PTR−2, while implementing modulo with current FB-Size if required. Then rips out 16-(backed up aux BREMAIN) if it is non-zero.

1.18.2 Do CRC2

(CRC syndrome should already be 0 here since CRCI passed). Wait for remaining ⅜ frame in FIFOB. Blast thru CRC2 over the remaining ⅜ frame size.

1.18.3 If CRC2 is bad, initiate error concealment and jump to Confirm-Sync

Increment Num_CRC2_Errors log.

Send CONCEAL_FRAME_BAD_CRC2 message to DSPB, which will increment its Error_Conceal_Frame_Count and conceal that many frames.

Clear TC_BUFFER_FULL semaphore in PAGE_A.

Switch to main FB Rd ptr—we should already be at the end of the current (bad) frame. jmp Confirm_Sync (which also fixes wrap around problem of input FIFO).

1.18.4 (if CRC2 is good) Backup aux, restore main FB Rd Ptr, jmp audblk_Loop

Continue processing the next audblk (blknum==2 since we just received good CRC2).

1.19 if blknum<6 jmp audblk_Loop

Continue processing the next audblk.

1.20 (else this frame is done) Process auxdata and errorcheck

Just fast forward the main pointer to where the auxiliary pointer is, i.e. after CRC2 which is the just before the next sync word (or 0x000 if IEC958 mode).

1.21 /* Confirm_Sync: */Fix wrap around problem and confirm next sync word

Wait for FIFOB to have at least 10 words of the new frame before proceeding—this resolves a hardware race condition since the IPTR does not saturate with OPTR when the auxiliary pointer is used (during the CRC2 pass just before restoring the main pointer).

if IEC_958 enabled then ensure that we receive 0x????, 0xf872, 0x4e1f, 0x????1, 0x????.

Ensure that we receive 0x0b77.

If any of the above checks fail, increment Num_Sync_Losts log, send LOST_SYNC IPC message to DSPB and jmp Find_Sync.

1.22 jmp Frame_Loop 2.0 DSPA Operating System Pseudocode

The main heartbeat of DSPA is data-driven, i.e. parsing and partial decode of the incoming bitstream. All other functions are covered by interrupt handlers. Currently, only two such asynchronous events (with respect to the application) exist: Inter-Processor Communication, and Timer interrupt.

2.1 Inter-Processor Communication Handler

DSPA receives this highest priority interrupt from DSPB and first backs up maincode context (ACC0 Hi/Lo) and sets DMEM page to 0 (OS_DMEM_PAGE).

Then it checks if the opcode (in Bits 23:16 of COM_BA) is valid.

If the opcode is invalid, OS_ERROR IPC message is prepared back to DSPB in BAB_TX_Buffer and a send is attempted. If IPC AB is busy, the send is aborted and will be attempted again by the next timer interrupt.

Else, the handler for the particular opcode is called as specified below:

2.1.1 Rd_DMEM (0x01)

Reads out DMEM from address in Bits 13:0 of COM_BA, prepares response in BAB_TX_Buffer and attempts a send to DSPB.

2.1.2 Rd_PMEM (0x02)

Reads out PMEM from address in Bits 12:0 of COM_BA, prepares response in BAB_TX_Buffer and attempts a send to DSPB.

2.1.3 Rd_IOREG (0x03)

Reads out IOREG from address=Bits 4:0 and Page=Bits 7:5 of COM_BA, prepares response in BAB_TX_Buffer and attempts a send to DSPB.

2.1.4 Rd_Reserved (0x04)

Do nothing!

2.1.5 Wr_DMEM (0x05)

Write dataword (in PAR_1_BA) into DMEM (at address=Bits 13:0 of COM_AB).

2.1.6 Wr_PMEM (0x06)

Write dataword (in PAR_1_BA) into PMEM (at address=Bits 12:0 of COM_AB).

2.1.7 Wr_IOREG (0x07) Use dataword in PAR_1_BA and apply to IOREG at address=Bits 4:0 and Page=Bits 7:5 of COM_BA. Depending on the write code in Bits 9:8, the datword is moved into the IOREG (write_code=00) or ANDed as a mask (write_code=10), or ORed as a mask (write_code=01).

2.1.8 Wr_Reserved (0x08)

Do nothing!

2.1.9 Soft_Reset (0x09)

Clear COM_P_BA to reset any semaphores and then jump to ROM soft reset module.

2.1.10 SHMEM_Data_Taken (0x10)

Lower 2 bytes of COM_BA indicate what kind of Data was taken by DSPB, based on which, the appropriate semaphore bit in PAGE_A is cleared.

Each opcode handler above terminates as:

LSB of COM_P_BA is reset to indicate that DSPB can send another IPC message. ACC0 Hi/Lo and DMEM page are restored and then DSPA returns to maincode.

2.2 Timer Handler

DSPA receives this periodic interrupt and first sets DMEM page to 0 (OS_DMEM_PAGE). Then the following tasks are performed, after which DMEM page is restored to 1 (Application_DMEM_Page) and reti is performed.

2.2.1 Check and send SHMEM PCM

If PCM Mixer control is not enabled (LSB==0) exit gracefully (restore FIFO B and ACC0).

If PAGE_A semaphore indicates that SHMEM_PCM is still full (not taken by DSPB), then if FIFO C overflow is not imminent, abort. If overflow is imminent, then reset the SHMEM_PCM_Wr_Ptr and continue below.

Switch to FIFO C, get the dipstick in number of samples (for now always assumed as 16-bit). Dipstick is computed by a similar module to the FIFO B computation as specified before.

If PCM_Started_Flag==0, then if dipstick <PCM_STARTUP_THRESHOLD, exit gracefully. Otherwise set PCM_Started_Flag=1 and grab one 16-bit sample (junk word due to hardware race) and continue below. NOTE: backup and restore FBITS here to make this fudge transparent.

/* Here, PCM has already started, possibly just now */

If dipstick==0 exit gracefully.

Otherwise, compute emptiness of SHMEM_PCM buffer using current SHMEM_Wr_Ptr. This cannot be zero since semaphore is not set.

Extract min(dipstick, SHMEM_PCM emptiness) from FIFOC and write into SHMEM_PCM buffer. NOTE: Backup and restore FBITS to be transparent to maincode use of FIFOB (bitripper is shared between the 2 FIFOs).

If SHMEM_PCM_Wr_Ptr indicates SHMEM_PCM is full, then reset it, set the PAGE_A semaphore, and attempt to send SHMEM_DATA_READY IPC message with PCM data-type to DSPB using PCM_Tx buffer.

Exit gracefully (restore FIFO B and ACC0).

2.2.2 Check and send IPC PCM message

If IPC_PCM_Tx_Buffer has non-zero opcode, there is a pending message which could not be sent by the originating module since IPC AB was busy then. So attempt to send it again now.

2.2.3 Check and send IPC BAB message

If IPC_BAB_Tx_Buffer has non-zero opcode, there is a pending message which could not be sent by the originating module since IPC AB was busy then. So attempt to send it again now.

3.0 DSPB AC-3 Application Pseudocode

After reset (download and/or soft reset), DSPB has all its registers (but not DMEM/PMEM) cleared and starts executing from location 0x0000 which starts with the first sub-section described below. This is similar to DSPA reset, except that when DSPB resets, all the peripheral I/O blocks are also reset.

3.1 Startup initialize

Setup IO pages, DMEM pages.

Initialize Host Tx/Rx buffers, pointers and variables

Clear out IPC Tx buffers.

Clear variables for PCM pass thru from DSPB.

Clear out control variables like error conceal frame count, num of underflows, current volume, mute flag etc.

If Bond ID and Rev ID are not acceptable, then spin here forever.

Setup default host settings and sampled host settings. DSPA+DSPB both need AC3_Enable, PCM_Mixer_control, IEC958_Enable. DSPB alone needs: AC3_Started, PCM_Started, ProLogic_On, Host_Mute_Flag, C/Ls/Rs_Delay (only sampled settings), Host_Pink_Noise_Control.

Setup default DSP mode in STATUS (MPYSHF, RND, SAT all ON).

Initialize Clock Manager to default setting.

Initialize Output Unit to default setting—this should be done before input unit so that if LRCK/SCLK are derived from master MCLK into DAO, then input unit can be alive and seeing data without deadlock. Also, fill 16 zeros into each DAO FIFO and enable DAO clocks.

Initialize Input Unit to default setting—this includes the patch to work around the race conditions in I2S mode. The CDI/DAI are not enabled although they are brought out of reset.

Initialize special post-processing modules: Pink Noise and Bass Manager.

Setup PCM Buffer variables and pointers for each channel type: Buffer size, Base address, Wr/Rd pointers.

Zero out PCM scalefactors in PMEM that implement actual DAO output scaling (volume).

Zero out Almost-PCM buffers.

Enable Host interrupt (including SCP).

Zero out Host_Audio_Mgr_Control and wait for kickstart (LSB) from host. Host can set all the IOREGs and other DMEM variables before doing this.

Send kickstart to DSPA via IPC_BA message (using BA_Tx_Buffer).

Enable IPC, DAO half empty, and timer interrupts.

3.2 /* Frame_Loop: */Sample Host Settings

Sample IEC958_Enable from Host_Audio_Mgr_Control. If it has changed since last time send WR_DMEM IPC message to DSPA to update with new value.

Sample IEC958_Enable from Host_AC3_Control. If it has changed since last time send WR_DMEM IPC message to DSPA to update with new value.

Sample PCM_Mixer Enable from Host_PCM_Mixer_Control. If it has changed since last time send WR_DMEM IPC message to DSPA to update with new value.

Sample LFE_Enable_Flag from Host_AC3_Control.

Setup dialnorm_On_Mode, dynrng_Mode, and compr On Mode from encoded k values in Host_Compression_Control.

Setup output_mode, dualmode and karaoke_Flag from Host_Output_Mode_Control.

Sample ProLogic_Control, Pink_Noise_Control, Bass_Mgr_Control from their Host settings.

Sample Host_PCM_Precision and setup PMEM constant for DAO rounding.

Disable interrupts.

Sample C/Ls/Rs Delay settings from host. If they are out of bounds do nothing. If the settings are not new (same as old delay setting) do nothing. Else for each channel, compute the DELTA delay to be added/subtracted (map the user setting of mS to actual multiples of 16 samples based on current fscod) and move the read pointer of that channel back (front) the correct amount while considering wrap around.

Enable interrupts.

3.3 If AC3 is not enabled & Pink Noise not enabled & PCM Mixer not enabled, jmp back to Frame_Loop Here, no work to do. Simply zero out framenum and loop back infinitely.

3.4 Zero out blknum, if AC3 is not enabled jmp Block_Loop_Start

Bypass the AC-3 initialization section if not enabled.

3.5 (else AC-3 is ON) Wait for TC Buffer full

If Error_Conceal_Frame_Count>0 then return (and conceal frame).

Otherwise spin until TC-BUFFER_FULL semaphore is set by DSPA in PAGE_A.

3.6 Load Frame level Descriptor

Update local copies of the following from SHMEM:

Framenum (check to see if it is same as local copy) fscod, bsmod, acmod, dsurmod, clev (looked up from SHMEM cmixlev), slev (looked up from SHMEM surmixlev), lfeon, dialnorm, compr, dialnorm2, compr2, nfchans, bsid, langcod, Enc_mixlevel_roomtyp, langcod2, Enc_mixlevel_roomtyp2, copyrightb, origbs, timecod1, timecod2, addbsil.

3.7 Initialize Frame 4.7.1 Setup Downmix Table

Clear Downmix_On_Flag. Clear Downmix_Table. Compute input_nfront, input_nrear and Input_Chan_Exist enumeration of existent input channel types. Similarly compute output_nfront, output_nrear, and Output_Chan_Exist enumeration of output channel types.

Setup downmix table according to the Dolby Spec.

3.8 /* Block_Loop_Start: */, /* Block_Loop: */ if AC3 is not enabled force acmod=dsurmod=2, and bypass all the AC-3 processing with jmp Block_Loop_End.

Otherwise, (AC3 ON) Wait for TC buffer full (redundant for blknum==0 since checked at frame level).

3.9 Load Block level Descriptor

Check blknum sync. Update local copies of the following from SHMEM: Enc_blksw, dynrng, dynrng2, Enc_dithflag.

3.10 Initialize Block

Zero out Chnum.

3.10.1 Compute Gain0

For (acmod!=0) and (acmod==0 && Chnum==0), the result of this module is used.

Use dynrng and compr in Q20 format. Setup gainmant as looked up value of dialnorm. Based on specified compression control mode along with Downrnix_On_Flag to decide if downmixing is ON, use compr or dynrng (possibly with cut/boost factors) to modify gainmant and setup gainexp.

NOTE: gainexp is setup so that positive values indicate right shifts. This is unlike the Dolby spec for gainexp, but is consistent with the exponents specified for channel TCs.

Finally, normalize the gainmant to have no extra sign bits while updating gainexp correspondingly.

3.11 /* Channel_Loop_Start: */Wait for TC Buffer Full

Redundant for Chnum==0 since this is done at the start of the block itself.

3.12 Load channel level descriptor

Currently, just checks out that Chnum is in sync between DSPA and DSPB.

3.13 if fbw channel, initialize fbw channel

Based on acmod and chnum, lookup chtype—this indicates what type of channel it is, i.e. L, R, C, Ls or Rs.

If (acmod==0 && Chnum==1) do special Compute_Gain1 which does the same as Compute_Gain0 above, but uses dialnorm2, dynrng2 and comp2 instead.

3.14 (else LFE channel) initialize LFE channel by simply setting chtype=5

3.15 If Error_Conceal_Frame_Count>0, engage concealment

We need to conceal this channel (and the rest of this frame). Zero out the 512 elements of Almost_PCM base and jmp Channel_Loop_Error_Conceal_Continue. This will act as though TCs came into DSPB as zero for this channel, and subsequent overlap and add will ramp down to zero.

3.16 (else do inverse transform) if (LIFE channel or blksw [chnum]==0) select large blocksize transform, else select small blocksize transform Actually different branches exist for each blocksize with separate modules. But since these modules are very similar, the pseudocode description below acts as if the same modules (albeit sensitive to blocksize) are called.

3.17 Pre-Twiddle

Input=SHMEM TCs. Optimized code (double in-lined). Output=Pre__Twiddle__Output complex shared array.

Separate modules exist for large and small blocksize.

3.18 Send TCs taken to DSPA

If Error__Conceal__Frame__Count>0 simply return. This is so that when the error-event just happened on DSPA we do not send this irrelevant message to DSPA.

Otherwise send SHMEM__DATA__TAKEN IPC message with TCs opcode to DSPA.

3.19 Pre__FFT

Input=Pre__Twiddle__Output. Scale input by gainmant and bit-reverse the output sequence. Output=In__Place__FFT complex array. Separate modules exist for large and small blocksize.

Post__FFT is also called to scale the In__Place__FFT array according to gainexp.

3.20 FFT

Input=Output=In__Place__FFT complex array. Strictly speaking this is an Inverse FFT based on a Decimation-in-Time FFT, with 5 identical standards stages and a last special stage where each group has only one butterfly. Butterfly is 8-instruction with 2-instruction call/return overhead.

Separate modules exist for large and small blocksize.

3.21 Pre-Twiddle

Input=In Place__FFT complex array. Optimized code (double in-lined). Since all 8 ARs are used, interrupts are turned off during the processing, and turned on only after AR0/1 are restored.

Output=Post__Twiddle__Output complex shared array.

Separate modules exist for large and small blocksize.

3.22 De-interleave and Window

Input=In Place__FFT complex array. Optimized code (quadruple in-lined). First pass generates 256 Almost PCM samples (in shared space with In__Place__FFT array) which are to be overlap-added to Old__Almost__PCM samples to produce playable PCM. Second pass generates 256 Next__Old__Almost__PCM samples (in a separate array) to be used for overlap-add next block.

3.23 /* Channel__Loop__Error__Conceal__Continue: */Overlap and Add, update Old__Almost__PCM Input=Almost__PCM, Old__Almost__PCM[Chnum], and Next__Old__Almost__PCM. Optimized code (in-lined 8 times) overlaps and adds Almost PCM and Old__Almost__PCM and generates playable PCM in-place (overwrites Almost__PCM). The same loop also updates Old__Almost__PCM from the Next__Old__Almost__PCM array.

3.24 Wait and dump PCM to PCM buffer

Waits till emptiness of current Chnum's PCM buffer is >=256, and then copies over the PCM samples created above into the PCM buffer. NOTE: Stalling in this module can happen only in case of L channel, since once L is filled up, all the others are guaranteed to have at least 256 emptiness. This module also updates the Old__Wr__Ptrs for use by postprocessing modules.

3.25 Increment Chnum. If (Chnum <nfchans OR lfeon==LFE__Enable__Flag==1) jmp Channel__Loop__Start Code is smart to recognize that Chnum==nfchans is LFE channel and appropriately initialize Chtype=5 before processing the channel.

3.26 /* Block__Loop__End: */Zero out non-existent channels

If AC3 is OFF then zero out all 6 channels and exit.

If acmod==7 and lfeon==1 abort immediately to avoid extra MIPS burden to this worst case.

Prepare a temporary buffer of 256 zeros as though it were the output of the AC3 inverse transform.

Lookup Chan__Exist based on acmod, and for each channel that does not exist, Wait and dump PCM to PCM buffer.

NOTE: Special case is Rs. If Prologic is ON (not just enabled), then do not zero out Rs buffer since this is a fake buffer. Instead simply copy over Ls Wr/Rd pointers to make the Rs/Ls buffers identical.

Finally, if lfeon==0, then zero out LFE PCM buffer in the same way as above.

This module also updates the Old__Wr__Ptr for the zeroed out channels.

SPECIAL NOTE ON INTEGRATING POST-PROCESSING MODULES

At this point, all 6 output PCM buffers have 256 new samples. But before promoting the dipstick, several postprocessing steps can happen. Each postprocessing module should make use of the Chtype__?__PCM__Old__Wr__Ptr to access the most recently created PCM (either AC-3 output or zeros if non-existent). The postprocessing module should replace this section with its output. In order to consider wrap around, a 2-pass approach is suggested. The Chtype__?__Cont__Size indicates how many samples can be contiguously accessed from the Old__Wr__Ptr with a maximum of 256. If this is not 256, after this many samples are processed by the module, it should wrap its local pointer back to Chtype__?__PCM__Base and continue to do the remaining 256-Cont__Size samples. It is important that these variables (Old__Wr__Ptr, Cont__Size, PCM__Base etc.) are untouched, so that they can be used by further postprocessing modules.

Furthermore, postprocessing modules can use the following information (guaranteed to be accurate irrespective of whether AC3 is ON or not): fscod, acmod, dsurmod (if acmod==2), output__mode.

3.27 if PCM-Mixer is enabled, call it:

if AC3 is ON && AC3__Started__Flag==0 (prefill of 512 AC3 output has not yet happened), abort (simply return).

If Local__SHMEM__PCM__Buffer__Flag==2 (both local buffer AND SHMEM full) perform mixing: use the user-specified PCM__Level (AC3 mixing level is 1.0 minus this), and using Chtype__0/2__PCM__Old__Wr__Ptr, mix in 256 samples of interleaved PCM input to the L/R output of AC-3 decoder (or zeros in case AC3 was off). As described above, a 2-pass approach is used to take care of wrap around manually by using contiguous size. PCM__Started__Flag is set to 1. Local__SHMEM__PCM__Buffer__Flag is reset to 0. Finally, SHMEM__DATA__TAKEN IPC message is sent to DSPA with PCM opcode to clear the semaphore, and return to caller.

If not (local or SHMEM PCM is not ready), if AC3 is not enabled then stall, i.e. simply go back to start of this module. If AC3 is enabled, then abort—PCM did not arrive on time for some reason. 256 unmixed samples are played this time around.

3.28 If Pink Noise is enabled (specified chtype←-5), call it:

Zero out all other channel's PCM buffers. Depending on fscod, prepare white noise in temporary buffer.

If white noise is not desired (according to user control setting), filter this to produce specified pink noise.

If ProLogic is OFF, copy into target PCM buffer.

If ProLogic is ON (not just enabled) then encode the targeted channel's pink noise into Lt/Rt so that ProLogic decoder will steer it to the desired target channel.

3.29 If ProLogic is enabled, or ON:

Here, there are 3 possible states:

(1) Enable==1, and ON==0, so one needs to turn ON ProLogic;

(2) Enable==1, and ON==1, so one needs to continue doing ProLogic;

(3) Enable==0, and ON==1, so one needs to turn OFF ProLogic.

If Enable==0 (one needs to turn OFF ProLogic), disable interrupts. Restore Ls and Rs buffers to AC3 setup. Implement current host settings for Ls/Rs delay (thus undoing the additional 15 mS added before). Enable interrupts. Clear ProLogic_On_Flag and return.

Else, (Enable==1) user wants ProLogic:

If output_mode==0 (Lt/Rt requested) OR output_mode==2 (L0/R0 requested), OR acmod !=2 OR dsurmod!=2 (ProLogic content not indicated in AC3 stream), cannot/need not do ProLogic. If ProLogic_On_Flag==1, then turn it off as specified above. Otherwise simply return.

Otherwise (we really need to do ProLogic now), if ProLogic_On_Flag==0, we need to turn ON ProLogic. So disable interrupts. Restore Ls and Rs buffers to ProLogic setup. Actually, Rs buffer and pointer setup coincides with Ls buffer, although it is never actually filled. Implement current host settings for Ls/Rs delay with additional 15 mS for ProLogic surround. Enable interrupts. Set ProLogic_On_Flag and call ProLogic_Unit. Then continue below:

Here, initialization is done (either just now, or sometime earlier). Zero out block offset (used by ProLogic module) and call the ProLogic decoder module 32 times (8 samples per call) to generate 256 samples of LRCS output in-place in the PCM buffers.

3.30 if ThreeD is enabled, call it:

Depending on the specified 3D configuration (and possibly parameters) this module modifies the PCM buffers (using the same Old_Wr_Ptr, Cont_Size, PCM_Base scheme).

3.31 if (ThreeD is not enabled && Downmixing_On_Flag==1 && ProLogic_On_Flag==0), call it:

If no 3D downmix and if ProLogic is OFF, do standard Dolby downmixing if required (previously setup by Setup_Downmix call during frame-level initialization).

Downmixing is performed by examining every Out_Chtype. If this output channel exists in the current output_mode, then examine every input Chtype. If this input channel exists in the current input acmod, then move (if the first pass) or accumulate (if a later pass) this channel's PCM into temporary buffer with weightage according to the coefficient indexed in the 2D Downmix_Table(out_ch)[in_ch]. Again, the Old_Wr_Ptr, Cont_Size, PCM_Base scheme is used here to consider wrap around.

Finally, move the temporary buffer PCM into the output channel PCM buffer using the same scheme.

3.32 If Bass Manager is enabled call it.

Depending on the specified configuration (and possibly parameters) this module modifies the PCM buffers (using the same Old_Wr_Ptr, Cont_Size, PCM_Base, scheme).

3.33 Update PCM_Buffer_Dipstick (increment by 256)

3.34 If PCM_Buffer_Prefilled_Flag==0 (startup condition), then if PCM_Buffer_Dipstick>512+16, set PCM_Buffer_Prefilled_Flag=1 (indicate runtime) and clear Mute_Flag=0

3.35 /*Block_Loop_ret: */Increment blknum and jmp Block_Loop_Start if bknum<6

3.36 Increment Framenum (with wrap around at 0x7fffff)

3.37 If Error_Conceal_Frame_Count>0, decrement it 3.38 jmp Frame_Loop 4.0 DSPB Operating System Pseudocode Like DSPA, the main heartbeat of DSPB is also data-driven, i.e. inverse transform of transform coefficient data supplied by DSPA. All other OS functions are covered by interrupt handlers.

Currently, the following asynchronous events (with respect to the application) exist: Inter-Processor Communication, DAO Half empty, Host IRDY, Host ORDY, and Timer interrupt.

4.1 Inter-Processor Communication Handler

DSPB receives this highest priority interrupt from DSPA and first backs up maincode context (ACC0 Hi/Lo) and sets DMEM page to 0 (OS_DMEM_PAGE).

Then it checks if the opcode (in Bits 23:16 of COM_AB) is valid.

If the opcode is invalid, currently no strategy has been determined. DSPB simply proceeds to end the IPC handler.

Else, the handler for the particular opcode is called as specified below:

4.1.1 Rd_DMEM_Rsp (0x01)

DMEM address from lower 14 bits of COM_AB is ORed with DSPA Host_RD_DMEM_Rsp opcode and placed in Host_Tx_Cmd_Word. Data word from PAR_1_AB is placed in Host_Tx_Data_Word. This information is transmitted back to the host (which originated this DSPA read request).

4.1.2 Rd_PMEM_Rsp (0x02)

PMEM address from lower 13 bits of COM_AB is ORed with DSPA Host_RD_PMEM_Rsp opcode and placed in Host_Tx_Cmd_Word. Data word from PAR_1_AB is placed in Host_Tx_Data_word. This information is transmitted back to the host (which originated this DSPA read request).

4.1.3 Rd_IOREG_Rsp (0x03)

IOREG specification (Page+address) from lower 8 bits of COM_AB is ORed with DSPA Host_RD_IOREG_Rsp opcode and placed in Host_Tx_Cmd_Word. Data word from PAR_1_AB is placed in Host_Tx_Data_word. This information is transmitted back to the host (which originated this DSPA read request).

4.1.4 Rd_Reserved_Rsp (0x04)

Do nothing!

4.1.5 OS_Error (0x05)

Do nothing.

4.1.6 Conceal_Frame (0x06)

Increment Error_Conceal_Frame_Count variable. This drives maincode to abort waiting for the next channel's TCs and fake zero TCs into the inverse transform module.

Lower byte of COM_AB contains error code (CRC1, CRC2, Bit stream inconsistency etc.), but for now this information is not used.

4.1.7 Sync_Lost (0x07)

Do nothing.

4.1.8 SHMEM_Data-Ready (0x08)

This is used to indicate that PCM/transform data is ready in SHMEM. The lower 16 bits carry the data type.

If data is not PCM, do nothing and exit below (interrupt-driven TC transfer used only in MPEG where DSPA is faster than DSPB and fills up an input TC buffer for DSPB).

Otherwise (PCM data), If PCM_Mixer is not ON, exit below.

Else (need to process SHMEM PCM) backup AR6/7, MAR6/7 and zero out MAR6/7.

If Local_SHMEM_PCM_Buffer_Full_Flag==1, this is the second set of 256 PCM words, so set this flag=2 and exit after restoring AR6/7 and MAR6/7.

If Local_SHMEM_PCM_Buffer_Full_Flag==0, then copy over 256 words from SHMEM into local PCM buffer, set Local_SHMEM_PCM_Buffer_Full_Flag=1 and setup SHMEM_DATA_TAKEN_PCM IPC message to DSPA in PCM_Tx buffer. Attempt to send the IPC message. Restore AR6/7 and MAR6/7.

Each opcode handler above terminates as:

LSB of COM_P_AB is reset to indicate that DSPA can send another IPC message. ACC0 Hi/Lo and DMEM page are restored and then DSPB returns to maincode.

4.2 DAO Half-Empty Handler

DSPB receives this periodic interrupt every 16 samples (whenever DAO FIFO dipstick falls from 16 to 15). First set IO page to 3 (DAO) and DMEM page to 0. Backup AR6/7, MAR6/7 (clear them also), PAR0 and ACC0/1_Hi. Set SAT bit in STATUS register (maincode SHADOW).

If PCM_Buffer_Prefilled_Flag!=0 (prefill over) AND dipstick==16 (underflow imminent), log an underflow (Num_DAO_Underflow++), set Mute_Flag=1 to initiate soft mute, and clear PCM_Buffer_Prefilled_Flag. Also fudge the 16 samples in each PCM buffer to be repeat of the 1st (i.e. flat constant). This way when we repeat them with a ramp down, we will not introduce any tones.

For each chtype, figure out mapping to DAO channel, and read out 16 samples using Rd_Ptr. Move into DAO FIFO with multiply by PCM scale factor for this Chtype and accumulate with PCM rounding constant for desired precision output.

If PCM_Buffer_Prefilled_Flag==1, then after all 16 samples update the Rd_Ptr. If we hit the End_Plus_1 for this Chtype's PCM buffer, then rewind the Rd_Ptr to the PCM base address, otherwise update it with current Rd Ptr. NOTE: Since PCM buffer size is multiple of 16 we can never overshoot the buffer during the read of 16 samples—at most only reach the end.

After finishing all the 6 channels, if PCM_Buffer_Prefilled_Flag==1, decrement dipstick by 16. Restore AR6/7, MAR6/7, PAR0 and ACC0/1_Hi. Set DMEM page to 1 and IO page to 2 and reti.

4.3 Host IRDY (Input Ready)

When host sends in a new byte, DSPB receives this interrupt, sets DMEM page to 0 (OS_DMEM_PAGE) and backs up ACC0Hi/Lo.

Then the new byte from HOSTDATA is ORed into the lower byte of Host_Rx_in_Word (guaranteed to be zero beforehand). Decrement Host_Rx_Bytes_Left. If non-zero, shift Host_Rx_In_Word<<8 to be ready to OR the next incoming byte, and exit gracefully (restore ACC0, DMEM page).

Otherwise (Host Rx Bytes==0, so 3 bytes were received to complete this input word), increment Host_Rx_Word_Count and reset Host_Rx_Bytes_Left=3 for next incoming word.

If Host_Rx_Word_Count==1, we have received the command word so update Host_Rx_Cmd_Word with Host_Rx_In_Word, and clear Host_Rx_In_Word. If MSB of this word is set (L field) then we need to bring in another word from host (data word), so exit gracefully. Further interrupts will finish up the transaction. If MSB is not set (L=0) then this message is a single word message—continue processing below:

If Host_Rx_Word_Count==2, we have received a data word so update Host_Rx_Data_Word with Host_Rx_In_Word, and clear Host_Rx_In_Word. Zero out Host_Rx_Word_Count. Then perform the following steps and then exit gracefully (restore ACC0, DMEM page).

4.3.1 Process Host Rx Message

Isolate opcode from MSbyte of Host_Rx_Cmd_Word and process accordingly below:

If the opcode is invalid (out of bounds), setup Host_Tx_Data_Word with ERROR opcode with RX_BAD_OPCODE subfield, echo the Host_Rx_Cmd_Word back to Host in Host_Tx_data_Word Otherwise, call the appropriate module for the received opcode to implement the function. Functions are typically read and write of IOREG/DMEM/PMEM resources. For various application modules, specific Control/State variable arrays can be read/written.

In general, each opcode module performs its function, and if any message is to be sent back to the host (like a read response), it writes the message into Host_Tx_Cmd_Word (making it non-zero) and the data into Host_Tx_Data_Word. Fill_Host_Tx_Queue called below detects a pending outgoing message due to non-zero Cmd_Word and initiates the transfer and then clears the Cmd_Word.

If there is an IPC_BA message as a result of processing this message, the module fills up IPC_Host_Tx_Opcode (making it non-zero) and IPC_Host_Tx_Par_1. Send_IPC_Host_Message called below will attempt to send it to DSPA.

4.3.2 Check and Send.IPC Host Message

If IPC_Host_TX_Buffer has non-zero opcode, there is a pending message which needs to be sent. So attempt to send it now. If it does not go through Timer interrupt will attempt to resend.

4.3.3 Check and Fill Host Tx Queue

If Host_TX_Cmd_Word is zero, abort.

Otherwise, if Host_Tx_Kickstart_Needed_Flag==1 (no transaction in progress, so one needs to initiate one), zero out this flag. Then send out the MSbyte of Host_Tx_Cmd_Word into HOSTDATA. Left shift by 8 and move (the remaining 16 bits of the Cmd_Word) into Host_Tx_Out_Word. Latch the L field (MSB) of Cmd_Word in Host_Tx_Cmd_L_Field. Update Host_Tx_Out_Data_Word with Host_Tx_Data_Word. Set Host_Tx_Bytes_left=2 to indicate 2 bytes left to be sent from Host_Tx_Out_Word. Zero out Host_Tx_Cmd_Word (to indicate no pending word) and then return.

Otherwise (no kickstart needed), backup AR7/MAR7 and set MAR7 to circular size of Host_Tx_Queue.

If full flag (MSB of Host_Tx_Queue_Wr_Ptr) indicates that the queue is about to overflow, rewind the Wr ptr 2 locations and overwrite the next (most recent) message to the host with ERROR opcode+Tx_Overflow subfield and junk dataword. Then exit gracefully (restore AR7/MAR7, clear empty flag, update full flag, zero out Host_Tx_Cmd_Word and then return).

Otherwise (no overflow) update the queue with new Cmd word and data word, and then exit gracefully.

4.4 Host ORDY (Output Ready)

When host pulls out a byte, DSPB receives this interrupt, sets DMEM page to 0 (OS_DMEM_PAGE) and backs up ACC0Hi/Lo.

If Host_Tx_Bytes Left>0, then send the MSbyte of Host Tx Out Word into HOSTDATA. Decrement Host_Tx_Bytes_Left, leftshift Host_Tx_Out_Word <<8 to prepare next outgoing byte and exit gracefully (restore ACC0 and DMEM page and then reti).

Otherwise (no bytes left in Out word), check if latched L field in Host_Tx_Cmd_L_Field is 1. Then:

If latched L==1 (data word exists to accompany previous cmd word), update Host_Tx_Out_Word from Host_Tx_Out_Data_Word, send the MSByte into HOSTDATA, left shift Out_Word by 8 bits, set Host_Tx_Bytes_Left to 2, and exit gracefully.

If latched L==0 (no data word), one needs to process the Tx queue. If Tx queue is empty, then set Kickstart_Needed_Flag=1 (no more messages to send host, so next time we need to kickstart) and exit gracefully.

Otherwise (Tx queue non-empty), backup AR7/MAR7 and set MAR7 to circular size of Host_Tx_Queue. Read out the next 2 words from queue using Rd_Ptr into Host_Out_Word and Host_Tx_Data_Word respetively. Latch the L field of Out_Word into Host_Tx_Cmd_L_Field. Update Rd_Ptr. Update Empty flag by checking dipstick. Clear Tx Full flag (removed 2 words so it cannot be empty). Send the MSByte of Out_Word into HOSTDATA, left shift Out_Word by 8 bits, set Host_Tx_Bytes_Left to 2, and exit gracefully.

4.5 Timer Handler

DSPB receives this periodic interrupt, sets DMEM page to 0 (OS_DMEM_PAGE) and backs up AR6/7, MAR6/7 (and clears them) and ACC0 Hi/Lo. Then the following tasks are performed, after which DMEM page is restored to 1 (Application-DMEM_Page), the above registers are restored and reti is performed.

4.5.1 Check and Do Volume Adjustment

Set MPYSHF, RND, and SAT bits in STATUS. If Mute_Flag OR Host_Mute_Flag is set, then set Target volume to 0, else update Target volume from Host_Master_Volume.

If Current volume>Target Volume, decrement Current Volume by standard DELTA. If it undershot target volume, make Current volume=Target volume.

Else, if Current volume<Target Volume, increment Current Volume by standard DELTA. If it overshot target volume, make Current volume=Target volume.

Multiply (new) current volume to each individual Host_Channel_Volume setting and store PCM_Scalefactor in PMEM. This step is done unconditionally, since host may change individual channel volumes without touching master volume. PCM scalefactors are the final numbers actually used by DAO Half-Empty handler while moving PCM samples into the DAO FIFOs.

Clear MPYSHF, RND, and SAT bits in STATUS and return.

4.5.2 Check and send IPC ABA message

If IPC_ABA_Tx_Buffer has non-zero opcode, there is a pending message which could not be sent by the originating module since IPC BA was busy then. So attempt to send it again now.

4.5.3 Check and send IPC PCM message

If IPC_PCM_Tx_Buffer has non-zero opcode, there is a pending message which could not be sent by the originating module since IPC BA was busy then. So attempt to send it again now.

4.5.4 Check and send IPC Host message

If IPC_Host_TX_Buffer has non-zero opcode, there is a pending message which could not be sent by the originating module since IPC BAfs was busy then. So attempt to send it again now.

Configuration alternatives and applications modules available to the user can now be described.

After download (or after soft reset following a previous download) decoder 100 performs initialization of the application. Decoder 100 then waits for the Host to kickstart the application (discussed below), after which the application begins to execute.

Before issuing the kickstart, the host has the option of changing the hardware configuration from the default specified below. For each possible configuration, a multi-byte macro message is provided below (listed in Hex) which sets up the decoder 100 to operate in the corresponding system environment:

1.0 Mode 0 (DEFAULT)

Configuration Message (Hex):
80025B, fffffc, 800010, 90002c, 800014, 770800, 800017, 0111c0, 80001a, 0111c0, 80007c, 101301, 80007d, 101301, 80007d, 101301, 80007e, 101301, 80007fs, 03e100.

Clock:

External 50 MHZ on CLKIN with CLKSEL held high.

Compressed Data Input Port:

LRCLKN2: Slave Fs. Low=Left subframe.

SCLKN2: Slave 64 Fs (32 bits per subframe).

SDATAN2: 16 bits after 1 SCLK delay (I2S) in each subframe. Data should be valid on rising edge of SCLK. Payload should be AC3 (Consumer IEC958 format) with appropriate preamble before frames and zero padding between frames.

CMP Input FIFO: Size=2048 words.

PCM Data Input Port:

LRCLKN1: Slave Fs. Low=Left subframe.

SCLKN1: Slave 64 Fs (32 bits per subframe).

SDATAN1: 16 bits after 1 SCLK delay (I2S) in each subframe. Data should be valid on rising edge of SCLK.

PCM Input FIFO: Size=2048 words.

Digital Audio Output:

MCLK: Slave 256 Fs.

LRCLK: Master Fs. Low=Left subframe.

SCLK: Master 64 Fs (32 bits per subframe).

AUDAT0, AUDAT1, AUDAT2: 20 bits after 1 SCLK delay (I2S) in each subframe. Data is valid on rising edge of SCLK.

Output Mode: 7 (AUDAT0=CH0/1. AUDAT1=CH2/3. AUDAT2=CH4/5).

1.1 Mode 1

Configuration Message (Hex):

80025B, fffffc, 800010, 0e002c, 800014, 770800, 800017, 0111c0, 80001a, 0111c0, 80007c, 101301, 80007d, 101301, 80007e, 101301, 80007fs, 03e100

Clock:

External 50 MHZ on CLKIN with CLKSEL held high.

Compressed Data Input Port:

CMPREQ: Driven low by decoder 100 when at least one data-chunk can be accepted.

CMPCLK: Slave clock.

CMPDAT: Data should be valid on rising edge of CMP-CLK. Payload should be raw AC3 data.

CMP Input FIFO: Size=2048 words. Mostly Full (MF) threshold=1792 words. Data can be delivered in 252-word chunks (FIFO size–MF Threshold–4 words) as long as CMPREQ is low.

PCM Data Input Port:

LRCLKN1: Slave Fs. Low=Left subframe.

SCLKN1: Slave 64 Fs (32 bits per subframe).

SDATAN1: 16 bits after 1 SCLK delay (I2S) in each subframe. Data should be valid on rising edge of SCLK.

PCM Input FIFO: Size=2048 words.

Digital Audio Output:

MCLK: Slave 256 Fs.

LRCLK: Master Fs. Low=Left subframe.

SCLK: Master 64 Fs (32 bits per subframe).

AUDAT0, AUDAT1, AUDAT2: 20 bits after 1 SCLK delay (I2S) in each subframe. Data is valid on rising edge of SCLK.

Output Mode: 7 (AUDAT0=CH0/1. AUDAT1=CH2/3. AUDAT2=CH4/5).

1.2 Mode 2

Configuration Message (Hex):

80025B, fffffc, 800010, d0002c, 800014, 770800, 800017, 0111c0, 80001a, 0111c0, 80007c, 101301, 80007d, 101301, 80007e, 101301, 80007fs, 03e100

Clock:

External 50 MHZ on CLKIN with CLKSEL held high.

Compressed Data Input Port:

Unused.

PCM Data Input Port:

LRCLKN1: Slave Fs. Low=Left subframe.

SCLKN1: Slave 64 Fs (32 bits per subframe).

SDATAN1: 16 bits after 1 SCLK delay (I2S) in each subframe. Data should be valid on rising edge of SCLK. Payload can be either PCM or AC3 (Consumer IEC958 format) with appropriate preamble before frames and zero padding between frames.

PCM Input FIFO: Size=2048 words.

Digital Audio Output:

MCLK: Slave 256 Fs.

LRCLK: Master Fs. Low=Left subframe.

SCLK: Master 64 Fs (32 bits per subframe).

AUDAT0, AUDAT1, AUDAT2: 20 bits after 1 SCLK delay (I2S) in each subframe. Data is valid on rising edge of SCLK.

Output Mode: 7 (AUDAT0=CH0/1. AUDAT1=CH2/3. AUDAT2=CH4/5).

Decoder 100 can be operated in conjunction with selected Application Modules that are available for host messaging. The command, read and write message structures are as discussed above.

Audio Manager Module

Write Opcode=0x08. Read Opcode=0x09.

Table 74 lists the complete set of control/state variables of the Audio Manager Module. Examples of common operations are given below:

Control: Audio_Control=0x0000[0,1]1; 0x880000, 0x0000[0,1]1; WR_HEX audioctl 0000[0,1]1 kick-starts the application. As detailed in TABLE 69, Bit 4=IEC958_Enable enables parsing of the input data as payload of IEC958 SPDIF carrying AC3 data. Please refer to Annex B of the Dolby AC3 Specification for more information.

Volume: [Master_Volume, L_Volume, C_Volume, R_Volume, Ls_Volume, Rs_Volume, LFE_Volume]=0.0,1.0); 0x88000[6-c], 0x[000000-7fffff]; WR_FL [mast_vol, l_vol, c_vol, r_vol, ls_vol, rs_vol, lfe_vol] (0.0, 1.0)

Center Delay: C_Delay=0 . . . 5; 0x880002, 0x0000 [0–5]; WR_INT c_delay 0 . . . 5 sets up delay value in ms (milliseconds).

Surround Delay: [Ls_delay, Rs_Delay]=0 . . . 15; 0x88000[4,5], 0x0000[0-f]; WR_INT [ls_delay, rs_delay]0 . . . 15 sets up delay value in ms. If ProLogic decode is currently ON, 15 ms is automatically added to this setting so that actual delay is in the range 15 . . . 30 ms.

Pink Noise: Pink_Noise_Control=0x0000[0,1][0–5]; 0x880001, 0x0000[0,1][0–5]; WR_HEX pinkctl 0x0000[0,1][0–5] switches ON Pink/White Noise in Channels L, C, R, Ls, Rs and LFE respectively. As detailed in TABLE 69, Bit 4=White_Noise_Enable enables white noise if set (otherwise output is Pink noise). If AC3 is enabled then Pink/White Noise will work only by replacing output of AC3 decoder, i.e. valid AC3 input is required to decoder 100. Alternatively, with AC3 disabled (and PCM Mixer OFF) noise is generated and played back directly. Also, for ProLogic Pink Noise, PCM-based ProLogic should be currently running when the noise is switched ON since the noise generator replaces the decoder output.

Pink_Noise_Control =0x0000[0,1][6-f]; 0x880001, 0x0000[0,1][6-f]; WR_HEX pinkctl 0x0000[0,1][6-f] switches OFF Pink Noise. This reverts audio output to the underlying application (AC3 or PCM ProLogic).

Mute: Mute=0/1; 0x88000d, 0x00000[0,1]; WR_INT mute 0/1 unmutes/mutes all audio outputs.

AC3 Module

Write Opcode=0x0a. Read Opcode=0x0b. TABLE 75 lists the complete set of control/state variables of the AC3 Module. Examples of common operations are given below:

Control: AC3_Control=0x0000[0,1]1; 0x8a0000, 0x0000[0,1]1; WR HEX ac3ctl 0000[0,1]1 enables the AC3 decoder. As detailed in TABLE 70, Bit 4=LFE_Enable which enables decoding of LFE channel (if it exists in the stream).

Output Mode: To setup a particular output speaker (downmix) configuration, first the individual volumes of each undesired channel should be set to 0 (see Section 6.4.1 above). Next, the desired output mode should be specified. This should typically be done before kickstart of the application. For example, if Dolby Surround compatible (ProLogic encoded output) mode is desired, the following sequence should be used:

C_Volume=0.0, Ls_Volume=0.0, Rs_Volume=0.0, LFE_Volume=0.0, Output_Mode_Control=0x000000; 0x880008, 0x000000, 0x88000a, 0x000000, 0x88000b, 0x000000, 0x88000c, 0x000000, 0x8a0001, 0x000000;

WR_FL c_vol 0.0; WR_FL ls_vol 0.0; WR_FL rs_vol 0.0; WR_FL lfe_vol 0.0, WR_HEX outctl 000000

In case of dual mono input (stream acmod=0), the Dualmode field of Output_Mode_Control should be setup correctly to direct the mono channels as desired.

Compression Mode: Compression_Control=0 . . . 3; 0x880002, 0x00000[0–3]; WR_INT compctl 0 . . . 3 sets up the standard Dolby compression modes: Custom Mode 0 (Analog Dialnorm), Custom Mode 1 (Digital Dialnorm), Line Out Mode, and RF Remodulation Mode. Please refer to the Dolby Licensee Information manual for more details.

Compression Parameters: [Cut_x, Boost_y]=(0.0, 1.0); 0x8a000[3–4], 0x[000000-7fffff]; WR_FL [cut_x, boost_y] (0.0, 1.0) sets up the cut and boost compression scale factors. The resulting effect of these settings depends on the selected Compression Mode. Please refer to the Dolby Licensee Information manual for more details.

AC3 Stream Information: TABLE 70 lists out a complete set of READ-ONLY variables that are reported to the host by the AC3 Decoder module. These can be read out using the appropriate Read Request+Response sessions indicated in Section 4.2. With the decoder 100 evaluation board, one can use the RD_HEX, RD_INT or RD_FL batch files depending on what data type output is convenient. For example, to read the acmod value, host should issue the 3-byte Read Request 0x0b0007 and then receive the 6-byte Read response 0x9b0007, 0x00000[0–7], where the dataword (latter 3 bytes) indicates the reported value of acmod. For the decoder 100 evaluation board, RD_HEX acmod will do exactly this and report the current acmod value in Hex. Use RD_INT acmod instead to display the result as a decimal signed integer.

Please refer to the Dolby AC3 Specification for more information on these stream variables.

ProLogic Module

Write Opcode=0x0e. Read Opcode=0x0f.

TABLE 76 lists the complete set of control/state variables of the ProLogic Module. Examples of common operations are given below:

Control: ProLogic_Control =0x000[0,1][0,1]1; 0x8e0000, 0x000[0,1][0,1]1; WR_HEX proctl 000[0,1][0,1]1 enables the ProLogic decoder. The ProLogic decoder will come ON only if its audio input is Lt/Rt encoded, i.e. PCM-only input (always assumed to be Lt/Rt) or output of AC3 decoder when AC3 content is Lt/Rt encoded (acmod=2 and dsurmod=2 in the AC3 stream) as detailed in TABLE 71.

Bit 8=Autobalance_Enable and Bit 4=Btype_NR_Enable, enable the Autobalance and B-Type Noise Reduction features respectively.

Wide/Normal Center: Wide center corresponds to Bass Manager Module OFF (Bass_Mgr_Control=0x000000) and Normal center corresponds to Bass Manager ON in Configuration 3 with Subwoofer enabled and Full range center disabled (Bass_Mgr_Control=0x000131). See Section 6.4.4 for more details on the Bass Manager.

Bass Manager Module

Write Opcode=0x14. Read Opcode=0x15.

TABLE 77 lists the complete set of control/state variables of the Bass Manager Module. Examples of common operations are given below:

Control: Bass_Mgr_Control=0x00[0,1][0,1][0–5]1; 0x940000, 0x00[0,1][0,1][0–5]1; WR_HEX bmctl 00[0,1][0,1][0–5]1 switches ON the Bass Manager. As detailed in TABLE 72, Bits 7:4 specify the Configuration number, and for relevant configurations, Bits 8 and 12 enable Subwoofer and Full range center respectively. Please refer to the Dolby Licensee Information Manual for more details.

Center and Surround Levels: [C_Bass_Mgr_Level, Ls_Bass_Mgr_Level, Rs-Bass_Mgr_Level]=(0.0, 1.0);

0x94000[1,3,4], 0x[000000-7fffff]; WR_FL [c_bmlev, ls_bmlev, rs_bmlev] (0.0, 1.0) set the level for C, Ls and Rs channels respectively when entering Config 2 (see Dolby Licensee Information Manual). These should be explicitly set (without assuming defaults) before initiating Config 2. The suggested value is 0.25 (0x200000) for all three settings.

PCM Mixer Module

Write Opcode=0x1c. Read Opcode=0x1d.

TABLE 73 lists the complete set of control/state variables of the PCM Mixer Module. Examples of common operations are given below:

Control: PCM_Mixer_Control=0x00000[0,1]; 0x9c0000, 0x00000[0,1]; WR_HEX pcmctl 00000[0,1] switches OFF/ON the PCM Mixer.

Mixing Level: PCM_Mixer_PCM Level=(0.0, 1.0); 0x9c0001, 0x[000000-7fffff]; WR_FL pcmlev (0.0, 1.0) sets the level for the PCM input to the mixer. 1.0-this setting is used as the mixing level for the AC3 input to the mixer. Currently, PCM Mixing is restricted to L/R channels only, i.e. the PCM L/R input is always mixed with the L/R output of the AC3 decoder, and other channels (if any) are unaltered.

Special Notes:

1. All variables are Read-Write unless specifically mentioned as READ-ONLY.

2. Startup defaults are mentioned explicitly for every writable variable. Default* indicates default value forced only at download time. Default indicates default value forced at every reset (before initialization and kickstart).

3. Values are specified in 24-bit Hex, signed decimal integer, or floating point wherever functionally relevant. However, host messages should always consist of appropriately converted 24-bit words. Floating point values should be converted to 24-bit fractional integers.

TABLE 69

Audio Manager. Write = 0x08, Read = 0x09

| Index | Variable | Script | Dataword Content |
|---|---|---|---|
| 0x00 | Audio_Mgr_Control | audioctl | Bit 4: IEC958_Enable = 0/1 = Disable/Enable 1EC958 parsing of Compressed Data Input.<br>Bit 0: Kickstart_Enable = 0/1 = Disable/Enable Kickstart of Application. Default = 0x000000 |
| 0x01 | Pink Noise_Control | pinkctl | Bit 4: White_Noise_Enable = 0/1 = Pink/White Noise output<br>Bits 3:0 = Output_Channel = 0 ... 5 = L, C, R, Ls, Rs, LFE channel output. > 5 = Disabled.<br>default = 0x7fffff |
| 0x02 | C_Delay | c_delay | 0 ... 5 = mS delay. Default* = 0 |
| 0x03 | PCM_Precision | pcmprec | 1 ... 20 = Precision of output PCM. Default* = 20. |
| 0x04 | Ls_Delay | ls_delay | 0 ... 15 = mS delay (automatic +15 for ProLogic). Default* = 0 |
| 0x05 | Rs_Delay | rs_delay | 0 ... 15 = mS delay (automatic +15 for ProLogic). Default* = 0 |
| 0x06 | Master_Volume | mast_vol | 0.0–1.0. Default* = 1.0 |
| 0x07 | L_Volume | l_vol | 0.0–1.0. Default* = 1.0 |
| 0x08 | C_Volume | c_vol | 0.0–1.0. Default* = 1.0 |
| 0x09 | R_Volume | r_vol | 0.0–1.0. Default* = 1.0 |
| 0x0a | Ls_Volume | ls_vol | 0.0–1.0. Default* = 1.0 |
| 0x0b | Rs_Volume | rs_vol | 0.0–1.0. Default* = 1.0 |
| 0x0c | LFE_Volume | lfe_vol | 0.0–1.0. Default* = 1.0 |
| 0x0d | Mute | mute | 0/1 = Unmute/mute audio. Default = 0 |
| 0x0e | DAO0_Channel[a] | dao0_ch | 0 ... 5 = Channel type[b] Digital Audio Output 0. Default* = 0(L) |
| 0x0f | DAO1_Channel[a] | dao1_ch | 0 ... 5 = Channel type[b] Digital Audio Output 1. Default* = 2(R) |
| 0x10 | DAO2_Channel[a] | dao2_ch | 0 ... 5 = Channel type[b] Digital Audio Output 2. Default* = 3(Ls) |
| 0x11 | DAO3_Channel[a] | dao3_ch | 0 ... 5 = Channel type[b] Digital Audio Output 3. Default* = 4(Rs) |
| 0x12 | DAO4_Channel[a] | dao4_ch | 0 ... 5 = Channel type[b] Digital Audio Output 4. Default* = 1©  |
| 0x13 | DAO5_Channel[a] | dao5_ch | 0 ... 5 = Channel type[b] Digital Audio Output 5. Default* = 5(LFE) |

[a]Mapping should be setup before kickstart of application and should always be complete and one-to-one, i.e. each DAO should mapped to one and only Channel type.
[b]Channel type 0 ... 5 corresponds to Channels L, C, R, Ls, Rs and LFE respectively.

TABLE 70

AC3. Write = 0x0a, Read = 0x0b

| Index | Variable | Script | Dataword Content |
|---|---|---|---|
| 0x00 | AC3_Control | ac3ctl | Bit 4: LFE_Enable = 0/1 = Disable/Enable LFE channel decoding<br>Bit 0: AC3_Enable = 0/1 = Disable/Enable AC3 decoding. Default* = 0x000011 |
| 0x01 | Output_Mode_Control | outctl | Bit 8: Reserved. Always write 0.<br>Bits 5:4: Dualmode = 0 ... 3 = -u setting of Dolby C decoder. Valid |

TABLE 70-continued

AC3. Write = 0x0a, Read = 0x0b

| Index | Variable | Script | Dataword Content |
|---|---|---|---|
| | | | only if acmod=0 (dual mono).<br>0 = Stereo<br>1 = Left Mono<br>2 = Right mono<br>3 = Mixed-Mono.<br>Bits 3:0: Output_Mode = 0 . . . 7 =<br>−o setting of Dolby C decoder<br>0 = 2/0 L, R Dolby Surround compatible<br>1 = 1/0 C<br>2 = 2/0 L, R<br>3 = 3/0 L, C, R<br>4 = 2/1 L, R, S (Ls = Rs = S − 3dB)<br>5 = 3/1 L, C, R, S (Ls = Rs = S − 3dB)<br>6 = 2/2 L, R, Ls, Rs<br>7 = 3/2 L, C, R, Ls, Rs<br>Default* = 0x000007<br>NOTE: Undesired Channel outputs should be explicitly muted by setting the corresponding Ch_vol (see Audio Manager) to 0.0 |
| 0x02 | Compression_Control | compctl | 0 . . . 3 = −k setting of Dolby C decoder<br>0 = Custom Mode 0 (Analog Dialnorm)<br>1 = Custom Mode 1 (Digital Dialnorm)<br>2 = Line Out Mode<br>3 = RF Remodulation Mode<br>Default* = 1 |
| 0x03 | Cut_x | cut_x | 0.0–1.0 = Compression cut scale factor = −x setting of Dolby C decoder. Default* = 0.0 |
| 0x04 | Boost_y | boost_y | 0.0–1.0 = Compression boost scale factor = −y setting of Dolby C decoder. Default* = 0.0 |
| 0x05 | fscod | fscod | 0 . . . 3 = Current fscod value. READ ONLY except if input is PCM-only, in which case this should be set by Host to indicate Fs as:<br>0 = 48 KHz<br>1 = 44.1 KHz<br>2 = 32 KHz<br>3 = Reserved<br>4 = 96 KHz<br>No default should be assumed. Should be explicitly set before using PCM-only input. |
| 0x06 | bsmod | bsmod | 0 . . . 7 Current bsmod value. READ-ONLY |
| 0x07 | acmod | acmod | 0 . . . 7 = Current acmod value. READ-ONLY |
| 0x08 | dsurmod | dsurmod | 0 . . . 3 = Current dsurmod value. Valid only in 2/0 mode (acmod=2). READ-ONLY |
| 0x09 | clev | clev | 0.0–1.0 = Current center mixing level (interpreted stream value). Valid only if 3 front channels exist. READ-ONLY |
| 0x0a | slev | slev | 0.0–1.0 = Current surround mixing level (interpreted stream value). Valid only if a surround channel exists. READ-ONLY |
| 0x0b | lfeon | lfeon | 0/1 = Current lfeon value. READ-ONLY |
| 0x0c | dialnorm | dialnorm | 0 . . . 31 = Current dialnorm value. READ-ONLY |
| 0x0d | compr | compr | 0xffffff = Nonexistent in stream.<br>0x00-0xff = Current compr value. READ-ONLY |
| 0x0e | dialnorm2 | dialnorm2 | 0 . . . 31 = Current dialnorm2 value. Valid only in 1+1 dual mono mode |

TABLE 70-continued

AC3. Write = 0x0a, Read = 0x0b

| Index | Variable | Script | Dataword Content |
|---|---|---|---|
| 0x0f | compr2 | compr2 | (acmod=0). READ-ONLY<br>0xffffff = Nonexistent in stream.<br>0x00-0xff = Current compr2 value.<br>Valid only in 1+1 dual mono mode (acmod=0). READ-ONLY |
| 0x10 | bsid | bsid | 0 . . . 31 = Current bsid value. READ-ONLY |
| 0x11 | langcod | langcod | 0xffffff = Nonexistent in stream.<br>0 . . . 255 = Current langcod value. READ-ONLY |
| 0x12 | mixlevel_roomtyp | mixroom | 0xffffff = Nonexistent in stream.<br>0x00 . . . 0x7f: Bits 6:2: current mixlevel. Bits 1:0: current roomtyp. READ-ONLY |
| 0x13 | langcod2 | langcod2 | 0xffffff = Nonexistent in stream.<br>0 . . . 255 = Current langcod value.<br>Valid only in 1+1 dual mono mode (acmod=0). READ-ONLY |
| 0x14 | mixlevel2_roomtyp2 | mixroom2 | 0xffffff = Nonexistent in stream.<br>0x00 . . . 0x7f: Bits 6:2: current mixlevel2. Bits 1:0: current roomtyp2. Valid only in 1+1 dual mono mode (acmod+0). READ-ONLY |
| 0x15 | copyrightb | cpyrghtb | 0/1 = Current copyrightb value. READ-ONLY |
| 0x16 | origbs | origbs | 0/1 = Current origbs value. READ-ONLY |

TABLE 71

ProLogic. Write 0x0e, Read = 0x0f.

| Index | Variable | Script | Dataword Content |
|---|---|---|---|
| 0x00 | ProLogic_Control | proctl | Bit 8: Autobalance_Enable = 0/1 = Disable/Enable Autobalance.<br>Bit 4: Btype_NR_Enable = 0/1 = Disable/Enable B-Type Noise Reduction.<br>Bit 0: ProLogic_Enable = 0/1 = Disable/Enable ProLogic decoding.<br>Default* = 0x000111 |

TABLE 72

Bass manager. Write 0x14, Read = 0x15.

| Index | Variable | Script | Dataword Content |
|---|---|---|---|
| 0x00 | Bass_Mgr_Control | bmctl | Bit 12: Full_Range_Center_Enable = 0/1 = Disable/Enable Full Range Center output. Valid only for Config 3.<br>Bit 8: Subwoofer_Enable = 0/1 = Disable/Enable Subwoofer output. Valid only for Config 3 and Config 4.<br>Bit 7:4: Bass_Mgr_Config = 0 . . . 5 = As per Dolby Licensee Information Manual:<br>  0 = Config 0<br>  1 = Config 1<br>  2 = Config 2<br>  3 = Config 3<br>  4 = DVD Config |

TABLE 72-continued

Bass manager. Write 0x14, Read = 0x15.

| Index | Variable | Script | Dataword Content |
|---|---|---|---|
| | | | 5 = Alternative Config 2<br>Bit 0: Bass_Mgr_Enable = 0/1 = Disable/Enable Bass Manager post-processing.<br>Default* = 0x000010 |
| 0x01 | C_Bass_Mgr_Level | c_bmlev | 0.0–1.0 = Level adjustment for C channel output. Valid only for Config 2. No default should be assumed. Should be explicitly set (suggested value = 0.25) before enabling Bass Manager in Config 2. |
| 0x02 | Reserved | | |
| 0x03 | Ls_Bass_Mgr_Level | ls_bmlev | 0.0–1.0 = Level adjustment for Ls channel output. Valid only for Config 2. No default should be assumed. Should be explicitly set (suggested value = 0.25) before enabling Bass Manager in Config 2. |
| 0x04 | Rs_Bass_Mgr_Level | rs_bmlev | 0.0–1.0 = Level adjustment for Rs channel output. Valid only for Config 2. No default should be assumed. Should be explicitly set (suggested value = 0.25) before enabling Bass Manager in Config 2. |

TABLE 73

PCM Mixer. Write = 0x1c, Read = 0x1d.

| Index | Variable | Script | Dataword Content |
|---|---|---|---|
| 0x00 | PCM_Mixer_Control | pcmctl | Bit 0: PCM Mixer_Enable = 0/1 = Disable/Enable PCM Mixing.<br>Default* = 0x0000000 |
| 0x01 | PCM_Mixer_PCM_Level | pcmlev | 0.0–1.0 = PCM Mixing level. AC3 will be mixed in with 1.0-PCM_Mixer_PCM_Level when PCM Mixer is enabled.<br>Default* = 0.5 |

FIG. 56 is a diagram illustrating an error concealment method for use in a dual processor audio decoder such as decoder 100. This error concealment scheme advantageously ensures that any incoming frames of compressed audio data which contains errors are not processed and passed on for decompression. Such errors may ultimately, after conversion to analog form and any mixing or other processing, cause clicks, pops or distortions audible to the end user. Notwithstanding, data flow must still be maintained through the data pipelines or similar problems will occur.

At Step 5601 DSPA detects an error in an incoming frame of compressed audio data. The error may be, for example, the result of a bad CRC test, a frame mis-alignment, or a bit inconsistency. When DSPA detects an error in the current frame, DSP conceals that frame (i.e., does not pass that frame data on to shared memory) and sends an error message to DSPB via the IPC registers.

With each error message received from DSPA, DSPB increments a counter value at Step 5603. The counter keeps count of the number of frames which contain errors and hence are being concealed. Then, with each frame that is being concealed, DSPB at Step 5604 sends a frame of 0's to the transform engine to maintain a full data pipeline and then decrements counter. If the counter value does not equal zero at Step 5605, DSPB sends another frame of zeros to the transform engine. When the counter value reached zero at Step 5605, DSP waits until DSPA detects another error in the incoming data stream.

As discussed above, a stream of encoded and/or compressed audio data can be received at the input CIN of decoder 100. In the case of AC-3 data, the stream of audio data is partitioned into frames and each frame further partitioned into blocks. The received data is in a frequency domain format which includes frequency domain coefficients consisting of mantissas and exponents. The exponents in particular are needed early in the decompression processing performed by decoder 100 and therefore are found in at least the first block of each incoming frame such that they can be reused as required. The issue then arises as to the storage of the coefficients efficiently in memory.

FIG. 57 illustrates one method according to the principles of the present invention in which exponent data can be efficiently processed by DSPA and stored in memory. The method begins at Step 5701, where DSPA receives the first block of an incoming frame, the incoming frame including six channels of encoded exponent data. Next, DSPA packs the encoded exponent data for each of two sets of three channels into a single word. Then, DSPA stores the words of packed and encoded exponent data in memory (Step 5703).

DSPA now can calculate the packed and encoded exponent data for the current (first) block at Step 5704. Eventually, these exponents will be passed to DSPB via shared memory as discussed above.

After the calculation of the exponents of the current frame at Step 5704, DSPA receives the next block of the frame at Step 5705. If a re-use flag has been set for the next block of the frame, the exponent data already stored in memory can then be used. At Step 5707, DSPA calculates the exponents for the current block from the packed and encoded data in memory. If however, at Step 5706, no re-use flag has been set for the current block, DSPA must once again at Step 5708 pack the received encoded exponent data for each of two sets of three channels into a single word. At Step 5709, DSPA stores the packed and encoded data for the current block in memory and then proceeds to Step 5707 for the calculation of exponents.

If at Step 5710, the end of the current frame has been reached, processing returns to Step 5701 for receipt of the first block of the next frame. Otherwise, the processing returns to Step 5705 for the processing of the next block of the current frame.

In sum, the principles of the present invention allow for the construction, operation and use of a dual processor audio decoder (decompressor). Such a dual processor audio device will provide substantial speed advantage over any of the prior art audio devices. Additionally, the principles of the present invention allow for the designer using such a device substantially flexibility through software manipulation.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

Appendix 1

Sheet 1 of 30

Instruction: ADD
Syntax: add srcA, srcB, dest
Operation: dest=srcA+srcB

Description: Source A is added with source B and the result is stored in the destination. If saturation is enabled, then the result is saturated in the case of overflow. If the destination is an accumulator, the result is written to the high 24 bits of the accumulator.

Restrictions: none

Flags Affected: V, C, Z, N, U, POV2, POV3

Modes Used: SAT

DA972680344

Appendix 2

Sheet 2 of 30

Instruction: ADDC

Syntax: addc srcA, srcB, dest

Operation: dest=srcA+srcB+C

Description: Source A is added with source B and the carry bit; the result is stored in the destination. If saturation is enabled, then the result is saturated in the case of overflow. If the destination is an accumulator, the result is written to the high 24 bits of the accumulator.

Restrictions: none

Flags Affected: V, C, Z, N, U, POV2, POV3

Modes Used: SAT

DA972680344

Appendix 3

Sheet 3 of 30

Instruction: AND

Syntax: and srcA, srcB, dest

Operation: dest=srcA & srcB

Description: Source A is bitwise added with source B and the result is stored in the destination. If the destination is an accumulator, the result is written to the high 24 bits of the accumulator.

Restrictions: none

Flags Affected: Z, N

Modes Used: none

DA97

Appendix 4

Sheet 4 of 30

Instruction: DIV

Syntax: div srcA, ACCx

Operation: acc=acc/srcA

Description: Divide iteration. Performs one iteration of a non-restoring fractional division algorithm. The dividend is in accumulator and source A is divisor. DIV must be repeated 24 times to complete a 24-bit division. The accumulator is divided by source A and the result is stored in the accumulator. The 24 msb of the accumulator is the partial remainder and the 24 Lsb of the accumulator is the quotient. Although not specified in the assembler syntax, srcB is always the same as dest.

Restrictions: The only allowable combinations of srcB and dest values from the assembler are srcB=ACC0 and dest=ACC0, or srcB–ACC1 and dest=ACC1.

Flags Affected: C, Z, N, U

Modes Used: none

DA97

Appendix 5

Sheet 5 of 30

Instruction: JMP

Syntax: jmp dest, cc//if (cc), jump to destination jmp dest//always jump to destination Operation: if (cc) pc=dest Description: Jump to new program address.

Restrictions: none

Flags Affected: none

Modes Used: none

DA97

Appendix 6

Sheet 6 of 30

Instruction: JMPS

Syntax: jmps dest, cc//if (cc), jump to subroutine jmps dest//always jump to subroutine Operation: if(cc) {if (service interrupt) {stack pointer+1; stack.pc=dest; stack.lc=0; sr=shadow sr; }else {stack pointer+1; stack.pc=dest; stack.lc=0;}}

Description: Jump to subroutine.

Restrictions: none

Flags Affected: none

Modes Used: none

DA97

Appendix 7

Sheet 7 of 30

Instruction: LD

Syntax: ld src, dest

Operation: dest=src

Description: Load data into program data destination.

Restrictions: none

Flags Affected: none

Modes Used: none

DA97

Appendix 8

Sheet 8 of 30

Instruction: MAC

Syntax: mac srcA, srcB, dest

Operation: dest=srcA*srcB+acc0

Description: Source A is multiplied with source B and the result is added with accumulator 0. If the destination is an accumulator, the 48-bit result is stored in the accumulator. Otherwise, the 24 msb of the result is stored in destination. If multiply shift mode is enabled, the result of the multiply is shifted left by one bit before adding to the accumulator. If saturation is enabled, the 48-bit result is saturated in the case of overflow. If rounding is enabled, the result is rounded to 24 bits if the destination is not an accumulator. The result is also rounded to 24 bits if the destination is a rounded accumulator.

Restrictions: srcB=acc1 is not allowed.
Flags Affected: V, C, Z, N, U, POV2, POV3
Modes Used: SAT, RND, MPYSHF
DA97

Appendix 9

Sheet 9 of 30

Instruction: MAC1
Syntax: MAC1 srcA, srcB, dest
Operation: dest=srcA* srcB+acc1
Description: Source A is multiplied with source B and the result is added with accumulator 1. If the destination is an accumulator, the 48-bit result is stored in the accumulator. Otherwise, the 24 msb of the result is stored in destination. If multiply shift mode is enabled, the result of the multiply is shifted left by one bit before adding to the accumulator. If saturation is enabled, the 48-bit result is saturated in the case of overflow. If rounding is enabled, the result is rounded to 24 bits if the destination is not an accumulator. The result is also rounded to 24 bits if the destination is a rounded accumulator.

Restrictions: srcB=acc0 is not allowed.
Flags Affected: V, C, Z, N, U, POV2, POV3
Modes Used: SAT, RND, MPYSHF
DA97

Appendix 10

Sheet 10 of 30

Instruction: MACL
Syntax: MACL srcA, srcB, dest
Operation: dest=srcA*srcB+acc0
Description: Source A is multiplied with source B and the result is added with accumulator 0. If the destination is an accumulator, the 24 lsb of the result is stored in both the high and low halves of the accumulator. Otherwise, the 24 msb of the result is stored in destination. Multiply shift mode (MPYSHF) and round mode (RND) have no effect on this opcode. If saturation mode is enabled, the result is saturated to 24 bits in the case of overflow.

Restrictions: srcB=acc1 is not allowed.
Flags Affected: V, C, Z, N, U
Modes Used: SAT
DA97

Appendix 11

Sheet 11 of 30

Instruction: MACL1
Syntax: macl srcA, srcB, dest
Operation: dest=srcA*srcB+acc1
Description: Source A is multiplied with source B and the result is added with accumulator 1. If the destination is an accumulator, the 24 lsb of the result is stored in both the high and low halves of the accumulator. Otherwise, the 24 msb of the result is stored in destination. Multiply shift mode (MPYSHF) and round mode (RND) have no effect on this opcode. If saturation mode is enabled, the result is saturated to 24 bits in the case of overflow.

Restrictions: srcB=acc0 is not allowed.
Flags Affected: V, C, Z, N, U
Modes Used: SAT
DA97

Appendix 12

Sheet 19 of 30

Instruction: MPY
Syntax: mpy srcA, srcB, dest
Operation: dest=srcA*srcB
Description: Source A is multiplied with source B. If the destination is an accumulator, the 48-bit result is stored in the accumulator. Otherwise, the 24 msb of the result is stored in destination. If multiply shift mode is enabled, the result is shifted left by one bit before writing to the destination. If saturation is enabled, the 48-bit result is saturated in the case of overflow. If rounding is enabled, the result is rounded to 24 bits if the destination is not an accumulator. The result is also rounded if the destination is a rounded accumulator.

Flags Affected: C, Z, N, U, V, POV2, POV3
Modes Used: SAT, RND, MPYSHF
DA97

Appendix 13

Sheet 13 of 30

Instruction: MPYL
Syntax: mpyl srcA, srcB, dest
Operation: dest=srcA*srcB
Description: Source A is multiplied with source B. If the destination is an accumulator, the 24 Lsb of the result is stored in both the high and low halves of the accumulator. Otherwise, the 24 msb of the result is stored in destination. Multiply shift mode (MPYSHF) and round mode (RND) have no effect on this opcode. If saturation mode is enabled, the result is saturated to 24 bits in the case of overflow.

Flags Affected: C, Z, N, U, V
Modes Used: SAT
DA97

Appendix 14

Sheet 14 of 30

Instruction: MSU
Syntax: msu srcA, srcB, dest
Operation: dest=acc0−srcA*srcB
Description: Source A is multiplied with source B and the result is subtracted from accumulator 0. If the destination is an accumulator, the 48-bit result is stored in the accumulator. Otherwise, the 24 msb of the result is stored in destination. If multiply shift mode is enabled, the result of the multiply is shifted left by one bit before subtracting from the accumulator. If saturation is enabled, the 48-bit result is saturated in the case of overflow. If rounding is enabled, the result is rounded to 24 bits if the destination is not an accumulator. The result is also rounded if the destination is a rounded accumulator.

Restrictions: srcB=acc1 is not allowed.

Flags Affected: V, C, Z, N, U, POV2, POV3

Modes Used: SAT, RND, MPYSHF

DA97

Appendix 15

Sheet 15 of 30

Instruction: MSU1

Syntax: msu1 srcA, srcB, dest

Operation: dest=acc1−srcA*srcB

Description: Source A is multiplied with source B and the result is subtracted from accumulator 1. If the destination is an accumulator, the 48-bit result is stored in the accumulator. Otherwise, the 24 msb of the result is stored in destination. If multiply shift mode is enabled, the result of the multiply is shifted left by one bit before subtracting from the accumulator. If saturation is enabled, the 48-bit result is saturated in the case of overflow. If rounding is enabled, the result is rounded to 24 bits if the destination is not an accumulator. The result is also rounded if the destination is a rounded accumulator.

Restrictions: srcB=acc0 is not allowed.

Flags Affected: V, C, Z, N, U, POV2, POV3

Modes Used: SAT, RND, MPYSHF

DA97

Appendix 16

Sheet 16 of 30

Instruction: MSUL

Syntax: msul srcA, srcB, dest

Operation: dest=acc0−srcA*srcB

Description: Source A is multiplied with source B and the result is subtracted from accumulator 0. If the destination is an accumulator, the 24 Lsb of the result is stored in both the high and low halves of the accumulator. Otherwise, the 24 msb of the result is stored in destination. Multiply shift mode (MPYSHF) and round mode (RND) have no effect on this opcode. If saturation mode is enabled, the result is saturated to 24 bits in the case of overflow.

Restrictions: srcB=acc1 is not allowed.

Flags Affected:V, C, Z, N, U

Modes Used: SAT

DA97

Appendix 17

Sheet 17 of 30

Instruction: MSUL1

Syntax: msul1 srcA, srcB, dest

Operation: dest=acc1−srcA*srcB

Description: Source A is multiplied with source B and the result is subtracted from accumulator 1. If the destination is an accumulator, the 24 Lsb of the result is stored in both the high and low halves of the accumulator. Otherwise, the 24 msb of the result is stored in destination. Multiply shift mode (MPYSHF) and round mode (RND) have no effect on this opcode. If saturation mode is enabled, the result is saturated to 24 bits in the case of overflow.

Restrictions: srcB=acc0 is not allowed.

Flags Affected: V, C, Z, N, U

Modes Used: SAT

DA97

Appendix 18

Sheet 18 of 30

Instruction: MVD

Syntax: mvd srcA, dest

Operation: dest=srcA

Description: Move data from source to destination along source A bus.

Restrictions: none

Flags Affected: none

Modes Used: none

DA97

Appendix 19

Sheet 19 of 30

Instruction: MVP

Syntax: mvp srcB, dest

Operation: dest=srcB

Description: Move data from source B bus to destination.

Restrictions: none

Flags Affected: none

Modes Used: none

DA97

Appendix 20

Sheet 20 of 30

Instruction: NOP

Syntax: nop

Operation: none

Description: No operation.

Restrictions: none

Flags Affected:none

Modes Used: none

DA97

Appendix 21

Sheet 21 of 30

Instruction: OR

Syntax: or srcA, srcB, dest

Operation: dest=srcA | srcB

Description: Source A is bitwise ored with source B and the result is stored in the destination. If the destination is an accumulator, the result is written to the high 24 bits of the accumulator.
Restrictions: none
Flags Affected: Z, N
Modes Used: none
DA97

Appendix 22

Sheet 22 of 30

Instruction: REP
Syntax: rep src
Operation: dest=src
Description: Load data into loop counter. Instruction following rep is repeated n+1 times, where n is the value in acc or immediate short data. REP is an assembler directive for LD; the assembler automatically sets dest equal to LC.
Restrictions: Instruction following rep may not use immediate srcB data.
Flags Affected: none
Modes Used: none
DA97

Appendix 23

Sheet 23 of 30

Instruction: RET/RETI
Syntax: ret cc//if (cc), return ret//always return reti cc//if (cc), return reti//always return
Operation: if (cc) {if (service interrupt){sr=sr;stack pointer–1;}else {stack pointer–1;}}
Description: Return from subroutine or interrupt. Bit 14 of the instruction word distinguishes between RET and RETI.
Restrictions: none
Flags Affected: none
Modes Used: none
DA97

Appendix 24

Sheet 24 of 30

Instruction: SHF
Syntax: shf ACCx, n, dest
Operation: dest=(acc << shf) or (acc >> shf)
Description: The designated accumulator is shifted left by 1, 2, or 3, or right by 1. If the destination is an accumulator, the 48-bit result is stored in the accumulator. Otherwise, the 24 msb of the result is stored in destination. Left shifts fill the Lsbs with zeros, and the right shift is arithmetic.
Restrictions: none
Flags Affected: V, C, Z, N, U
Modes Used: none
DA971050257

Appendix 25

Sheet 25 of 30

Instruction: SHFL
Syntax: shfl ACCx, n, dest
Operation: dest=(acc << shf) or (acc; >> shf)
Description: The designated accumulator is shifted left by 1, 2, or 3, or right by 1. If the destination is an accumulator, the 24 Lsb of the result is stored in both the high and low halves of the accumulator. Otherwise, the 24 Lsb of the result is stored in destination. Left shifts fill the Lsb with zeros, and the right shift is arithmetic.
Restrictions: none
Flags Affected: V, C, Z, N, U
Modes Used: none Appendix 26

Sheet 26 of 30

Instruction: SUB
Syntax: sub srcA, srcB, dest
Operation: dest=srcB–srcA
Description: Source A is subtracted from source B and the result is stored in the destination. If saturation is enabled, then the result is saturated in the case of overflow. If the destination is an accumulator, the result is written to the high 24 bits of the accumulator.
Restrictions: none
Flags Affected:V, C, Z, N, U, POV2, POV3
Modes Used: SAT Appendix 27

Sheet 27 of 30

Instruction: SUBC
Syntax: subc srcA, srcB, dest
Operation: dest=srcB–srcA–C
Description: Source A and the carry bit are subtracted from source B and the result is stored in the destination. If saturation is enabled, then the result is saturated in the case of overflow. If the destination is an accumulator, the result is written to the high 24 bits of the accumulator.
Restrictions: none
Flags Affected: V, C, Z, N, U, POV2, POV3
Modes Used: SAT Appendix 28

Sheet 28 of 30

Instruction: SUBR
Syntax: subr srcA, srcB, dest
Operation: dest=srcA–srcB
Description: Source B is subtracted from source A and the result is stored in the destination. If saturation is enabled, then the result is saturated in the case of overflow. If the destination is an accumulator, the result is written to the high 24 bits of the accumulator.
Restrictions: none
Flags Affected: V, C, Z, N, U, POV2, POV3
Modes Used: SAT Appendix 29

Sheet 29 of 30

Instruction: TRAP
Syntax: trap

Description: Generates debug interrupt.
Restrictions: Disabled if NMIEN bit is cleared.
Flags Affected: none
Modes Used: none Appendix 30

Sheet 30 of 30

Instruction: XOR
Syntax: xor srcA, srcB, dest
Operation: dest=srcA–srcB
Description: Source A is bitwise exclusive-ored with source B and the result is stored in the destination. If the destination is an accumulator, the result is written to the high 24 bits of the accumulator.
Restrictions: none
Flags Affected: Z, N
Modes Used: none
233:2836-PO58us
041697 v4

What is claimed is:

1. An audio decoder comprising a first digital signal processor for performing a first set of operations on a received compressed audio data stream compressed using an algorithm employing transform encoding and a bit allocation routine including:
 parsing said compressed audio data stream;
 recovering data fields within said compressed audio data stream;
 calculating a bit allocation; and
 passing frequency domain transform coefficients to shared memory; and
 a second digital signal processor for performing a second set of operations on data passed from said first digital processor to shared memory including performing inverse transform operations on said data passed from said first digital signal processor.

2. The audio decoder of claim 1 wherein said first and second digital signal processors process said compressed audio data as channels, said first digital signal processor processing channel n and said second digital signal processor processing in parallel channel n–1.

3. The audio decoder of claim 1 wherein said first and second digital signal processors are operable to exchange command and control messages via a set of registers.

4. The audio decoder of claim 1 wherein said first and second digital signal processors are fabricated on a single chip and further comprising:
 first memory associated with said first digital signal processor including data RAM, program RAM, and program ROM; and
 second memory associated with said second digital signal processor including data RAM, program RAM, and program ROM.

5. The audio decoder of claim 4, wherein a selected one of said digital signal processors comprises an execution unit coupled to first and second busses;
 a program address unit coupled to said first bus for controlling an exchange of data between program memory and said first bus;
 a data address unit coupled to said second bus for controlling an exchange of data between data memory and said second bus;
 and further comprising a RAM repair unit, said RAM repair unit including a registers file, a plurality of remap registers and address match logic.

6. A dual-digital signal processor (dual-DSP) single chip audio decoder comprising:
 a first signal processor operable to parse a received compressed stream of digital audio data and extract frequency domain transform coefficients represented by exponents and mantissas;
 a shared memory system, said first processor loading said transform coefficients into said shared memory;
 interprocessor communications registers including a register used by said first processor to indicate that said coefficients have been loaded into said memory; and
 a second signal processor operable to retrieve said transform coefficients from said shared memory and perform reverse transform operations thereon to recover pulse-code-modulated samples.

7. The dual-DSP audio decoder of claim 6 wherein said first signal processor is further operable to perform a bit allocation for unpacking and dequantizing said mantissas representing said transform coefficients.

8. The dual-DSP audio decoder of claim 6 wherein said compressed stream of digital audio data is compressed using a high coding gain algorithm.

9. The dual-DSP audio decoder of claim 6 wherein said first processor is operable to extract said frequency domain transform coefficients for a first channel substantially simultaneously with said second processor recovering pulse-code-modulated samples for a second channel.

10. The dual-DSP audio decoder of claim 6 wherein said first and second processors operate in parallel in conjunction with dedicated program and data memories.

11. A method of decompressing a stream of audio data compressed using a high coding gain algorithm and representing pulse code modulated (PCM) samples as frequency domain coefficients comprising the steps of:
 extracting the frequency domain coefficients from the stream using a first processor comprising the substeps of:
  parsing the compressed audio data stream to extract channels of data;
  recovering data fields within the compressed audio data stream for each channel; and
  calculating a bit allocation to determine a number of bits used to encode each PCM sample into frequency domain coefficients; and
 performing an inverse transform on the frequency domain coefficients using a second processor to recover the encoded PCM samples.

12. The method of claim 11 wherein the high coding gain algorithm comprises and AC-3 encoding algorithm.

13. The method of claim 11 wherein the first and second processors comprise digital signal processors.

14. The method of claim 11 wherein said step of extracting is performed on a first channel of data substantially concurrently with said step of performing the inverse transform on a second channel of data.

15. The method of claim 11 and further comprising the step of transferring the frequency domain coefficients from the first processor to the second processor using shared memory and a semaphore.

* * * * *